US012313227B2

(12) United States Patent
Jiang et al.

(10) Patent No.: US 12,313,227 B2
(45) Date of Patent: May 27, 2025

(54) LED FILAMENT AND LED LIGHT BULB

(71) Applicant: ZHEJIANG SUPER LIGHTING ELECTRIC APPLIANCE CO., LTD., Zhejiang (CN)

(72) Inventors: Tao Jiang, Zhejiang (CN); Mingbin Wang, Zhejiang (CN); Yuexing Li, Zhejiang (CN); Zhichao Zhang, Zhejiang (CN); Chihshan Yu, Zhejiang (CN); Aiming Xiong, Zhejiang (CN); Lin Zhou, Zhejiang (CN); JunFeng Xu, Zhejiang (CN)

(73) Assignee: ZHEJIANG SUPER LIGHTING ELECTRIC APPLIANCE CO., LTD., Lishui (CN)

( * ) Notice: Subject to any disclaimer, the term of this patent is extended or adjusted under 35 U.S.C. 154(b) by 0 days.

(21) Appl. No.: 18/642,164

(22) Filed: Apr. 22, 2024

(65) Prior Publication Data

US 2024/0288131 A1 Aug. 29, 2024

Related U.S. Application Data

(63) Continuation of application No. 18/126,000, filed on Mar. 24, 2023, now Pat. No. 12,007,077, which is a (Continued)

(30) Foreign Application Priority Data

Sep. 28, 2014 (CN) ......................... 201410510593.6
Feb. 2, 2015 (CN) ......................... 201510053077.X (Continued)

(51) Int. Cl.
*F21K 9/232* (2016.01)
*F21K 9/235* (2016.01)

(Continued)

(52) U.S. Cl.
CPC .............. *F21K 9/232* (2016.08); *F21K 9/235* (2016.08); *F21K 9/238* (2016.08); *F21V 3/10* (2018.02);

(Continued)

(58) Field of Classification Search
CPC ...................................................... F21K 9/232
See application file for complete search history.

(56) References Cited

U.S. PATENT DOCUMENTS 2,688,711 A 9/1954 Camillerapp
6,523,978 B1 2/2003 Huang (Continued)

FOREIGN PATENT DOCUMENTS

CN 1636259 A 7/2005
CN 101702421 A 5/2010

(Continued)

*Primary Examiner* — William N Harris
(74) *Attorney, Agent, or Firm* — Simon Kuang Lu

(57) ABSTRACT

An LED light bulb is provided. The LED light bulb includes a lamp housing, a bulb base, a stem, two conductive supports, a driving circuit, and a flexible LED filament. The flexible filament includes a first LED section, a second LED section, a conductive section, a first conductive electrode, and a second conductive electrode. The first LED section is bent in a first three-dimensional curve shape. The second LED section is bent in a second three-dimensional curve shape. The conductive section includes a center point of the flexible LED filament. The flexible LED filament is bent in a third three-dimensional curve shape including the first three-dimensional curve shape, the conductive section, and the second three-dimensional curve shape. A polarity of the conductor is opposite to polarities of the first conductive electrode and the second conductive electrode.

23 Claims, 91 Drawing Sheets

Related U.S. Application Data continuation-in-part of application No. 17/408,519, filed on Aug. 23, 2021, now Pat. No. 11,686,436, which is a continuation-in-part of application No. 16/894,913, filed on Jun. 8, 2020, now Pat. No. 11,421,827, which is a continuation-in-part of application No. 16/748,070, filed on Jan. 21, 2020, now Pat. No. 10,784,428, which is a continuation-in-part of application No. 16/234,124, filed on Dec. 27, 2018, now Pat. No. 10,845,008, which is a continuation-in-part of application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, and a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed as application No. PCT/CN2015/090815 on Sep. 25, 2015, now Pat. No. 10,781,979, and a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, and a continuation-in-part of application No. 15/237,983, filed on Aug. 16, 2016, now Pat. No. 10,228,093, said application No. 18/126,000 is a continuation of application No. 17/900,897, filed on Sep. 1, 2022, now Pat. No. 11,629,825, which is a continuation of application No. 17/356,576, filed on Jun. 24, 2021, now Pat. No. 11,525,547, which is a continuation of application No. 16/914,461, filed on Jun. 28, 2020, now Pat. No. 11,085,591, which is a continuation of application No. 16/840,469, filed on Apr. 6, 2020, now Pat. No. 10,711,951, which is a continuation of application No. 16/505,732, filed on Aug. 28, 2019, now Pat. No. 10,677,396, which is a continuation of application No. 15/858,036, filed on Dec. 29, 2017, now Pat. No. 10,544,905, which is a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed on Nov. 4, 2016, now Pat. No. 10,781,979, and a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093, said application No. 15/858,036 is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740.

(30) Foreign Application Priority Data

| | | |
|---|---|---|
| Jun. 10, 2015 | (CN) | 201510316656.9 |
| Jun. 19, 2015 | (CN) | 201510347410.8 |
| Aug. 7, 2015 | (CN) | 201510489363.0 |
| Aug. 17, 2015 | (CN) | 201510502630.3 |
| Sep. 2, 2015 | (CN) | 201510555889.4 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |
| Sep. 18, 2017 | (CN) | 201710839083.7 |
| Sep. 21, 2017 | (CN) | 201730450712.8 |
| Sep. 22, 2017 | (CN) | 201730453237.X |
| Sep. 22, 2017 | (CN) | 201730453239.9 |
| Sep. 26, 2017 | (CN) | 201710883625.0 |
| Oct. 16, 2017 | (CN) | 201730489929.X |
| Oct. 27, 2017 | (CN) | 201730517887.6 |
| Oct. 27, 2017 | (CN) | 201730518659.0 |
| Oct. 30, 2017 | (CN) | 201730520672.X |
| Nov. 3, 2017 | (CN) | 201730537542.7 |
| Nov. 3, 2017 | (CN) | 201730537544.6 |
| Dec. 26, 2017 | (CN) | 201711434993.3 |
| Dec. 29, 2017 | (CN) | 201711477767.3 |
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Aug. 30, 2018 | (CN) | 201811005536.7 |
| Sep. 17, 2018 | (CN) | 201811079889.1 |
| Oct. 30, 2018 | (CN) | 201811277980.4 |
| Oct. 31, 2018 | (CN) | 201811285657.1 |
| Nov. 19, 2018 | (CN) | 201811378173.1 |
| Nov. 19, 2018 | (CN) | 201811378189.2 |
| Dec. 18, 2018 | (CN) | 201811549205.X |
| Jan. 22, 2019 | (CN) | 201910060475.2 |
| Jun. 10, 2019 | (CN) | 201910497661.2 |
| Nov. 1, 2019 | (CN) | 201911057715.X |
| Dec. 5, 2019 | (CN) | 201911234236.0 |
| Aug. 24, 2020 | (CN) | 202010856691.0 |
| Sep. 1, 2020 | (CN) | 202010904065.4 |
| Sep. 3, 2020 | (CN) | 202010912636.9 |
| Nov. 20, 2020 | (CN) | 202011313059.8 |
| Jan. 27, 2021 | (CN) | 202110108853.7 |
| Jul. 9, 2021 | (CN) | 202110779145.6 |

(51) Int. Cl.

| | |
|---|---|
| ***F21K 9/238*** | (2016.01) |
| ***F21V 3/10*** | (2018.01) |

| | |
|---|---|
| ***F21Y 107/00*** | (2016.01) |
| ***F21Y 107/20*** | (2016.01) |
| ***F21Y 107/70*** | (2016.01) |
| ***F21Y 115/10*** | (2016.01) |
| ***H05B 45/00*** | (2022.01) |

(52) U.S. Cl.
CPC .......... *H05B 45/00* (2020.01); *F21Y 2107/00* (2016.08); *F21Y 2107/20* (2016.08); *F21Y 2107/70* (2016.08); *F21Y 2115/10* (2016.08)

(56) References Cited

U.S. PATENT DOCUMENTS

| | | | | |
|---|---|---|---|---|
| 6,586,882 | B1 | 7/2003 | Harbers | |
| D548,369 | S | 8/2007 | Bembridge | |
| 7,484,860 | B2 | 2/2009 | Demarest et al. | |
| 7,618,175 | B1 | 11/2009 | Hulse | |
| 7,810,974 | B2 | 10/2010 | Van Rijswick et al. | |
| 8,400,051 | B2 | 3/2013 | Hakata et al. | |
| 8,455,895 | B2 | 6/2013 | Chai et al. | |
| 8,933,619 | B1 | 1/2015 | Ou | |
| 9,016,900 | B2 | 4/2015 | Takeuchi et al. | |
| 9,231,171 | B2 | 1/2016 | Liu et al. | |
| 9,761,765 | B2 | 9/2017 | Basin et al. | |
| D799,100 | S | 10/2017 | Morris | |
| D801,556 | S | 10/2017 | Yao | |
| D804,063 | S | 11/2017 | Yeung | |
| 9,909,724 | B2 | 3/2018 | Marinus et al. | |
| D827,164 | S | 8/2018 | Jiang et al. | |
| D828,933 | S | 9/2018 | Castiglioni | |
| D829,940 | S | 10/2018 | Wang et al. | |
| D829,941 | S | 10/2018 | Wang et al. | |
| D829,942 | S | 10/2018 | Gao | |
| D830,586 | S | 10/2018 | Jiang et al. | |
| D830,587 | S | 10/2018 | Wu et al. | |
| D832,470 | S | 10/2018 | Wu et al. | |
| D838,008 | S | 1/2019 | Wang et al. | |
| D838,009 | S | 1/2019 | Wang et al. | |
| 10,415,763 | B2 | 9/2019 | Eckert | |
| D862,740 | S | 10/2019 | Chen | |
| D876,674 | S | 2/2020 | Zhou | |
| D879,330 | S | 3/2020 | Chen | |
| D880,017 | S | 3/2020 | Chen | |
| 10,663,117 | B2 | 5/2020 | Chen | |
| 10,767,816 | B1 | 9/2020 | Wu et al. | |
| 10,784,428 | B2 | 9/2020 | Jiang et al. | |
| D907,279 | S | 1/2021 | Bie | |
| D908,251 | S | 1/2021 | Chen | |
| 11,015,764 | B2 | 5/2021 | Jiang et al. | |
| 11,047,532 | B1 | 6/2021 | Chen et al. | |
| 11,187,387 | B1 | 11/2021 | Yan et al. | |
| 11,231,147 | B2 | 1/2022 | Cao et al. | |
| 11,421,827 | B2 | 8/2022 | Jiang et al. | |
| D963,232 | S | 9/2022 | Qin | |
| D975,911 | S | 1/2023 | Shen | |
| 11,543,083 | B2 | 1/2023 | Jiang et al. | |
| D978,413 | S | 2/2023 | Qin | |
| 2003/0123150 | A1 | 7/2003 | Brickey et al. | |
| 2009/0059593 | A1 | 3/2009 | Tsai | |
| 2009/0212698 | A1 | 8/2009 | Bailey | |
| 2009/0251882 | A1 | 10/2009 | Ratcliffe | |
| 2011/0278605 | A1 | 11/2011 | Agatani et al. | |
| 2012/0119647 | A1 | 5/2012 | Hsu | |
| 2013/0058080 | A1 | 3/2013 | Ge et al. | |
| 2013/0077285 | A1 | 3/2013 | Isogai et al. | |
| 2013/0100640 | A1 | 4/2013 | Zhang | |
| 2013/0141892 | A1 | 6/2013 | Okazaki et al. | |
| 2013/0147348 | A1 | 6/2013 | Motoya et al. | |
| 2013/0235592 | A1 | 9/2013 | Takeuchi et al. | |
| 2013/0249381 | A1* | 9/2013 | Takeuchi | H05B 33/02<br>313/292 |
| 2013/0265796 | A1* | 10/2013 | Kwisthout | G02B 6/001<br>362/558 |
| 2013/0293098 | A1 | 11/2013 | Li et al. | |
| 2014/0063829 | A1 | 3/2014 | Kushalappa et al. | |
| 2014/0103794 | A1* | 4/2014 | Ueda | F21V 23/002<br>313/318.01 |
| 2014/0152177 | A1* | 6/2014 | Matsuda | F21K 9/23<br>315/32 |
| 2014/0268779 | A1* | 9/2014 | Sorensen | F21K 9/232<br>362/249.06 |
| 2014/0369036 | A1 | 12/2014 | Feng | |
| 2014/0375201 | A1 | 12/2014 | Su et al. | |
| 2015/0003038 | A1 | 1/2015 | Liu | |
| 2015/0069442 | A1 | 3/2015 | Liu et al. | |
| 2015/0070871 | A1 | 3/2015 | Chen et al. | |
| 2015/0070887 | A1 | 3/2015 | Yamauchi | |
| 2015/0097199 | A1 | 4/2015 | Chen et al. | |
| 2016/0369949 | A1 | 12/2016 | Wu et al. | |
| 2016/0369952 | A1 | 12/2016 | Weekamp | |
| 2017/0012177 | A1 | 1/2017 | Trottier | |
| 2017/0051877 | A1 | 2/2017 | Weijers et al. | |
| 2017/0138543 | A1 | 5/2017 | Steele et al. | |
| 2018/0080611 | A1 | 3/2018 | Haberkorn et al. | |
| 2018/0080612 | A1 | 3/2018 | Haberkorn et al. | |
| 2018/0172218 | A1 | 6/2018 | Feit | |
| 2019/0368667 | A1 | 12/2019 | On et al. | |
| 2019/0386185 | A1 | 12/2019 | Jiang et al. | |
| 2020/0161522 | A1 | 5/2020 | Jiang et al. | |
| 2020/0219857 | A1 | 7/2020 | Park et al. | |
| 2021/0381657 | A1 | 12/2021 | Xiong et al. | |
| 2023/0265977 | A1 | 8/2023 | Jiang et al. | |

FOREIGN PATENT DOCUMENTS

| | | | |
|---|---|---|---|
| CN | 201448620 | U | 5/2010 |
| CN | 202252991 | U | 5/2012 |
| CN | 102751274 | A | 10/2012 |
| CN | 102980054 | A | 3/2013 |
| CN | 103560128 | A | 2/2014 |
| CN | 103594608 | A | 2/2014 |
| CN | 203477967 | U | 3/2014 |
| CN | 103700652 | A | 4/2014 |
| CN | 103890481 | A | 6/2014 |
| CN | 203628391 | U | 6/2014 |
| CN | 103939758 | A | 7/2014 |
| CN | 103956421 | A | 7/2014 |
| CN | 103972364 | A | 8/2014 |
| CN | 103994349 | A | 8/2014 |
| CN | 203771136 | U | 8/2014 |
| CN | 203907532 | U | 10/2014 |
| CN | 203910792 | U | 10/2014 |
| CN | 104319345 | A | 1/2015 |
| CN | 204083941 | U | 1/2015 |
| CN | 104456165 | A | 3/2015 |
| CN | 204289439 | U | 4/2015 |
| CN | 104600174 | A | 5/2015 |
| CN | 104716247 | A | 6/2015 |
| CN | 204387765 | U | 6/2015 |
| CN | 105161608 | A | 12/2015 |
| CN | 105371243 | A | 3/2016 |
| CN | 105591010 | A | 5/2016 |
| CN | 106122819 | A | 11/2016 |
| CN | 209282188 | U | 8/2019 |
| CN | 111682016 | A | 9/2020 |
| CN | 212319432 | U | 1/2021 |
| EP | 2760057 | A1 | 7/2014 |
| EP | 2567145 | B1 | 4/2016 |
| GB | 2547085 | A | 8/2017 |
| JP | 3075689 | U | 2/2001 |
| JP | 2012064568 | A | 3/2012 |
| JP | 2012099726 | A | 5/2012 |
| JP | 2013225587 | A | 10/2013 |
| JP | 2014032981 | A | 2/2014 |
| JP | 2014143156 | A | 8/2014 |
| WO | 2012053134 | A1 | 4/2012 |
| WO | 2018094887 | A1 | 5/2018 |

* cited by examiner

LED FILAMENT AND LED LIGHT BULB

CROSS-REFERENCE TO RELATED APPLICATIONS

This application is a continuation of application Ser. No. 18/126,000, filed on Mar. 24, 2023, which is a continuation-in-part (CIP) of application Ser. No. 17/408,519, filed on Aug. 23, 2021, and Ser. No. 17/900,897, filed on Sep. 1, 2022. The prior applications are herewith incorporated by reference in its entirety.

TECHNICAL FIELD

The present disclosure relates to a lighting field, and more particularly to an LED filament and its application in an LED light bulb.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may result in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

In addition, since the driving requirements for lighting the LED filament are substantially different from for lighting the conventional tungsten filament lamp. Therefore, for LED light bulbs, how to design a power supply circuitry with a stable current to reduce the ripple phenomenon of the LED filament in an acceptable level so that the user does not feel the flicker is one of the design considerations. Besides, under the space constraints and the premises of achieving the required light efficiency and the driving requirements, how to design a power supply circuitry with the structure simply enough to embed into the space of the lamp head is also a focus of attention.

Patent No. CN202252991U discloses the light lamp employing with a flexible PCB board instead of the aluminum heat dissipation component to improve heat dissipation. Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omni-directional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

In view of this, an LED light bulb is provided. The LED light bulb comprises a lamp housing, a bulb base, a stem, two conductive supports, a driving circuit, and a flexible LED filament. The lamp housing has a central axis. The bulb base is connected to the lamp housing. The stem is disposed in the lamp housing along the central axis of the lamp housing. The two conductive supports are disposed in the lamp housing and have opposite polarities. The driving circuit is disposed in the bulb base and electrically connected to the two conductive supports. The flexible LED filament is disposed in the lamp housing and electrically connected to the two conductive supports. The flexible LED filament comprises a first LED section, a second LED section, a conductive section, a first conductive electrode, and a second conductive electrode. The first LED section comprises a first plurality of LED chips connected in series and a first light conversion layer wrapping the first plurality of LED chips. The first LED section is bent into a first three-dimensional curve shape in the lamp housing. The second LED section comprises a second plurality of LED chips connected in series and a second light conversion layer wrapping the second plurality of LED chips. The second LED section is bent into a second three-dimensional curve shape in the lamp housing. The conductive section is disposed between the first LED section and the second LED section. The conductive section comprises a conductor electrically connected to the first plurality of LED chips and the second plurality of LED chips, and the conductive section is further electrically connected to one of the two conductive supports. The first conductive electrode is disposed at one end of the first LED section and electrically connected to the first plurality of LED chips and the other one of the two conductive supports, a portion of the first conductive electrode and a portion of the conductor being wrapped by the first light conversion layer. The second conductive electrode is disposed at one end of the second LED section and electrically connected to the second plurality of LED chips and the other one of the two conductive supports, the other end of the second LED section connecting the other end of the first LED section by the conductive section, a portion of the second conductive electrode and a portion of the conductor being wrapped by the second light conversion layer. The flexible LED filament is bent in a third three-dimensional curve shape in the lamp housing. The third three-dimensional curve shape comprise the first three-dimensional curve shape, the conductive section, and the second three-dimensional curve shape. The conductive section includes a center point of the flexible LED filament and a polarity of the conductor is opposite to polarities of the first conductive electrode and the second conductive electrode.

In some embodiments, the shortest distance between one of the first plurality of LED chips of the first LED section and one of the second plurality of LED chips of the second LED section is greater than a distance between adjacent two of the first plurality of LED chips of the first LED section and greater than a distance between adjacent two of the second plurality of LED chips of the second LED section.

In some embodiments, a length of the conductor is greater than a distance between the adjacent two of the first plurality of LED chips of the first LED section and greater than a distance between the adjacent two of the second plurality of LED chips of the second LED section.

In some embodiments, the first plurality of LED chips of the first LED section is connected in series by wires, the second plurality of LED chips of the second LED section is connected in series by wires, the conductor is a conductive foil, and the conductor is electrically connected to one of the first plurality of LED chips of the first LED section by a wire.

In some embodiments, a length of one of the wires connecting two of the first plurality of LED chips of the first LED section is less than a length of the conductor, and a length of one of the wires connecting two of the second plurality of LED chips of the second LED section is less than the length of the conductor.

In some embodiments, the first light conversion layer comprises a first top layer and a first base layer, the second light conversion layer comprises a second top layer and a second base layer, the first plurality of LED chips of the first LED section is disposed between the first top layer and the first base layer, and the second plurality of LED chips of the second LED section is disposed between the second top layer and the second base layer.

In some embodiments, a portion of the conductor is disposed between the first top layer and the first base layer, and a portion of the conductor is disposed between the second top layer and the second base layer.

In some embodiments, the first conductive electrode is disposed between the first top layer and the first base layer, and the second conductive electrode is disposed between the second top layer and the second base layer.

In some embodiments, a portion of the conductor is exposed from the first light conversion layer and the second light conversion layer.

In some embodiments, a portion of the first conductive electrode is exposed from the first light conversion layer, and a portion of the second conductive electrode is exposed from the second light conversion layer.

In some embodiments, the portion of the conductor exposed from the first light conversion layer and the second light conversion layer is electrically connected to the one of the two conductive supports, the portion of the first conductive electrode exposed from the first light conversion layer and the portion of the second conductive electrode exposed from the second light conversion layer are electrically connected to the other one of the two conductive supports.

In some embodiments, the first three-dimensional curve shape and the second three-dimensional curve shape are axially symmetrical about the central axis of the lamp housing.

According to another embodiment, an LED light bulb is provided. The LED light bulb comprises a lamp housing, a bulb base, a stem, two conductive supports, a driving circuit, and a flexible LED filament. The lamp housing has a central axis. The bulb base is connected to the lamp housing. The stem is disposed in the lamp housing along the central axis of the lamp housing. The two conductive supports are disposed in the lamp housing and have opposite polarities. The driving circuit is disposed in the bulb base and electrically connected to the two conductive supports. The driving circuit comprises a first output terminal, a second output terminal, and a third output terminal. The flexible LED filament is disposed in the lamp housing and electrically connected to the two conductive supports. The flexible LED filament comprises a first LED section, a second LED section, a conductive section, a first conductive electrode, a second conductive electrode, and a light conversion layer. The first LED section comprises a first plurality of LED chips connected in series to have a first node and a second node. Polarities of the first node and the second node of the first LED section are opposite, and the first LED section is bent into a first three-dimensional curve shape in the lamp housing. The second LED section comprises a second plurality of LED chips connected in series to have a third node and a fourth node. Polarities of the third node and the fourth node of the second LED section are opposite, the polarities of the first node and the fourth node are the same, the polarities of the second node and the third node are the same, and the second node of the first LED section is electrically connected to the third node of the second LED section. The second LED section is bent into a second three-dimensional curve shape in the lamp housing. The conductive section comprises a conductor electrically connected to the second node of the first LED section and the third node of the second LED section. The first conductive electrode is electrically connected to the first node of the first LED section. The second conductive electrode is electric ally connected to the fourth node of the second LED section. The light conversion layer wraps the first plurality of LED chips of the first LED section, the second plurality of LED chips of the second LED section, a portion of the first conductive electrode, a portion of the second conductive electrode, and a portion of the conductor. The first output terminal of the driving circuit is electrically connected to the conductor, the second output terminal of the driving circuit is electrically connected to the first node of the first LED section, and the third output terminal of the driving circuit is electrically connected to the fourth node of the second LED section. The light conversion layer comprises a top layer and a base layer, and the first conductive electrode, the second conductive electrode, and the conductor are disposed between the base layer and the top layer. The flexible LED filament is bent into a third three-dimensional curve shape in the lamp housing, the third three-dimensional curve shape comprises the first three-dimensional curve shape, the conductive section, and the second three-dimensional curve shape.

In some embodiments, the first output terminal is a positive electrode, the second output terminal is a negative electrode, the third output terminal is a negative electrode, the polarity of the second node is anode, and the polarities of the first node and fourth node are cathode.

In some embodiments, the first output terminal is a negative electrode, the second output terminal is a positive electrode, the third output terminal is a positive electrode, the polarities of the first node and the fourth node are anode, and the polarity of the second node is cathode.

In some embodiments, the shortest distance between one of the first plurality of LED chips of the first LED section and one of the second plurality of LED chips of the second LED section is greater than a distance between adjacent two of the first plurality of LED chips of the first LED section and greater than a distance between adjacent two of the second plurality of LED chips of the second LED section.

In some embodiments, a length of the conductive section is greater than a distance between the adjacent two of the first plurality of LED chips of the first LED section and greater than a distance between the adjacent two of the second plurality of LED chips of the second LED section.

In some embodiments, the first plurality of LED chips of the first LED section is connected in series by wires, the second plurality of LED chips of the second LED section is connected in series by wires, the conductor is a conductive foil, and the conductor is electrically connected to the second node of the first LED section and the third node of the second LED section by wires.

In some embodiments, a length of one of the wires connecting two of the first plurality of LED chips of the first LED section is less than a length of the conductor, and a length of one of the wires connecting two of the second plurality of LED chips of the second LED section is less than the length of the conductor.

In some embodiments, the first plurality of LED chips of the first LED section and the second plurality of LED chips of the second LED section are disposed between the top layer and the base layer.

In some embodiments, a portion of the conductor is disposed between the top layer and the base layer, and a portion of the conductor is exposed from the light conversion layer.

In some embodiments, the portion of the conductor exposed from the light conversion layer is electrically connected to one of the two conductive supports.

In some embodiments, the first three-dimensional curve shape and the second three-dimensional curve shape are axially symmetrical about the central axis of the lamp housing.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which:

FIGS. 14H to 14K are schematic views showing an LED filament with attaching strength being enhanced in accordance with the present invention, wherein FIG. 14H is a perspective view of a conductor, FIG. 14I is a perspective view showing a base layer, a conductor and a top layer, and FIGS. 14J and 14K are cross sectional views along a line E1-E2 in FIG. 14I for different structures;

FIG. 57C is a schematic partial cross-sectional view of a position A-A in

FIG. 57A;

DETAILED DESCRIPTION

Figure 1A:
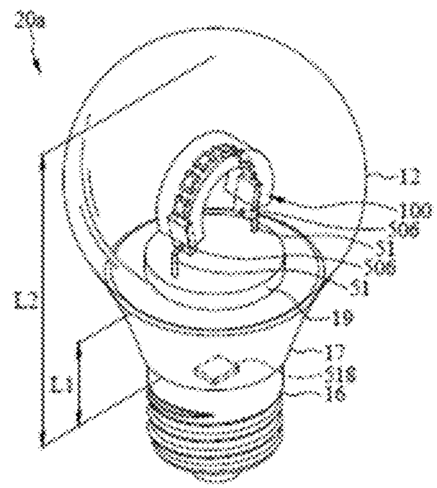
FIGS. 1A and 1B are perspective views of the LED light bulb in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms “a”, “an” and “the” are intended to include the plural forms as well, unless the context clearly indicates otherwise. As used herein, the term “and/or” includes any and all combinations of one or more of the associated listed items and may be abbreviated as “/”.

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using “first,” “second,” etc., in the specification, it may still be referred to as “first” or “second” in a claim in order to distinguish different claimed elements from each other.

It will be further understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being “connected” or “coupled” to or “on” another element, it can be directly connected or coupled to or on the other element or intervening elements may be present. In contrast, when an element is referred to as being “directly connected” or “directly coupled,” or “immediately connected” or “immediately coupled” to another element, there are no intervening elements present. Other words used to describe the relationship between elements should be interpreted in a like fashion (e.g., “between” versus “directly between,” “adjacent” versus “directly adjacent,” etc.). However, the term “contact,” as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as “beneath,” “below,” “lower,” “above,” “upper” and the like, may be used herein for ease of description to describe one element’s or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the term “below” can encompass both an orientation of above and below. The device may be otherwise oriented (rotated 90 degrees or at other orientations) and the spatially relative descriptors used herein interpreted accordingly.

Terms such as “same,” “equal,” “planar,” or “coplanar,” as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term “substantially” may be used herein to emphasize this meaning, unless the context or other statements indicate otherwise. For example, items described as “substantially the same,” “substantially equal,” or “substantially planar,” may be exactly the same, equal, or planar, or may be the same, equal, or planar within acceptable variations that may occur, for example, due to manufacturing processes.

Terms such as “about” or “approximately” may reflect sizes, orientations, or layouts that vary only in a small relative manner, and/or in a way that does not significantly alter the operation, functionality, or structure of certain elements. For example, a range from “about 0.1 to about 1” may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 1B:
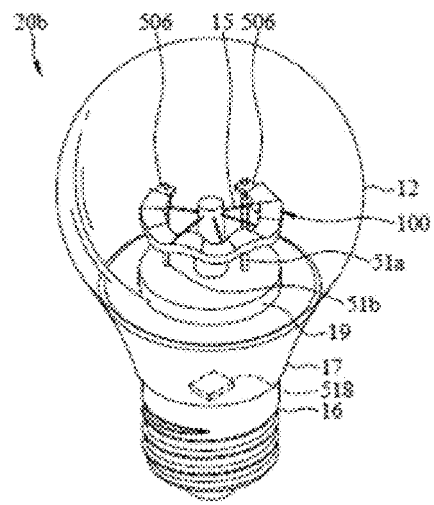

Referring to FIGS. 1A and 1B, FIG. 1A and FIG. 1B are schematic structural diagrams showing the structure of a first embodiment and a second embodiment of the present invention. As shown in the figures, the LED light bulbs 1*a*, 1*b* include a lamp housing 12, a lamp cap 16 connected with the lamp housing 12, at least two conductive brackets (also referring to conductive supports) 51*a*, 51*b* disposed in the lamp housing 12, a driving circuit 518 disposed in the lamp cap 16 and electrically connected to the conductive brackets 51*a*. 51*b* and the lamp cap 16, and a single strip light emitting part 100 disposed in the lamp housing 12, the embodiment of the light emitting part 100 may be an LED filament including an LED chip.

The conductive brackets 51*a* and 51*b* are used for electrically connecting with the two conductive electrodes 506 of the LED filament 100, and can also be used for supporting the weight of the LED filament 100. The driving circuit 518 is electrically connected to the conductive brackets 51*a*, 51*b* and the lamp cap 16. The lamp cap 16 is configured to connect to the lamp socket of the conventional light bulb. The lamp socket is used to transmit the electricity to the lamp cap 16. The driving circuit 518 is used to drive the light emitting part 100 emitting the light ray after the driving circuit 518 obtains the electricity from the lamp cap 16. The LED light bulbs 1*a* and 1*b* can generate omni-directional light because of the light emitting part 100 of the LED light bulbs 1*a* and 1*b* has symmetrical characteristics in terms of structure, shape, contour, curve, or the like, or the symmetrical characteristics of the light emitting direction of the light emitting part 100 (that is, the light emitting surface of the LED filament of the present invention, the details as described later). In the present embodiment, the driving circuit 518 is disposed within the LED light bulb. However, in some embodiments, the drive circuit 518 is disposed outside of the LED light bulb.

In the embodiment as shown in the FIG. 1A, the conductive brackets 51*a*, 51*b* of the LED light bulb 1*a* are exemplified by two, but not limited thereto, and the number of the conductive brackets can be increased by the requirements of conducting or supporting of the light emitting part 100.

In the embodiment as shown in the FIGS. 1A and 1B, each of the LED light bulbs 1*a*, 1*b* further includes a stem 19 and a heat sink 17. The stem 19 is disposed in the lamp housing 12, and the heat sink 17 is located between the lamp cap 16 and the lamp housing 12 and is connected to the stem 19. In the present embodiment, the lamp cap 16 is indirectly connected to the lamp housing 12 through the heat sink 17. In some embodiments, the lamp cap 16 can be directly connected to the lamp housing 12 without heat sink 17. The light emitting part 100 is connected to the stem 19 via the conductive brackets 51*a* and 51*b*. The stem 19 can be used to exchange the air in the LED light bulb 1*b* and replace the air with a mixture of nitrogen and helium. The stem 19 can also provide a thermal dissipating function to transfer the heat generated by the light emitting part 100 to the outside of the lamp housing 12. The heat sink 17 may be a hollow cylindrical body that surrounds the opening of the lamp housing 12. The heat sink 17 is connected with the stem 19 and the lamp cap 16 and is used for conducting the heat generated there between to the outside of the LED light bulb 1*b*. The inside of the heat sink 17 may be provided with a driving circuit 518. The contour of the heat sink 17 is in contact with the air outside the lamp housing 12 to dissipate the heat. The heat sink 17 can be made of metal, ceramic or high thermal conductivity plastic with good thermal conductivity.

The material of the heat sink 17, along with the opening/thread of the LED light bulb, can also be a ceramic material with good thermal conductivity. The heat sink 17 can also be integrally formed with the ceramic stem 19. In this way, the heat sink 17 being glued with the lamp cap 16 of the LED light bulb can be eliminated. The thermal resistance of the heat dissipation path of the light emitting part 100 can be reduced, thereby allowing the LED light bulb to have better heat dissipation.

Figure 2:
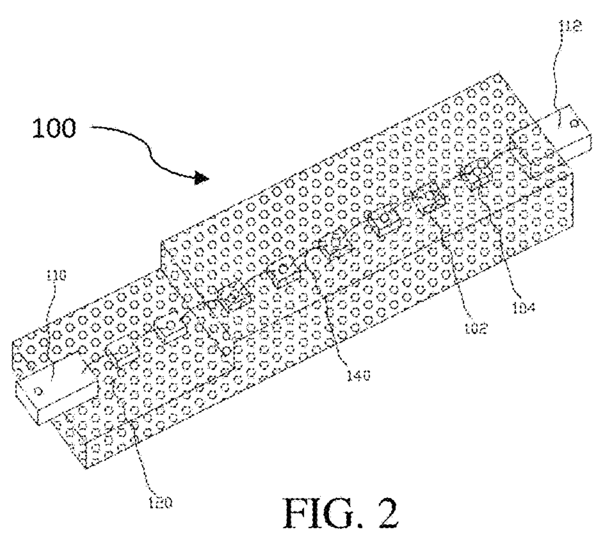
FIG. 2 is a perspective view of the LED filament with partial sectional view in accordance with an embodiment of the present invention.

FIG. 2 is a perspective with a partially cross sectional view showing an embodiment of a light emitting part of the present invention. The present invention will be described below with an LED filament as a light emitting part. However, the embodiment in which the LED filament of the LED light bulb of the present invention may be implemented is not limited thereto. And any LED filament can be bent with various shapes and therefore capable of emitting an omni-directional light that should be regarded as an equivalent replacement element for the light emitting part of the present invention. The LED filament 100 includes a plurality of LED chip units 102, 104, at least two conductive electrodes 110, 112, and a light conversion layer 120 (in a particular embodiment, the light conversion layer may be referred to a silicone layer). The phosphors in the light conversion layer 120 absorbs certain radiation (such as light) and emits the light. The LED filament 100 emitting light rays when the conductive electrodes 110, 112 are powered on (voltage source or current source). In the present embodiment, the light emitted by the LED filament can be substantially 360 degrees and similar to the illumination of the point light source. Therefore, once the LED filament of the embodiment of the present invention is applied to an LED light bulb, the illumination with omni-directional light can be achieved.

As shown in FIG. 2, the cross sectional shape of the LED filament 100 of the present invention is rectangular, but the cross sectional shape of the LED filament 100 is not limited thereto. The cross sectional shape of the LED filament 100 may be triangular, circular, elliptical, polygonal, rhombus, or even square with the corners as chamfered or rounded.

The LED chip units 102, 104, or named with the LED section 102, 104, may be composed of a single LED chip, or two LED chips. Of course, it may also include multiple LED chips, that is, equal to or greater than three LED chips.

Figure 3A:
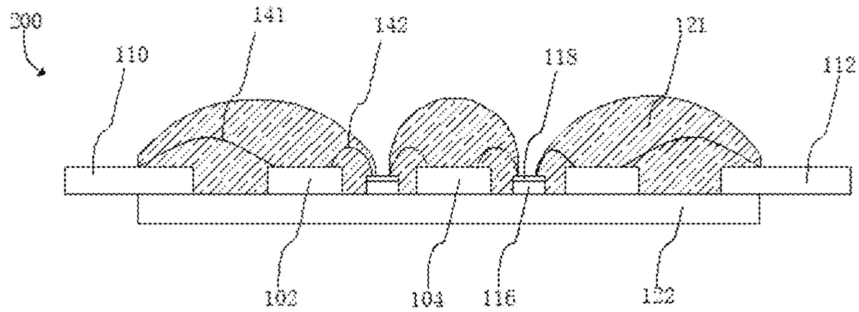
FIGS. 3A to 3F are cross sectional views of various LED filaments in accordance with the present invention.

FIGS. 3A to 3F are cross sectional views showing various embodiments of the LED filament in accordance with the present invention. As shown in FIG. 3A, the LED filament includes the LED chip units 102, 104, the conductive electrodes 110, 112, and the wires. The difference between the present embodiment and the previous embodiment is the light conversion layer 120 in the present embodiment is provided with a first light conversion layer 121 and a base layer 122. The upper surface of the base layer 122 is attached with a plurality of copper foils 116 and the LED chip units 102 and 104. The copper foils 116 are located between two adjacent LED chip units 102, 104. Wherein, the conductive electrodes 110, 112 are disposed corresponding to the LED chip units 102, 104, and the LED chip units 102, 104 and the copper foil 116, the LED chip units 102, 104 and the conductive electrodes 110, 112 are electrically connected by wires respectively. The LED chip is provided with a p-junction and an n-junction, wherein the conductive wires comprise a first wire 141 used for connecting the LED chip units 102, 104 with the conductive electrodes 110, 112, and a second wire 142 used for connecting the LED chip units 102, 104 with the copper foil 116. The first light conversion layer 121 covers a single LED chip unit and the first wire 141 and the second wire 142 connecting to the LED chip unit. The number of the first light conversion layers 121 is the same as the number of the LED chip unit. The LED light bulb employs the LED filament as aforementioned designs, the heat dissipation function and the light emitting efficiency of the LED filament are improved due to the thermal radiation area is increased. Furthermore, because the probability of the wire disconnection is reduced, the reliability of the LED light bulb product is increased, and also the brightness and illuminated appearance of the LED filament with bending curve is achieved.

According to present embodiment, each of the LED chip units 102, 104 includes two LED chips, and of course, may also include a plurality of LED chips, that is, equal to or greater than three LED chips. The exterior shape of the LED chip can be a strip type, but the present invention is not limited thereto. The strip type LED chip has fewer conductive electrodes, reducing the possibility of shielding the light emitted by the LED chip. The LED chip units 102 and 104 are connected in series and the conductive electrodes 110 and 112 are disposed at two ends of the connected LED chip units, and a portion of each of the conductive electrodes 110 and 112 is exposed outside the first light conversion layer 121. Each of the six sides of every LED chip in the LED chip units 102, 104 is covered by the first light conversion layer 121, that is, six sides of the LED chip of the LED units 102, 104 are covered by a first light conversion layer 121, and the coverage of the first light conversion layer 121 may be partial overlap or as wrap but not limited to direct contact with the LED chip. Preferably, in the present embodiment, each of the six sides of the LED chip of the LED chip units 102, 104 directly contacts the first light conversion layer 121. However, in the implementation, the first light conversion layer 121 may cover merely one of the six sides of each of the LED chip of the LED chip units 102, 104, that is, the first light conversion layer 121 directly contacts the one side such as a top or a bottom side. Similarly, the first light conversion layer 121 can directly contact at least one side of the two conductive electrodes 110, 112 or the copper foil 116.

The wire is a gold wire or an aluminum wire, and the combination of the copper foil 116 and the gold wire to provide the LED filament having a stabilized and a flexible conductive structure. The copper foil 116 can be replaced by any other conductive material. The width or/and length of the opening of the copper foil 116 is larger than the contour of the LED chip units 102, 104 and further to define the positions of the LED chip units 102, 104. Furthermore, at least two of the six faces of the LED chip units 102, 104 are contacted and covered by the first light conversion layer 121. By utilizing the copper foil 116 and the wire as linkage, a plurality of the LED chip units 102 and 104 are interconnected in series, in parallel or in a combination of both. Then, the front end and the rear end of the interconnected LED chip units 102, 104 are respectively connected to the two conductive electrodes 110, 112 disposing on the base layer 122, and the conductive electrodes 110, 112 are electrically connected to the power supply to provide the electricity for emitting the LED chip units 102, 104.

The first light conversion layer 121 covers two ends of the copper foil 116, wherein the covering area or the average thickness of the first conversion layer 121 disposing on each of the two ends of the copper foil 116 are substantially the same or not equal. The first light conversion layer 121 covers the upper surface of the copper foil 116 with an area ratio about 30 to 40 percent. In an embodiment of the present invention, as shown in the FIG. 3B, the first light conversion layer 121 may cover the entire copper foil 116 disposing between the two adjacent first light conversion layers. Wherein the covering area or the average thickness of the first conversion layer 121 disposing on the two ends of the copper foil 116 and on the middle of the copper foil 116 are not equal. The first light conversion layer 121 covering the middle surface of the copper foil has a thickness in a range of about 30 to 50 micron (μm). The surface of the first light conversion layer 121 is an arc shape, and the height of the arc shape gradually decreases from the middle to both sides with respect to the base layer 122, and the angle between each of two sides of the curved shape and the base layer 122 is an acute angle or an obtuse angle.

The first light conversion layer 121 includes a phosphor gel or a phosphor film. At least a portion of each of the six sides of the LED chip units 102, 104 directly contacts the first light conversion layer 121 and/or one or both sides of each of the LED chip unit 102, 104 are bonded to the first light conversion layer 121 through the glue. In the aforementioned embodiment, the six sides the LED chip units 102, 104 are all covered by the first light conversion layer 121 and/or partially direct contacted with the first light conversion layer 121. Both embodiments have equivalent concept. In some embodiments, the foregoing glue may also incorporate with phosphors to increase the overall light conversion efficiency. The glue is usually also a silicon gel. The difference between the glue and the silicon gel is the glue generally mixed with silver powder or heat dissipating powder to improve the thermal conductivity.

Figure 3B:
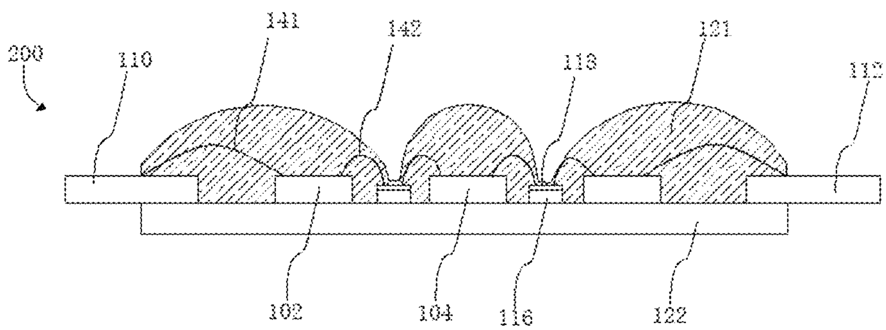
Figure 3C:
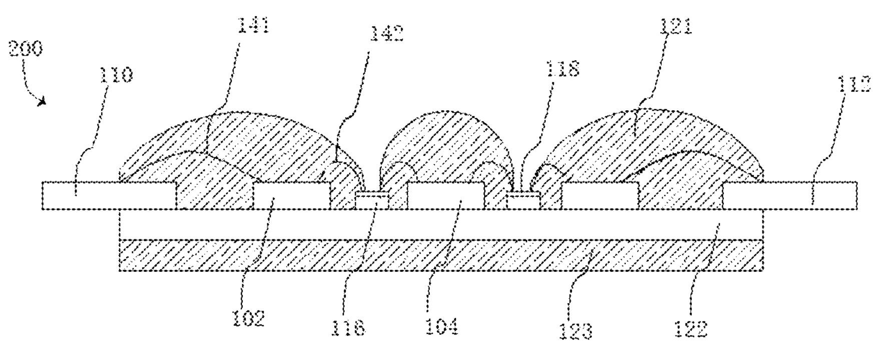
Figure 3D:
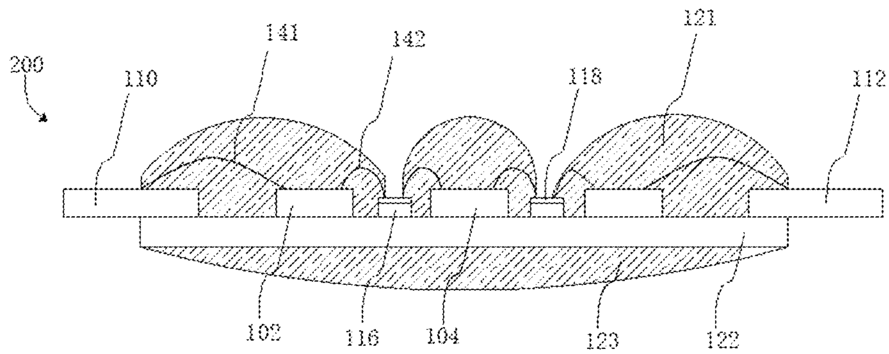

As shown in FIG. 3C, the difference from the aforementioned embodiment is that the lower surface of the base layer 122 is covered by a second light conversion layer 123 with a uniform thickness. The upper surface and the lower surface of the base layer 122 are opposite to each other. As shown in FIG. 3D, the second light conversion layer 123 covering the lower surface of the base layer 122 has an inclined side or an inclined side with an arc shape. The lower surface of the base layer 122 covering by the second light conversion layer 123, the LED filament therefore can generate fluorescence with more yellow light and less blue light. Therefore, the difference in color temperature between the front and back surfaces of the LED chip units 102 and 104 can be reduced. Thereby, the color temperature of emitting light from both sides of the LED chip units 102 and 104 is closer.

Figure 3E:
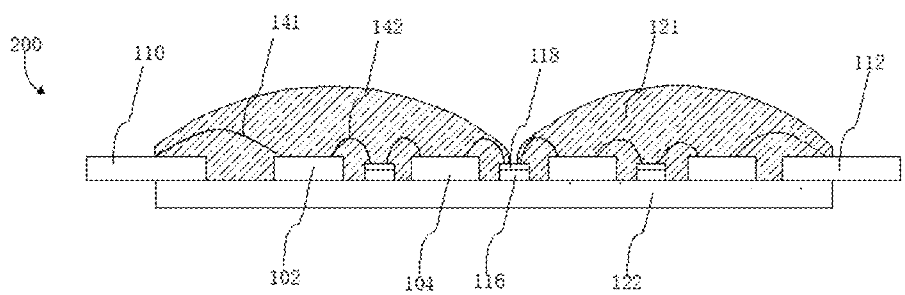

In one embodiment, as shown in FIG. 3E, the first light conversion layer 121 covers two adjacent LED chip units 102, 104, a copper foil 116 is located between two adjacent LED chip units 102, 104, and the first wire 141 and the second wire 142 connecting between the LED chip units 102 and 104. In one embodiment, a silver plating layer 118 is disposed on the upper surface of the copper foil 116, and a portion of the copper foil 116 located at the ends of the LED filament and extending beyond the base layer 122 can serve as the conductive electrodes 110, 112. The silver plating layer 118 not only has good electrical conductivity but also has the effect of increasing light reflection. The surface of the silver plating layer 118 can be selectively provided with a solder mask layer (not shown), and the thickness of the solder mask layer is 30~50 μm. The solder mask layer is obtained by an OSP (Organic Solderability Preservatives) process. The solder mask layer has functions of oxidation resistance, thermal shock resistance, and moisture resistance.

Figure 3F:
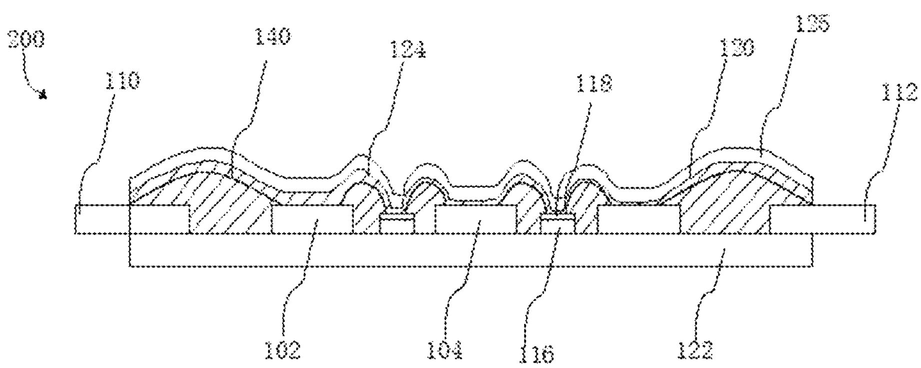

In another embodiment of the present invention, as shown in FIG. 3F, the LED filament 200 has LED chip units 102, 104, conductive electrodes 110, 112, wires 140, and a light conversion layer 120. The copper foil 116 is located between the adjacent two LED chip units 102, 104, the conductive electrodes 110, 112 are arranged corresponding to the LED chip units 102, 104, and the LED chip units 102, 104 and the copper foil 116, the LED chip units 102, 104 and the conductive electrodes 110, 112 are electrically connected by wire 140 respectively. The light conversion layer 120 is disposed on the LED chip units 102, 104 and at least two sides of conductive electrodes 110, 112. The light conversion layer 120 exposes a portion of each of the conductive electrodes 110, 112 of the LED filament, and the light conversion layer 120 includes a phosphor layer 124 and a silicon layer 125. The phosphor layer 124 directly contacts the surfaces of the LED chip unit 102, 104. In the phosphors spraying process, the phosphors may be sprayed on the surfaces of the LED chip unit 102, 104, the copper foil 116, the conductive electrodes 110, 112 and the wire 140 by electrostatic spraying to form the phosphor layer 124. Then, the vacuum coating method can be used to dispose a silicon layer 125 on the phosphor layer 124, wherein the silicon layer 125 does not contain phosphor. The thickness of the phosphor layer 124 and the silicon layer 125 are equal or unequal. The thickness of the phosphor layer 124 and silicon layer 125 respectively is about 30 to 70 micron (um) and 30 to 50 micron (um). In another embodiment, the surfaces of the LED chip units 102, 104, the copper foil 116, the conductive electrodes 110, 112, and the wires 140 may be covered with a transparent resin layer, and the transparent resin layer does not contain phosphors, and then covered by phosphors powder on the transparent resin layer. The thickness of the transparent resin layer and the phosphor layer are equal or unequal, and the thickness of the transparent resin layer is about 30 to 50 micron (um).

Figure 4A:
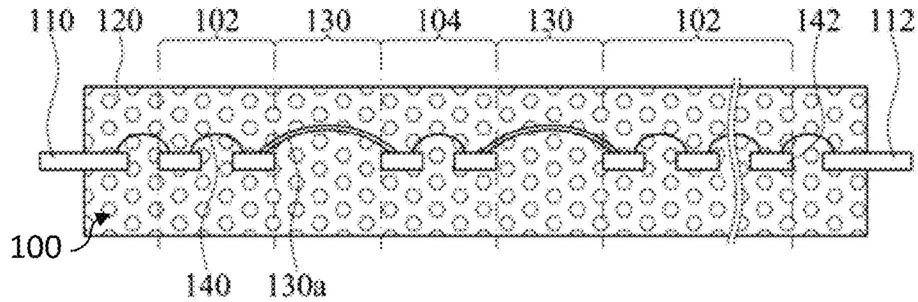
FIGS. 4A to 4F are cross sectional views of various LED filaments in accordance with the present invention.
Figure 4B:
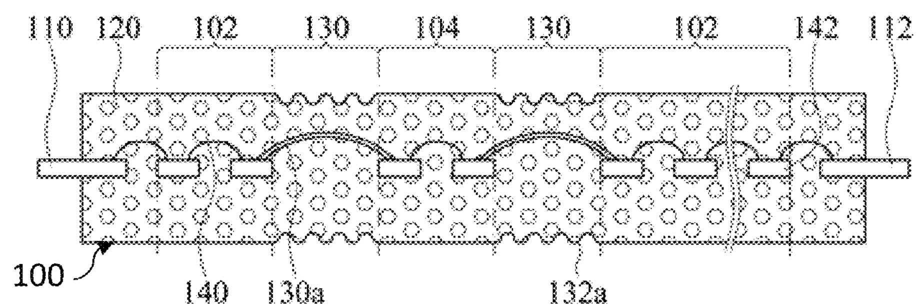
Figure 4C:
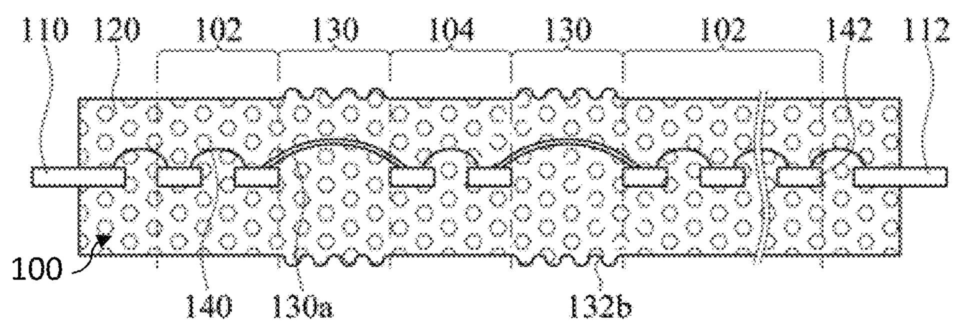
Figure 4D:
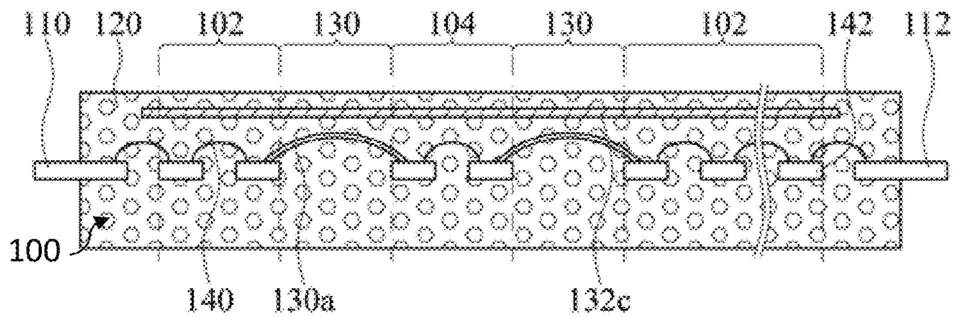
Figure 4E:
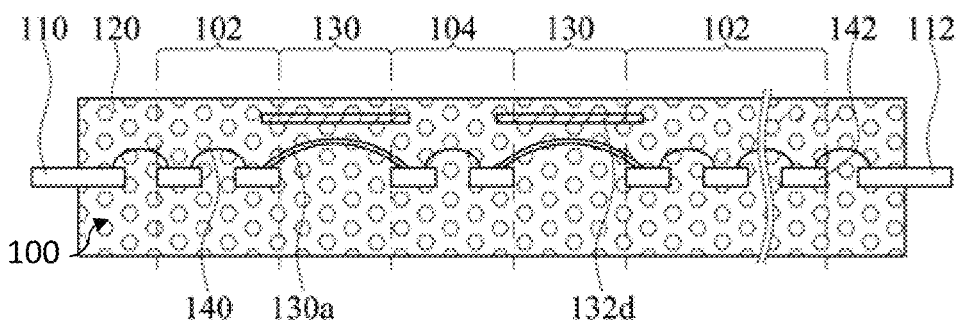
Figure 4F:
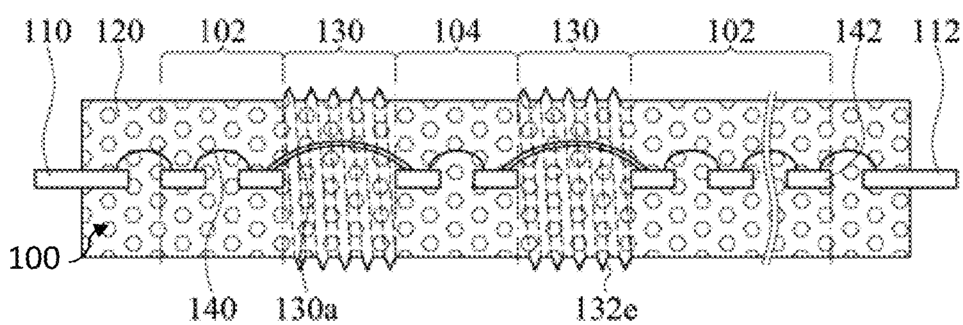
Figure 4G:
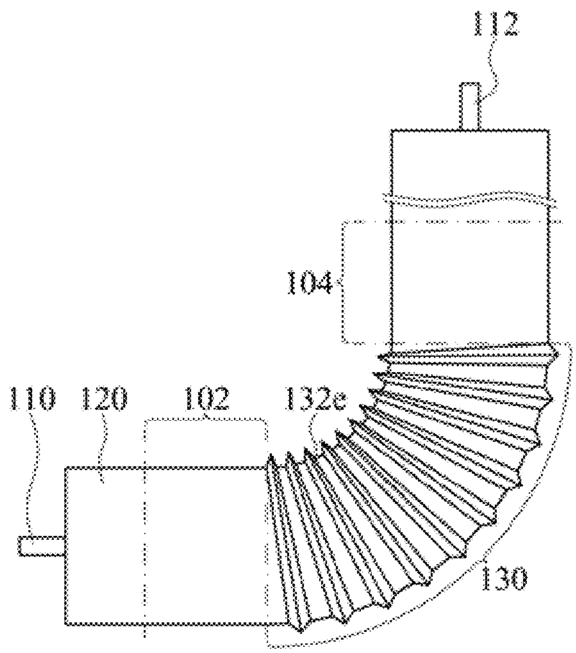
FIG. 4G is a schematic view showing the bent state of the LED filament of FIG. 4F in accordance with an embodiment of the present invention.

Referring to FIGS. 4A to 4K, FIGS. 4A to 4K are schematic views of various embodiments of an LED filament, and FIGS. 4A to 4E and FIGS. 4H to 4K are cross sectional views for different segments of the LED filament along the axial direction thereof. The FIG. 4G is a schematic view of the bent state of the LED filament of FIG. 4F. As shown in FIG. 4A to FIG. 4K, the LED filament can be divided into different segments in the axial direction of the LED filament, for example, the LED filament can be distinguished as an LED section 102, 104 (ie, the LED chip unit referred to foregoing embodiment) and the conductive section 130, but not limited thereto. The number of the LED section 102, 104 and the conductive section 130 in a single LED filament may be one or multiple. The LED section 102, 104 and conductive section 130 are disposed along the axial direction of the LED filament. Wherein, the LED section 102, 104 and the conductive section 130 may have different structure with specific function respectively to achieve different effects, as detailed below.

As shown in FIG. 4A, the LED filament 100 includes LED sections 102, 104, a conductive section 130, at least two conductive electrodes 110, 112, and a light conversion layer 120. The conductive section 130 is located between two LED sections 102, 104. The two conductive electrodes 110, 112 are disposed on the LED filament correspondingly and electrically connected to each of the LED sections 102, 104. The two LED sections 102 and 104 are electrically connected to each other through the conductive section 130. In the present embodiment, the conductive section 130 includes a conductor **130*a* connecting the LED sections 102 and 104, the length of the wire 140 being less than the length of the conductor 130*a*. The spacing between any two LED chips separately disposed in two different LED sections is greater than the spacing between any two adjacent LED chips in a single LED section. In addition, in accordance with other embodiments of the present invention, each of the LED sections 102, 104 includes at least two LED chips 142, and the LED chips 142 are electrically connected to each other through the wires 140**, but the present invention is not limited thereto.

The light conversion layer 120 covers the LED sections 102, 104, the conductive section 130 and the conductive electrodes 110,112, and a part of each of the two electrodes is exposed respectively. In the present embodiment, each of the six sides of the LED chip 142 of each of the LED sections 102, 104 is covered by the light conversion layer 120. Once the six sides of the LED chip 142 are covered by the first light conversion layer 120 and may be referred to as a light conversion layer 120 to wrap the LED chips 142, this kind of covering or wrapping can be considered, but not limited to, as direct contact. Preferably, in the present embodiment, each of the six sides of the LED chip 142 directly contacts the light conversion layer 120. However, in the implementation, the light conversion layer 120 may cover merely two of the six sides of each of the LED chip 142, that is, the light conversion layer 120 directly contacts the two sides such as a top and a bottom sides showing in the FIG. 4, but not limited thereto. Similarly, the light conversion layer 120 can directly contact the surfaces of the two conductive electrodes 110, 112. In various embodiments, the light conversion layer 120 may employ an encapsulation without the function of light converting. For example, the light conversion layer 120 of the conductive section 130 may be instead of a transparent encapsulation with excellent flexibility.

In some embodiments, the LED filaments 100 are disposed in the LED light bulb, and only a single LED filament is disposed in each LED light bulb to provide sufficient illumination. Moreover, for a single LED filament, in order to present the aesthetic appearance and also to achieve uniform and broad illumination, even to achieve omni-directional light, the LED filament in the LED light bulb can be bent with various curves. Since the LED filament bent with various curves accompanies diversified illumination, the light emitting direction and coverage of the LED filament can be adjusted according to the requirement of the LED light bulb. For the purpose of the LED filament easily bent to form various curved postures, and also the bending stresses of the LED filament to be considered, the conductive section 130 of the LED filament is designed preferably without the LED chip but only the conductor **130*a*. The conductor 130*a* (for example, a metal wire, metal coating, or conductive strip) is easier to bend compare with the LED chip, in other words, the conductive section 130 without any LED chips will be more easily to bend compare with the LED section 102, 104** having the LED chip.

As shown in FIG. 4B, in the present embodiment, the LED section 102, 104 and the conductive section 130 of the LED filament 100 have different structural features. In the embodiment, the conductive section 130 further includes a wavy recess structure **132*a* encirclingly disposed on the surface of the conductive section 130 and symmetrically to the axis of the LED filament 100. In the present embodiment, the wavy recess structure 132*a* is recessed in the surface of the conductive section 130. The plurality of wavy recess structures 132*a*** are arranged spaced apart along the axial direction and are parallel to each other to present a continuous wavy shape.

In the bending state of the LED filament 100, the conductive section 130 is sustained the most stresses. Therefore, the conductive section 130 is easier to bend and capable of enduring the extending and compressing stresses due to the wavy concave structure **132*a* of the conductive section 130. For example, the conductive section 130 may sustain both extending and compressing stresses on opposite surfaces of the conductive section 130 in the bending state, and the wavy concave structure 132*a* may improve the stress distribution of such extension and compression. The wavy concave structure 132*a* at the extension portion becomes looser and flatter, that is, the depth difference of recessions becomes smaller and the pitch of adjacent peaks or troughs becomes larger. The wavy concave structure 132***a* at the compression portion becomes closer and concave inwardly, that is, the depth difference of the concaves becomes larger and the pitch of adjacent peaks or troughs becomes smaller. Since the wavy concave structure 132*a* can provide a tolerance to endure the stresses of extension and compression and the spaces for the recessions compressed closer, the conductive section 130 is easier to be bent.

As shown in FIG. 4C, in the present embodiment, the LED sections 102, 104 and the conductive section 130 of the LED filament 100 have different structural features. In this embodiment, the conductive section 130 further includes a wavy convex structure 132*b* encirclingly disposed on the surface of the conductive section 130 and symmetrically to the axis of the LED filament 100. In the present embodiment, the wavy convex structure 132*b* protrudes from the surface of the conductive section 130. The plurality of wavy convex structures 132*b* are arranged spaced apart in the axial direction and are parallel to each other to exhibit a continuous wave shape.

In the bending state of the LED filament 100, the conductive section 130 is sustained the most stresses. Therefore, the conductive section 130 is easier to bend and capable of enduring the extending and compressing stresses due to the wavy convex structures 132*b* of the conductive section 130. For example, the conductive section 130 may sustain both extending and compressing stresses on opposed surfaces of the conductive section 130 in the bending state, and the wavy convex structure 132*b* may improve the stress distribution of such extension and compression. The wavy convex structures 132*b* at the extension portion becomes looser and flatter, that is, the height difference of protrusions becomes smaller and the pitch of adjacent peaks or troughs becomes larger. The wavy convex structure 132*b* at the compression portion becomes closer and concave inwardly, that is, the height difference of the protrusions becomes larger and the pitch of adjacent peaks or troughs becomes smaller. Since the wavy convex structure 132*b* can provide a tolerance to endure the stresses of extension and compression and the spaces for the protrusions compressed closer, the conductive section 130 is easier to be bent.

As shown in FIG. 4D, in the present embodiment, both the LED sections 102, 104 and the conductive section 130 of the LED filament 100 have similar contour, and the LED filament further includes an auxiliary strip 132*c*. The auxiliary strip 132*c* is disposed in the LED filament 100 and covered by the light conversion layer 120. The auxiliary strip 132*c* are arranged to cross the LED sections 102, 104 and the conductive section 130 of the LED filament and extending along the axial direction of the LED filament.

When the LED filament is bent, the LED sections 102, 104 have a smaller degree of curvature because of the LED chip 142 inside, in contrast, the conductive section 130 have a larger degree of curvature. In the case of the LED filament enduring serious bending, the degree of curvature between the LED sections 102, 104 and the conductive section 130 are very different. Since the stress will be concentrated in a place where the curve changes greatly, the light conversion layer 120 between the LED sections 102, 104 and the conductive section 130 of the LED filament will encounter a high possibility of cracking or even breakage. The auxiliary strip 132*c* has a function of absorbing the stresses and breaking up the stress concentrated in the light conversion layer 120, thereby, the auxiliary strip 132*c* disposed in the LED filament reduces the possibility of cracking or even breakage of the light conversion layer 120 between the LED sections 102, 104 and the conductive section 130. By the arrangement of the auxiliary strip 132*c*, the bending endurance of the LED filament is improved. In the present embodiment, the number of the auxiliary strip 132*c* is one, in other embodiments, the auxiliary strip 132*c* may be plural and disposed at different positions of the LED filament in the radial direction.

As shown in FIG. 4E, in the present embodiment, the LED sections 102, 104 of the LED filament 100 and the conductive section 130 are identical in appearance contour, and the LED filament further includes a plurality of auxiliary strips 132*d*. The plurality of auxiliary strips 132*d* are disposed in the LED filament 100 and covered by the light conversion layer 120. The plurality of auxiliary strips 132*d* are arranged along the axial direction of the LED filament and present a segmented arrangement. Each of the auxiliary strips 132*d* is disposed in a region corresponding to each of the conductive sections 130, and each of the auxiliary strips 132*d* extends through the corresponding conductive section 130 and extends toward to adjacent LED sections 102, 104 along the axial direction of the LED filament. In the present embodiment, the auxiliary strip 132*d* does not throughout the region corresponding to the LED sections 102, 104.

When the LED filament 100 is bent, the degree of curvature between the LED sections 102, 104 and the conductive section 130 are very different. The plurality of auxiliary strips 132*d* can absorb the stress caused by bending between the LED sections 102, 104 and the conductive section 130, and also reduce the stress concentration on the light conversion layer 120 between the LED sections 102, 104 and the conductive section 130. Therefore, the auxiliary strips 132*d* disposed in the LED filament reduces the possibility of cracking or even breakage of the light conversion layer 120 on the LED sections 102, 104 and the conductive section 130. By the arrangement of the auxiliary strip 132*d*, the bending endurance of the LED filament is increased, thereby improving the quality of the product. In the present embodiment, the plurality of auxiliary strips 132*d* extend in the axial direction of the LED filaments and are aligned with each other in a specific radial direction. In other embodiments, the plurality of auxiliary strips 132*d* may also extend along the axial direction of the LED filaments but not aligned with each other in a particular radial direction, and may be dispersed at different positions in the radial direction.

As shown in FIG. 4F, in the present embodiment, the LED sections 102, 104 and the conductive section 130 of the LED filament 100 have different structure features. In the present embodiment, the conductive section 130 further includes a spiral structure 132*e* encirclingly disposed on the surface of the conductive section 130 and extending along the axial direction of the LED filament 100. In the present embodiment, the spiral structure 132*e* is a spiral structure protruding from the surface of the conductive section 130, and the spiral structure 132*e* is extending along the axial direction of the LED filament from one end of the conductive section 130 (for example, adjacent to one end of the LED section 102) to the other end of the conductive section 130 (for example, adjacent to one end of another LED section 104). As shown in FIG. 4F, the portion of the spiral structure 132*e* located behind the conductive section 130 is represented by a dotted line in the drawing. Overall contour appearance, the spiral structure 132*e* showing a slanted arrangement relative to the axial direction of the LED filament. In other embodiments, the spiral structure 132*e* may also be a spiral-like structure that is conversely recessed into the surface of the conductive section 130. In other embodiments of the present invention, considering the mass productivity of the overall fabrication process of the LED filament 100, both the LED sections 102, 104 and the conductive section 130 of the LED filament 100 may have the same spiral structure 132*e* on the surfaces.

The FIG. 4G is a schematic view showing the bent state of the LED filament of FIG. 4F in accordance with an embodiment of the present invention. As shown in FIG. 4G, in the bending state of the LED filament 100, since the conductive section 130 serves as a mainly bending region and thereby it is sustained with the most stresses. The conductive section 130 is easier to bend and capable of enduring the extending and compressing stresses due to the spiral structures 132*e* of the conductive section 130. For example, as shown in FIG. 4G, the conductive section 130 may sustain both extending and compressing stresses on opposed surfaces of the conductive section 130 in the bending region, and the spiral structure 132*e* may improve the stress distribution of such extension and compression. The spiral structure 132*e* at the extension portion becomes looser and flatter, that is, the height difference of protrusions becomes smaller and the pitch of adjacent peaks or troughs becomes larger. In contrast, the spiral structure 132*e* at the compression portion becomes closer and concave inwardly, that is, the height difference of the protrusions becomes larger and the pitch of adjacent peaks or troughs becomes smaller. Since the spiral structure 132*e* can provide a tolerance to endure the stresses of extension and compression and the spaces for the protrusions compressed closer, the conductive section 130 is easier to be bent.

Figure 4H:
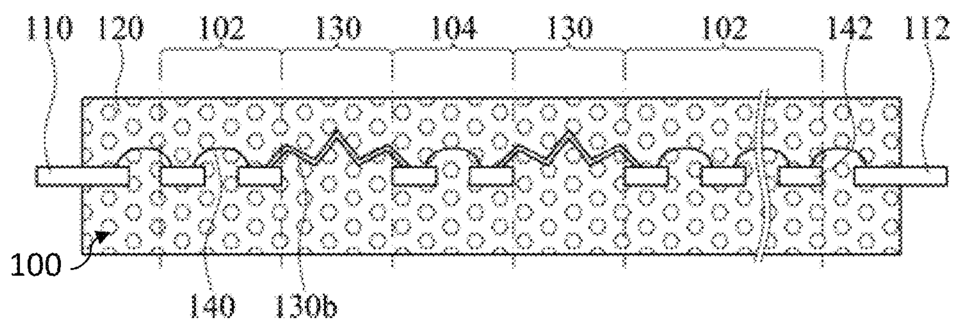
FIGS. 4H to 4K are cross sectional views of various LED filaments in accordance with the present invention.
Figure 4I:
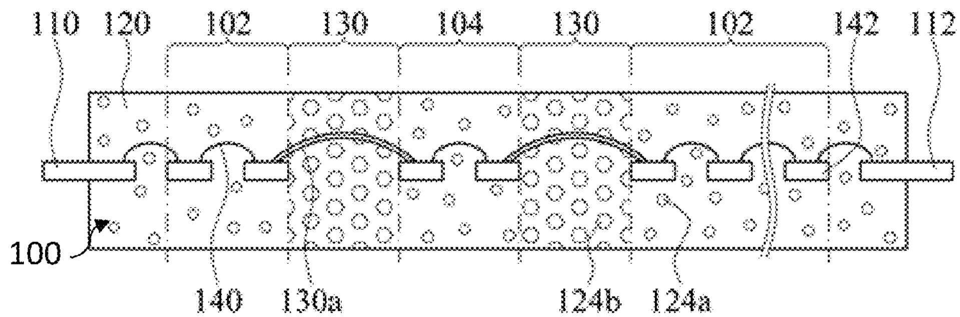

As shown in FIG. 4H, in the present embodiment, the LED filament 100 is substantially identical to the LED filament of FIG. 4A, the difference is that the structure of the conductor 130*b* of the conductive section 130 in the LED filament 100 of FIG. 4H is in the form of wavy shaped. When the LED filament is bent, the conductive section 130 serves as a mainly bending region, and the conductor 130*b* located inside the conductive section 130 is also bent along with the bending of the conductive section 130. Due to the wavy shaped structure of the conductor 130*b*, the conductor 130*b* has better ductility to extend or compress during the conductive section 130 in a bending state, so that the conductor 130*b* is susceptible to stress of pulling and is not easily broken. Accordingly, the connection relationship between the conductor 130*b* and the connected LED chip 142 will be more stable, and the durability of the conductor 130*b* is also improved.

As shown in FIG. 41, in the present embodiment, the light conversion layer 120 disposing on the LED filament are embedded with different particles distributed therein corresponding to the positions of the LED sections 102, 104 and the conductive section 130 respectively. Moreover, the light conversion layer 120 disposing on corresponding regions of the LED sections 102, 104 and the conductive section 130 may have different structures, different materials, different effects, or different distribution densities. Because of the functions of the LED sections 102, 104 and the conductive section 130 are different, and thus the light conversion layer 120 disposed thereon may be respectively provided with different types of particles to achieve different effects. For example, the light conversion layer 120 corresponding to the LED sections 102, 104 may include phosphor particles 124*a*, while the light conversion layer 120 corresponding to the conductive section 130 includes the light conducting particles 124*b*. The phosphor particles 124*a* can absorb the light emitted by the LED chip 142 and convert the light wavelength to reduce or increase the color temperature, and the phosphor particles 124*a* also affect the light diffusion. Therefore, the phosphor particles 124*a* embedded in the light conversion layer 120 corresponding to the LED sections 102, 104 change the color temperature of the light and also make the light dispersion more uniform. The conductive section 130 docs not have an LED chip, and the conductive section 130 has a large value of curvature in a state of bending the LED filament. Besides, the light conducting particles 124*b* has functions of enhancing the light diffusion and light transmission. Therefore, the light conducting particles 124*b* are embedded in the light conversion layer 120 corresponding to the conductive section 130 and used to direct the light from the adjacent LED sections 102, 104 into the conductive section 130 and further disperse evenly throughout the conductive section 130.

The light conducting particles 124*b* are, for example, particles of different sizes made of polymethyl methacrylate (PMMA) or a resin, but not limited thereto. In some embodiments, the particles embedded in the conductive section 130 may also have highly elasto-plastic deformation properties, such as particles made of plastic, thereby improving the bendability of the conductive section 130 and enhancing the capability of self-sustained of the LED filament 100 in a state of bending.

Figure 4J:
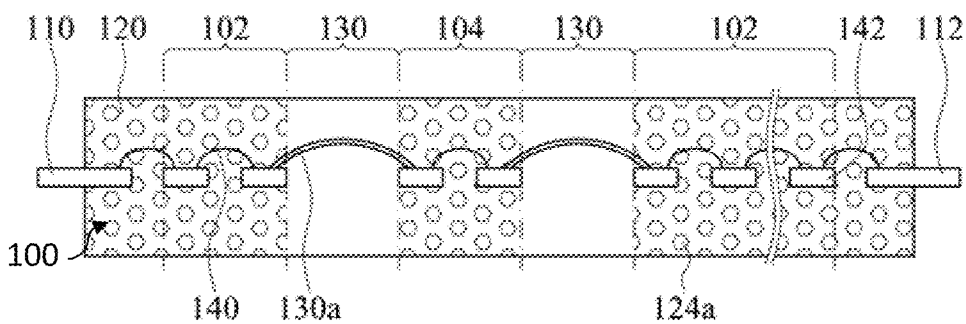

As shown in FIG. 4J, in the present embodiment, the light conversion layer 120 corresponding to the LED sections 102, 104 of the LED filament 100 includes light diffusing particles, such as phosphor particles 124*a*, while the light conversion layer 120 corresponding to the conductive section 130 does not include the light diffusing particles. In the present embodiment, the light conversion layer 120 disposing on the LED sections 102, 104 and the conductive section 130 is made of, for example, a silicon gel, and no functional particles in the light conversion layer 120 corresponding to the conductive section 130. In this way, it can improve the bendability of the conductive section 130.

In some embodiments, the material of the light conversion layer 120 disposed on the conductive section 130 may be different from the material of the light conversion layer 120 disposed on the LED sections 102, 104. For example, the light conversion layer 120 corresponding to the LED sections 102, 104 is made of silicone, and the light conversion layer 120 corresponding to the conductive section 130 is made of a light conducting material, for example, the light conversion layer 120 corresponding to the conductive section 130 may be made of PMMA, resin, or a combination thereof, but the present invention is not limited thereto. Since the material of the light conversion layer 120 disposing on the conductive section 130 is different from the material of the light conversion layer 120 disposing on the LED sections 102, 104, the conductive section 130 and the LED sections 102, 104 may have different properties, for example, the conductive section 130 and the LED sections 102, 104 may have different elastic coefficient. Therefore, the LED sections 102, 104 has more support to protect the LED chips 142 and the conductive sections 130 has better bendability, and subsequently the LED filaments 100 can be bent to present a diverse curve.

Figure 4K:
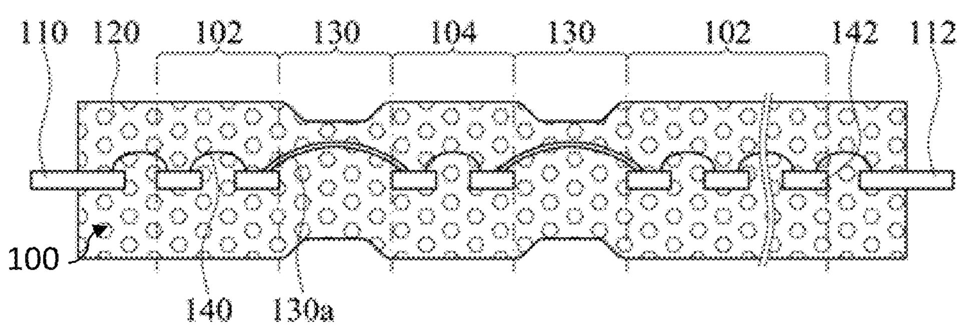

As shown in FIG. 4K, in the present embodiment, the LED sections 102, 104 and the conductive section 130 of the LED filament 100 have different contour features. In the present embodiment, the LED sections 102, 104 and the conductive section 130 have different widths, thicknesses or diameters in the radial direction of the LED filament 100. In other words, the minimum distance between the opposite surfaces of the LED sections 102, 104 (that is, an outer diameter of the LED sections 102, 104) is greater than the maximum distance between the opposite surfaces of the conductive section 130 (that is, an outer diameter of the conductive section 130). As shown in FIG. 4K, the outer diameter of the conductive section 130 is shorter than the outer diameter of the LED sections 102, 104. When the LED filament 100 is bent, the conductive section 130 serves as a mainly bending region, and the thinner conductive section 130 is easier to bend with a variety of curves.

In this embodiment, the outer surface of the conductive section 130 is formed with a smooth transition curve between adjacent LED sections 102, 104, and the outer diameter of the conductive section 130 is gradually thinner from an end adjacent to the LED sections 102, 104 toward to the middle of the conductive section 130. That is, the junction of the conductive section 130 and the LED sections 102, 104 is provided with a smooth curve, therefore the LED filament in a state of bending, the stress can be dispersed and the stress does not concentrate at the junction between the conductive section 130 and the LED section 102, 104. Therefore the possibility of cracking or even rupture at the light conversion layer 120 can be reduced. In other embodiments, the outer diameter of the conductive section 130 may also be greater than the outer diameter of the LED sections 102, 104, and the light conversion layer 120 disposing on the LED sections 102, 104 and the light conversion layer 120 disposing on the conductive section 130 may be made of different materials. For example, for the LED sections 102, 104, the light conversion layer 120 is made of harder and supportive materials, and for the conductive section 130 the light conversion layer 120 is made of a flexible transparent encapsulation, such as PMMA, resin or other single material or composite material.

The various embodiments shown in FIGS. 4A to 4K may be implemented separately or in combination. For example, the LED filament 100 shown in FIG. 4B can be used in combination with the LED filament 100 shown in FIG. 4D, that is, the conductive section 130 of the LED filament 100 has a wavy concave structure 132*a*, and also embedded with auxiliary strip 132*c* inside the LED filament 100 to enhance the bendability and the capability of self-sustained of the LED filament. Alternatively, the LED filament shown in FIG. 4I can be used in combination with the LED filament shown in FIG. 4G, that is, the particles distributed in the light conversion layer 120 corresponding to the LED sections 102, 104 have different sizes, different materials and/or different densities from the particles distributed in the light conversion layer 120 corresponding to the conductive section 130. Moreover, the conductive section 130 further includes a spiral structure 132*e*, so that not only the bendability but also the lighting uniformity of the LED filament is enhanced. Thereby the illumination of the omni-directional light is enhanced.

According to the structure of the LED filament 100 described above, as shown in FIG. 5, an LED filament 200 comprises a plurality of LED sections 202, 204, a plurality of conductive sections 230, at least two conductive electrodes 210, 212 and a light conversion layer 220. The conductive section 230 is located between two adjacent LED sections 202, 204. The two conductive electrodes 210, 212 are disposed on the LED filament 200 correspondingly and electrically connected to each of the LED sections 202, 204. The adjacent two LED sections 202, 204 are electrically connected to each other through the conductive section 230. Each of the LED sections 202, 204 includes at least two LED chips that are electrically connected to each other. The light conversion layer 220 covers the LED sections 202, 204, the conductive sections 230 and the conductive electrodes 210, 212, and a part of each of the two electrodes 210, 212 is exposed respectively. The LED filament 200 further includes a plurality of circuit films 240 (also referred to as light-transmitting circuit films). The LED chips 202 and 204 and the conductive electrodes 210 and 212 are electrically connected to each other through the circuit film 240, and the light conversion layer 220 covers the circuit film 240. The length of the circuit film 240 is less than the length of the conductor 230*a*, or the shortest distance between two LED chips respectively located in two adjacent LED sections 202, 204 is greater than the distance between two adjacent LED chips in the LED section 202/204.

Figure 6A:
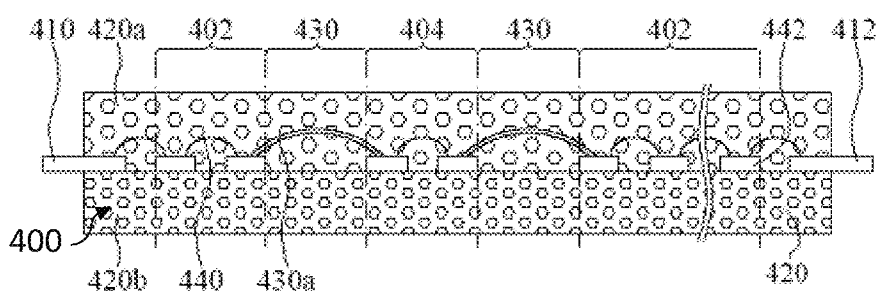
FIG. 6A is a cross sectional view of an LED filament in accordance with an embodiment of the present invention.

Referring to FIGS. 6A to 6G, FIG. 6A is a schematic structural view of another embodiment of an LED filament of the present invention. One of the differences between the LED filament 400 shown in the FIGS. 6A to 6G and the LED filament 100 shown in the FIGS. 4A to 4K is the light conversion layer 420 of the LED filament 400 shown in the FIGS. 6A through 6G further providing with a two-layer structure. In some embodiments, each of the structural features of the LED filament 100 shown in FIGS. 4C to 4K can also be employed in the LED filament 400 shown in FIG. 6A or FIG. 6B. As shown in FIG. 6A, the LED filament 400 has a light conversion layer 420, LED sections 402, 404, conductive electrodes 410, 412, and a conductive section 430 for electrically connecting adjacent two LED sections 402, 404. Each of the LED sections 402, 404 includes at least two LED chips 442 that are electrically connected to each other by the wires 440. In the present embodiment, the conductive section 430 includes at least one conductor 430*a* that connects the adjacent LED sections 402, 404, wherein the shortest distance between the two LED chips 442 respectively located in the two adjacent LED sections 402, 404 is greater than the distance between two adjacent LED chips 442 within the one LED section 402/404. Therefore, it is ensured that when the two LED sections 402, 404 are bent, the conductive section 430 is not easily broken due to the stress of bending. The length of the wire 440 is less than the length of the conductor 430*a*. The light conversion layer 420 is coated on at least two sides of the LED chip 442 and conductive electrodes 410, 412, and a portion of each of the conductive electrodes 410, 412 is not coated with the light conversion layer 420. The light conversion layer 420 may have at least one top layer 420*a* (or upper layer) and one base layer 420*b* (or lower layer). In the present embodiment, the top layer 420*a* and the base layer 420*b* are disposed on the opposing surface of the LED chip 442 and conductive electrodes 410, 412, and a portion of each of the conductive electrodes 410, 412 is excluded. It should be particularly noted that the thickness, diameter or width of the top layer 420*a* in the LED sections 402, 404 or the conductive section 430 described pertaining to FIGS. 6A-6M refers to the radial direction of the LED filament. The thickness of the top layer 420*a* is the distance between its outer surface to the interface of the top layer 420*a* and the base layer 420*b*, or the distance from its outer surface and the interface of the LED chip 442 or the conductor 430*a* and the base layer 420*b*, wherein the outer surface of the top layer 420*a* is a surface away from the base layer.

In the present embodiment, the top layer 420*a* and the base layer 420*b* may be composed of different particles or particle densities according to the requirements or designed structures. For example, in the case where the main emitting surface of the LED chip 442 is toward to the top layer 420*a* but not the base layer 420*b*, the base layer 420*b* may be composed of light scattering particles to increase the light dispersion. Thereby the brightness of the base layer 420*b* can be maximized, or even the brightness that can be produced close to the top layer 420*a*. In addition, the base layer 420*b* may also be composed of phosphor particles with high density to increase the hardness of the base layer 420*b*. In the manufacturing process of the LED filament 400, the base layer 420*b* may be prepared first, and then the LED chip 442, the wire 440 and the conductor 430*a* are disposed on the base layer 420*b*. Since the base layer 420*b* has a hardness that can support the subsequent manufacturing process of the LED chips and the wires, therefore the yield and the firmness of the LED chips 442, the wires 440, and the conductors 430*a* disposed on the base layer 420*b* can be improved and resulted in less or even no sink or skew. Finally, the top layer 420*a* is overlaid on the base layer 420*b*, the LED chip 442, the wires 440, and the conductor 430*a*.

Figure 6B:
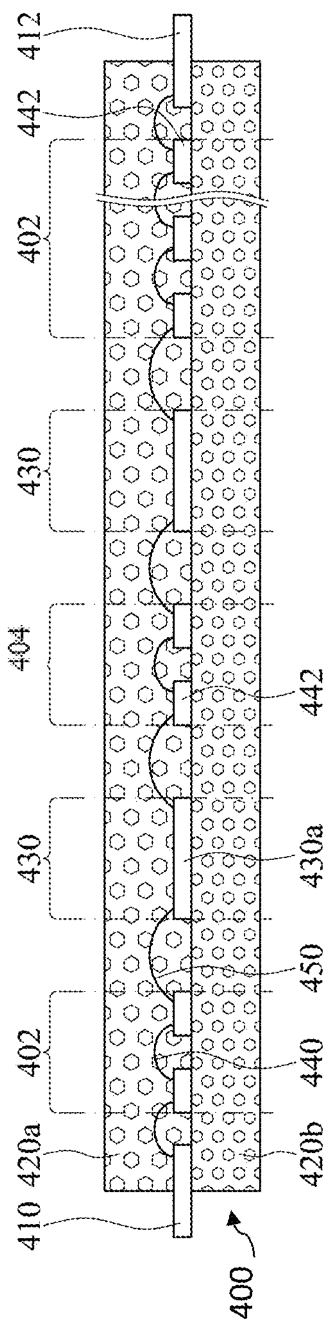
FIGS. 6B to 6J are cross sectional views of various LED filaments in accordance with the present invention.

As shown in FIG. 6B, in the present embodiment, the conductive section 430 is also located between the two adjacent LED sections 402, 404, and the plurality of LED chips 442 in the LED sections 402, 404 are electrically connected to each other through the wires 440. However, the conductor 430*a* in the conductive section 430 in FIG. 6B is not in the form of a wire but in a sheet or film form. In some embodiments, the conductor 430*a* can be a copper foil, a gold foil, or other materials that can conduct electrical conduction. In the present embodiment, the conductor 430*a* is attached to the surface of the base layer 420*b* and contact with the top layer 420*a*, that is, located between the base layer 420*b* and the top layer 420*a*. Moreover, the conductive section 430 and the LED sections 402, 404 are electrically connected by wires 450, that is, the two closest LED chips 442 respectively located in the adjacent two LED sections 402, 404 are electrically connected by the wires 450 and the conductors 430*a* of the conductive section 430. Wherein, the length of the conductive section 430 is greater than the distance between two adjacent LED chips of one LED sections 402, 404, and the length of the wire 440 in the LED sections 402, 404 is less than the length of the conductor 430*a*. This design ensures that the conductive section 430 has good bendability. Assuming that the maximum thickness of the LED chip in the radial direction of the filament is H, the thickness of the conductive electrode and the conductor 430*a* in the radial direction of the filament is around 0.5H to 1.4H, preferably around 0.5H to 0.7H. This ensures the wire bonding process can be carried out while ensures the quality of the LED filament and the precision of the wire bonding process, thereby the LED filament has good strength and the stability of the product is improved.

Figure 6C:
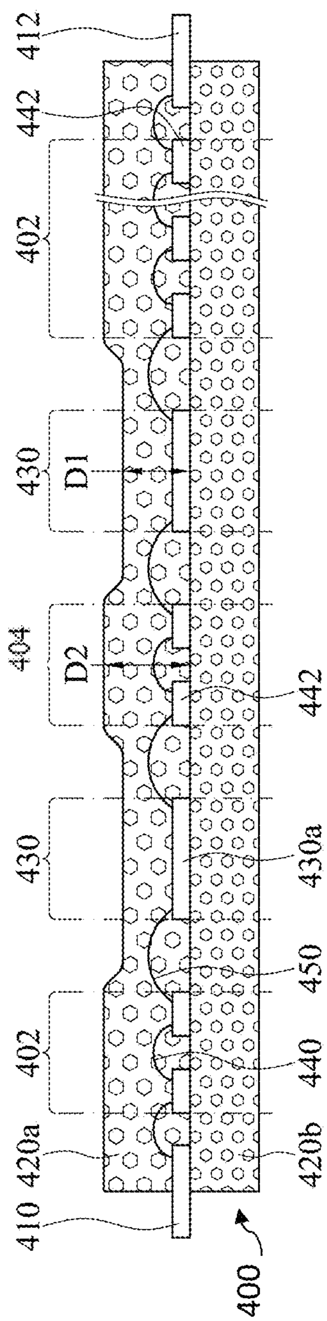

As shown in FIG. 6C, in the present embodiment, the LED sections 402, 404 and the conductive section 430 of the LED filament have different structural features. In the present embodiment, the LED sections 402, 404 and the conductive section 430 have different widths, thicknesses, or diameters in the radial direction of the LED filaments. As shown in FIG. 6C, the conductive section 430 is relatively thinner compared to the LED sections 402, 404, therefore it is helpful to the LED filament curling to various curves. In the present embodiment, the base layer 420*b* is substantially uniform in width, thickness or diameter in the radial direction of the LED filament, whether in the LED sections 402, 404 or in the conductive section 430. And, the top layer 420*a* has different widths, thicknesses or diameters in the radial direction of the LED filaments for the LED section 402, 404 and the conductive section 430. As shown in FIG. 6C, the top layer 420*a* of the LED sections 402, 404 has a maximum diameter D2 in the radial direction of the LED filament, while the top layer 420*a* of the conductive section 430 has the largest diameter D1 in the radial direction of the LED filament, D2 will be greater than D1. The diameter of the top layer 420*a* is gradually reduced from the LED sections 402, 404 toward to the conductive section 430, and is gradually increased from the conductive section 430 toward to adjacent LED sections 402, 404, so that the top layer 420*a* is conformally covered the LED filament and forms a smooth concave-convex curve along the axial direction of the LED filament.

Figure 6D:
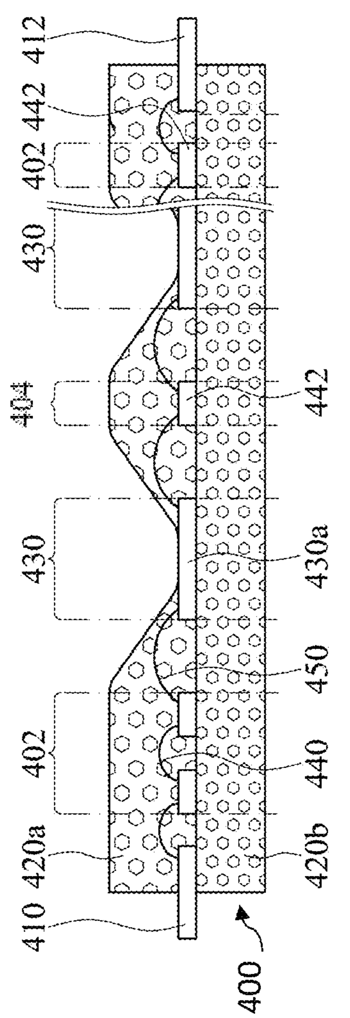

As shown in FIG. 6D, in the present embodiment, the top layer 420*a* of the LED sections 402, 404 has the largest diameter (or maximum thickness) in the radial direction of the LED filament and the diameter of the top layer 420*a* is gradually reduced from the LED sections 402, 404 to the conductive section 430, and a portion of the conductor 430*a* (for example, the intermediate portion) is not covered by the top layer 420*a*. The base layer 420*b*, whether in the LED sections 402, 404 or in the conductive section 430, has substantially the same width, thickness or diameter in the radial direction of the LED filament. In the present embodiment, the number of LED chips 442 in each of the LED sections 402, 404 may be different. For example, some LED sections 402, 404 have only one LED chip 442, and some LED sections 402, 404 have two or more LED chips 442. In addition to the number of the LED chip 442 designing in each LED section 402, 402 is different, the types of the LED chip 442 may also be different. It is acceptable as well that the number of the LED chip 442 designing in each LED section 402, 402 is consistent, and the types of the LED chip 442 is different.

Figure 6E:
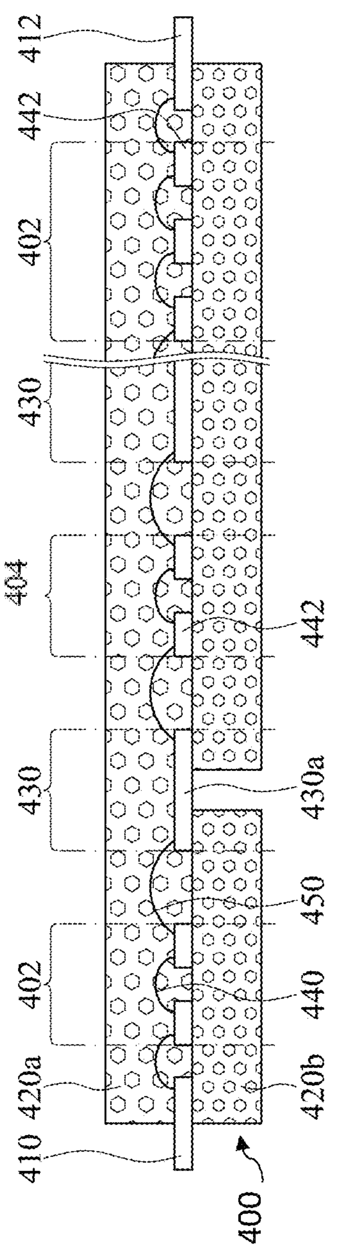

As shown in FIG. 6E, in the present embodiment, the top layer 420*a* is substantially uniform in width, thickness or diameter in the radial direction of the LED filament, whether in the LED sections 402, 404 or in the conductive section 430. A portion of the base layer 420*b* has been recessed or hollowed out corresponding to a portion of at least one conductor 430*a*, for example, the intermediate portion of the at least one conductor 430*a* is not covered by the base layer 420*b*, and at least one of the other conductors 430*a* is completely covered by the base layer 420*b*.

Figure 6F:
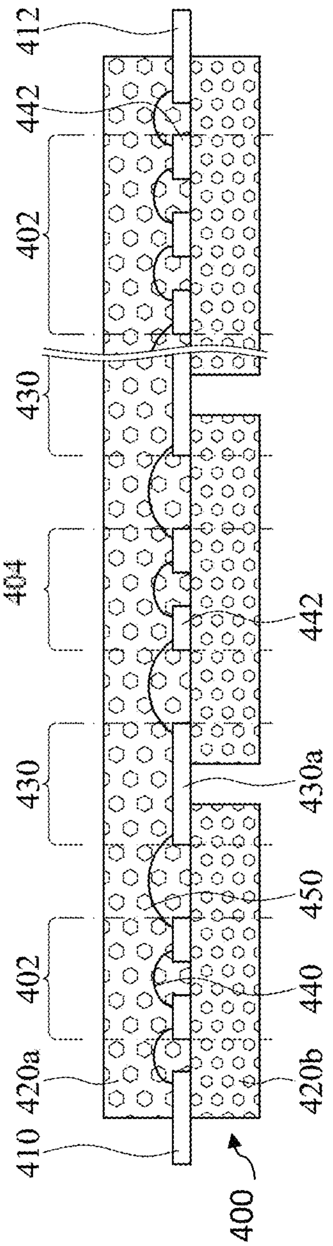

As shown in FIG. 6F, in the present embodiment, the top layer 420*a* is substantially uniform in width, thickness or diameter in the radial direction of the LED filament, whether in the LED sections 402, 404 or in the conductive section 430. A portion of the base layer 420*b* has been recessed or hollowed out corresponding to a portion of each conductor 430*a*, for example, the intermediate portion of the conductor 430*a* is not covered by the base layer 420*b*.

Figure 6G:
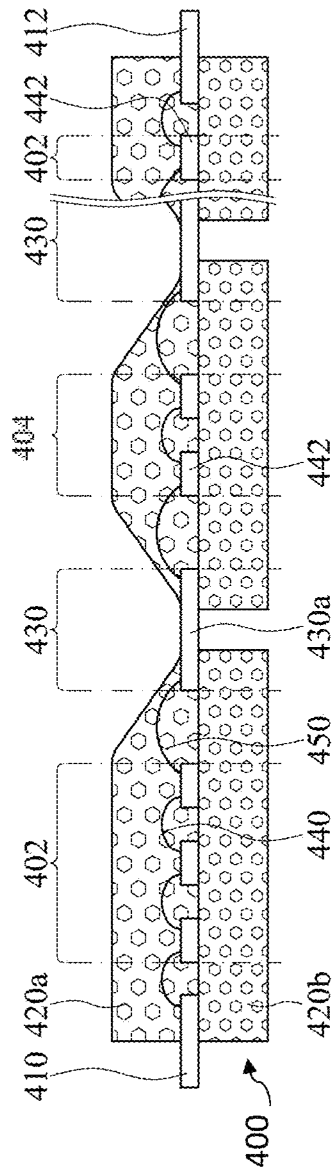

As shown in FIG. 6G, in the present embodiment, the top layer 420*a* of the LED sections 402, 404 has the largest diameter in the radial direction of the LED filament, and the diameter of the top layer 420*a* is gradually decreased from the LED sections 402, 404 to the conductive section 430. Moreover, a portion of the conductor 430*a* (for example, the middle portion) is not covered by the top layer 420*a*, and a portion of the base layer 420*b* is recessed or hollowed out such that a portion of the conductor 430*a* (for example, the intermediate portion) is not covered by the base layer 420*b*. In other words, at least a portion of the conductor 430*a* at the opposite sides thereof are not covered by the top layer 420*a* and the base layer 420*b*, respectively.

As described above with respect to the embodiments of FIGS. 6E to 6G, when the base layer 420*b* has a recession region or hollow region corresponding to a part of or all of the conductive sections 430, and the recession region or the hollow region may be in the form of a slit or a groove. Therefore, the conductor 430*a* is not completely exposed and the conductive section 430 can be provided with better bendability.

Figure 6H:
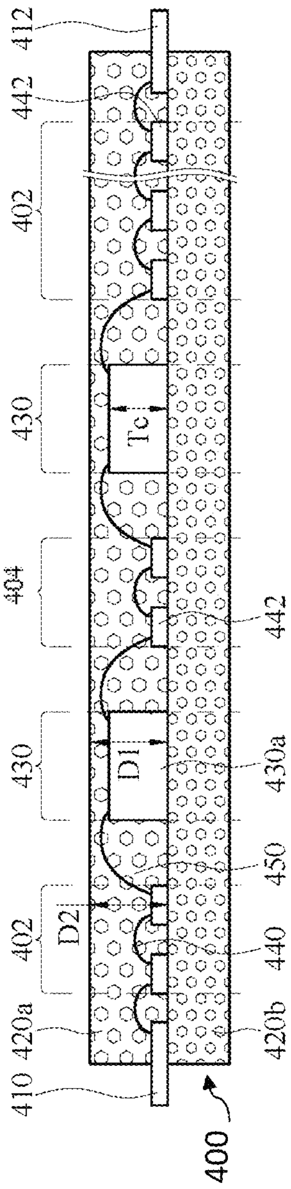

As shown in FIG. 6H, in the present embodiment, the conductor 430*a* is, for example, a conductive metal sheet or a metal strip. The conductor 430*a* has a thickness Tc, and since the thickness of the LED chip 442 is thinner than the conductor 430*a*, the thickness Tc of the conductor 430*a* is significantly greater than the thickness of the LED chip 442. In addition, with respect to the thickness of the LED chip 442, the thickness Tc of the conductor 430*a* is closer to the thickness of the top layer 420*a* at the conductive section 430, for example, Tc=(0.7~0.9)×D1, preferably Tc=(0.7~0.8)×D1. In the meanwhile, the thickness of the top layer 420*a* in the conductive section 430 can refer to the diameter D1 in the radial direction of the aforementioned top layer 420*a*. Furthermore, in the present embodiment, the thickness of the top layer 420*a* disposed on the LED sections 402, 404 and on the conductive section 430 is substantially consistent with the same. In the meanwhile, the thickness of the top layer 420*a* in the LED sections 402, 404 can be referred to the diameter D2 in the radial direction of the aforementioned top layer 420*a*.

Figure 6I:
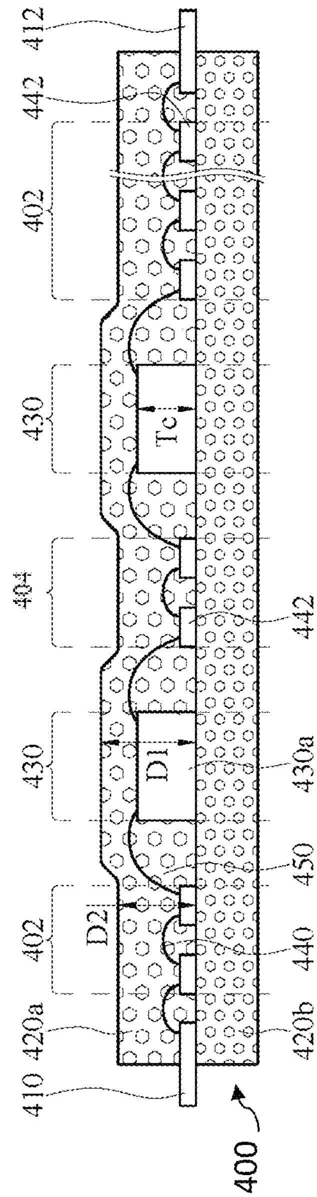

As shown in FIG. 6I, in the present embodiment, the thickness Tc of the conductor 430*a* is also significantly greater than the thickness of the LED chip 442, and the thickness Tc of the conductor 430*a* is closer to the thickness of the top layer 420*a* on the conductive section 430 (diameter D1). Also, in the present embodiment, the thickness of the top layer 420*a* in the conductive section 430 and that in the LED sections 402, 404 are inconsistent. As shown in FIG. 6I, the top layer 420*a* of the LED sections 402, 404 has a minimum diameter D2 in the radial direction of the LED filament, while the top layer 420*a* of the conductive section 430 has the largest diameter D1 in the radial direction of the LED filament, D1 will be greater than D2. The diameter of the top layer 420*a* is gradually increased from the LED sections 402, 404 to the conductive section 430, and is gradually reduced from the conductive section 430 to the LED sections 402, 404, so that the top layer 420*a* forms a smooth concave-convex curve along the axial direction of the LED filament.

Figure 6J:
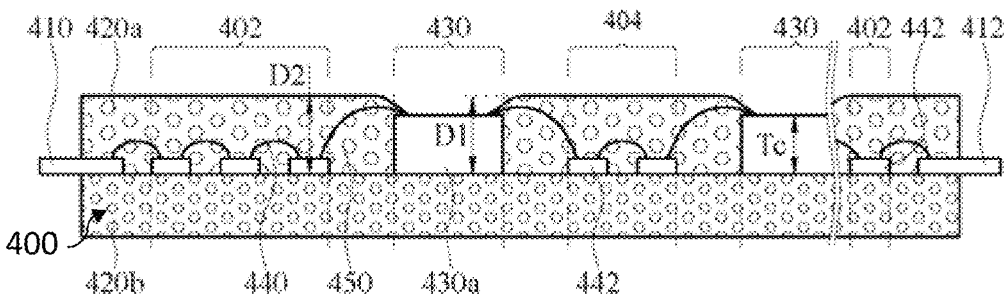

As shown in FIG. 6J, in the present embodiment, the thickness Tc of the conductor 430*a* is also significantly greater than the thickness of the LED chip 442, however, the top layer 420*a* of the LED sections 402, 404 has the largest diameter in the radial direction of the LED filament. The diameter of the top layer 420*a* is gradually reduced from the LED sections 402, 404 to the conductive section 430, and a portion of the conductor 430*a*, for example the intermediate portion, is not covered by the top layer 420*a*.

Figure 6K:
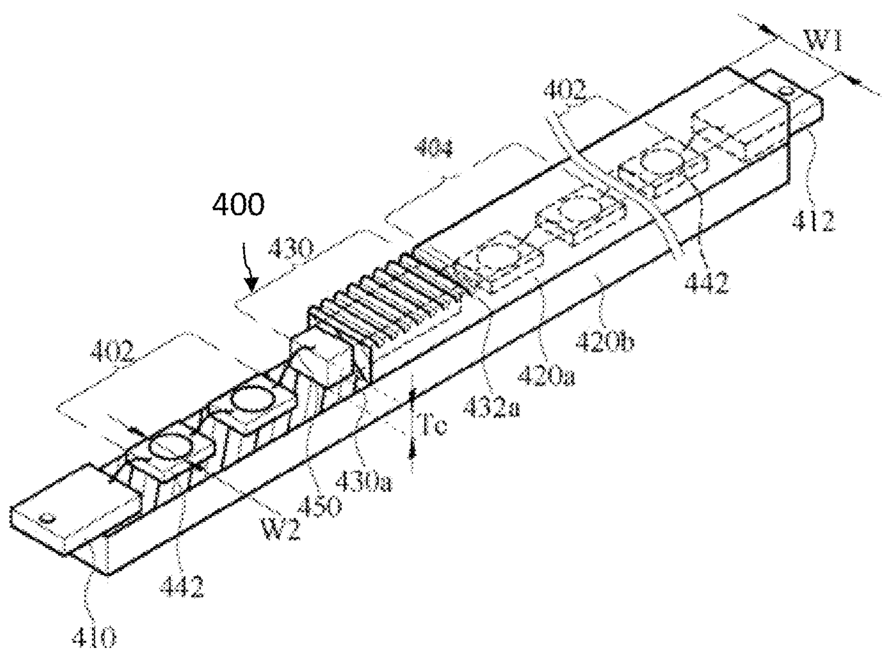
FIGS. 6K and 6L are perspective views of various LED filaments in accordance with the present invention.

As shown in FIG. 6K, in the present embodiment, the thickness of the conductor 430*a* is also significantly larger than the thickness of the LED chip 442. Besides, compared with the thickness of the LED chip 442, the thickness of the conductor 430*a* is closer to the thickness of the top layer 420*a* corresponding to the conductive section 430. In the width direction of the LED filament, the top layer 420*a* has a width W1, and the LED chip 442 has a width W2, and the width W2 of the LED chip 442 is close to the width W1 of the top layer 420*a*, wherein the width direction is perpendicular to both the axial direction and the aforementioned thickness direction. That is, the top layer 420*a* is slightly larger than the LED chip 442 in the width direction and slightly larger than the conductor 430*a* in the thickness direction. In other embodiments, the ratio of the width W1 of the top layer 420*a* to the width W2 of the LED chip 442 is around 2 to 5, i.e., W1:W2=2~5:1. In the present embodiment, the base layer 420*b* has the same width W1 as the top layer 420*a*, but is not limited thereto. In addition, as shown in FIG. 6K, in the present embodiment, the conductive section 430 further includes a wavy concave structure 432*a* disposed on one side surface of the conductive section 430. In the present embodiment, the wavy concave structure 432*a* is recessed by the upper side surface of the top layer 420*a* of the conductive section 430. The plurality of wavy concave structures 432*a* are spaced apart in the axial direction and are parallel to each other to present a continuous wave shape. In some embodiments, the plurality of wavy concave structures 432*a* are continuously closely aligned along the axial direction. In some embodiments, the wavy concave structure 432*a* may also be disposed around the entire circumferential surface of the conductive section 430 centering on the axial direction of the LED filament. In some embodiments, the wavy concave structure 432*a* may also be replaced by a wavy convex structure (as shown in FIG. 4C). In some embodiments, the wavy concave structure and the wavy convex structure may be staggered together to form a wavy concave-convex structure.

Figure 6L:
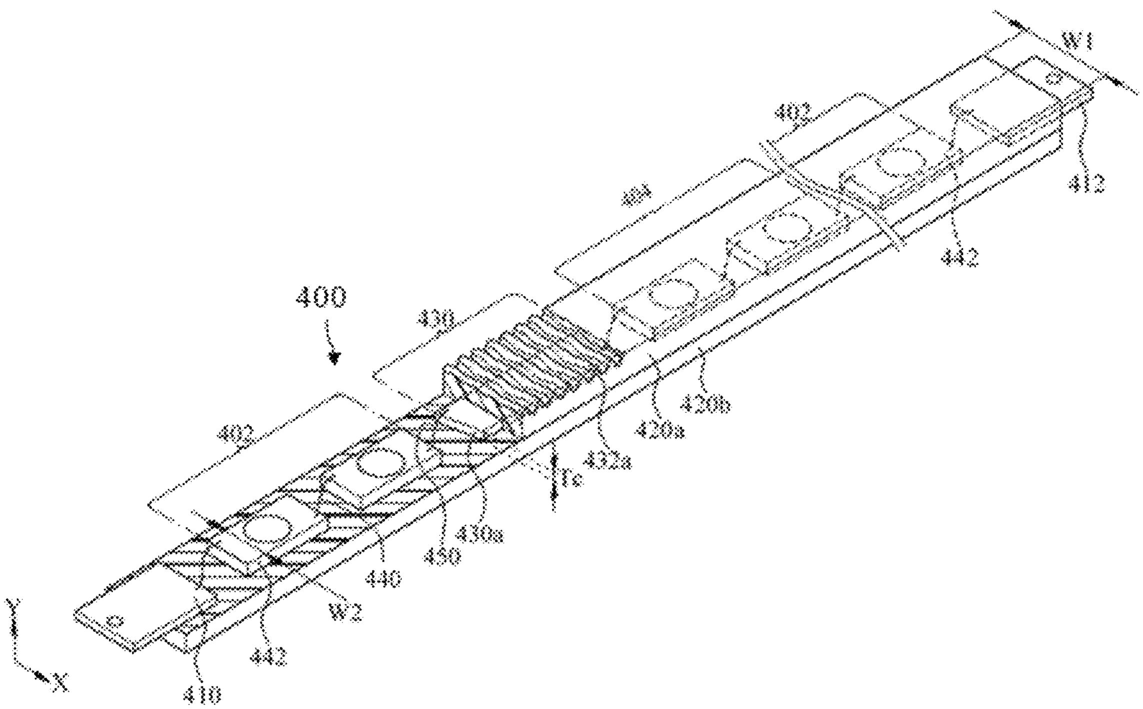

As shown in FIG. 6L, in the present embodiment, the LED chip 442 has a length in the axial direction of the LED filament and has a width in the X direction, and the ratio of the length to the width of the LED chip 442 is around 2:1 to 6:1. For example, in one embodiment, two LED chips are electrically connected as one LED chip unit, and the LED chip unit can have an aspect ratio of 6:1, which enables the LED filament to have a larger luminous flux. Moreover, the LED chip 442, the conductive electrodes 410, 412 and the conductor 430*a* have a thickness in the Y direction, the thickness of the conductive electrodes 410, 412 is smaller than the thickness of the LED chip 442, and the thickness Tc of the conductor 430*a* is also smaller than the thickness of the chip 442, that is, the conductor 430*a* and the conductive electrodes 410, 412 are thinner than the chip 442. Further, the top layer 420*a* and the base layer 420*b* have a thickness in the Y direction, and the thickness of the base layer 420*b* is smaller than the maximum thickness of the top layer 420*a*. In the present embodiment, the shape of the conductor 430*a* is a parallelogram rather than a rectangle in the top view along the Y direction, that is, the angle of the four sides of the conductor 430*a* is not 90 degrees presented in the top view. In addition, the two ends of the LED chip 442 are respectively connected to the wire 440 or the wire 450 and to be connected to the other chip 442 or the conductor 430*a* through the wire 440 or the wire 450. Furthermore, the connection points of the two ends of the LED chip 442 using to connect with the wire 440 or the wires 450 are not aligned with each other in the axial direction of the LED filaments. For example, the connection point of one end of the chip 442 is offset toward the negative X direction, and the connection point of the other end of the chip 442 is offset toward the positive X direction, that is, there will be a distance between the two connection points of the two ends of the chip 442 in the X direction.

A wavy concave or convex structure 432*a* as shown in FIG. 6K, which is a wave shape showing depressions and ridges in the Y direction, and is kept linear perpendicularly to the axial direction of the LED filament in the top view. It is to be noted that each groove of the wavy concave structure 432*a* or each protrusion of convex structure 432*a* is a straight line perpendicularly arranged along the axial direction of the LED filament, or the line connecting the lowest point of each groove of the wavy concave structure 432*a* in the Y direction is a straight line or the line connecting the highest point of each protrusion of the convex structure 432*a* in the Y direction is a straight line. The wavy concave or convex structure 432*a* as shown in FIG. 6L is not only wavy in the Y direction but also curved in the axial direction of the LED filament in the top view, that is, each groove of the wavy concave structure 432*a* and each protrusion of convex structure 432*a* is separately curved in a straight line and the two straight lines are perpendicularly arranged along the axial direction of the LED filament. Moreover, a line connecting the lowest point of each groove of the wavy concave structure 432*a* in the Y direction or a line connecting the highest point of each protrusion of the convex structure 432*a* in the Y direction is in a curve.

Figure 6M:
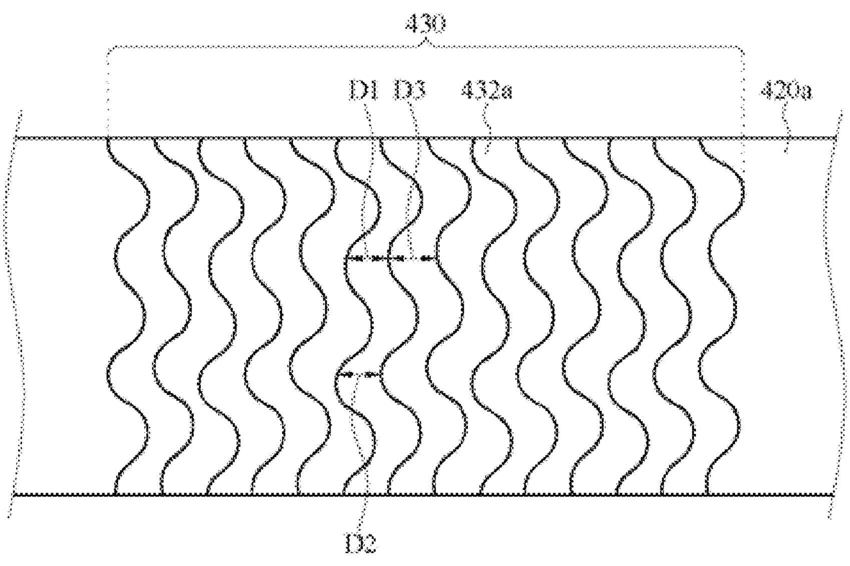
FIG. 6M illustrates a partial top view of FIG. 6L.

As shown in FIG. 6M, which is a partial top view of the conductive section 430 of FIG. 6L. FIG. 6M presents a wavy concave or convex structure 432*a* and FIG. 6L presents a curved configuration of the conductive section 430 in the axial direction of the LED filament. Moreover, in the present embodiment, the width of each groove of the wavy concave structure 432*a* itself in the axial direction of the LED filament is irregular, that is, the width of any two places of each groove is unequal. For example, two places of a certain groove of the wavy concave structure 432*a* in FIG. 6M have a width D1 and a width D2 respectively, and the width D1 and the width D2 are not equal. In addition, in the present embodiment, the width of each groove of the wavy concave structure 432*a* in the axial direction of the LED filament is also irregular. For example, each groove of the wavy concave structure 432*a* is aligned in parallel along the axial direction of the LED filament, however, the widths of each grooves are unequal. For example, two adjacent grooves of the wavy concave structures 432*a* in FIG. 6M have a width D1 and a width D3 at two positions aligned in the axial direction, and the width D1 and the width D3 are not equal. In other embodiments, the shape of the wavy concave or convex structure 432*a* is a straight strip or a combination of a straight strip and a wave from the top view of the conductive section. In other words, the surface of the top layer 420*a* at the conductive section 430 can be a straight line or a combination of a straight line and a wavy line in the side view.

Figure 7:
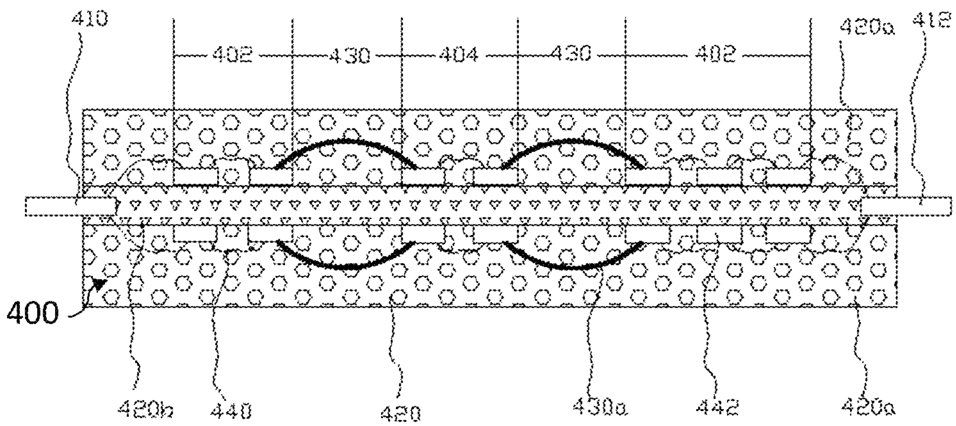
FIG. 7 is a cross sectional view of an LED filament with multiple layers in accordance with an embodiment of the present invention.

FIG. 7 illustrates another embodiment of an LED filament layered structure. In the present embodiment, the LED sections 402, 404, the gold wires 440, and the top layer 420*a* are disposed on both sides of the base layer 420*b*, that is, the base layer 420*b* is located between the two top layers 420*a*. The conductive electrodes 410, 412 are respectively disposed at both ends of the base layer 420*b*. As shown in the figure, the LED sections 402, 404 in the upper and lower top layers 420*a* can be connected to the same conductive electrode 410/412 by gold wires 440, in this way, the light ray distribution can be more uniform. Moreover, the gold wire 440 may be bent with posture to reduce the impact force, the posture may be, for example, slightly M-shape in FIG. 4H, curve or straight shape.

Figure 8:
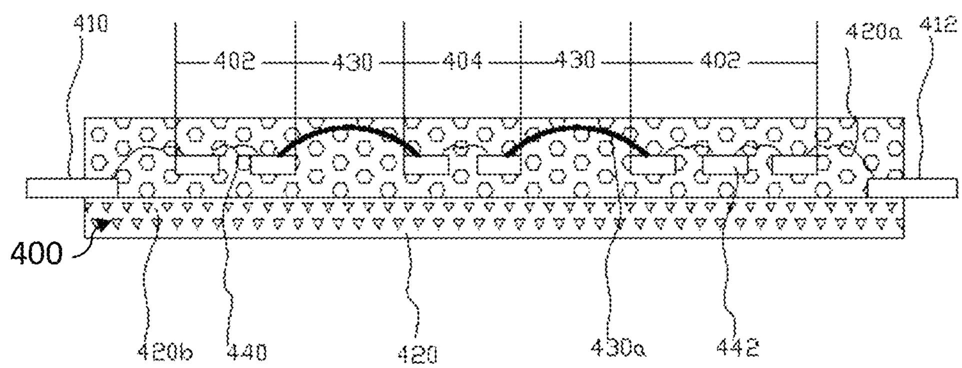
FIG. 8 is a cross sectional view of an LED filament with multiple layers in accordance with an embodiment of the present invention.

FIG. 8 illustrates another embodiment of the LED filament layered structure of the present invention. As shown in FIG. 8, the light conversion layer of LED filament 400 includes a top layer 420*a* and a base layer 420*b*. Each side of the LED sections 402, 404 is in direct contact with the top layer 420*a*, and the base layer 420*b* is not in contact with the LED sections 402, 404. In the manufacturing process, the base layer 420*b* can be formed in advance, and the LED sections 402, 404 and the top layer 420*a* are formed successively.

Figure 9:
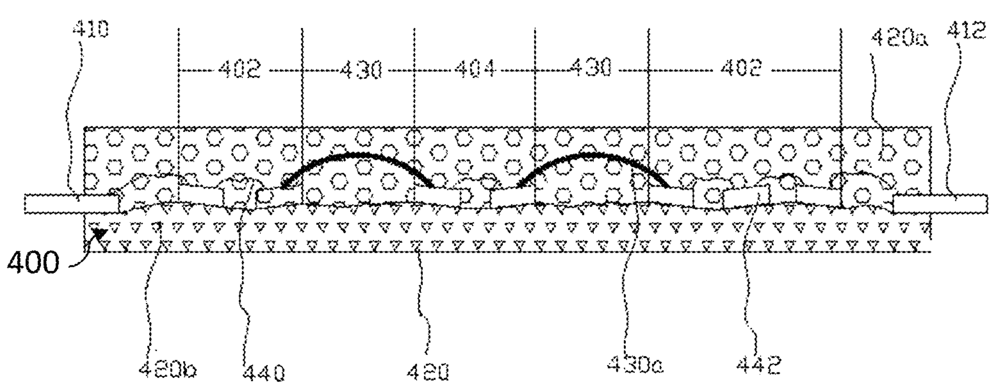
FIG. 9 is a cross sectional view of an LED filament with multiple layers in accordance with an embodiment of the present invention.

In another embodiment, as shown in FIG. 9, the base layer 420*b* of the LED filament 400 is formed with a wavy surface accompanying undulations, then the LED sections 402, 404 are disposed thereon and consequently are inclined to different directions. Thus, the LED filament has a broader light emitting angle. That is to say, from the side view, the LED sections are arranged with different angles with respect to the horizontal plane rather than in parallel to the horizontal plane, wherein the horizontal plane is defined by the interface of the bottom surface of the base layer and the surface of the carrier, and the carrier is used to provide the supporting in the manufacturing process. Furthermore, the configured height/angle/direction between each LED section can also be different. In other words, a plurality of LED sections are connected in series and not aligning in a straight line. In this way, the filament 400 has the effect of increasing the emitting angle and the uniformity of the light without being bent or curved.

Figure 10:
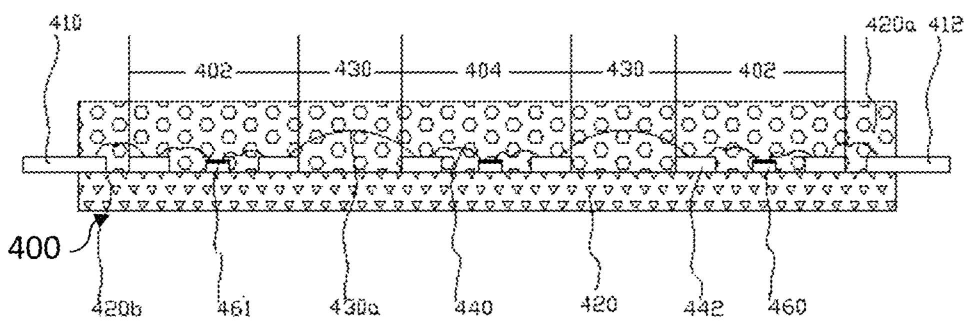
FIG. 10 is a cross sectional view of an LED filament with multiple layers in accordance with an embodiment of the present invention.

In the LED filament structure as shown in FIG. 10, the filament 400 includes at least one LED section 402, 404, at least one pair of conductive electrodes 410, 412, a plurality of gold wires 440, a light conversion layer 420, and at least one conductive section 430 electrically connecting the two adjacent LED sections 402, 404. Wherein each of the LED sections 402, 404 includes at least two LED chips 142 that are electrically connected to each other by wires 440. The light conversion layer 420 includes a base layer 420*a* and a top layer 420*b*, and a copper foil 460 having a plurality of openings is attached to the base layer 420*a*. The upper surface of the copper foil 460 may further have a silver plating layer 461, and the copper foil located at each end of the LED filament as a conductive electrode 410, 412 and extending beyond the light conversion layer 420. Subsequently, the LED sections 402, 404 can be disposed to the base layer 420*a* by means of die bond paste or the like. Thereafter, a phosphor glue or phosphor film is applied to coat the LED sections 402, 404, gold wire 440, conductive section 430, and a portion of the conductive electrodes 410, 412 to form a light conversion layer 420. The width or/and length of the opening of the copper foil 460 is greater than that of the LED chip 442, defining the position of the LED chip. At least two of the six faces of the LED chip, generally five faces in the present embodiment, being covered by the phosphor glue. In the present embodiment, the combination of copper foil 460 and the gold wire 440 provides a solid conductive structure and also maintaining the flexibleness of the LED filament. Besides, the silver plating layer 461 has an effect of increasing light reflection in addition to good electrical conductivity.

Figure 11:
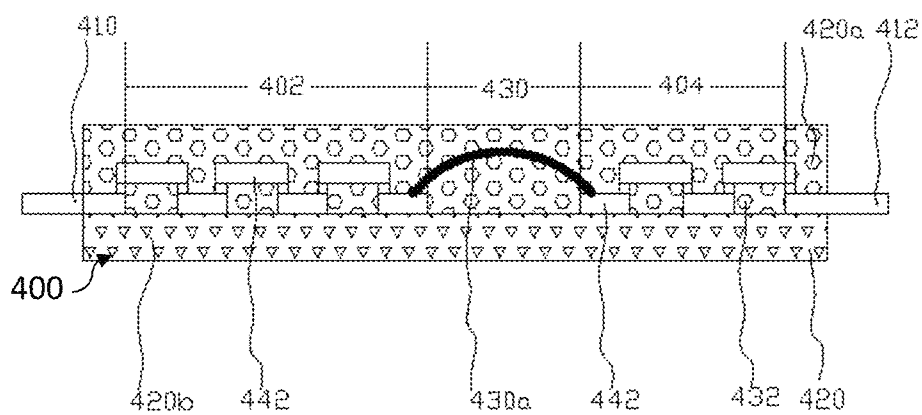
FIG. 11 is a cross sectional view of an LED filament with multiple layers in accordance with an embodiment of the present invention.

In the LED filament package structure as shown in FIG. 11, the LED filament 400 is similar to the LED filament disclosed in FIG. 10, and the difference is that: (1) the LED chip 442 used for the filament 400 is a flip chip having the same solder pad height, wherein the solder pad is directly connected to the silver plating layer 461; (2) the length of the opening of the LED filament described aforementioned (that is, the length in the axial direction of the LED filament) must be greater than the LED chip 442 in order to accommodate the LED chip 442, furthermore, the LED chip 442 of the LED filament in the present embodiment is located corresponding to the opening 432 and above the copper foil 460/silver plating layer 461, therefore the length of the LED chip 442 is greater than the opening 432. The present embodiment omits the step of gold wire bonding in compared to the previous embodiment.

The LED filament structures as shown in FIG. 11 can be employed. The feature of the LED filament structure is that the LED chip is used as flip-chip configuration, that is, the original height of the different solder pads is processed to the same height, usually the lower N-pole extension is processed to the same height as the P-pole.

Figure 12:
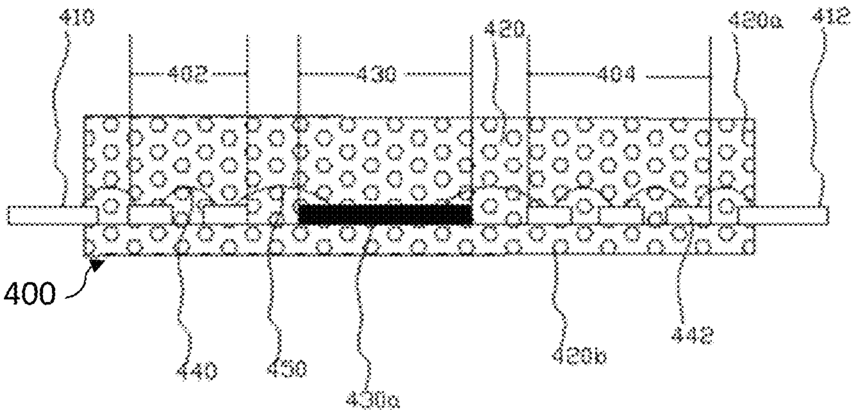
FIG. 12 is a cross sectional view of an LED filament in accordance with an embodiment of the present invention.

The connection mode between the conductor in the conductive section and the light conversion layer is described as follows. Referring to FIG. 12, in the LED filament structure shown in FIG. 12, the LED filament 400 has a light conversion layer 420, the LED sections 402, 404, the conductive electrodes 410, 412, and at least one conductive section 430. The conductive section 430 is located between adjacent LED sections 402 and 404. The LED sections 402 and 404 include at least two LED chips 442 electrically connected to each other through the wires 440. In the present embodiment, the conductive section 430 includes a conductor 430*a*. The conductive section 430 and the LED sections 402, 404 are electrically connected by wires 450, that is, two LED chips respectively located in the adjacent two LED sections 402, 404 and closest to the conductive section 430 are electrically connected to each other through the wires 450 connecting with the conductor 430*a* in the conductive section 430. The length of the conductive section 430 is greater than the distance between two adjacent LED chips in one single LED sections 402, 404, and the length of the wire 440 is less than the length of the conductor 430*a*. The light conversion layer 420 is disposed on at least one side of the LED chip 442 and the conductive electrode 410, 412, and a part of the two conductive electrodes is exposed from the light conversion layer. The light conversion layer 420 includes at least a top layer 420*a* and a base layer 420*b*. In the present embodiment, the LED sections 402, 404, the conductive electrodes 410, 412, and the conductive section 430 are all attached to the base layer 420*b*.

The conductor 430*a* can be a copper foil or other electrically conductive material. The upper surface of the conductor 430*a* may further have a silver plating layer, and subsequently, the LED chip 442 may be attached to the base layer 420*b* by means of die bond paste or the like. Thereafter, a phosphor glue or phosphor film is applied to coat over the LED chip 442, the wires 440, 450, and a portion of the conductive electrodes 410, 412 to form a light conversion layer 420. At least two of the six faces of the LED chip, generally five faces in the present embodiment, being covered by the phosphor glue. The wires 440, 450 may be gold wires. In the present embodiment, the combination of copper foil 460 and the gold wire 440 provides a solid conductive structure and also maintaining the flexibleness of the LED filament. Besides, the silver plating layer 461 has an effect of increasing light reflection in addition to good electrical conductivity.

Figure 13:
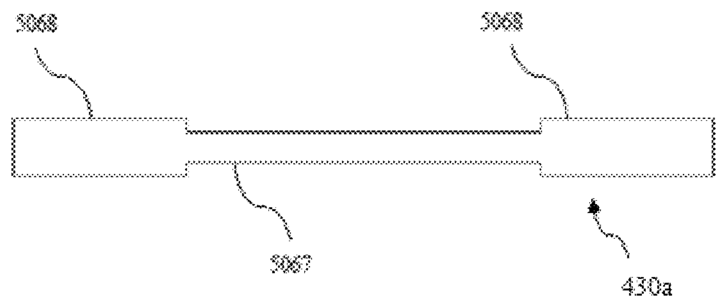
FIG. 13 is a top view of the conductor of an LED filament in accordance with an embodiment of the present invention.

In an embodiment, the shape of the conductor may also result from considering the gold wire connection or filament bending. For example, in one embodiment, a top view of conductor 430*a* is shown in FIG. 13, the conductor 430*a* has a joint region 5068 and a transition region 5067. The joint region 5068 is at the end of the conductor 430*a* for being electrically connected with other components. In the present embodiment, the conductor 430*a* comprises two joint regions 5068, and the transition region 5067 is located between two joint regions 5068 and for connecting the two joint regions 5068. The width of the joint region 5068 may be greater than that of the transition region 5067. Since the joint region 5068 is used to serve as a pad for electrical contact, a relatively sufficient width is required. For example, if the width of the LED filament is W, the width of the joint region 5068 of the conductor 430*a* can be between around ¼ W and W. The joint region 5068 can be multiple and the width thereof may be not consistent. Because the transition region 5067 between the joint regions 5068 is not required to form any joint point, the width can be less than that of the joint region 5068. For example, if the width of the LED filament is W, the width of the transition region 5067 can be between 1/10 W and ⅕ W, the conductor 430*a* is easy to be bent along with the bending of the filament due to the less width of the transition region 5067 of the conductor 430*a*; therefore, the risk that a wire close to the conductor may be easily broken by stress of bending is lower.

Figure 14A:
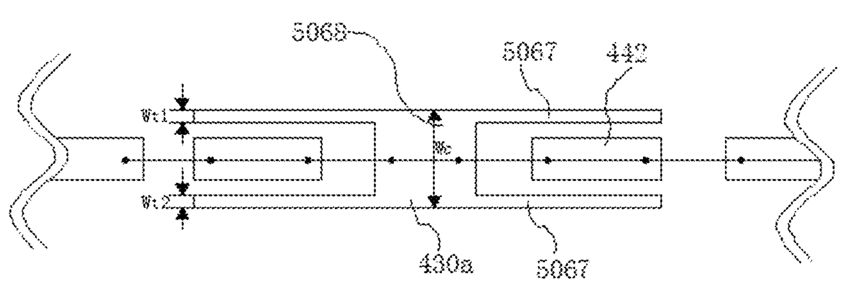
FIG. 14A is a top view of the conductor of an LED filament in accordance with an embodiment of the present invention.

In one embodiment, as shown in the top view of FIG. 14A, one of the LED chips 442 constituting an LED filament is connected to the conductor 430*a* via the wire 450, wherein the conductor 430*a* has two openings like notch with the quadrilateral shape symmetrically at the two terminals of the conductor 430*a*. Therefore, the LED chip disposed in the opening has three sides opposite to the part of the conductor 430*a*. Moreover, two terminals of the conductor 430*a* being defined as the transition region 5067 and the middle area between the terminals being defined as the joint region 5068 having a width Wc. Furthermore, each transition region 5067 of the conductor 430*a* is divided into two strips with the width Wt1 and Wt2 symmetrically aligned with the longitudinal centerline of the conductor 430*a*. Moreover, the sum of the widths of the two strips of the transition regions 5067, that is the width Wt1 and Wt2, is less than the width of the joint region 5068 Wc. As shown in FIG. 14A, the sum of the widths Wt1, Wt2 of the two strips of the transition regions 5067 is less than the width Wc of the joint region 5068 in the direction perpendicular to the longitudinal of the LED filament, which can increase the mechanical strength between the conductor and the LED chip 442 of the LED filament and also to avoid the damage of the wires 450 connecting the LED chips and the conductors. In an embodiment, the length of the strip of the transition region may extend to the LED section adjacent to the conductive section in the longitudinal direction of the LED filament, thereby slow down the impact of the external force on the LED chip and improving product stability. In the present embodiment, the width Wc of the joint region 5068 is equal to the width of the base layer 420*b* or the width of the LED filament, and the side of the LED chip 442 disposed in the opening without opposing the conductor 430*a* is electrically connected to other LED chips through the wire 440. The length of the wire 450 between the LED chip 442 and the conductor 430*a* is shorter than the distance between any two LED chips in the LED section. For example, the length of the wire between the LED chip 442 and the conductor 430*a* is shorter than the distance between two adjacent LED chips in the LED section. As a result, the risk of the LED filaments being broken caused by the elastic setback stress is also lower.

Figure 14B:
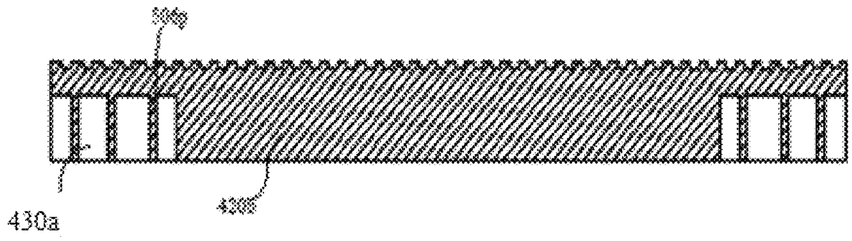
FIG. 14B is a cross sectional view of the conductor of an LED filament in accordance with an embodiment of the present invention.
Figure 14C:
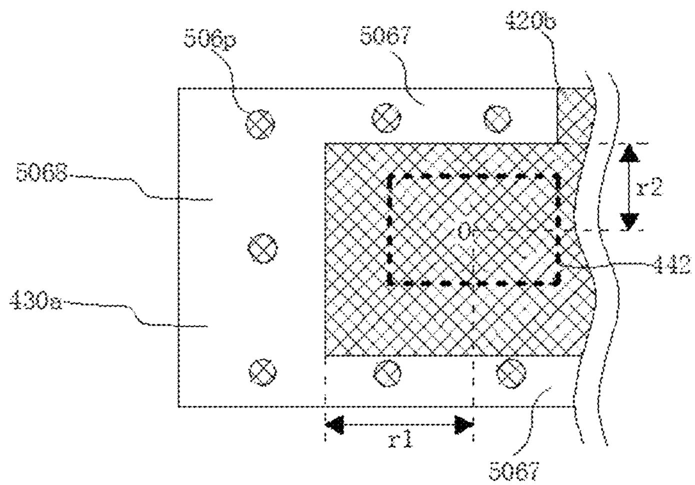
FIGS. 14C to 14G are bottom views of various designs of the conductor of an LED filament in accordance with the present invention.

In one embodiment, the conductor 430*a* in the LED filament has a contour consisting of a joint region 5068 and four strip shaped transition regions 5067 as shown in FIG. 14A. Further, the conductor 430*a* can be illustrated with a left half portion and a right half portion symmetrically aligned with the short axis centerline thereof such as a left half portion or a right half portion of the bottom view shown in the FIG. 14C, FIG. 14E, FIG. 14F and FIG. 14G. In other embodiments, the conductor 430*a* may not have symmetric contour with respect to the short axis centerline thereof, and the transition region 5067 for connecting the joint regions 5068 may be any combination of the transition regions 5067 shown in FIG. 14C, FIG. 14D, and FIGS. 14E, 14F, and 14G. As shown in FIG. 14H, the conductor 430*a* has at least one through hole 506*p*, and also referring to FIG. 14B and FIG. 14C. FIG. 14B is a cross sectional view of the conductor 430*a* and the FIG. 14C is a bottom view shown a left half portion or a right half portion of the conductor 430*a* in the FIG. 14B. Wherein the base layer 420*b*, for example the phosphor film, infiltrates the hole 506*p* from one end, and optionally selected to fill up to the other end of the hole 506*p*. The phosphor film shown in FIG. 14B is not filled to overflow the through hole. Moreover, in the present embodiment, the upward surface of FIG. 14B is roughened so that the surface thereof has better thermal dissipation capability. In other embodiments, the conductor 430*a* may be located between the top layer 420*a* and the base layer 420*b* as shown in FIG. 14J, the base layer 420*b* has a beveled groove, and the through hole size of the conductor 430*a* is smaller than the maximum size of the bevel groove of the base layer 420*b*. Therefore, when the phosphor film, that is, the material of the top layer 420*a*, overlies the conductor 430*a* and fills the through hole, the phosphor film in the bevel groove partially contacts the area under the conductor 430*a*. As shown in FIG. 14J, FIG. 14J is a cross sectional view taken along the line E1-E2 of FIG. 14I. The phosphor glue used to form the top layer 420*a* is filled into the through hole 506*p* of the conductor 430*a* and then further filled into the beveled groove of the base layer 420*a*. In another embodiment, as shown in FIG. 14K, the phosphor film used to form the base layer 420*b* is filled into the through hole 506*p* of the conductor 430*a* and then further filled till contacting the surface of the top layer 420*a*. As shown in FIG. 14J and FIG. 14K, since the conductor 430*a* is similarly riveted by the top layer 420*a* or the base layer 420*b* in the axial direction of the LED filament, the contact area between the conductor 430*a* and the top layer 420*a* or the base layer 420*b* is increased. The increase in the contact area that increases the bonding strength between the conductor 430*a* and the top layer 420*a* or the base layer 420*b*, and the bendability of the conductive section is thereby improved.

Figure 14D:
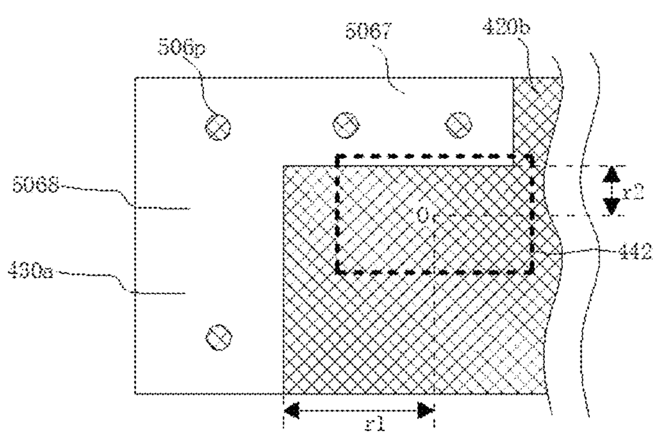

FIGS. 14D, 14E, 14F and 14G are embodiments of the conductors 430*a* having through holes. The FIG. 14D is a partial bottom view of an LED filament of an embodiment in which the conductor 430*a* has only one transition regions 5067 connected to the joint region 5068, whether the transition region 5067 or the joint region 5068 has a rectangular shape. The FIG. 14D is a bottom view showing only a left half portion or a right half portion of the conductor 430*a* symmetrically aligned with the short axis centerline thereof, and it is arranged with one strip shaped transition region 5067 connected to the joint region 5068. When the left half portion is combined with the right half portion, the contour of the conductor 430*a* may be any combination of the transition regions 5067 and the joint regions 5068 shown in FIGS. 14C, 14D, 14E, 14F, and 14G. Taking the central point of the LED chip 442 as the center, the shortest distance from the center to the closest boundary of the joint region is set to r1, and the shortest distance from the center to the closest boundary of the transition region is set to r2. When the distance r1 is greater than or equal to the distance r2, the broken risk of the LED filament caused by the elastic frustration stress can be reduced. The FIG. 14D shows the case where r1 is greater than r2. In the case where the conductor 430*a* is enclosed by the base layer 420*b*, for example a phosphor film, referring to schematic diagram of FIG. 14D, the location of the chip 442 is present with the dotted line due to the chip 442 is blocked by the base layer 420*b*. From the bottom view, it is seen that the LED chip 442 overlaps the portion of the transition region 5067. In other embodiments, the LED chip 442 does not overlap the portion of the transition region 5067 in a bottom view. In other embodiments, the conductor comprises one joint region and two transition regions, one transition region 5067 can be connected to the middle of the joint region 5068, and another transition region can be connected to the middle or one end of the joint region 5068, alternatively, another transition region 5067 can also be connected to the joint region 5068 any position between the ends and the middle of the joint region 5068. When another transition region 5067 is connected to the middle joint region 5068, the transition region 5067 and the joint region 5068 form a shape like a cross in the bottom view.

Figure 14E:
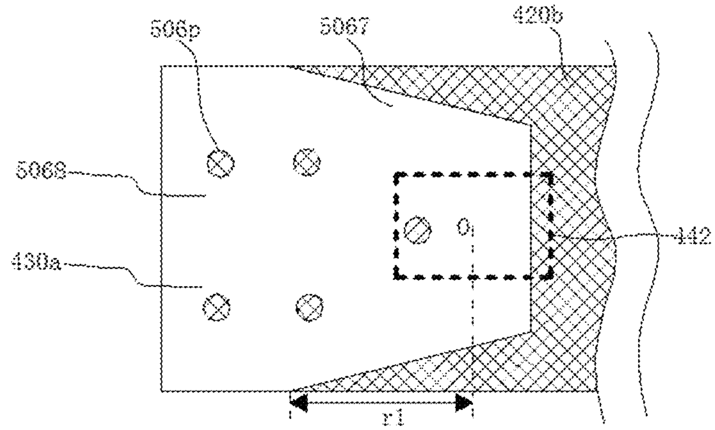

The difference between embodiments showing in the FIG. 14E and FIG. 14C is the conductor 430*a* in the embodiment of FIG. 14E having simply two transition regions, each transition region 5067 of the conductor 430*a* having two symmetrical contours symmetrically arranged about the longitudinal axis of the LED filament and a portion of the contour is in contact with the joint region 5068. For example, each transition region 5067 of the conductor 430*a* is in a shape of trapezoid extending from the boundary of the joint region 5068 and the shorter trapezoidal side away from the joint region 5068. In other words, in the bottom view, the transition region 5067 has a fixed end, that is the boundary of the joint region 5068 connecting with the transition region 5067, whose width is equal to the length of the long side of the trapezoid or the width of the joint region 5068 and the base layer 420*b*. In other embodiments, the transition region 5067 whose width is gradually reduced from the fixed end to the other end may also be in a shape of triangular or semicircular. The average width of the transition region 5067 is less than that of the joint region 5068. As shown in FIG. 14E, in the case where the embedded conductor 430*a* is enclosed by the base layer 420*b* (for example, a phosphor film), therefore the chip 442 is covered by the base layer 420*b* and from the bottom view the LED chip 442 illustrated by the dashed line is overlapped with the transition region 5067.

Figure 14F:
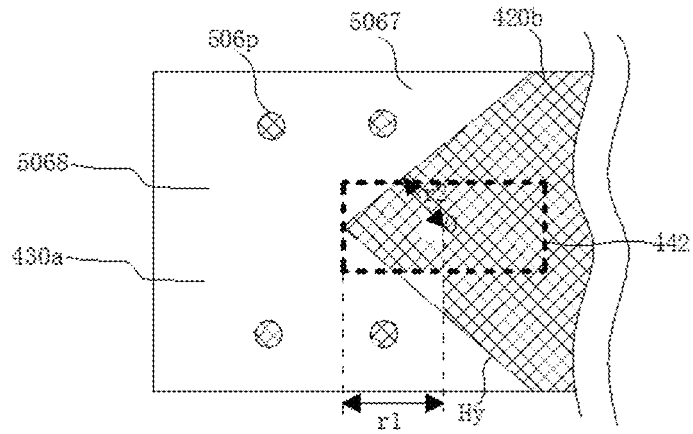

The difference between the FIG. 14F and FIG. 14D is the transition region 5067 of FIG. 14F having two triangles symmetrical about the longitudinal axis of the LED filament, one lateral of the triangle is aligned with the outer side of the LED filament, and the other lateral is connected with the joint region 5068, and the oblique lateral of the triangle has an end point intersecting with the joint region 5068 in the longitudinal axis of the LED filament. The triangle being symmetrical designed in the transition region 5067 may be an equilateral triangle, an acute triangle, or an obtuse triangle, etc. In the present embodiment, the two oblique laterals of the two symmetrically triangles are intersected, but are not limited thereto. The distance between two oblique laterals in parallel with the short axial direction of the LED filament will gradually increase along the distance move away from a fixed end to the other end, that is, the two oblique laterals respectively intersecting with the opposite sides of the base layer 420*b* at the other end. Wherein the fixed end is the boundary of the joint region 5068 connecting with the transition region 5067.

Figure 14G:
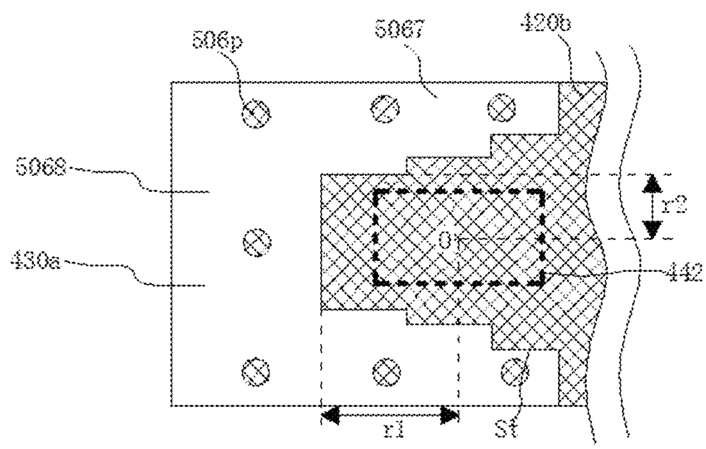
Figure 14H:
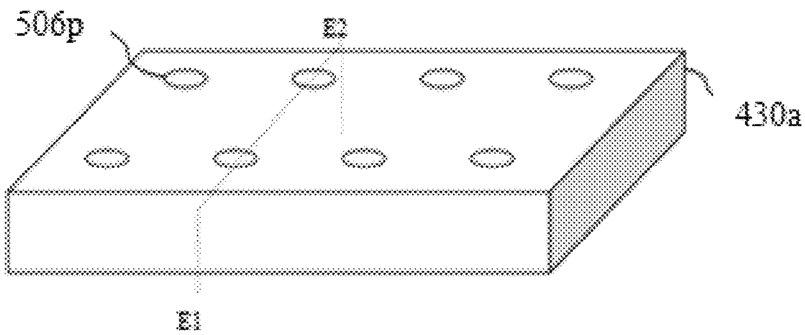
Figure 14I:
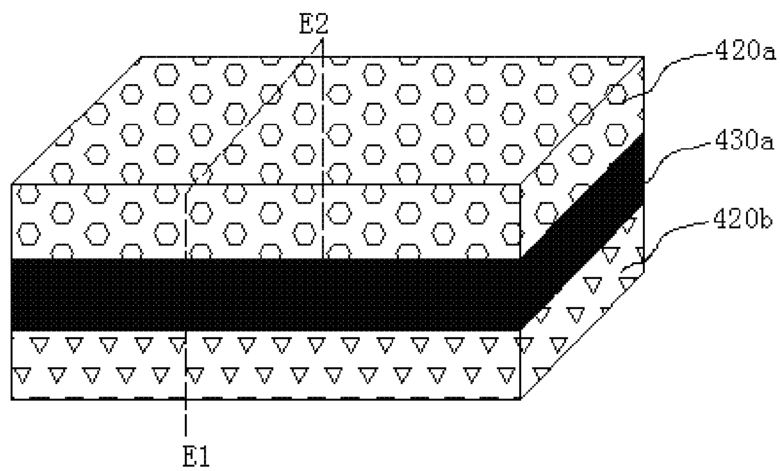
Figure 14J:
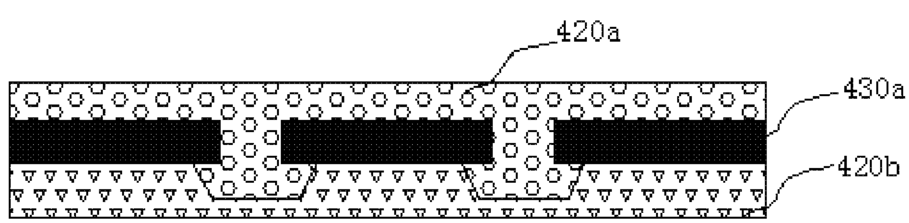
Figure 14K:
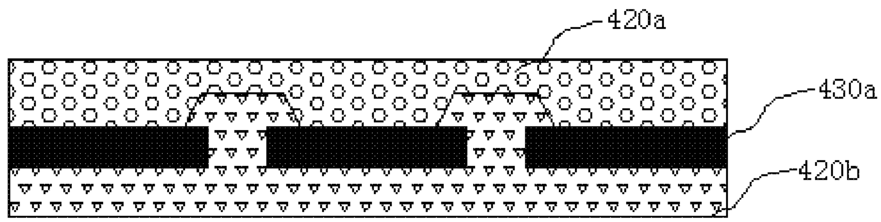
Figure 14L:
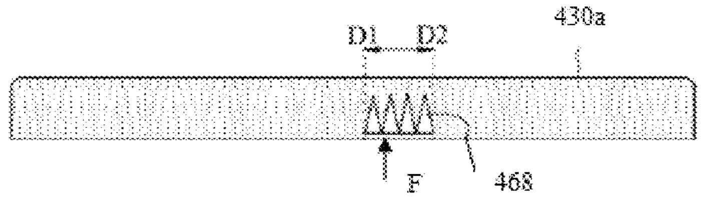
FIG. 14L is a cross sectional view of the conductor of an LED filament in accordance with an embodiment of the present invention.

The embodiment of FIG. 14G is similar to FIG. 14F, the difference is the oblique lateral of the triangle of the transition region 5067 in FIG. 241 is not a straight line but a stepped shape. In other embodiments, the oblique lateral of the triangle of the transition region 5067 can be in the shape of curved, arched, or wavy. And all the structures described based on FIG. 14A to FIG. 14G also are able to be applied to the structure of electrode 410, 412.

Figure 5:
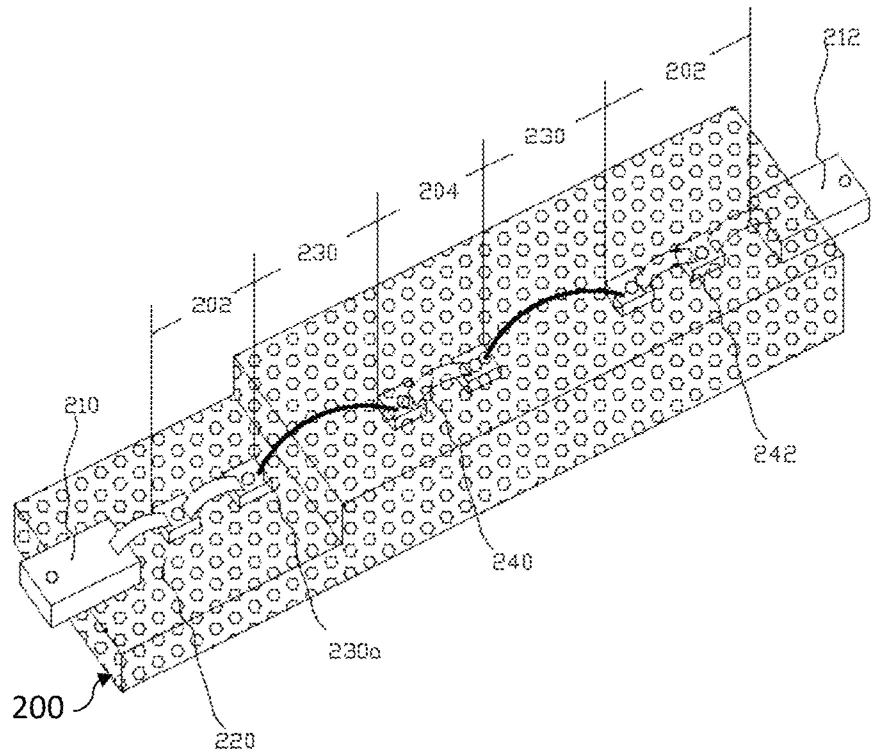
FIG. 5 is a perspective view of the LED filament with partial sectional view in accordance with an embodiment of the present invention.

In other embodiments, the conductor 130*a* in FIG. 4, the conductor 230*a* in FIG. 5, and the conductor 430*a* in FIGS. 7 to 9 may be the structure of the conductor 430*a* shown in FIGS. 12 to 14M, and other components are unchanged. When the conductor 430*a* in FIG. 7 is the structure of the conductor 430*a* shown in FIGS. 12 to 14M, the rivet structure shown in FIG. 14J can be formed, and the material of the top layer 420*a* is filled in the hole 506*p* of the conductor 430*a* and further filled to the space between the conductor 430*a* and the base layer 420*b*. Therefore, the contact area between the conductor and the top layer is increased that will lead to the improvement of the bonding strength between the conductor and the top layer, thereby the bendability of the conductive section is improved.

Since the LED filament is placed inside the LED light bulb with undulating posture, the bending portion with a small radian may be weakened by the thermal stress due to thermal expansion caused by the heat generating from the LED light bulb. Therefore, the holes or notches can be appropriately placed in the LED filament near the bending portion to mitigate this effect. In one embodiment, as shown in schematic diagram FIG. 14L which the LED chip and the conductive electrode of the LED filament are omitted, the region between the D1 to D2 is a predetermined bending portion. The conductor 430*a* is provided with a plurality of holes. Preferably, the size of the holes 468 are gradually increased from outer bending portion (showing as upper in the figure) to the inner thereof (showing as), and the hole 468 is triangular in the cross sectional view of the present embodiment. When the LED filament is bent upward by the F direction, the LED filament is easier to bent due to the plurality of holes 468 between the region from D1 to D2, and the hole 468 at the bending portion can buffer the thermal stress. Moreover, the deformation of the LED filament is followed the designed hole shape and the bending angle.

Figure 14M:
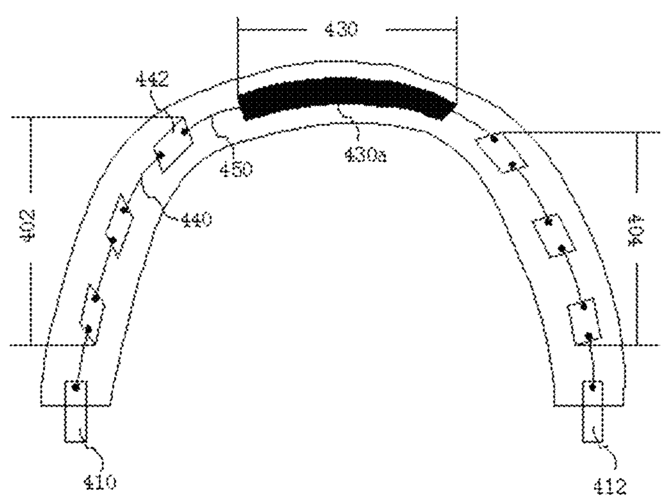
FIG. 14M is a schematic view showing the bent state of the LED filament of FIG. 12 in accordance with an embodiment of the present invention.

FIG. 14M is a bending form of the LED filament shown in FIG. 12 of the present invention. In the related art, a plurality of LED filaments are generally connected by the conductive electrode to realize the requirement of curling the LED filament. Since bending occurs at the conductive electrode, the strength of the electrode is weakened and the electrode can be broken easily, further, the conductive electrode takes up some space to make the light emitting area of the LED filament smaller. In the present invention, the conductive section 430 is a bent portion of the LED filament, and the rivet structure and the conductor reinforcement are formed by the conductor 430*a* shown in FIGS. 14A to 14K, so that the wire 450 connecting the LED chip 442 and the conductor 430*a* is less likely to be broken. In various embodiments, the conductors may be arranged in a configuration as shown in FIG. 13 or provided with an accommodating space on the conductor 430*a* (e.g., the hole structure shown in FIG. 14L) to reduce the probability of the LED filament cracking during bending. The LED filament of the invention has the advantages of good bendability and high luminous efficiency.

Figure 15:
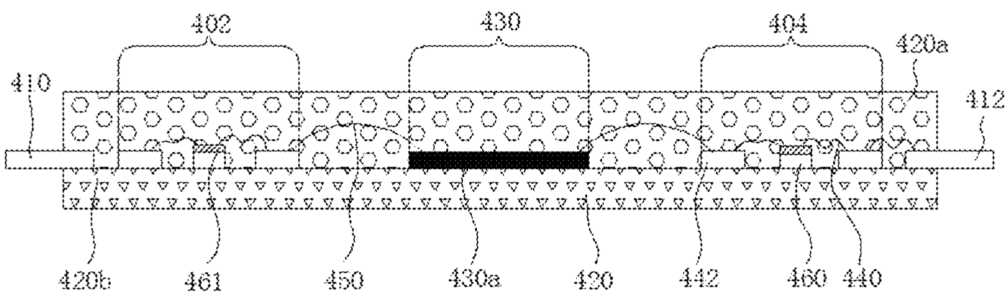
FIG. 15 is a cross sectional view of the structure of an LED filament in accordance with an embodiment of the present invention.

The structure as shown in FIG. 15, the LED filament is similar to the LED filament disclosed in FIGS. 12 to 14M, except that a copper foil 460 is disposed between the two LED chips 442, and a silver plating layer 461 is disposed on the copper foil. The copper foil 460 is electrically connected to the LED chips 442 through the wire 440.

Figure 16:
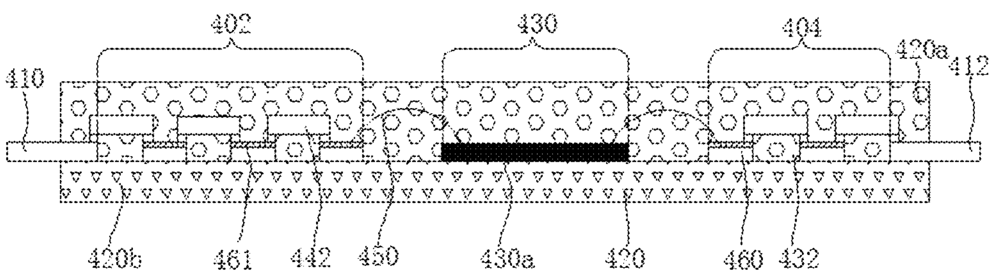
FIG. 16 is a cross sectional view of the structure of an LED filament in accordance with an embodiment of the present invention.

The structure as shown in FIG. 16, the LED filament is similar to the LED filament disclosed in FIGS. 12 to 14M, and the difference is that: (1) the LED chip used for the LED filament is a flip chip having the same solder pad height and the solder pad is directly connected to the silver plating layer; (2) the length of the aforementioned opening (e.g., opening 432 in FIG. 11) of the LED filament in the longitudinal direction of the LED filament must be greater than the length of the LED chip to accommodate the LED chip, and the LED chip 442 of the LED filament of the present embodiment corresponds to the opening 432 is located above the copper foil 460 and the silver plating layer 461, so the length of the LED chip 442 is greater than the length of the opening.

According to the aforementioned embodiments of the present invention, since the LED filament structure is provided with at least one LED section and at least one conductive section, when the LED filament is bent, the stress is easily concentrated on the conductive section. Therefore, the breakage probability of the gold wire connected between the adjacent LED chips is reduced during bending. Thereby, the quality of the LED filament and its application is improved. In addition, the conductive section employs a copper foil structure, which reduces the length of the metal wire bonding and further reduces the breakage probability of the metal wire during bonding. In other embodiments of the invention, in order to improve the bendability of the conductive section, and further prevent the conductor from damaged when the LED filament is bent. The conductor in the LED filament conductive section may be in a shape of "M" or wave profile for providing better flexibility in extending of the LED filament.

Figure 17A:
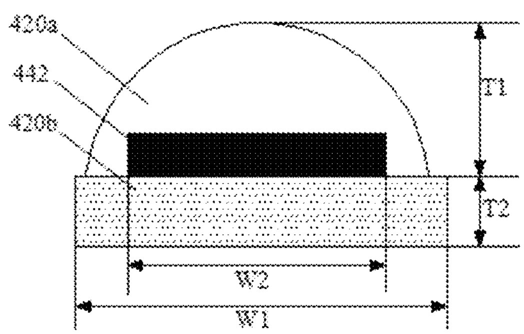
FIGS. 17A and 17B are schematic views showing the placement of the LED chip in an LED filament.

FIG. 17A is a schematic view showing the arrangement of the LED chip 442. The thickness and diameter of the base layer 420*b* may be smaller than that of the top layer 420*a*. As shown in FIG. 17A, the thickness T2 of the base layer 420*b* is smaller than the thickness T1 of the top layer 420*a*, and the thickness of the base layer 420*b* or the top layer 420*a* may be uneven due to the process, therefore, the T1 and T2 represent the maximum thickness of the top layer 420*a* and the base layer 420*b*, respectively. Besides, the LED chip 442 is placed on the surface of the base layer 420*b* and wrapped in the top layer 420*a*. In some aspects, the conductive electrode of an LED filament (not shown) may be disposed primarily in the base layer 420*b*. In the case when the thickness of the base layer 420*b* is thinner than that of the top layer 420*a*, the heat generated from the LED filament conductive electrode can be more easily dissipated from the base layer 420*b*. In some aspects, the major emitting direction of the LED chip 442 is to face the top layer 420*a*, so that most of light emitting from the LED chip 442 will penetrate the top layer 420*a*, which causes the base layer 420*b* to have a relatively lower brightness than the top layer 420*a*. In one embodiment, the top layer 420*a* has a relatively large amount of light reflecting and/or diffusing particles, for example phosphor particles, which can reflect or diffuse the light toward the base layer 420*b*, and the light can easily penetrate the thinner base layer 420*b*, thereby achieving uniform brightness of the top layer 420*a* and the base layer 420*b*. In another embodiment, when the top layer 420*a* and the base layer 420*b* have the same thickness, the phosphor particle concentration of the top layer 420*a* can be configured to be greater than the phosphor particle concentration of the base layer 420*b*, so that the color temperature of the LED filament is more uniform.

Figure 17B:
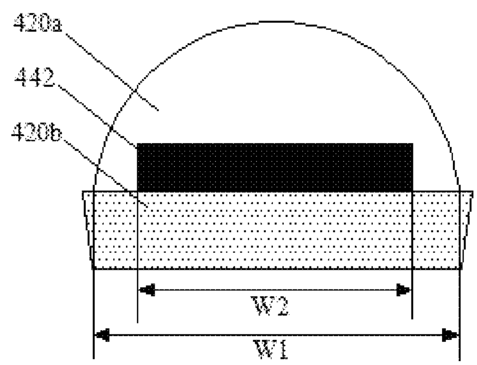

Referring to FIGS. 17A and 17B, W1 is the width of the base layer 420*b* or the top layer 420*a*, and W2 is the width of the LED chip 442. When the width of the base layer 420*b* or the top layer 420*a* is not uniform, W1 represents the width of the upper surface of the base layer 420*b* or the width of the lower surface of the top layer 420*a*, the proportion of W1 and W2 is W1:W2=1:(0.8 to 0.9). The upper surface of the base layer 420*b* contacts the LED chip 402, and the lower surface thereof is away from the LED chip 442 and opposite to the upper surface of the base layer 420*b*, in contrast, the upper surface of the top layer 420*b* is away from the LED chip 442, and the lower surface thereof is opposite to the upper surface of the top layer 420*b* and contacts the base layer 420*a*. In FIG. 17A, W1 indicates the width of the upper surface of the base layer 420*b* or the minimum width of the base layer 420*b*. FIG. 17B is a schematic view showing the arrangement of the LED chip 402, and W1 is the width of the lower surface of the top layer 420*b* or the maximum width of the top layer 420*a*. The LED chip 442 is a six faced illuminator, in order to ensure lateral illuminating of the LED filament, that is lateral faces of the LED chip 442 are still covered by the top layer 402*a*, the widths W1 and W2 can be designed to be unequal and the width W1 is greater than the width of W2. On the other hand, in order to ensure that the LED filament has a certain flexibility and can be bent with a small curvature radius, in other words, for making sure that the filament retains a certain degree of flexibility, therefore, the ratio of the thickness and the width of the cross section of the LED filament which is perpendicular to the longitudinal direction of the LED filament is ideally tended to be consistent. With this design, the LED filament can be easily realized with an omni-directional light effect and has a better bending property.

Figure 18:
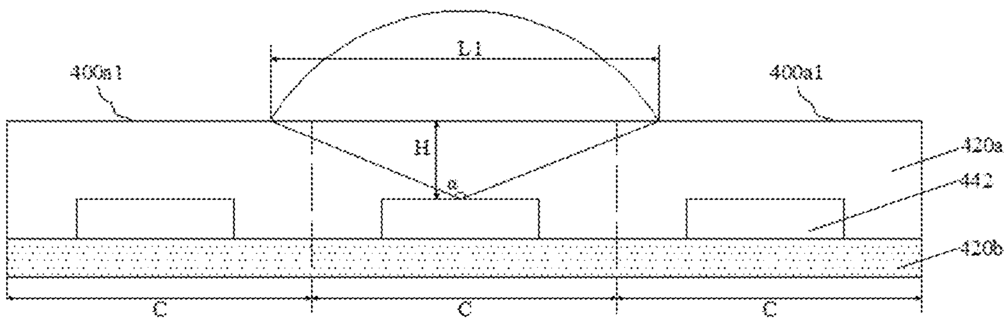
FIG. 18 is a cross sectional view showing the LED filament in the axial direction of the LED filament.
Figure 19:
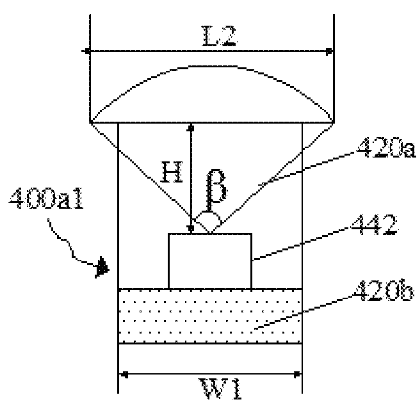
FIG. 19 is a cross-sectional view showing the LED filament in the radial direction of the LED filament.

Referring to FIG. 18, FIG. 18 shows the cross sectional view of a portion of the LED filament 400 in the longitudinal direction of the LED filament 400, FIG. 18 shows three LED filament units 400*al* and each LED filament unit 400*al* includes a single LED chip 442. FIG. 19 is a cross sectional view of the LED filament unit 400*al* in the short axial direction of the LED filament. As shown in FIGS. 18 and 19, the illumination angle of the LED chip 442 in the longitudinal direction of the LED filament is a, the illumination angle of the LED chip 442 in the short axial direction of the LED filament is B, and the surface of the LED chip 442 away from the base layer 420*b* is defined by the upper surface of the LED chip 442, the distance from the upper surface of the LED chip 442 to the outer surface of the top layer is H, and the length of the LED filament unit 400*al* in the longitudinal direction of the LED filament is C, and the light emitting area of an LED chip 442 in the LED filament in the longitudinal direction of the LED filament is the illumination coverage of the illumination angle α, the LED chip emits the light along with the illumination angle α and it projects on the outer surface of the top layer 420*a* with a length of the linear distance L1. The light emitting area of an LED chip 442 in the LED filament in the short axial direction of the LED filament is the illumination coverage of the illumination angle β, the LED chip emits the light along with the illumination angle ß and it projects on the outer surface of the top layer 420*a* with a length of the linear distance L2. It is considered that the LED filament has ideal light emitting area, better bending property, thermal dissipation performance, avoiding to occur obvious dark areas of LED filament and reducing material waste, etc. at the same time, the L1 value can be designed by the equation as 0.5 C≤L1≤10 C, preferably C≤L1≤2 C. Further, under the equation L2≥W1, if the L1 value is smaller than the C value, the light emitting areas of the adjacent LED chips 442 in the longitudinal direction cannot be intersected, therefore the LED filament may have a dark area in the longitudinal direction. Moreover, when the L2 value is smaller than the W1 value, it represents the width of the LED chip 442 in the short axial direction of the filament is too large, and it is also possible to cause the top layer 420*a* having dark areas on both sides in the short axial direction. The dark areas not only affect the overall light illumination efficiency of the LED filament, but also indirectly cause waste of material use. The specific values of α, β depend on the type or specification of the LED chip 442.

In one embodiment, in the longitudinal direction of the LED filament:

$$H=L1/2\tan 0.5\alpha,\ 0.5C\le L1\le 10C,\ \text{then } 0.5C/2\tan 0.5\alpha\le H\le 10C/2\tan 0.5\alpha;$$

in the short axial direction of the LED:

$$H=L2/2\tan 0.5\beta,\ L2\ge W1,\ \text{then } H\ge W1/2\tan 0.5\beta;$$

therefore, Hmax=10 C/2 tan 0.5α, Hmin=a; setting a is the maximum value in both 0.5 C/2 tan 0.5α and W1/2 tan 0.5β, and setting A is the maximum value in both C/2 tan 0.5α and W1/2 tan 0.5β.

Thus, the equation between the distance H and the setting value a and A respectively as a≤H≤10 C/2 tan 0.5α, preferably A≤H≤2 C/2 tan 0.5α. When the type of the LED chip 442, the spacing between adjacent LED chips, and the width of the filament are known, the distance H from the light emitting surface of the LED chip 442 to the outer surface of the top layer can be determined, so that the LED filament has a superior light emitting area in both the short axial and longitudinal direction of the LED filament.

Most LED chips have an illumination angle of 120° in both the short axial and longitudinal direction of the LED filament. The setting b is the maximum of 0.14 A and 0.28 W1, and B is the maximum of 0.28 C and 0.28 W1, then the equation between the distance H and the setting value b and B respectively as b≤H≤2.9 C and preferably B≤H≤0.58 C.

In one embodiment, in the longitudinal direction of the LED filament:

$$H=L1/2\tan 0.5\alpha,\ 0.5C\le L1\le 10C;$$

in the short axial direction of the LED filament:

$$H=L2/2\tan 0.5\beta,\ L2\ge W1;\ \text{then } W1\le 2H\tan 0.5\beta;$$

then 0.5 C tan 0.5β/tan 0.5α≤L2≤10 C tan 0.5β/tan 0.5α, L2≥W1;

therefore, W1≤10 C tan 0.5B/tan 0.5α, thus W1 max=min (10 C tan 0.5β/tan 0.5α, 2H tan 0.5β).

The relationship between the LED chip width W2 and the base layer width W1 is set to W1:W2=1:0.8 to 0.9, so that the minimum of W1 as W1 min=W2/0.9 can be known.

Setting d is the minimum of 10 C tan 0.5β/tan 0.5a and 2H tan 0.5β, and D is the minimum of 2 C tan 0.5β/tan 0.5a and 2H tan 0.5β, then the equation between the base layer width W1, the LED chip width W2, and the setting value d and D respectively is W2/0.9≤W1≤d, preferably W2/0.9≤W1≤D.

When the type of the LED chip 442, the distance between the adjacent two LED chips in the LED filament, and the H value are known, the range of the width W of the LED filament can be calculated, so that the LED filament can be ensured in the short axial direction and the longitudinal direction of the LED filament both have superior light emitting areas.

Most of the LED chips have an illumination angle of 120° in the short axial and in the longitudinal direction of the LED filament, the e is set to a minimum value of 10 C and 3.46H, and the E is set to a minimum value of 2 C and 3.46H, in the case the equation between the width W1, W2 and the setting value e and E respectively as 1.1 W2 ≤W1≤e, preferably 1.1 W2≤W1≤E.

In one embodiment, in the longitudinal direction of the LED filament:

$$H=L1/2\tan 0.5\alpha,\ 0.5C\le L1\le 10C,\ \text{then } 0.2H\tan 0.5\alpha\le C\le 4H\tan 0.5\alpha;$$

in the short axial direction of the LED filament:

$$H=L2/2\tan 0.5\beta,\ L2\ge W1,\ \text{then } L1\ge W1\tan 0.5\alpha/\tan 0.5\beta;$$

thus W1 tan 0.5α/tan 0.5β≤10 C, and C≥0.1 W1 tan 0.5α/tan 0.5β;

then C max=4H tan 0.5α.

Setting f is the maximum value of both 0.2H tan 0.5α and 0.1 W1 tan 0.5α/tan 0.5β, and setting F is the maximum value of both H tan 0.5α and 0.1 W1 tan 0.5α/tan 0.5β, therefore f≤C≤4 H tan 0.5α, preferably F≤C≤2 H tan 0.5α.

When the width W, the H value, and type of the LED chip 442 of the LED filament are determined, the range of the width C of the LED filament can be known, so that the LED filament has superior light emitting area in both the short axial direction and the longitudinal direction of the LED filament.

Most LED chips have an illumination angle of 120° in the short axial direction and in the longitudinal direction of the LED filament of the LED filament. The setting g is the maximum value of 0.34H and 0.1 W1, and setting G is the maximum value of 1.73H and 0.1 W1, thereby the equation between the value C, H and the setting value g and G respectively as g≤C≤6.92H, preferably G≤C≤3.46H.

In the above embodiment, since the thickness of the LED chip 442 is small relative to the thickness of the top layer 420*a*, it is negligible in most cases, that is, the H value may also represent the actual thickness of the top layer 420*a*. In one embodiment, the height of any of the two top layers 420*a* as shown in FIG. 7 also applies to the range of the H value as the aforementioned equation. In another embodiment, the difference from FIG. 7 is that the LED chip 442 and the conductive electrodes 410 and 412 are disposed on one surface of the base layer 420*b*, and the LED chip 442 and the conductive electrodes 410 and 412 are not disposed on the other surface opposite to the surface, in this case, the height of the top layer 420*a* applies to the range of the H value as the aforementioned equation. In other embodiments, the light conversion layer is similar to the structure of the light conversion layer 420 as shown in FIG. 6A and FIG. 7, for example, only the position of the conductive electrode shown in FIG. 6A and FIG. 7 is different, and the height of the top layer 420*a* is suitable for the range of the H value as the aforementioned equation.

Figure 20A:
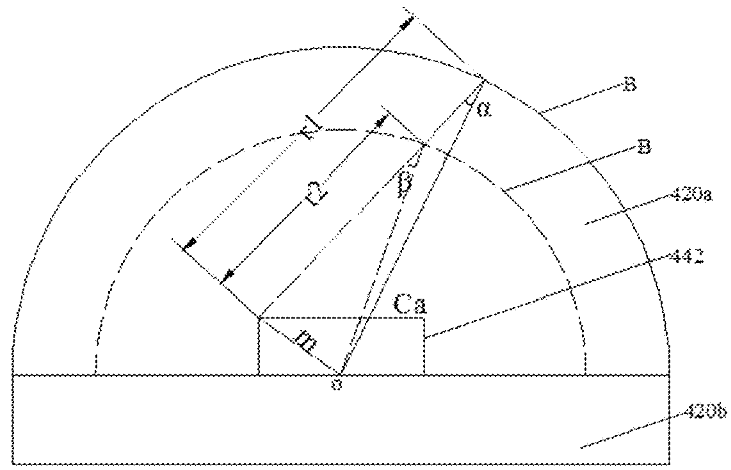
FIGS. 20A and 20B are cross sectional views showing different top layers **420*a* of the LED filament units 400*a*1**.
Figure 20B:
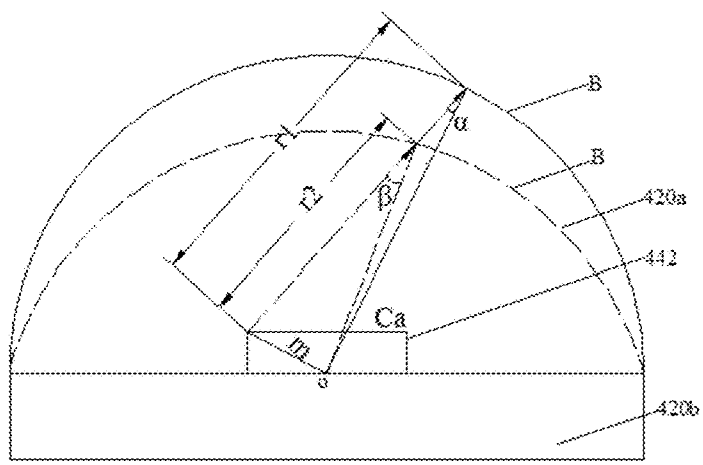
Figure 20C:
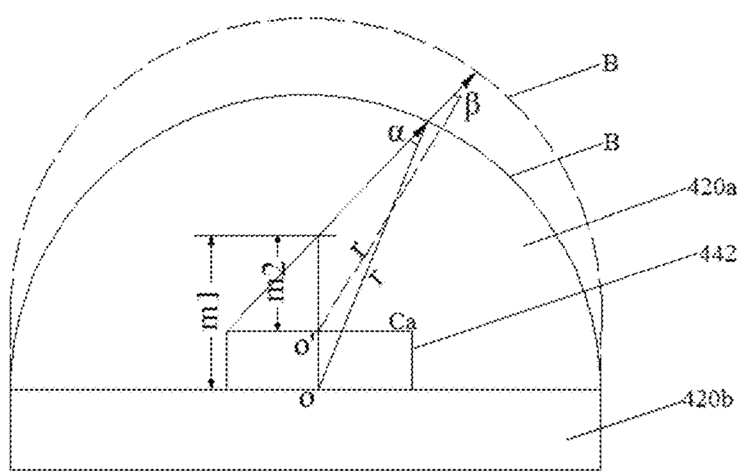
FIG. 20C is a cross sectional view showing another embodiment of the LED filament in accordance with the present invention.

Referring to FIGS. 20A and 20B, FIGS. 20A and 20B are cross sectional views of the LED filament unit 400*al* having different thickness of the top layers 420*a*, and the surface of the LED chip 442 opposite to the interface between the LED chip 442 and the base layer 420*b* is referred to as light emitting surface Ca. In one embodiment, as shown in FIG. 20A, the shape of the top layer 420*a* is a semicircle with different diameters, for example the dashed line illustrated another diameter, and the center o of the top layer 420*a* is not located on the light emitting surface Ca of the LED chip 442, further, the distance that the emitting light projected onto the circumference of the outer surface of the top layer 420*a* is r1, r2, respectively. When the light emitting traverses the interface B, that is the interface between the top layer and the inert gas, the incident angles formed at the interfaces of the radii r1 and r2 of the top layer 420*a* are α, β, respectively. It can be known from the equation tan α=m/r1 and tan β=m/r2 that the radius is larger, the incident angle is smaller, and the light emitting efficiency of the LED filament is higher. That is to say, when the top layer 420*a* has a semicircular shape, the maximum radius/diameter value should be taken as much as possible to obtain a better light emitting efficiency. In another embodiment, as shown in FIG. 20B, a top layer 420*a* has a semicircular shape, and the other top layer 420*a* has an elliptical shape, wherein the major axis of the ellipse has the same length as the diameter of the semicircular shape, and the center point o of the top layer 420*a* and the center point o of the ellipse do not overlap with the light emitting surface Ca of the LED chip 442. As shown in FIG. 20B, when the emitted light passes through the interface B in the same direction, the distances of the emitting light on the circumference and the elliptical arc are r1 and r2 respectively, and the incident angles are α and β, respectively, from the equations tan α=m/r1 and tan β=m/r2, it can be seen that the larger the r1 and r2, the smaller the incident angle, the higher the light emitting efficiency of the LED filament. In other words, in compared to the elliptical shape, the cross section of the top layer 420*a* in the shape of semicircular has better light emitting efficiency, that is, the distance from the center point of the LED chip to the outer surface of the top layer is substantially the same. As shown in FIG. 20C, the center O of the top layer 420*a* indicated by the solid line does not overlap with the light emitting surface Ca of the LED chip, and the center O' of the top layer 420*a* indicated by the dashed line overlaps with the light emitting surface of the LED chip, and the radius of the semicircle with the center of O and the radius of the semicircle of O' is equal. As shown in the figure, tan α=m1/r and tan β=m2/r, m1 is greater than m2, and thus a is greater than B, so that when the light emitting surface overlaps with the center of the top layer 420*a*, that is the distance from the center point to the outer surface of the top layer is substantially the same, the light emitting efficiency is better.

The LED chip used in the aforementioned embodiments can be replaced by a back plated chip, and the plated metal is silver or gold alloy. When the back plated chip is used, the specular reflection can be enhanced, and the luminous flux of the light emitted from the light emitting surface A of the LED chip can be increased.

Figure 21A:
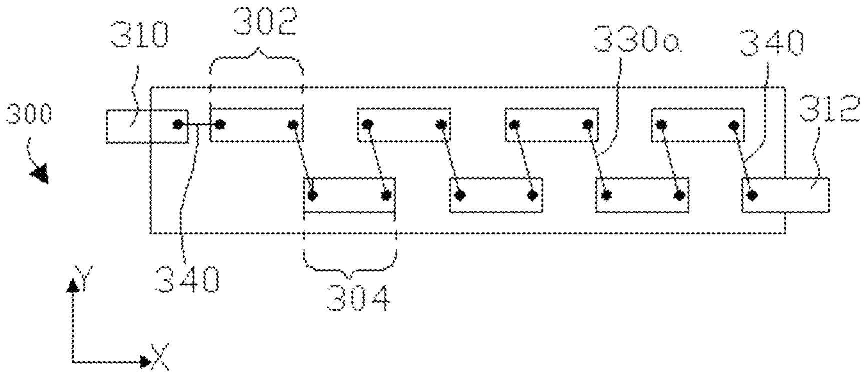
FIGS. 21A to 21I are schematic top views of a plurality of embodiments in accordance with the present invention.

Next, a chip bonding design relating to an LED filament will be described. FIG. 21A is a top view of an embodiment of the LED filament 300 in an unbent state in accordance with the present invention. The LED filament 300 includes a plurality of LED chip units 302, 304, a conductor 330*a*, and at least two conductive electrodes 310, 312. The LED chip units 302 and 304 may be a single LED chip, or may include a plurality of LED chips, that is, equal to or greater than two LED chips.

The conductor 330*a* is located between the adjacent two LED chip units 302, 304, the LED chip units 302, 304 are at different positions in the Y direction, and the conductive electrodes 310, 312 are disposed corresponding to the LED chip units 302, 304 and electrically connected to the LED chip units 302 and 304 through the wires 340. The adjacent two LED chip units 302 and 304 are electrically connected to each other through the conductor 330*a*. The angle between the conductor 330*a* and the LED filament in the longitudinal direction (X direction) is 30° to 120°, preferably 60° to 120°. In the related art, the direction of the conductor 330*a* is parallel to the X direction, and the internal stress acting on the cross sectional area of the conductor is large when the filament is bent at the conductor. Therefore, the conductor 330*a* is disposed at a certain angle with the X direction and it can effectively reduce the internal stress thereof. The wire 340 is at an angle, parallel, vertical or any combination with the X direction. In the embodiment, the LED filament 300 includes two wires 340, one wire 340 is parallel to the X direction, and the other wire 340 has an angle of 30° to 120° with respect to the X direction. The LED filament 300 emits light after its conductive electrodes 310, 312 are powered with voltage source or current source.

Figure 21B:
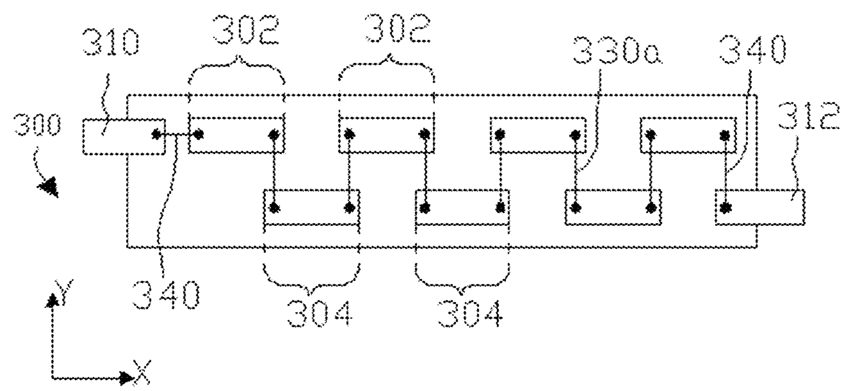
Figure 21C:
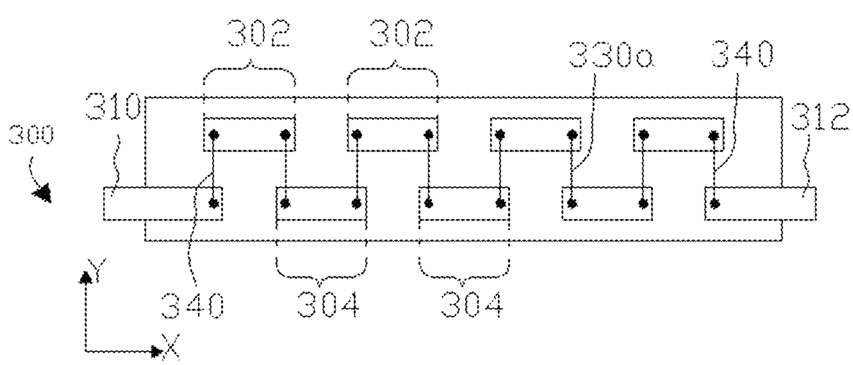
Figure 21D:
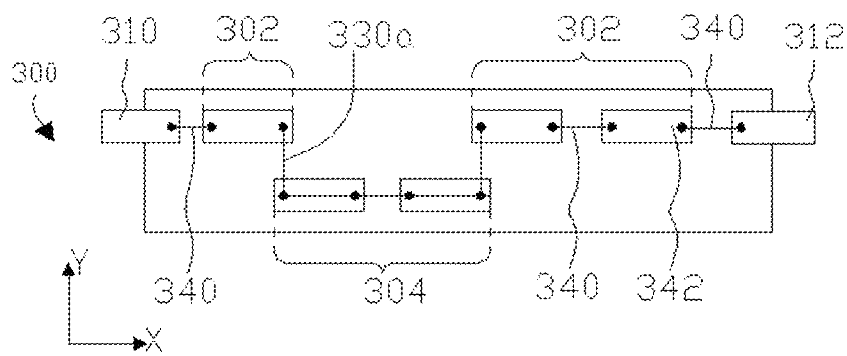

FIGS. 21B to 21D show the case where the conductor 330*a* is 90° with respect to the X direction, that is, the conductor 330*a* is perpendicular to the X direction, which can reduce the internal stress on the conductor cross sectional area when the filament is bent. In some embodiment the wire 340 both in parallel and vertically with respect to the X direction are combined in an LED filament, as shown in FIG. 21B, the LED filament 300 includes two wires 340, one wire 340 being parallel to the X direction and the other wire 340 being perpendicular to the X direction.

As shown in FIG. 21C, the difference from the embodiment shown in FIG. 21B is that the wire 340 is perpendicular to the X direction, and the bendability duration between the conductive electrodes 310, 312 and the LED chip units 302, 304 is improved. Further, since the conductor 330*a* and the wire 340 are simultaneously arranged to be perpendicular to the X direction, the LED filament can have good bendability at any position.

Figure 21E:
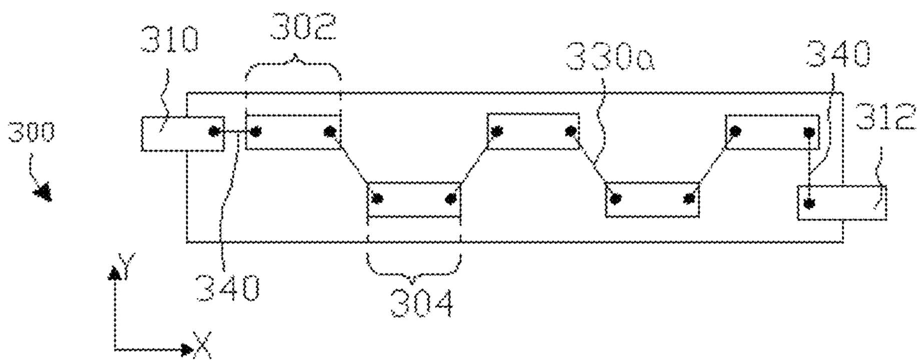

FIG. 21E is a top view of the LED filament 300 in an unbent state in accordance with one embodiment of the present invention. FIG. 21E differs from the embodiment shown in FIG. 21C is that, in the X direction, the LED chip unit 304 is between two adjacent LED chip units 302, and no overlap with the LED chip unit 302 in the projection in the Y direction, so that when the LED filament is bent at the conductor 330*a*, the LED chip is not damaged, thereby improving the stability of the LED light bulb product quality.

Figure 21F:
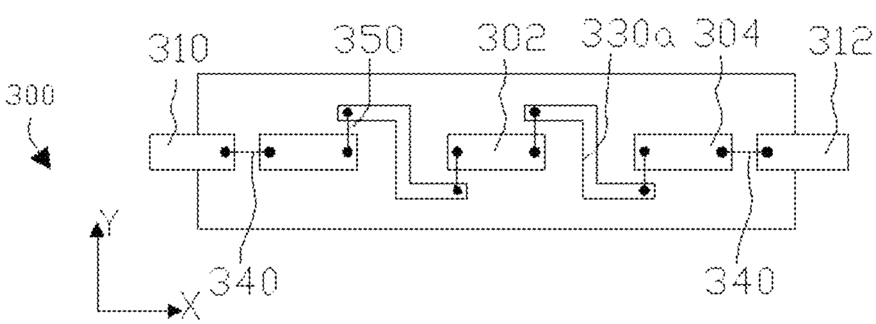

As shown in FIG. 21F, the LED filament 300 includes a plurality of LED chip units 302, 304, a conductor 330*a*, and at least two conductive electrodes 310, 312. The conductor 330*a* is located between adjacent LED chip units 302, 304, and the LED chip units 302, 304 are disposed at substantially the same position in the Y direction, so that the overall width of the LED filament 300 is smaller, thereby shortening the thermal dissipation path of the LED chip and improving the thermal dissipation effect. The conductive electrodes 310, 312 are correspondingly arranged to the LED chip units 302, 304, and are electrically connected to the LED chip units 302, 304 through the wires 340. The LED chip units 302/304 are electrically connected to the conductors 330*a* through the wires 350, and the conductors 330*a* are in the font shape like deformed Z letter. The aforesaid shape can increase the mechanical strength of the region where the conductor and the LED chip are located in, and can avoid the damage of the wire connecting the LED chip and the conductor when the LED filament 300 is bent. At the same time, the wire 340 is disposed in a parallel with the X direction.

Figure 21G:
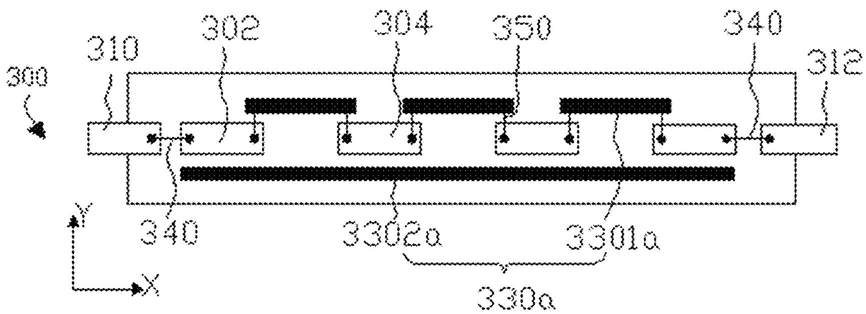

As shown in FIG. 21G, the LED filament 300 includes a plurality of LED chip units 302, 304, at least one conductor 330*a*, and at least two conductive electrodes 310, 312. The LED chip units 302, 304 are in the same position in the Y direction, and the conductor 330*a* parallel to the X direction, the conductor 330*a* includes a first conductor 3301*a* and a second conductor 3302*a*, respectively located on opposite sides of the LED chip unit 302/304, and the first conductor 3301*a* is located between adjacent LED chip units 302, 304 and electrically connected to the LED chip unit 302/304 through the wire 350. The wire 350 is perpendicular to the X direction, and reduces the internal stress on the cross sectional area of the wire when the LED filament 300 is bent, thereby improving the bendability of the wire. The second conductor 3302*a* is not electrically connected to the LED chip units 302, 304, and the second conductor 3302*a* extends along the X direction to the one end of each wire 340 adjacent to the electrode. When the LED filament 300 is suffered external force, it can play the role of stress buffering, protect the LED chip, improve product stability, and secondly make the force balance on both sides of the LED chip. The conductive electrodes 310, 312 are configured corresponding to the LED chip units 302, 304, and are electrically connected to the LED chip units 302, 304 through wires 340.

Figure 21H:
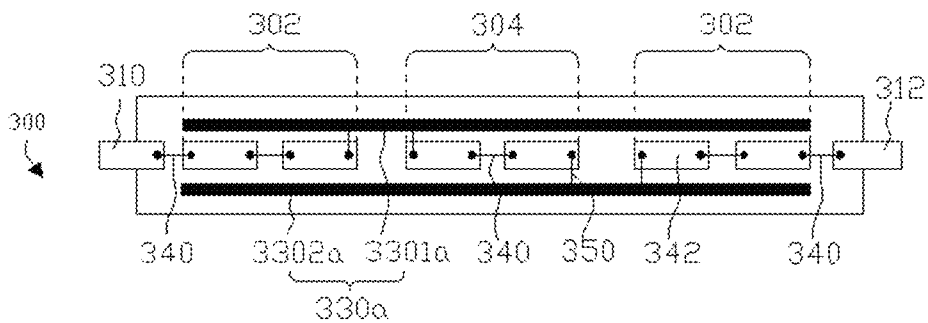

As shown in FIG. 21H, the difference from the embodiment shown in FIG. 21G is that the first conductor 3301*a* and the second conductor 3302*a* extends along the X direction to the one end of each wire 340 adjacent to the electrode, and the first conductor 3301*a* and the second conductor 3302*a* are electrically connected to both the LED chip unit 302 and the LED chip unit 304 by wires 350. In other embodiments, for example, the first conductor 3301*a* is electrically connected to the LED chip unit 302 and the LED chip unit 304 through the wire 350, and the second conductor 3302*a* may not be electrically connected to the LED chip unit 302/304. By setting conductors on both sides of the LED chip, when the LED filament 300 is bent, it can not only increase the strength of the LED filament 300 but also disperse the heat generated by the LED chips during illumination.

Figure 21I:
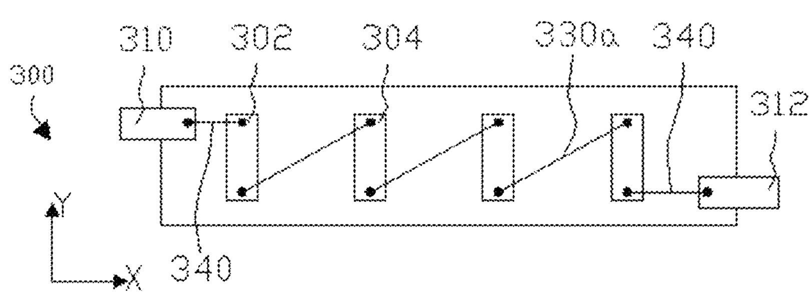

FIG. 21I is a top view showing an embodiment of the LED filament 300 in an unbent state. In the present embodiment, the LED chip units 302 and 304 are single LED chips, and the width of the LED chip units 302 and 304 is parallel to the X direction. Preferably, the LED chip units 302 and 304 are at substantially the same position in the Y direction, so that the overall width of the LED filament 300 is smaller, thereby shortening the heat dissipation path of the LED chip and improving the thermal dissipation effect. The adjacent two LED chip units 302 and 304 are connected by a conductor 330*a*, and the angle between the conductor 330*a* and the X direction is 30° to 120°, which reduces the internal stress on the cross sectional area of the wire and also improves the bendability of the wire when the LED filament 300 is bent. In other embodiments, the LED chip unit longitudinally may have an angle with the X direction as the conductor 330*a*, which may further reduce the overall width of the LED filament 300.

Figure 22A:
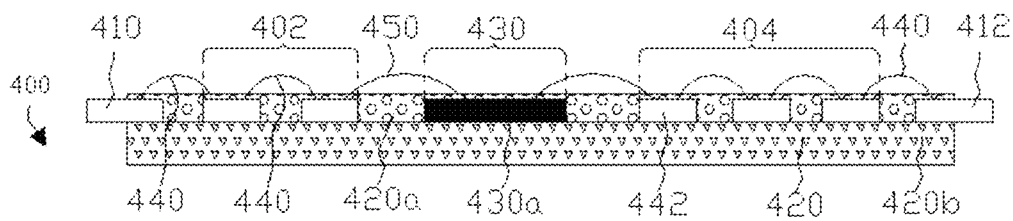
FIG. 22A is a schematic structural view showing an embodiment of a layered structure of an LED filament in accordance with the present invention.
Figure 22B:
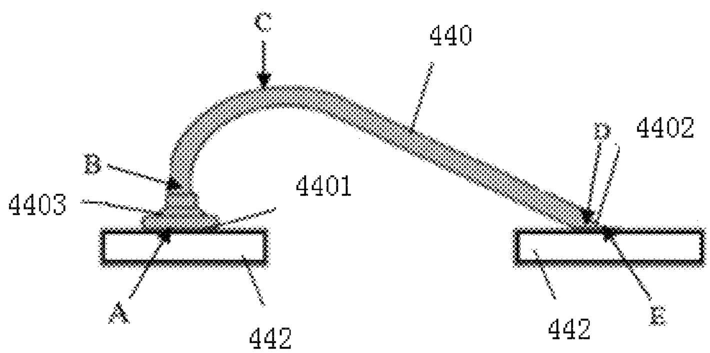
FIG. 22B is a schematic structural view of an LED chip bonding wire of an embodiment in accordance with the present invention.

FIG. 22A is a schematic view showing an embodiment of a layered structure of the LED filament 400 of the present invention. The LED filament 400 has a light conversion layer 420, two LED chip units 402, 404, two conductive electrodes 410, 412, and a conductive section 430 for electrically connecting adjacent two LED chip units 402, 404. Each of the LED chip units 402, 404 includes at least two LED chips 442 that are electrically connected to each other by wires 440. In the present embodiment, the conductive section 430 includes a conductor 430, and the conductive section 430 is electrically connected to the LED sections 402, 404 through the wires 450. The shortest distance between the two LED chips 442 located in the adjacent two LED chip units 402, 404 is greater than the distance between adjacent two LED chips in the same chip unit 402/404. Moreover, the length of wire 440 is less than the length of conductor 430*a*. The light conversion layer 420 is disposed on the LED chip 442 and at least two sides of the conductive electrodes 410, 412. The light conversion layer 420 exposes a portion of the conductive electrodes 410, 412. The light conversion layer 420 may be composed of at least one top layer 420*a* and one base layer 420*b* as the upper layer and the lower layer of the LED filament respectively. In the present embodiment, the LED chips 442 and the conductive electrodes 410, 412 are sandwiched in between the top layer 420*a* and the base layer 420*b*. When the wire bonding process of the face up chip is carried out along the x direction, for example, the bonding wire and the bonding conductor are gold wires, the quality of the bonding wire is mainly determined by the stress at the five points A, B, C, D, and E as shown in FIG. 22B. The point A is the junction of the soldering pad 4401 and the gold ball 4403, point B is the junction of the gold ball 4403 and the gold wire 440, point C is between the two segments of the gold wire 440, point D is the gold wire 440 and the two solder butted joints 4402, and the point E is between the two solder butted joints 4402 and the surface of the chip 442. Because of point B is the first bending point of the gold wire 440, and the gold wire 440 at the point D is thinner, thus gold wire 440 is frangible at points B and D. So that, for example, in the implementation of the structure of the LED filament 300 package showing in FIG. 22A, the top layer 420*a* only needs to cover points B and D, and a portion of the gold wire 440 is exposed outside the light conversion layer. If one of the six faces of the LED chip 442 farthest from the base layer 420*b* is defined as the upper surface of the LED chip 442, the distance from the upper surface of the LED chip 442 to the surface of the top layer 420*a* is in a range of around 100 to 200 μm.

The next part will describe the material of the filament of the present invention. The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general formula (I):

(I)

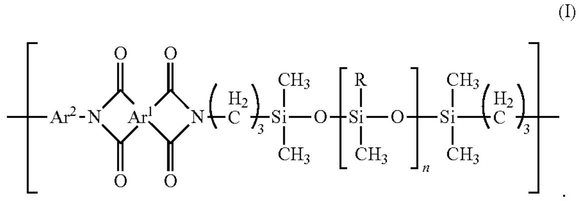

In general formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

$Ar^2$ is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing, especially the elongation tends to decrease. On the other hand, when it exceeds 100000, the viscosity becomes too high and the resin is hard to be formed.

$Ar^1$ is a component derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N'-(5,5'-(perfluoropropane-2,2-diyl) bis(2-hydroxy-5,1-phenylene))bis(1,3-dioxo-1,3-dihydroisobenzofuran)-5-arboxamide) (6FAP-ATA), and N,N'-(9H-fluoren-9-ylidenedi-4,1-phenylene)bis[1,3-dihydro-1,3-dioxo-5-isobenzofuran carboxamide] (FDA-ATA). Examples of the aromatic anhydride comprising ester group include p-phenylene bis(trimellitate) dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), 2,3,3',4'-diphenyl ether tetracarboxylic dianhydride (aODPA), and 4,4'-(4,4'-isopropylidenediphenoxy)bis (phthalic anhydride)(BPADA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride (BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8(4H)-tetrone (TCA), hexahydro-4,8-ethano-1H,3H-benzo[1,2-C:4,5-C']difuran-1,3,5,7-tetrone (BODA), cyclobutane-1,2,3,4-tetracarboxylic dianhydride (CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenonetetracarboxylic dianhydride (BTDA), cyclobutanctetracarboxylic dianhydride (CBDA) and 4,4'-(hexafluoroisopropylidene)diphthalic anhydride (6FDA) are preferred. The above dianhydride can be used alone or in combination.

$Ar^2$ is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-dimethylbiphenyl-4,4'-diamine, 9,9-bis(4-aminophenyl)fluorene (FDA), 9,9-bis(4-amino-3-methylphenyl)fluorene, 2,2-bis (4-aminophenyl)propane, 2,2-bis(3-methyl-4-aminophenyl) propane, 4,4'-diamino-2,2'-dimethylbiphenyl(APB). The fluorinated aromatic diamine includes 2,2'-bis(trifluoromethyl)benzidine (TFMB), 2,2-bis(4-aminophenyl)hexafluoropropane (6FDAM), 2,2-bis[4-(4-aminophenoxy)phenyl] hexafluoropropane (HFBAPP), and 2,2-bis(3-amino-4-methylphenyl)hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate (BPTP), and 4-aminophenyl 4-aminobenzoate (APAB). The aromatic diamine comprising ether group includes 2,2-bis[4-(4-aminophenoxy)phenyl]propane)(BAPP), 2,2'-bis[4-(4-aminophenoxy)phenyl] propane (ET-BDM), 2,7-bis(4-aminophenoxy)-naphthalene (ET-2,7-Na), 1,3-bis(3-aminophenoxy)benzene (TPE-M), 4,4'-[1,4-phenyldi(oxy)]bis[3-(trifluoromethyl)aniline] (p-6FAPB), 3,4'-diaminodiphenyl ether, 4,4'-diaminodiphenyl ether (ODA), 1,3-bis(4-aminophenoxy)benzene (TPE-R), 1,4-bis(4-aminophenoxy)benzene (TPE-Q), and 4,4'-bis (4-aminophenoxy)biphenyl(BAPB). The aromatic diamine comprising amido group includes N,N'-bis(4-aminophenyl) benzene-1,4-dicarboxamide (BPTPA), 3,4'-diamino benzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylanediyl-dibenzoic acid). The aromatic diamine comprising hydroxyl group includes 3,3'-dihydroxybenzidine (HAB), and 2,2-bis(3-amino-4-hydroxyphenyl) hexafluoropropane (6FAP). The aromatic diamine comprising carboxy group includes 6,6'-diamino-3,3'-methylanediyl-dibenzoic acid (MBAA), and 3,5-diaminobenzoic acid (DBA). The aromatic diamine comprising sulfonyl group includes 3,3'-diaminodiphenyl sulfone (DDS),4,4'-diaminodiphenyl sulfone, bis[4-(4-aminophenoxy)phenyl]sulfone (BAPS) (or referred to as 4,4'-bis(4-aminophenoxy)diphenylsulfone), and 3,3'-diamino-4,4'-dihydroxydiphenyl sulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminodicyclohexylmethane (PACM), and 3,3'-dimethyl-4,4-diaminodicyclohexylmethane (DMDC). The siloxane diamine (or referred to as amino-modified silicone) includes α,ω-(3-aminopropyl)polysiloxane (KF8010), X22-161A, X22-161B, NH15D, and 1,3-bis(3-aminopropyl)-1,1,3,3-tetramethyldisiloxane (PAME). The straight chain alkyl diamine has 6~12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis (3'-amino-5'-trifluoromethylphenoxy)biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane (BAP), 2,2-bis (3-amino-4-hydroxyphenyl)hexafluoropropane(6FAP), 1,3-bis(3-hydro-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diaminobenzanilide (DABA), 2-(4-aminophenyl)-5-aminobenzoimidazole, diethylenetriamine, 3,3'-diaminodipropylamine, triethylenetetramine, and N,N'-bis(3-aminopropyl)ethylenediamine (or referred to as N,N-di(3-aminopropyl)ethylethylamine). Examples of diamines comprising thiol group include 3,4-diaminobenzenethiol. The above diamines can be used alone or in combination.

The organosilicon-modified polyimide can be synthesized by well-known synthesis methods. For example, it can be prepared from a dianhydride and a diamine which are dissolved in an organic solvent and subjected to imidation in the presence of a catalyst. Examples of the catalyst include acetic anhydride/triethylamine, and valerolactone/pyridine. Preferably, removal of water produced in the azeotropic process in the imidation is promoted by using a dehydrant such as toluene.

Polyimide can also be obtained by carrying out an equilibrium reaction to give a poly(amic acid) which is heated to dehydrate. In other embodiments, the polyimide backbone may have a small amount of amic acid. For example, the ratio of amic acid to imide in the polyimide molecule may be 1~3:100. Due to the interaction between amic acid and the epoxy resin, the substrate has superior properties. In other embodiments, a solid state material such as a thermal curing agent, inorganic heat dispersing particles and phosphor can also be added at the state of poly(amic acid) to give the substrate. In addition, solubilized polyimide can also be obtained by direct heating and dehydration after mixing of alicylic anhydride and diamine. Such solubilized polyimide, as an adhesive material, has a good light transmittance. In addition, it is liquid state; therefore, other solid materials (such as the inorganic heat dispersing particles and the phosphor) can be dispersed in the adhesive material more sufficiently.

In one embodiment for preparing the organosilicon-modified polyimide, the organosilicon-modified polyimide can be produced by dissolving the polyimide obtained by heating and dehydration after mixing a diamine and an anhydride and a siloxane diamine in a solvent. In another embodiment, the amidic acid, before converting to polyimide, is reacted with the siloxane diamine.

In addition, the polyimide compound may be obtained by dehydration and ring-closing and condensation polymerization from an anhydride and a diamine, such as an anhydride and a diamine in a molar ratio of 1:1. In one embodiment, 200 micromole (mmol) of 4,4'-(hexafluoroisopropylidene) diphthalic anhydride(6FDA), 20 micromole (mmol) of 2,2-bis(3-amino-4-hydroxyphenyl)hexafluoropropane(6FAP), 50 micromole (mmol) of 2,2'-di(trifluoromethyl)diaminobiphenyl(TFMB) and 130 micromole (mmol) of aminopropyl-terminated poly(dimethylsiloxane) are used to give the PI synthesis solution.

The above methods can be used to produce amino-terminated polyimide compounds. However, other methods can be used to produce carboxy-terminated polyimide compounds. In addition, in the above reaction between anhydride and diamine, where the backbone of the anhydride comprises a carbon-carbon triple bond, the affinity of the carbon-carbon triple bond can promote the molecular structure. Alternatively, a diamine comprising vinyl siloxane structure can be used.

The molar ratio of dianhydride to diamine may be 1:1. The molar percentage of the diamine comprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the phosphor and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine (having a structure shown in formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

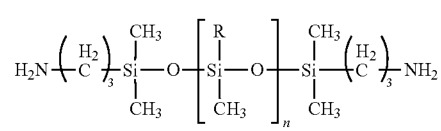

Wherein R is methyl or phenyl, preferably methyl, n is 1~5, preferably 1, 2, 3 or 5.

The only requirements on the organic solvent used for synthesizing the organosilicon-modified polyimide are to dissolve the organosilicon-modified polyimide and to ensure the affinity (wettability) to the phosphor or the fillers to be added. However, excessive residue of the solvent in the product should be avoided. Normally, the number of moles of the solvent is equal to that of water produced by the reaction between diamine and anhydride. For example, 1 mol diamine reacts with 1 mol anhydride to give 1 mol water; then the amount of solvent is 1 mol. In addition, the organic solvent used has a boiling point of above 80° C. and below 300° C., more preferably above 120° C. and below 250° C., under standard atmospheric pressure. Since drying and curing under a lower temperature are needed after coating, if the temperature is lower than 120° C., good coating cannot be achieved due to high drying speed during the coating process. If the boiling point of the organic solvent is higher than 250° C., the drying under a lower temperature may be deferred. Specifically, the organic solvent may be an ether-type organic solvent, an ester-type organic solvent, a dimethyl ether-type organic solvent, a ketone-type organic solvent, an alcohol-type organic solvent, an aromatic hydrocarbon solvent or other solvents. The ether-type organic solvent includes ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol dimethyl ether, diethylene glycol diethyl ether, diethylene glycol methyl ethyl ether, dipropylene glycol dimethyl ether or diethylene glycol dibutyl ether, and diethylene glycol butyl methyl ether. The ester-type organic solvent includes acetates, including ethylene glycol monoethyl ether acetate, diethylene glycol monobutyl ether acetate, propylene glycol monomethyl ether acetate, propyl acetate, propylene glycol diacetate, butyl acetate, isobutyl acetate, 3-methoxybutyl acetate, 3-methyl-3-methoxybutyl acetate, benzyl acetate and 2-(2-butoxyethoxy)ethyl acetate; and methyl lactate, ethyl lactate, n-butyl acetate, methyl benzoate and ethyl benzoate. The dimethyl ether-type solvent includes triethylene glycol dimethyl ether and tetraethylene glycol dimethyl ether. The ketone-type solvent includes acetylacetone, methyl propyl ketone, methyl butyl ketone, methyl isobutyl ketone, cyclopentanone, and 2-heptanone. The alcohol-type solvent includes butanol, isobutanol, isopentanol, 4-methyl-2-pentanol, 3-methyl-2-butanol, 3-methyl-3-methoxybutanol, and diacetone alcohol. The aromatic hydrocarbon solvent includes toluene and xylene. Other solvents include γ-butyrolactone, N-methylpyrrolidone, N,N-dimethylformamide, N,N-dimethylacetamide and dimethyl sulfoxide.

The present disclosure provides an organosilicon-modified polyimide resin composition comprising the above organosilicon-modified polyimide and a thermal curing agent, which may be epoxy resin, hydrogen isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and phosphor.

Light Transmittance

The factors affecting the light transmittance of the organosilicon-modified polyimide resin composition at least include the type of the main material, the type of the modifier (thermal curing agent), the type and content of the heat dispersing particles, and the siloxane content. Light transmittance refers to the transmittance of the light near the main light-emitting wavelength range of the LED chip. For example, blue LED chip has a main light-emitting wavelength of around 450 nm, then the composition or the polyimide should have low enough or even no absorption to the light having a wavelength around 450 nm, so as to ensure that most or even all the light can pass through the composition or the polyimide. In addition, when the light emitted by the LED chip passes through the interface of two materials, the closer the refractive indexes of the two materials, the higher the light output efficiency. In order to be close to the refractive index of the material (such as die bonding glue) contacting with the filament substrate (or base layer), the organosilicon-modified polyimide composition has a refractive index of 1.4~1.7, preferably 1.4~1.55. In order to use the organosilicon-modified polyimide resin composition as substrate in the filament, the organosilicon-modified polyimide resin composition is required to have good light transmittance at the peak wavelength of InGaN of the blue-excited white LED. In order to obtain a good transmittance, the raw materials for synthesizing the organosilicon-modified polyimide, the thermal curing agent and the heat dispersing particles can be adjusted. Because the phosphor in the organosilicon-modified polyimide resin composition may have certain effect on the transmittance test, the organosilicon-modified polyimide resin composition used for the transmittance test does not comprise phosphor. Such an organosilicon-modified polyimide resin composition has a transmittance of 86~93%, preferably 88~91%, or preferably 89~92%, or preferably 90~93%.

In the reaction of anhydride and diamine to produce polyimide, the anhydride and the diamine may vary. In other words, the polyimides produced from different anhydrides and different diamines may have different light transmittances. The aliphatic organosilicon-modified polyimide resin composition comprises the aliphatic organosilicon-modified polyimide and the thermal curing agent, while the fluorinated aromatic organosilicon-modified polyimide resin composition comprises the fluorinated aromatic organosilicon-modified polyimide and the thermal curing agent. Since the aliphatic organosilicon-modified polyimide has an alicyclic structure, the aliphatic organosilicon-modified polyimide resin composition has a relatively high light transmittance. In addition, the fluorinated aromatic, semi-aliphatic and full aliphatic polyimides all have good light transmittance in respect of the blue LED chips. The fluorinated aromatic organosilicon-modified polyimide is synthesized from a siloxane-type diamine, an aromatic diamine comprising a fluoro (F) group (or referred to as fluorinated aromatic diamine) and an aromatic dianhydride comprising a fluoro (F) group (or referred to as fluorinated aromatic anhydride). In other words, both $Ar^1$ and $Ar^2$ comprise a fluoro (F) group. The semi-aliphatic and full aliphatic organosilicon-modified polyimides are synthesized from a dianhydride, a siloxane-type diamine and at least one diamine not comprising an aromatic structure (e.g. a benzene ring) (or referred to as aliphatic diamine), or from a diamine (one of the diamine is siloxane-type diamine) and at least one dianhydride not comprising an aromatic structure (e.g. a benzene ring) (or referred to as aliphatic anhydride). In other words, at least one of $Ar^1$ and $Ar^2$ has an alicyclic hydrocarbon structure.

Although blue LED chips have a main light-emitting wavelength of 450 nm, they may still emit a minor light having a shorter wavelength of around 400 nm, due to the difference in the conditions during the manufacture of the chips and the effect of the environment. The fluorinated aromatic, semi-aliphatic and full aliphatic polyimides have different absorptions to the light having a shorter wavelength of 400 nm. The fluorinated aromatic polyimide has an absorbance of about 20% to the light having a shorter wavelength of around 400 nm, i.e. the light transmittance of the light having a wavelength of 400 nm is about 80% after passing through the fluorinated aromatic polyimide. The semi-aliphatic and full aliphatic polyimides have even lower absorbance to the light having a shorter wavelength of 400 nm than the fluorinated aromatic polyimide, which is only 12%. Accordingly, in an embodiment, if the LED chips used in the LED filament have a uniform quality, and emit less blue light having a shorter wavelength, the fluorinated aromatic organosilicon-modified polyimide may be used to produce the filament substrate or the light-conversion layer. In another embodiment, if the LED chips used in the LED filament have different qualities, and emit more blue light having a shorter wavelength, the semi-aliphatic or full aliphatic organosilicon-modified polyimides may be used to produce the filament substrate or the light-conversion layer.

Adding different thermal curing agents imposes different effects on the light transmittance of the organosilicon-modified polyimide. Table 1-1 shows the effect of the addition of different thermal curing agents on the light transmittance of the full aliphatic organosilicon-modified polyimide. At the main light-emitting wavelength of 450 nm for the blue LED chip, the addition of different thermal curing agents renders no significant difference to the light transmittance of the full aliphatic organosilicon-modified polyimide; while at a short wavelength of 380 nm, the addition of different thermal curing agents does affect the light transmittance of the full aliphatic organosilicon-modified polyimide. The organosilicon-modified polyimide itself has a poorer transmittance to the light having a short wavelength (380 nm) than to the light having a long wavelength (450 nm). However, the extent of the difference varies with the addition of different thermal curing agents. For example, when the thermal curing agent KF105 is added to the full aliphatic organosilicon-modified polyimide, the extent of the reduction in the light transmittance is less. In comparison, when the thermal curing agent 2021p is added to the full aliphatic organosilicon-modified polyimide, the extent of the reduction in the light transmittance is more. Accordingly, in an embodiment, if the LED chips used in the LED filament have a uniform quality, and emit less blue light having a short wavelength, the thermal curing agent BPA or the thermal curing agent 2021p may be added. In comparison, in an embodiment, if the LED chips used in the LED filament have different qualities, and emit more blue light having a short wavelength, the thermal curing agent KF105 may be used. Both Table 1-1 and Table 1-2 show the results obtained in the transmittance test using Shimadzu UV-Vis Spectrometer UV-1800. The light transmittances at wavelengths 380 nm, 410 nm and 450 nm are tested based on the light emission of white LEDs.

Even when the same thermal curing agent is added, different added amount thereof will have different effects on the light transmittance. Table 1-2 shows that when the added amount of the thermal curing agent BPA to the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to certain degree, adding more thermal curing agent will have limited effect on the light transmittance.

Different heat dispersing particles would have different transmittances. If heat dispersing particles with low light transmittance or low light reflection are used, the light transmittance of the organosilicon-modified polyimide resin composition will be lower. The heat dispersing particles in the organosilicon-modified polyimide resin composition of the present disclosure are preferably selected to be transparent powders or particles with high light transmittance or high light reflection. Since the soft filament for the LED is mainly for the light emission, the filament substrate should have good light transmittance. In addition, when two or more types of heat dispersing particles are mixed, particles with high light transmittance and those with low light transmittance can be used in combination, wherein the proportion of particles with high light transmittance is higher than that of particles with low light transmittance. In an embodiment, for example, the weight ratio of particles with high light transmittance to particles with low light transmittance is 3~5:1.

Different siloxane content also affects the light transmittance. As can be seen from Table 2, when the siloxane content is only 37 wt %, the light transmittance is only 85%. When the siloxane content is increased to above 45%, the light transmittance exceeds 94%.

TABLE 1-1

| Organosilicon-Modified Polyimides | Thermal Curing Agent Types | Thermal Curing Agent Amount (%) | Light Transmittance (%) 380 nm | 410 nm | 450 nm | Film Thickness (μm) | Mechanical Strength Elongation (%) | Tensile Strength (MPa) |
|---|---|---|---|---|---|---|---|---|
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 44 | 43.4 | 8.0 |
| Full Aliphatic | KF105 | 8.0 | 87.2 | 88.9 | 90.4 | 44 | 72.6 | 7.1 |
| Full Aliphatic | EHPE3150 | 8.0 | 87.1 | 88.9 | 90.5 | 44 | 40.9 | 13.1 |
| Full Aliphatic | 2021p | 8.0 | 86.1 | 88.1 | 90.1 | 44 | 61.3 | 12.9 |

TABLE 1-2

| Organosilicon-Modified Polyimide | Thermal Curing Agent Type | Thermal Curing Agent Amount (%) | Light Transmittance (%) 380 nm | 410 nm | 450 nm | Film Thickness (mm) | Mechanical Strength Elongation (%) | Tensile Strength (MPa) |
|---|---|---|---|---|---|---|---|---|
| Full Aliphatic | BPA | 4.0 | 86.2 | 88.4 | 89.7 | 44 | 22.5 | 9.8 |
| Full Aliphatic | | 8.0 | 87.1 | 89.1 | 90.6 | 44 | 24.4 | 10.5 |
| Full Aliphatic | | 12.0 | 87.3 | 88.9 | 90.5 | 44 | 20.1 | 9.0 |

TABLE 2

| Organosilicon-Modified Polyimide | Siloxane Content (wt %) | Thermal Curing Agent | Tg (° C.) | Tensile Strength (MPa) | Elastic Modulus(GPa) | Elongation at Break (%) | Transmittance | Chemical Resistance | Resistance to Thermochromism |
|---|---|---|---|---|---|---|---|---|---|
| 1 | 37 | BPA | 158 | 33.2 | 1.7 | 10 | 85 | Δ | 83 |
| 2 | 41 | BPA | 142 | 38.0 | 1.4 | 12 | 92 | O | 90 |
| 3 | 45 | BPA | 145 | 24.2 | 1.1 | 15 | 97 | Δ | 90 |
| 4 | 64 | BPA | 30 | 8.9 | 0.04 | 232 | 94 | O | 92 |
| 5 | 73 | BPA | 0 | 1.8 | 0.001 | 291 | 96 | O | 95 |

Heat Resistance

The factors affecting the heat resistance of the organosilicon-modified polyimide resin composition include at least the type of the main material, the siloxane content, and the type and content of the modifier (thermal curing agent).

All the organosilicon-modified polyimide resin composition synthesized from fluorinated aromatic, semi-aliphatic and, full aliphatic organosilicon-modified polyimide have superior heat resistance, and are suitable for producing the filament substrate or the light-conversion layer. Detailed results from the accelerated heat resistance and aging tests (300° C.×1 hr) show that the fluorinated aromatic organosilicon-modified polyimide has better heat resistance than the aliphatic organosilicon-modified polyimide. Accordingly, in an embodiment, if a high power, high brightness LED chip is used as the LED filament, the fluorinated aromatic organosilicon-modified polyimide may be used to produce the filament substrate or the light-conversion layer.

The siloxane content in the organosilicon-modified polyimide will affect the resistance to thermochromism of the organosilicon-modified polyimide resin composition. The resistance to thermochromism refers to the transmittance determined at 460 nm after placing the sample at 200° C. for 24 hours. As can be seen from Table 2, when the siloxane content is only 37 wt %, the light transmittance after 24 hours at 200° C. is only 83%. As the siloxane content is increased, the light transmittance after 24 hours at 200° C. increases gradually. When the siloxane content is 73 wt %, the light transmittance after 24 hours at 200° C. is still as high as 95%. Accordingly, increasing the siloxane content can effectively increase the resistance to thermochromism of the organosilicon-modified polyimide.

Figure 23:
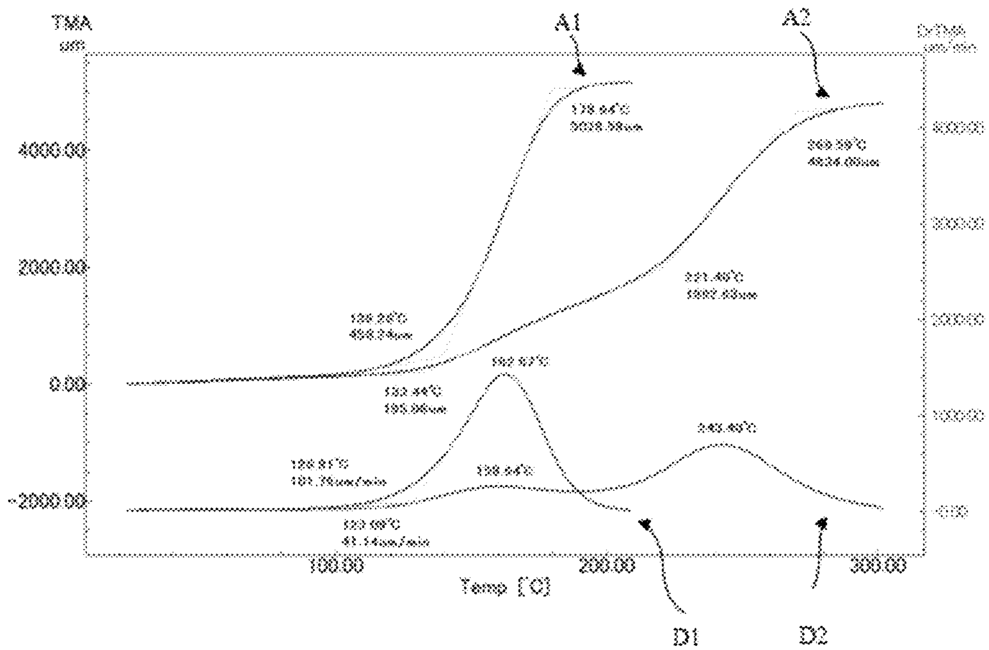
FIG. 23 shows the TMA analysis of the polyimide before and after adding the thermal curing agent.

Adding a thermal curing agent can lead to increased heat resistance and glass transition temperature. As shown in FIGS. 23, A1 and A2 represent the curves before and after adding the thermal curing agent, respectively; and the curves D1 and D2 represent the values after differential computation on curves A1 and A2, respectively, representing the extent of the change of curves A1 and A2. As can be seen from the analysis results from TMA (thermomechanical analysis) shown in FIG. 23, the addition of the thermal curing agent leads to a trend that the thermal deformation slows down. Accordingly, adding a thermal curing agent can lead to increase of the heat resistance.

In the cross-linking reaction between the organosilicon-modified polyimide and the thermal curing agent, the thermal curing agent should have an organic group which is capable of reacting with the functional group having active hydrogen in the polyimide. The amount and the type of the thermal curing agent have certain effects on chromism, mechanical property and refractive index of the substrate. Accordingly, a thermal curing agent with good heat resistance and transmittance can be selected. Examples of the thermal curing agent include epoxy resin, isocyanate, bismaleimide, and bisoxazoline compounds. The epoxy resin may be bisphenol A epoxy resin, such as BPA; or siloxane-type epoxy resin, such as KF105, X22-163, and X22-163A; or alicylic epoxy resin, such as 3,4-epoxycyclohexylmethyl3,4-epoxycyclohexanecarboxylate (2021P), EHPE3150, and EHPE3150CE. Through the bridging reaction by the epoxy resin, a three dimensional bridge structure is formed between the organosilicon-modified polyimide and the epoxy resin, increasing the structural strength of the adhesive itself. In an embodiment, the amount of the thermal curing agent may be determined according to the molar amount of the thermal curing agent reacting with the functional group having active hydrogen in the organosilicon-modified polyimide. In an embodiment, the molar amount of the functional group having active hydrogen reacting with the thermal curing agent is equal to that of the thermal curing agent. For example, when the molar amount of the functional group having active hydrogen reacting with the thermal curing agent is 1 mol, the molar amount of the thermal curing agent is 1 mol.

Thermal Conductivity

The factors affecting the thermal conductivity of the organosilicon-modified polyimide resin composition include at least the type and content of the phosphor, the type and content of the heat dispersing particles and the addition and the type of the coupling agent. In addition, the particle size and the particle size distribution of the heat dispersing particles would also affect the thermal conductivity.

The organosilicon-modified polyimide resin composition may also comprise phosphor for obtaining the desired light-emitting properties. The phosphor can convert the wavelength of the light emitted from the light-emitting semiconductor. For example, yellow phosphor can convert blue light to yellow light, and red phosphor can convert blue light to red light. Examples of yellow phosphor include transparent phosphor such as $(Ba,Sr,Ca)_2SiO_4$:Eu, and $(Sr,Ba)_2$ $SiO_4$:Eu(barium orthosilicate (BOS)); silicate-type phosphor having a silicate structure such as $Y_3Al_5O_{12}$:Ce(YAG (yttrium·aluminum·garnet):Ce), and $Tb_3Al_3O_{12}$:Ce(YAG (terbium·aluminum·garnet):Ce); and oxynitride phosphor such as Ca-α-SiAlON. Examples of red phosphor include nitride phosphor, such as $CaAlSiN_3$:Eu, and $CaSiN_2$:Eu. Examples of green phosphor include rare earth-halide phosphor, and silicate phosphor. The ratio of the phosphor in the organosilicon-modified polyimide resin composition may be determined arbitrarily according to the desired light-emitting property. In addition, since the phosphor have a thermal conductivity which is significantly higher than that of the organosilicon-modified polyimide resin, the thermal conductivity of the organosilicon-modified polyimide resin composition as a whole will increase as the ratio of the phosphor in the organosilicon-modified polyimide resin composition increases. Accordingly, in an embodiment, as long as the light-emitting property is fulfilled, the content of the phosphor can be suitably increased to increase the thermal conductivity of the organosilicon-modified polyimide resin composition, which is beneficial to the heat dissipation of the filament substrate or the light-conversion layer. Furthermore, when the organosilicon-modified polyimide resin composition is used as the filament substrate, the content, shape and particle size of the phosphor in the organosilicon-modified polyimide resin composition also have certain effect on the mechanical property (such as the elastic modulus, elongation, tensile strength) and the warpage extent of the substrate. In order to render superior mechanical property and thermal conductivity as well as small warpage extent to the substrate, the phosphor included in the organosilicon-modified polyimide resin composition are particulate, and the shape thereof may be sphere, plate or needle, preferably sphere. The maximum average length of the phosphor (the average particle size when they are spherical) is above 0.1 μm, preferably over 1 μm, further preferably 1~100 μm, and more preferably 1~50 μm. The content of phosphor is no less than 0.05 times, preferably no less than 0.1 times, and no more than 8 times, preferably no more than 7 times, the weight of the organosilicon-modified polyimide. For example, when the weight of the organosilicon-modified polyimide is 100 parts in weight, the content of the phosphor is no less than 5 parts in weight, preferably no less than 10 parts in weight, and no more than 800 parts in weight, preferably no more than 700 parts in weight. When the content of the phosphor in the organosilicon-modified polyimide resin composition exceeds 800 parts in weight, the mechanical property of the organosilicon-modified polyimide resin composition may not achieve the strength as required for a filament substrate, resulting in the increase of the defective rate of the product. In an embodiment, two kinds of phosphor are added at the same time. For example, when red phosphor and green phosphor are added at the same time, the added ratio of red phosphor to green phosphor is 1:5~8, preferably 1:6~7. In another embodiment, red phosphor and yellow phosphor are added at the same time, wherein the added ratio of red phosphor to yellow phosphor is 1:5~8, preferably 1:6~7. In another embodiment, three or more kinds of phosphor are added at the same time.

The main purposes of adding the heat dispersing particles are to increase the thermal conductivity of the organosilicon-modified polyimide resin composition, to maintain the color temperature of the light emission of the LED chip, and to prolong the service life of the LED chip. Examples of the heat dispersing particles include silica, alumina, magnesia, magnesium carbonate, aluminum nitride, boron nitride and diamond. Considering the dispersity, silica, alumina or the combination thereof are some preferable choices. The shape of the heat dispersing particles may be sphere, block, etc., where the sphere shape encompasses shapes which are similar to sphere. In an embodiment, heat dispersing particles may be in a shape of sphere or non-sphere, to ensure the dispersity of the heat dispersing particles and the thermal conductivity of the substrate, wherein the added weight ratio of the spherical and non-spherical heat dispersing particles is 1:0.15~0.35.

Table 3-1 shows the relationship between the content of the heat dispersing particles and the thermal conductivity of the organosilicon-modified polyimide resin composition. As the content of the heat dispersing particles increases, the thermal conductivity of the organosilicon-modified polyimide resin composition increases. However, when the content of the heat dispersing particles in the organosilicon-modified polyimide resin composition exceeds 1200 parts in weight, the mechanical property of the organosilicon-modified polyimide resin composition may not achieve the strength as required for a filament substrate, resulting in the increase of the defective rate of the product. In an embodiment, high content of heat dispersing particles with high light transmittance or high reflectivity (such as $SiO_2$, $Al_2O_3$) may be added, which, in addition to maintaining the transmittance of the organosilicon-modified polyimide resin composition, increases the heat dissipation of the organosilicon-modified polyimide resin composition. The heat conductivities shown in Tables 3-1 and 3-2 were measured by a thermal conductivity meter DRL-III manufactured by Xiangtan city instruments Co., Ltd. under the following test conditions: heating temperature: 90° C.; cooling temperature: 20° C.; load: 350N, after cutting the resultant organosilicon-modified polyimide resin composition into test pieces having a film thickness of 300 μm and a diameter of 30 mm.

TABLE 3-1

| | | | | | | | |
|---|---|---|---|---|---|---|---|
| Weight Ratio [wt %] | 0.0% | 37.9% | 59.8% | 69.8% | 77.6% | 83.9% | 89.0% |
| Volume Ratio [vol %] | 0.0% | 15.0% | 30.0% | 40.0% | 50.0% | 60.0% | 70.0% |
| Thermal Conductivity[W/m*K] | 0.17 | 0.20 | 0.38 | 0.54 | 0.61 | 0.74 | 0.81 |

TABLE 3-2

| Specification | 1 | 2 | 3 | 4 | 5 | 6 | 7 |
|---|---|---|---|---|---|---|---|
| Average Particle Size[μm] | 2.7 | 6.6 | 9.0 | 9.6 | 13 | 4.1 | 12 |
| Particle Size Distribution[μm] | 1~7 | 1~20 | 1~30 | 0.2~30 | 0.2~110 | 0.1~20 | 0.1~100 |
| Thermal Conductivity[W/m*K] | 1.65 | 1.48 | 1.52 | 1.86 | 1.68 | 1.87 | 2.10 |

Figure 24:
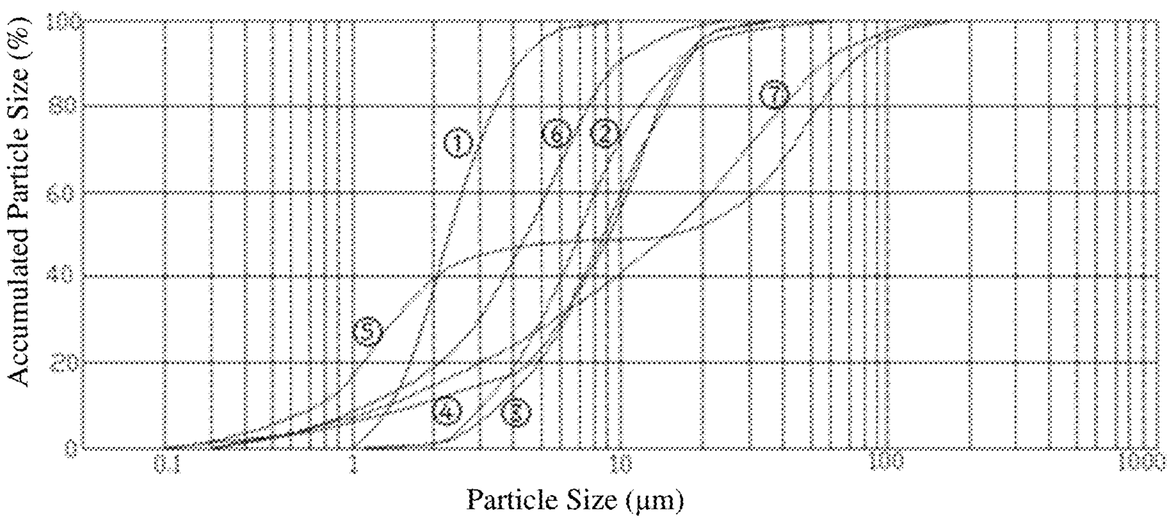
FIG. 24 shows the particle size distributions of the heat dispersing particles with different specifications.

For the effects of the particle size and the particle size distribution of the heat dispersing particles on the thermal conductivity of the organosilicon-modified polyimide resin composition, see both Table 3-2 and FIG. 24. Table 3-2 and FIG. 24 show seven heat dispersing particles with different specifications added into the organosilicon-modified polyimide resin composition in the same ratio and their effects on the thermal conductivity. The particle size of the heat dispersing particles suitable to be added to the organosilicon-modified polyimide resin composition can be roughly classified as small particle size (less than 1 μm), medium particle size (1-30 μm) and large particle size (above 30 μm).

Comparing specifications 1, 2 and 3, wherein only heat dispersing particles with medium particle size but different average particle sizes are added, when only heat dispersing particles with medium particle size are added, the average particle size of the heat dispersing particles does not significantly affect the thermal conductivity of the organosilicon-modified polyimide resin composition. Comparing specifications 3 and 4, wherein the average particle sizes are similar, the specification 4 comprising small particle size and medium particle size obviously exhibits higher thermal conductivity than specification 3 comprising only medium particle size. Comparing specifications 4 and 6, which comprise heat dispersing particles with both small particle size and medium particle size, although the average particle sizes of the heat dispersing particles are different, they have no significant effect on the thermal conductivity of the organosilicon-modified polyimide resin composition. Comparing specifications 4 and 7, specification 7, which comprises heat dispersing particles with large particle size in addition to small particle size and medium particle size, exhibits the most excellent thermal conductivity. Comparing specifications 5 and 7, which both comprise heat dispersing particles with large, medium and small particle sizes and have similar average particle sizes, the thermal conductivity of specification 7 is significantly superior to that of specification 5 due to the difference in the particle size distribution. See FIG. 24 for the particle size distribution of specification 7, the curve is smooth, and the difference in the slope is small, showing that specification 7 not only comprises each particle size, but also have moderate proportions of each particle size, and the particle size is normally distributed. For example, the small particle size represents about 10%, the medium particle size represents about 60%, and the large particle size represents about 30%. In contrast, the curve for specification 5 has two regions with large slopes, which locate in the region of particle size 1-2 μm and particle size 30-70 μm, respectively, indicating that most of the particle size in specification 5 is distributed in particle size 1-2 μm and particle size 30-70 μm, and only small amount of heat dispersing particles with particle size 3-20 μm are present, i.e. exhibiting a two-sided distribution.

Accordingly, the extent of the particle size distribution of the heat dispersing particles affecting the thermal conductivity is greater than that of the average particle size of the heat dispersing particles. When large, medium and small particle sizes of the heat dispersing particles are added, and the small particle size represents about 5-20%, the medium particle size represents about 50-70%, and large particle size represents about 20-40%, the organosilicon-modified polyimide resin will have optimum thermal conductivity. That is because when large, medium and small particle sizes are present, there would be denser packing and contacting each other of heat dispersing particles in a same volume, so as to form an effective heat dissipating route.

In an embodiment, for example, alumina with a particle size distribution of 0.1~100 μm and an average particle size of 12 μm or with a particle size distribution of 0.1~20 μm and an average particle size of 4.1 μm is used, wherein the particle size distribution is the range of the particle size of alumina. In another embodiment, considering the smoothness of the substrate, the average particle size may be selected as ⅕~⅖, preferably ⅕~⅓ of the thickness of the substrate. The amount of the heat dispersing particles may be 1~12 times the weight (amount) of the organosilicon-modified polyimide. For example, if the amount of the organosilicon-modified polyimide is 100 parts in weight, the amount of the heat dispersing particles may be 100~1200 parts in weight, preferably 400~900 parts in weight. Two different heat dispersing particles such as silica and alumina may be added at the same time, wherein the weight ratio of alumina to silica may be 0.4~25:1, preferably 1~10:1.

In the synthesis of the organosilicon-modified polyimide resin composition, a coupling agent such as a silicone coupling agent may be added to improve the adhesion between the solid material (such as the phosphor and/or the heat dispersing particles) and the adhesive material (such as the organosilicon-modified polyimide), and to improve the dispersion uniformity of the whole solid materials, and to further improve the heat dissipation and the mechanical strength of the light-conversion layer. The coupling agent may also be titanate coupling agent, preferably epoxy titanate coupling agent. The amount of the coupling agent is related to the amount of the heat dispersing particles and the specific surface area thereof. The amount of the coupling agent=(the amount of the heat dispersing particles*the specific surface area of the heat dispersing particles)/the minimum coating area of the coupling agent. For example, when an epoxy titanate coupling agent is used, the amount of the coupling agent=(the amount of the heat dispersing particles*the specific surface area of the heat dispersing particles)/331.5.

In other specific embodiments of the present invention, in order to further improve the properties of the organosilicon-modified polyimide resin composition in the synthesis process, an additive such as a defoaming agent, a leveling agent or an adhesive may be selectively added in the process of synthesizing the organosilicon-modified polyimide resin composition, as long as it does not affect light resistance, mechanical strength, heat resistance and chromism of the product. The defoaming agent is used to eliminate the foams produced in printing, coating and curing. For example, acrylic acid or silicone surfactants may be used as the defoaming agent. The leveling agent is used to eliminate the bumps in the film surface produced in printing and coating. Specifically, adding preferably 0.01~2 wt % of a surfactant component can inhibit foams. The coating film can be smoothened by using acrylic acid or silicone leveling agents, preferably non-ionic surfactants free of ionic impurities. Examples of the adhesive include imidazole compounds, thiazole compounds, triazole compounds, organoaluminum compounds, organotitanium compounds and silane coupling agents. Preferably, the amount of these additives is no more than 10% of the weight of the organosilicon-modified polyimide. When the mixed amount of the additive exceeds 10 wt %, the physical properties of the resultant coating film tend to decline, and it even leads to deterioration of the light resistance due to the presence of the volatile components.

Mechanical Strength

The factors affecting the mechanical strength of the organosilicon-modified polyimide resin composition include at least the type of the main material, the siloxane content, the type of the modifier (thermal curing agent), the phosphor and the content of the heat dispersing particles.

Different organosilicon-modified polyimide resins have different properties. Table 4 lists the main properties of the fluorinated aromatic, semi-aliphatic and full aliphatic organosilicon-modified polyimide, respectively, with a siloxane content of about 45% (wt %). The fluorinated aromatic has the best resistance to thermo chromism. The full aliphatic has the best light transmittance. The fluorinated aromatic has both high tensile strength and high elastic modulus. The conditions for testing the mechanical strengths shown in Table 4~6: the organosilicon-modified polyimide resin composition has a thickness of 50 μm and a width of 10 mm, and the tensile strength of the film is determined according to ISO527-3:1995 standard with a drawing speed of 10 mm/min.

TABLE 4

| Organosilicon-Modified Polyimide | Siloxane Content (wt %) | Thermal Curing Agent | Tensile Strength (MPa) | Elastic Modulus (GPa) | Elongation at Break (%) | Transmittance | Resistance to Thermo-chromism |
|---|---|---|---|---|---|---|---|
| Fluorinated Aromatic | 44 | X22-163 | 22.4 | 1.0 | 83 | 96 | 95 |
| Semi-Aliphatic | 44 | X22-163 | 20.4 | 0.9 | 30 | 96 | 91 |
| Full Aliphatic | 47 | X22-163 | 19.8 | 0.8 | 14 | 98 | 88 |

TABLE 5

| Siloxane Content (wt %) | Addition of Phosphor, Alumina | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 37 | x | BPA | 158 | 33.2 | 1.7 | 10 | 85 | Δ | 83 |
| 37 | ○ | BPA | — | 26.3 | 5.1 | 0.7 | — | — | — |
| 41 | x | BPA | 142 | 38.0 | 1.4 | 12 | 92 | ○ | 90 |
| 41 | ○ | BPA | — | 19.8 | 4.8 | 0.8 | — | — | — |
| 45 | x | BPA | 145 | 24.2 | 1.1 | 15 | 97 | Δ | 90 |
| 45 | ○ | BPA | — | 21.5 | 4.2 | 0.9 | — | — | — |
| 64 | x | BPA | 30 | 8.9 | 0.04 | 232 | 94 | ○ | 92 |
| 64 | ○ | BPA | — | 12.3 | 3.1 | 1.6 | — | — | — |
| 73 | x | BPA | 0 | 1.8 | 0.001 | 291 | 96 | ○ | 95 |
| 73 | ○ | BPA | — | 9.6 | 2.5 | 2 | — | — | — |

TABLE 6

| Organosilicon-Modified Polyimide | Thermal Curing Agent | | Transmittance (%) | | | Film | Mechanical Strength | |
|---|---|---|---|---|---|---|---|---|
| | Type | Amount (%) | 380 nm | 410 nm | 450 nm | Thickness (μm) | Elongation (%) | Tensile Strength(MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 40 | 43.4 | 8.0 |
| Full Aliphatic | KF105 | 12.0 | 87.5 | 89.2 | 90.8 | 43 | 80.8 | 7.5 |
| Full Aliphatic | EHPE3150 | 7.5 | 87.1 | 88.9 | 90.5 | 44 | 40.9 | 13.1 |
| Full Aliphatic | 2021p | 5.5 | 86.1 | 88.1 | 90.1 | 44 | 64.0 | 12.5 |

In the manufacture of the filament, the LED chip and the electrodes are first fixed on the filament substrate formed by the organosilicon-modified polyimide resin composition with a die bonding glue, followed by a wiring procedure, in which electric connections are established between adjacent LED chips and between the LED chip and the electrode with wires. To ensure the quality of die bonding and wiring, and to improve the product quality, the filament substrate should have a certain level of elastic modulus to resist the pressing force in the die bonding and wiring processes. Accordingly, the filament substrate should have an elastic modulus more than 2.0 GPa, preferably 2~6 GPa, more preferably 4~6 GPa. Table 5 shows the effects of different siloxane contents and the presence of particles (phosphor and alumina) on the elastic modulus of the organosilicon-modified polyimide resin composition. Where no fluorescent powder or alumina particle is added, the clastic modulus of the organosilicon-modified polyimide resin composition is always less than 2.0 GPa, and as the siloxane content increases, the elastic modulus tends to decline, i.e. the organosilicon-modified polyimide resin composition tends to soften. However, where phosphor and alumina particles are added, the elastic modulus of the organosilicon-modified polyimide resin composition may be significantly increased, and is always higher than 2.0 GPa. Accordingly, the increase in the siloxane content may lead to softening of the organosilicon-modified polyimide resin composition, which is advantageous for adding more fillers, such as more phosphor or heat dispersing particles. In order for the substrate to have superior elastic modulus and thermal conductivity, appropriate particle size distribution and mixing ratio may be selected so that the average particle size is within the range from 0.1 μm to 100 μm or from 1 μm to 50 μm.

In order for the LED filament to have good bending properties, the filament substrate should have an elongation at break of more than 0.5%, preferably 1~5%, most preferably 1.5~5%. As shown in Table 5, where no fluorescent powder or alumina particle is added, the organosilicon-modified polyimide resin composition has excellent elongation at break, and as the siloxane content increases, the elongation at break increases and the elastic modulus decreases, thereby reducing the occurrence of warpage. In contrast, where phosphor and alumina particles are added, the organosilicon-modified polyimide resin composition exhibits decreased elongation at break and increased elastic modulus, thereby increasing the occurrence of warpage.

By adding a thermal curing agent, not only the heat resistance and the glass transition temperature of the organosilicon-modified polyimide resin are increased, the mechanical properties, such as tensile strength, elastic modulus and elongation at break, of the organosilicon-modified polyimide are also increased. Adding different thermal curing agents may lead to different levels of improvement. Table 6 shows the tensile strength and the elongation at break of the organosilicon-modified polyimide resin composition after the addition of different thermal curing agents. For the full aliphatic organosilicon-modified polyimide, the addition of the thermal curing agent EHPE3150 leads to good tensile strength, while the addition of the thermal curing agent KF105 leads to good elongation.

TABLE 7

Specific Information of BPA

| Product Name | Viscosity at 25° C. (mPa · s) | Color (G) | Content of Hydrolysable Chlorine (mg/kg) | Equivalent of Epoxy (g/mol) | Hue APHA |
|---|---|---|---|---|---|
| BPA | 11000~15000 | ≤1 | ≤300 | 184~194 | ≤30 |

TABLE 8

Specific Information of 2021P

| Product Name | Viscosity at 25° C. (mPa.s) | Specific Gravity (25/25° C.) | Melting Point (° C.) | Boiling Point (° C./4 hPa) | Water Content (%) | Equivalent of Epoxy(g/mol) | Hue APHA |
|---|---|---|---|---|---|---|---|
| 2021P | 250 | 1.17 | −20 | 188 | 0.01 | 130 | 10 |

TABLE 9

Specific Information of EHPE3150 and EHPE3150CE

| Product Name | Viscosity at 25° C. (mPa · s) | Appearance | Softening Point | Equivalent of Epoxy (g/mol) | Hue APHA |
|---|---|---|---|---|---|
| EHPE3150 | — | Transparent Plate Solid | 75 | 177 | 20 (in 25% acetone solution) |
| EHPE3150CE | 50,000 | Light Yellow Transparent Liquid | — | 151 | 60 |

TABLE 10

Specific Information of PAME, KF8010, X22-161A, X22-161B, NH15D, X22-163, X22-163A and KF-105

| Product Name | Viscosity at 25° C. ($mm^2/s$) | Specific Gravity at 25° C. | Refractive Index at 25° C. | Equivalent of Functional Group |
|---|---|---|---|---|
| PAME | 4 | 0.90 | 1.448 | 130 g/mol |
| KF8010 | 12 | 1.00 | 1.418 | 430 g/mol |
| X22-161A | 25 | 0.97 | 1.411 | 800 g/mol |
| X22-161B | 55 | 0.97 | 1.408 | 1500 g/mol |
| NH15D | 13 | 0.95 | 1.403 | 1.6~2.1 g/mmol |
| X22-163 | 15 | 1.00 | 1.450 | 200 g/mol |
| X22-163A | 30 | 0.98 | 1.413 | 1000 g/mol |
| KF-105 | 15 | 0.99 | 1.422 | 490 g/mol |

The organosilicon-modified polyimide resin composition of the present embodiment may be used in a form of film or as a substrate together with a support to which it adheres. The film forming process comprises three steps: (a) coating step: spreading the above organosilicon-modified polyimide resin composition on a peelable body by coating to form a film; (b) heating and drying step: heating and drying the film together with the peelable body to remove the solvent from the film; and (c) peeling step: peeling the film from the peelable body after the drying is completed to give the organosilicon-modified polyimide resin composition in a form of film. The above peelable body may be a centrifugal film or other materials which do not undergo chemical reaction with the organosilicon-modified polyimide resin composition, e.g., PET centrifugal film.

The organosilicon-modified polyimide resin composition may be adhered to a support to give an assembly film, which may be used as the substrate. The process of forming the assembly film comprises two steps: (a) coating step: spreading the above organosilicon-modified polyimide resin composition on a support by coating to from an assembly film; and (b) heating and drying step: heating and drying the assembly film to remove the solvent from the film.

In the coating step, roll-to-roll coating devices such as roller coaster, mold coating machine and blade coating machine, or simple coating means such as printing, inkjetting, dispensing and spraying may be used.

The drying method in the above heating and drying step may be drying in vacuum, drying by heating, or the like. The heating may be achieved by a heat source such as an electric heater or a heating media to produce heat energy and indirect convection, or by infrared heat radiation emitted from a heat source.

A film (composite film) with high thermal conductivity can be obtained from the above organosilicon-modified polyimide resin composition by coating and then drying and curing, so as to achieve any one or combination of the following properties: superior light transmittance, chemical resistance, heat resistance, thermal conductivity, film mechanical property and light resistance. The temperature and time in the drying and curing step may be suitably selected according to the solvent and the coated film thickness of the organosilicon-modified polyimide resin composition. The weight change of the organosilicon-modified polyimide resin composition before and after the drying and curing as well as the change in the peaks in the IR spectrum representing the functional groups in the thermal curing agent can be used to determine whether the drying and curing are completed. For example, when an epoxy resin is used as the thermal curing agent, whether the difference in the weight of the organosilicon-modified polyimide resin composition before and after the drying and curing is equal to the weight of the added solvent as well as the increase or decrease of the epoxy peak before and after the drying and curing are used to determine whether the drying and curing are completed.

Figure 25A:
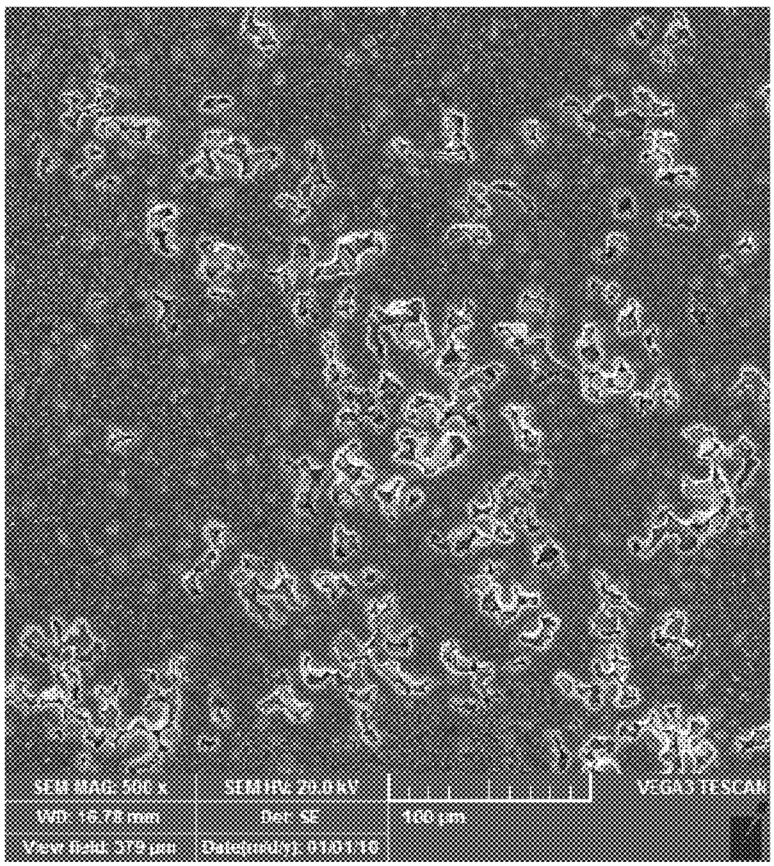
FIG. 25A shows the SEM image of an organosilicon-modified polyimide resin composition composite film (substrate)
Figure 25B:
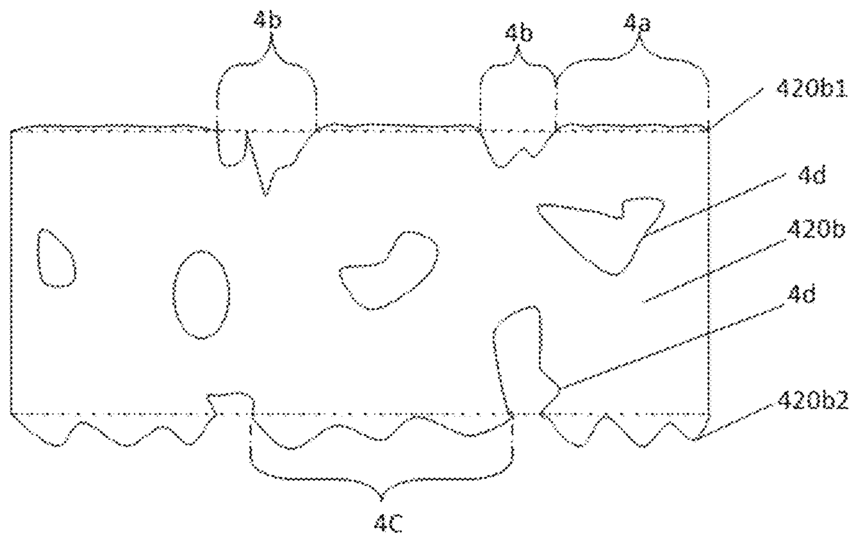
FIG. 25B shows the cross-sectional scheme of an organosilicon-modified polyimide resin composition composite film (substrate) according to an embodiment of the present invention.
Figure 25C:
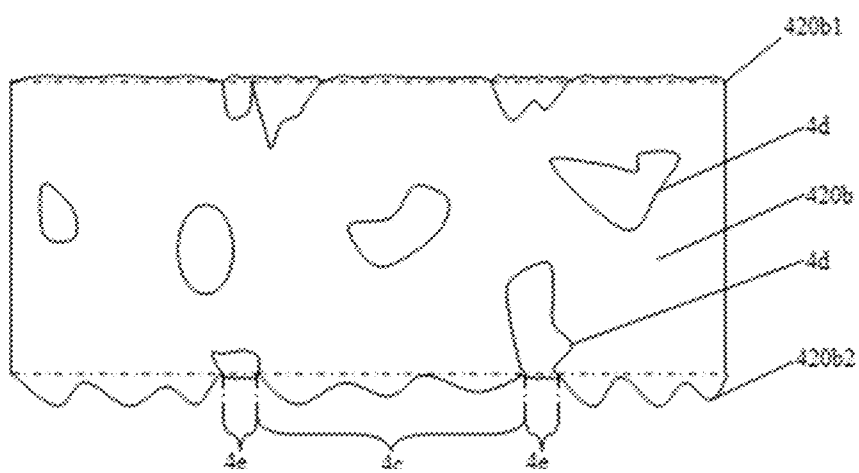
FIG. 25C shows the cross-sectional scheme of an organosilicon-modified polyimide resin composition composite film (substrate) according to another embodiment of the present disclosure.

In an embodiment, the amidation is carried out in a nitrogen atmosphere, or vacuum defoaming is employed in the synthesis of the organosilicon-modified polyimide resin composition, or both, so that the volume percentage of the cells in the organosilicon-modified polyimide resin composition composite film is 5~20%, preferably 5~10%. As shown in FIG. 25B, the organosilicon-modified polyimide resin composition composite film is used as the substrate for the LED soft filament. The substrate 420*b* has an upper surface 420*b*1 and an opposite lower surface 420*b*2. FIG. 25A shows the surface morphology of the substrate after gold is scattered on the surface thereof as observed with vega3 electron microscope from Tescan Corporation. As can be seen from FIG. 25B and the SEM image of the substrate surface shown in FIG. 25A, there is a cell 4d in the substrate, wherein the cell 4d represents 5~20% by volume, preferably 5~10% by volume, of the substrate 420*b*, and the cross section of the cell 4d is irregular. FIG. 25B shows the cross-sectional scheme of the substrate 420*b*, wherein the dotted line is the baseline. The upper surface 420*b*1 of the substrate comprises a first area 4*a* and a second area 4*b*, wherein the second area 4*b* comprises a cell 4d, and the first area 4*a* has a surface roughness which is less than that of the second area 4*b*. The light emitted by the LED chip passes through the cell in the second area and is scattered, so that the light emission is more uniform. The lower surface 420*b*2 of the substrate comprises a third area 4*c*, which has a surface roughness which is higher than that of the first area 4*a*. When the LED chip is positioned in the first area 4*a*, the smoothness of the first area 4*a* is favorable for subsequent bonding and wiring. When the LED chip is positioned in the second area 4*b* or the third area 4*c*, the area of contact between the die bonding glue and substrate is large, which improves the bonding strength between the die bonding glue and substrate. Therefore, by positioning the LED chip on the upper surface 420*b*1, bonding and wiring as well as the bonding strength between the die bonding glue and substrate can be ensured at the same time. When the organosilicon-modified polyimide resin composition is used as the substrate of the LED soft filament, the light emitted by the LED chip is scattered by the cell in the substrate, so that the light emission is more uniform, and glare can be further improved at the same time. In an embodiment, the surface of the substrate 420*b* may be treated with a silicone resin or a titanate coupling agent, preferably a silicone resin comprising methanol or a titanate coupling agent comprising methanol, or a silicone resin comprising isopropanol. The cross section of the treated substrate is shown in FIG. 25C. The upper surface 420*b*1 of the substrate has relatively uniform surface roughness. The lower surface 420*b*2 of the substrate comprises a third area 4*c* and a fourth area 4*c*, wherein the third area 4*c* has a surface roughness which is higher than that of the fourth area 4*c*. The surface roughness of the upper surface 420*b*1 of the substrate may be equal to that of the fourth area 4*c*. The surface of the substrate 420*b* may be treated so that a material with a high reactivity and a high strength can partially enter the cell 4d, so as to improve the strength of the substrate.

When the organosilicon-modified polyimide resin composition is prepared by vacuum defoaming, the vacuum used in the vacuum defoaming may be −0.5~−0.09 MPa, preferably −0.2~−0.09 MPa. When the total weight of the raw materials used in the preparation of the organosilicon-modified polyimide resin composition is less than or equal to 250 g, the revolution speed is 1200~2000 rpm, the rotation speed is 1200~2000 rpm, and time for vacuum defoaming is 3~8 min. This not only maintains certain amount of cells in the film to improve the uniformity of light emission, but also keeps good mechanical properties. The vacuum may be suitably adjusted according to the total weight of the raw materials used in the preparation of the organosilicon-modified polyimide resin composition. Normally, when the total weight is higher, the vacuum may be reduced, while the stirring time and the stirring speed may be suitably increased.

According to the present disclosure, a resin having superior transmittance, chemical resistance, resistance to thermochromism, thermal conductivity, film mechanical property and light resistance as required for a LED soft filament substrate can be obtained. In addition, a resin film having a high thermal conductivity can be formed by simple coating methods such as printing, inkjetting, and dispensing.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition. In addition, in order for the bulb employing said filament to achieve omnidirectional illumination, the composite film as the substrate should have certain flexibility. Therefore, flexible structures such as ether (such as (4,4'-bis(4-amino-2-trifluoromethylphenoxy)diphenyl ether), carbonyl, methylene may be introduced into the backbone of the organosilicon-modified polyimide. In other embodiments, a diamine or dianhydride comprising a pyridine ring may be employed, in which the rigid structure of the pyridine ring can improve the mechanical properties of the composite film. Meanwhile, by using it together with a strong polar group such as —F, the composite film may have superior light transmittance. Examples of the anhydride comprising a pyridine ring include 2,6-bis(3',4'-dicarboxyphenyl)-4-(3",5"-bistrifluoromethylphenyl)pyridine dianhydride.

The LED filament structure in the aforementioned embodiments is mainly applicable to the LED light bulb product, so that the LED light bulb can achieve the omnidirectional light illuminating effect through the flexible bending characteristics of the single LED filament. The specific embodiment in which the aforementioned LED filament applied to the LED light bulb is further explained below.

Figure 26A:
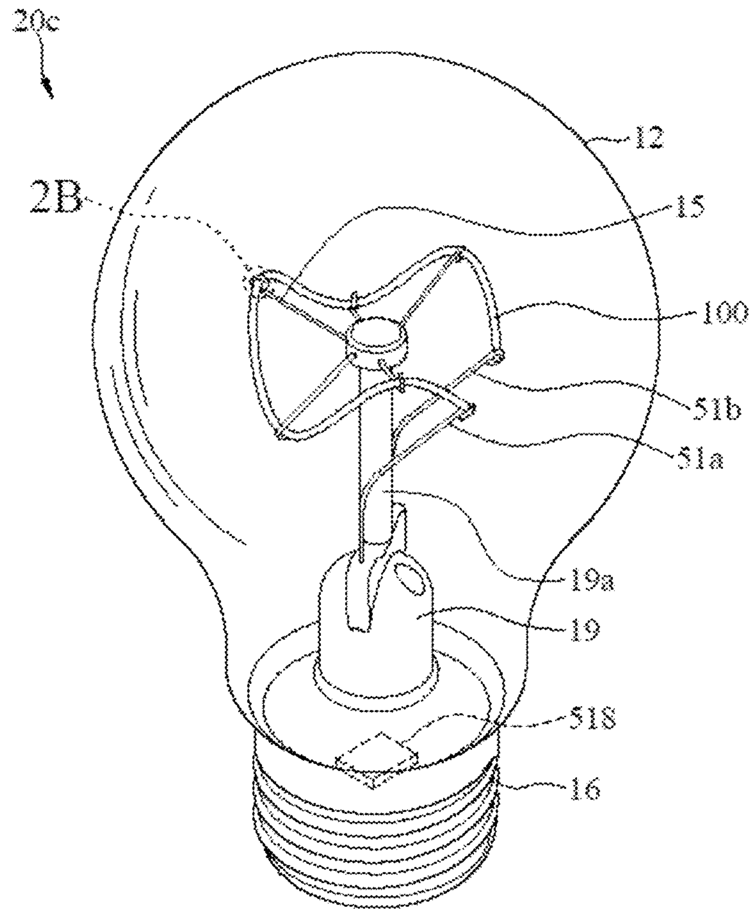
FIG. 26A illustrates a perspective view of an LED light bulb according to the third embodiment of the instant disclosure.

Please refer to FIG. 26A. FIG. 26A illustrates a perspective view of an LED light bulb according to the third embodiment of the present disclosure. According to the third embodiment, the LED light bulb 20*c* comprises a lamp housing 12, a bulb base 16 connected with the lamp housing 12, two conductive supports 51*a*, 51*b* disposed in the lamp housing 12, a driving circuit 518 electrically connected with both the conductive supports 51*a*, 51*b* and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20*c*. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The core is a semiconductor nanocrystalline material, typically the combination of at least of one metal and at least one non-metal. The core is prepared by combining a coation precursor(s) with an anion precursor(s). The metal for the core is most preferably selected from Zn, Cd, Hg, Ga, In, Ti, Pb or a rare earth element. The non-metal is most preferably selected from O, S, Se, P, As or Te. The cationic precursor ion may include all transition metals and rare earth elements, and the anionic precursor ions may be chosen from O, S, Se, Te, N, P, As, F, CL, and Br. Furthermore, cationic precursors may include elements or compounds, such as elements, covalent compounds, or ionic compounds, including but are not limited to, oxides, hydroxides, coordination compounds, or metal salts, which serves as a source for the electropositive element or elements in the resulting nanocrystal core or shell materials.

The cationic precursor solution may include a metal oxide, a metal halide, a metal nitride, a metal ammonia complex, a metal amine, a metal amide, a metal imide, a metal carboxylate, a metal acetylacetonate, a metal dithiolate, a metal carbonyl, a metal cyanide, a metal isocyanide, a metal nitrile, a metal peroxide, a metal hydroxide, a metal hydride, a metal ether complex, a metal diether complex, a metal triether compound, a metal carbonate, a metal nitrate, a metal nitrite, a metal sulfate, a metal alkoxide, a metal siloxide, a metal thiolate, a metal dithiolate, a metal disulfide, a metal carbamate, a metal dialky carbamate, a metal pyridine complex, a metal dipyridine complex, a metal phenanthroline complex, a metal terpyridine complex, a metal diamine complex, a metal triamine complex, a metal diimine, a metal pyridine diimine, a metal pyrazollborate, a metal bis(pyrazole)borate, a metal tris(pyrazole)borate, a metal nitrosyl, a metal thiocarbamate, metal diazabutadiene, a metal dithiocarbamate, a metal dialkylacetamide, a metal dialkylformamide, a metal formamidinate, a metal phosphine complex, a metal arsine complex, a metal diphosphine complex, a metal diarsine complex, a metal oxalate, a metal imidazole, a metal pyrazolate, a metal Schiff base complex, a metal porphyrin, a metal phthalocyanine, a metal subphthalocyanine, a metal picolinate, a metal piperidine complex, a metal pyrazolyl, a metal salicylaldehyde, a metal ethylenediamine, a metal triflate compound or any combination thereof. Preferably, the cationic precursor solution may include a metal oxide, a metal carbonate, a metal bicarbonate, a metal sulfate, a metal sulfite, a metal phosphate, a metal phosphite, a metal halide, a metal carboxylate, a metal hydroxide, a metal alkoxide, a metal thiolate, a metal amide, a metal imide, a metal alkyl, a metal aryl, a metal coordination complex, a metal solvate, a metal salt or a combination thereof. Most preferably, the cationic precursor is a metal oxide or metal salt precursor and may be selected from zinc stearate, zinc myristate, zinc acetate, and manganese stearate.

Anionic precursors may also include elements, covalent compounds, or ionic compounds, which are used as one or more electronegative elements in the resulting nanocrystals. These definitions expect to be able to prepare ternary compounds, quaternary compounds and even more complex species using the methods disclosed in the present invention, in which case more than one cationic precursor and/or more than one anion precursor can be used. When two or more cationic elements are used during a given monolayer growth, if the other part of the nanocrystalline contains only a single cationic, the resulting nanocrystals have a cationic alloy at the specified single layer. The same method can be used to prepare nanocrystals with anionic alloys.

The above method is applicable to the core/shell nanocrystals prepared using a series of cationic precursor compounds of core and shell materials, for example, precursors of Group II metals (eg, Zn, Cd or Hg), precursors of Group III metals (eg, Al, Ga or In), a precursor of a Group IV metal (for example, Ge, Sn or Pb), or a transition metal (for example, Ti, Zr, Hf, V, Nb, Ta, Cr, Mo, W, Mn, Tc), Re, Fe, Ru, Os, Co, Rh, Ir, Ni, Pd, Pt, Cu, Ag, Au, etc.).

The components of the light absorbing shell may be the same or different from the composition of the core. Typically, the light absorbing shell material has the same lattice structure as the material selected for the core. For example, if CdSe is used as the emission region material, the absorption region material may be CdS. The light absorbing shell material is chosen to provide good absorption characteristics and can depend on the light source. For example, CdS can be a good choice for the absorption region when the excitation comes from a typical blue LED (within the wavelength range between 440 and 470 nm) solid state illumination. For example, if the excitation originates from a purple LED to produce a red LED by frequency down-conversion, then ZnSe or $ZnSe_xS_{1-x}$ (where x is greater than or equal to 0 and less than or equal to 1) is a preferred choice for the absorption region. As another example, if one wishes to obtain near-infrared emission from a quantum dot for bio-medical applications (700-1000 nm) by using a red light source, then CdSe and InP often work as the absorption region material.

The protected area (wide bandgap semiconductor or insulator) at the outermost outer shell of the quantum dot provides the desired chemical and optical stability to the quantum dots. In general, a protective shell (also known as a protected area) neither effectively absorbs light nor emits directional photons within the preferred excitation window described above. This is because it has a wide band gap. For example, ZnS and GaN are examples of protective shell materials. Metal oxides can also be utilized. In certain embodiments, an organic polymer can be used as a protective shell. The thickness of the protective shell is typically in the range between 1 and 20 monolayers. Moreover, the thickness can also be increased as needed, but this also increases production costs.

A light absorbing shell includes a plurality of mono layers that form a compositional gradient. For example, the light absorbing shell can include three components varying in a ratio of 1:0:1 in a mono layer located closest to the core to a ratio 0:1:1 in a mono layer located closest to the protective shell. By way of example, three useful components are Cd, Zn, and S and for instance, a mono layer closest to the core may have a component CdS (ratio 1:0:1), a mono layer closest to the protective shell may have a component corresponding to ZnS (Ratio 0:1:1), and the intermediate mono layer between the core and the protective shell may have a component corresponding to $ZnSe_xS_{1-x}$ having a ratio (X):(1−X): 1, and wherein X greater than or equal to 0 and less than or equal to 1. In this case, X is larger for a mono layer closer to the core than a mono layer that closer to the protective shell. In another embodiment, the transition shell consists of three components, the ratio from the single layer closest to the core to the single layer closest to the protective shell: 0.9:0.1:1, 0.8:0.2:1, 0.6:0.4:1, 0.4:0.6:1, and 0.2:0.8:1. Other combinations of Cd, Zn, S, and Se alloys can also be used as transition shells instead of $ZnSe_xS_{1-x}$ as long as they have suitable lattice matching parameters. In one embodiment, a suitable transition shell includes one shell having Cd, Zn, and S components and the following layers listed from the layer closest to the light absorbing shell to the layer closest to the protective shell: $Cd_{0.9}Zn_{0.1}S$, $Cd_{0.8}Zn_{0.2}S$, $Cd_{0.6}Zn_{0.4}S$, $Cd_{0.4}Zn_{0.6}S$, $Cd_{0.2}Zn_{0.8}S$.

The LED filament 100 shown in FIG. 26A is bent to form a contour resembling to a circle while being observed from the top view of FIG. 26A. According to the embodiment of FIG. 2A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19*a* extending to the center of the bulb shell 12. The stand 19*a* supports the supporting arms 15. The first end of each of the supporting arms 15 is connected with the stand 19*a* while the second end of each of the supporting arms 15 is connected with the LED filament 100.

Figure 26B:
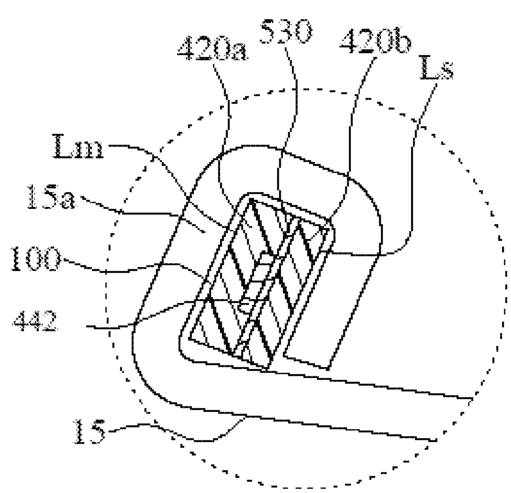
FIG. 26B illustrates an enlarged cross-sectional view of the dashed-line circle of FIG. 26A.

Please refer to FIG. 26B which illustrates an enlarged cross-sectional view of the dashed-line circle of FIG. 26A. The second end of each of the supporting arms 15 has a clamping portion 15*a* which clamps the body of the LED filament 100. The clamping portion 15*a* may, but not limited to, clamp at either the wave crest or the wave trough. Alternatively, the clamping portion 15*a* may clamp at the portion between the wave crest and the wave trough. The shape of the clamping portion 15*a* may be tightly fitted with the outer shape of the cross-section of the LED filament 100. The dimension of the inner shape (through hole) of the clamping portion 15*a* may be a little bit smaller than the outer shape of the cross-section of the LED filament 100. During manufacturing process, the LED filament 100 may be passed through the inner shape of the clamping portion 15*a* to form a tight fit. Alternatively, the clamping portion 15*a* may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19*a* extending to the center of the bulb shell 12 and the supporting arms 15 are connected to a portion of the stand 19*a* near the top thereof, the position of the LED filaments 100 is at the level close to the center of the bulb shell 12. Accordingly, the illumination characteristics of the LED light bulb 20*c* are close to that of the traditional light bulb including illumination brightness. The illumination uniformity of LED light bulb 20*c* is better. In the embodiment, at least a half of the LED filaments 100 is around a center axle of the LED light bulb 20*c*. The center axle is coaxial with the axle of the stand 19*a*.

In the embodiment, the first end of the supporting arm 15 is connected with the stand 19*a* of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20*c*. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The inner shape (the hole shape) of the clamping portion 15*a* fits the outer shape of the cross section of the LED filament 100; therefore, based upon a proper design, the cross section of the LED filament 100 may be oriented to face towards a predetermined orientation. For example, as shown in FIG. 26B, the LED filament 100 comprises a top layer 420*a*, LED chips 104, and a base layer 420*b*. The LED chips 104 are aligned in line along the axial direction (or an elongated direction) of the LED filament 100 and are disposed between the top layer 420*a* and the base layer 420*b*. The top layer 420*a* of the LED filament 100 is oriented to face towards ten o'clock in FIG. 26B. A lighting face of the whole LED filament 100 may be oriented to face towards the same orientation substantially to ensure that the lighting face of the LED filament 100 is visually identical. The LED filament 100 comprises a main lighting face Lm and a subordinate lighting face Ls corresponding to the LED chips. If the LED chips in the LED filament 100 are wire bonded and are aligned in line, a face of the top layer 420*a* away from the base layer 420*b* is the main lighting face Lm, and a face of the base layer 420*b* away from the top layer 420*a* is the subordinate lighting face Ls. The main lighting face Lm and the subordinate lighting face Ls are opposite to each other. When the LED filament 100 emits light, the main lighting face Lm is the face through which the largest amount of light rays passes, and the subordinate lighting face Ls is the face through which the second largest amount of light rays passes. In the embodiment, there is, but is not limited to, a conductive foil 530 formed between the top layer 420*a* and the base layer 420*b*, which is utilized for electrical connection between the LED chips. In the embodiment, the LED filament 100 wriggles with twists and turns while the main lighting face Lm is always towards outside. That is to say, any portion of the main lighting face Lm is towards the bulb shell 12 or the bulb base 16 and is away from the stem 19 at any angle, and the subordinate lighting face Ls is always towards the stem 19 or towards the top of the stem 19 (the subordinate lighting face Ls is always towards inside).

The LED filament 100 shown in FIG. 26A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51*a*, 51*b*. In practice, the single LED filament 100 (as shown in FIG. 26A) requires only two joint points respectively formed on the two conductive electrodes, which effectively lowers the risk of fault welding and simplifies the process of connection compared to the mechanically connection in the tightly pressing manner.

Figure 26C:
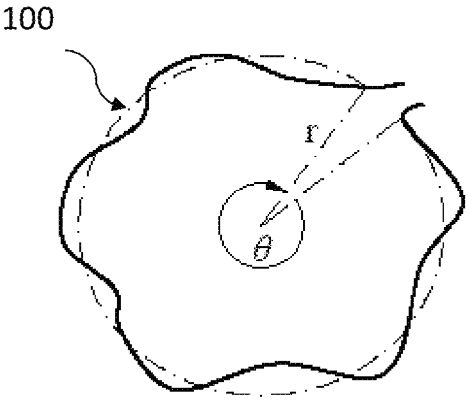
FIG. 26C is a projection of a top view of an LED filament of the LED light bulb of FIG. 26A.

Please refer to FIG. 26C. FIG. 26C is a projection of a top view of an LED filament of the LED light bulb 20*c* of FIG. 26A. As shown in FIG. 26C, in an embodiment, the LED filament may be curved to form a wave shape resembling a circle observed in a top view to surround the center of the light bulb or the stem. In different embodiments, the LED filament observed in the top view can form a quasi-circle or a quasi U shape.

As shown in FIG. 26B and FIG. 26C, the LED filament 100 surrounds with the wave shape resembling a circle and has a quasi-symmetric structure in the top view, and the lighting face of the LED filament 100 is also symmetric, e.g., the main lighting face Lm in the top view may face outwardly; therefore, the LED filament 100 may generate an effect of an omnidirectional light due to a symmetry characteristic with respect to the quasi-symmetric structure of the LED filament 100 and the arrangement of the lighting face of the LED filament 100 in the top view. Whereby, the LED light bulb 20*c* as a whole may generate an effect of an omnidirectional light close to a 360 degrees illumination. Additionally, the two joint points may be close to each other such that the conductive supports 51*a*, 51*b* are substantially below the LED filament 100. Visually, the conductive supports 51*a*, 51*b* keeps a low profile and is integrated with the LED filament 100 to show an elegance curvature.

Figure 27A:
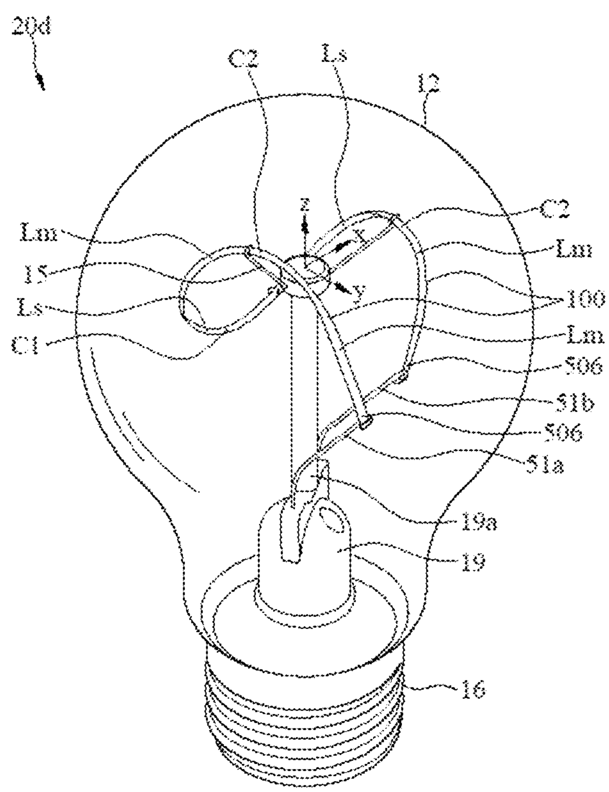
FIG. 27A is a perspective view of an LED light bulb according to an embodiment of the present invention.
Figure 27B:
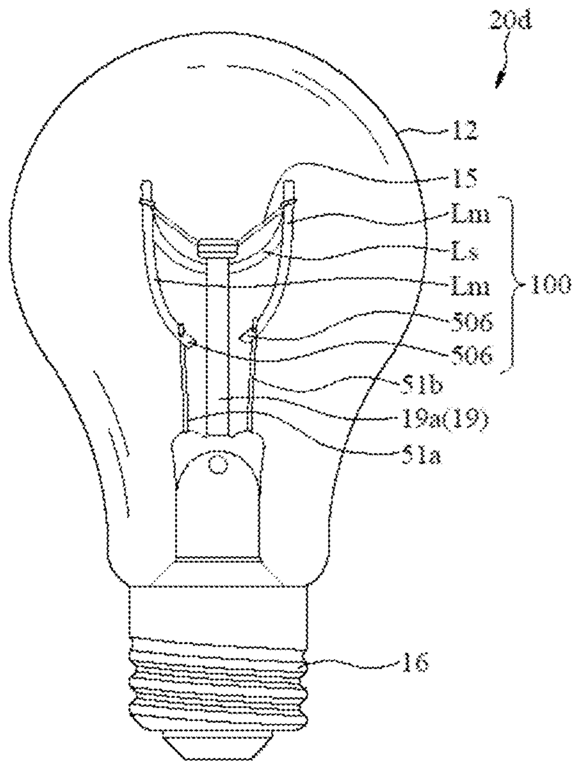
FIG. 27B is a front view of an LED light bulb of FIG. 27A.

Please refer to FIG. 27A and FIG. 27B. FIG. 27A is a perspective view of an LED light bulb according to an embodiment of the present invention. FIG. 27B is a front view (or a side view) of an LED light bulb of FIG. 27A. The LED light bulb 20*d* shown in FIG. 27A and FIG. 27B is analogous to the LED light bulb 20*c* shown in FIG. 26A. As shown in FIG. 27A and FIG. 27B, the LED light bulb 20*d* comprises a bulb shell 12, a bulb base 16 connected to the bulb shell 12, two conductive supports 51*a*, 51*b* disposed in the bulb shell 12, supporting arms 15, a stem 19, and one single LED filament 100. The stem 19 comprises a stem bottom and a stem top opposite to each other. The stem bottom is connected to the bulb base 16. The stem top extends to inside of the bulb shell 12 (e.g., extending to the center of the bulb shell 12) along an elongated direction of the stem 19. For example, the stem top may be substantially located at a center of the inside of the bulb shell 12. In the embodiment, the stem 19 comprises the stand 19*a*. Herein the stand 19*a* is deemed as a part of the whole stem 19 and thus the top of the stem 19 is the same as the top of the stand 19*a*. The two conductive supports 51*a*, 51*b* are connected to the stem 19. The LED filament 100 comprises a filament body and two conductive electrodes 506. The two conductive electrodes 506 are at two opposite ends of the filament body. The filament body is the part of the LED filament 100 without the conductive electrodes 506. The two conductive electrodes 506 are respectively connected to the two conductive supports 51*a*, 51*b*. The filament body is around the stem 19. An end of the supporting arm 15 is connected to the stem 19 and another end of the supporting arm 15 is connected to the filament body.

Figure 27C:
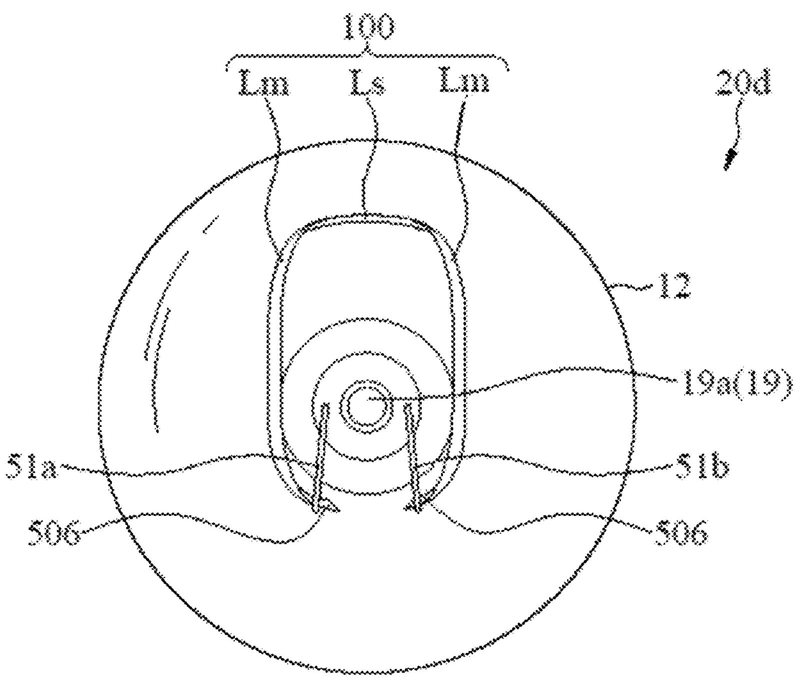
FIG. 27C is a top view of the LED light bulb of FIG. 27A.

Please refer to FIG. 27C. FIG. 27C is a top view of the LED light bulb 20*d* of FIG. 27A. As shown in FIG. 27B and FIG. 27C, the filament body comprises a main lighting face Lm and a subordinate lighting face Ls. Any portion of the main lighting face Lm is towards the bulb shell 12 or the bulb base 16 at any angle, and any portion of the subordinate lighting face Ls is towards the stem 19 or towards the top of the stem 19, i.e., the subordinate lighting face Ls is towards inside of the LED light bulb 20*d* or towards the center of the bulb shell 12. In other words, when a user observes the LED light bulb 20*d* from outside, the user would see the main lighting face Lm of the LED filament 100*d* at any angle. Based upon the configuration, the effect of illumination is better.

According to different embodiments, the LED filament 100 in different LED light bulbs (e.g., the LED light bulb 20*a*, 20*b*, 20*c*, or 20*d*) may be formed with different shapes or curves while all of the LED filaments 100 are configured to have symmetry characteristic. The symmetry characteristic has the benefit of creating an even, wide distribution of light rays, so that the LED light bulb is capable of generating an omnidirectional light effect. The symmetry characteristic of the LED filament 100 is discussed below.

The definition of the symmetry characteristic of the LED filament 100 may be based on four quadrants defined in a top view of an LED light bulb. The four quadrants may be defined in a top view of an LED light bulb (e.g., the LED light bulb 20*b* shown in FIG. 1B or the LED light bulb 20*c* shown in FIG. 26A), and the origin of the four quadrants may be defined as a center of a stem/stand of the LED light bulb in the top view (e.g., a center of the top of the stand of the stem 19 shown in FIG. 1B or a center of the top of the stand 19*a* shown in FIG. 26A). The LED filament of the LED light bulb (e.g., the LED filaments 100 shown in FIG. 1B and FIG. 26A) in the top view may be presented as an annular structure, shape or, contour. The LED filament presented in the four quadrants in the top view may be symmetric.

For example, the brightness presented by a portion of the LED filament in the first quadrant in the top view is symmetric with that presented by a portion of the LED filament in the second quadrant, in the third quadrant, or in the fourth quadrant in the top view while the LED filament operates. In some embodiments, the structure of a portion of the LED filament in the first quadrant in the top view is symmetric with that of a portion of the LED filament in the second quadrant, in the third quadrant, or in the fourth quadrant in the top view. In addition, an emitting direction of a portion of the LED filament in the first quadrant in the top view is symmetric with that of a portion of the LED filament in the second quadrant, in the third quadrant, or in the fourth quadrant in the top view.

In another embodiment, an arrangement of LED chips in a portion of the LED filament in the first quadrant (e.g., a density variation of the LED chips in the portion of the LED filament in the first quadrant) in the top view is symmetric with an arrangement of LED chips in a portion of the LED filament in the second quadrant, in the third quadrant, or in the fourth quadrant in the top view.

In another embodiment, a power configuration of LED chips with different power in a portion of the LED filament in the first quadrant in the top view is symmetric with a power configuration of LED chips with different power in a portion of the LED filament in the second quadrant, in the third quadrant, or in the fourth quadrant in the top view.

In another embodiment, refractive indexes of segments of a portion of the LED filament in the first quadrant in the top view are symmetric with refractive indexes of segments of a portion of the LED filament in the second quadrant, in the third quadrant, or in the fourth quadrant in the top view while the segments may be defined by distinct refractive indexes.

In another embodiment, surface roughness of segments of a portion of the LED filament in the first quadrant in the top view are symmetric with surface roughness of segments of a portion of the LED filament in the second quadrant, in the third quadrant, or in the fourth quadrant in the top view while the segments may be defined by distinct surface roughness.

The LED filament presented in the four quadrants in the top view may be in point symmetry (e.g., being symmetric with the origin of the four quadrants) or in line symmetry (e.g., being symmetric with one of the two axis the four quadrants).

A tolerance (a permissible error) of the symmetric structure of the LED filament in the four quadrants in the top view may be up to 20%-50%. For example, in a case that the structure of a portion of the LED filament in the first quadrant is symmetric with that of a portion of the LED filament in the second quadrant, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in one of the four quadrants in the top view is substantially equal to that of a portion of the LED filament in another one of the four quadrants in the top view. The lengths of portions of the LED filament in different quadrants in the top view may also have 20%-50% difference.

The definition of the symmetry characteristic of the LED filament 100 may be based on four quadrants defined in a side view, in a front view, or in a rear view of an LED light bulb. In the embodiments, the side view may include a front view or a rear view of the LED light bulb. The four quadrants may be defined in a side view of an LED light bulb (e.g., the LED light bulb 20*a* shown in FIG. 1A or the LED light bulb 20*c* shown in FIG. 26A). In such case, an elongated direction of a stand (or a stem) from the bulb base 16 towards a top of the bulb shell 12 away from the bulb base 16 may be defined as the Y-axis, and the X-axis may cross a middle of the stand (e.g., the stand 19*a* of the LED light bulb 20*c* shown in FIG. 26A) while the origin of the four quadrants may be defined as the middle of the stand. In different embodiment, the X-axis may cross the stand at any point, e.g., the X-axis may cross the stand at the top of the stand, at the bottom of the stand, or at a point with a certain height (e.g., ⅔ height) of the stand.

In addition, portions of the LED filament presented in the first quadrant and the second quadrant (the upper quadrants) in the side view may be symmetric (e.g., in line symmetry with the Y-axis) in brightness, and portions of the LED filament presented in the third quadrant and the fourth quadrant (the lower quadrants) in the side view may be symmetric (e.g., in line symmetry with the Y-axis) in brightness; however, the brightness of the portions of the LED filament presented in the upper quadrants in the side view may be asymmetric with that of the portions of the LED filament presented in the lower quadrants in the side view.

In some embodiments, portions of the LED filament presented in the first quadrant and the second quadrant (the upper quadrants) in the side view may be symmetric (e.g., in line symmetry with the Y-axis) in structure; portions of the LED filament presented in the third quadrant and the fourth quadrant (the lower quadrants) in the side view may be symmetric (e.g., in line symmetry with the Y-axis) in structure. In addition, an emitting direction of a portion of the LED filament in the first quadrant in the side view is symmetric with that of a portion of the LED filament in the second quadrant in the side view, and an emitting direction of a portion of the LED filament in the third quadrant in the side view is symmetric with that of a portion of the LED filament in the fourth quadrant in the side view.

In another embodiment, an arrangement of LED chips in a portion of the LED filament in the first quadrant in the side view is symmetric with an arrangement of LED chips in a portion of the LED filament in the second quadrant in the side view, and an arrangement of LED chips in a portion of the LED filament in the third quadrant in the side view is symmetric with an arrangement of LED chips in a portion of the LED filament in the fourth quadrant in the side view.

In another embodiment, a power configuration of LED chips with different power in a portion of the LED filament in the first quadrant in the side view is symmetric with a power configuration of LED chips with different power in a portion of the LED filament in the second quadrant in the side view, and a power configuration of LED chips with different power in a portion of the LED filament in the third quadrant in the side view is symmetric with a power configuration of LED chips with different power in a portion of the LED filament in the fourth quadrant in the side view.

In another embodiment, refractive indexes of segments of a portion of the LED filament in the first quadrant in the side view are symmetric with refractive indexes of segments of a portion of the LED filament in the second quadrant in the side view, and refractive indexes of segments of a portion of the LED filament in the third quadrant in the side view are symmetric with refractive indexes of segments of a portion of the LED filament in the fourth quadrant in the side view while the segments may be defined by distinct refractive indexes.

In another embodiment, surface roughness of segments of a portion of the LED filament in the first quadrant in the side view are symmetric with surface roughness of segments of a portion of the LED filament in the second quadrant in the side view, and surface roughness of segments of a portion of the LED filament in the third quadrant in the side view are symmetric with surface roughness of segments of a portion of the LED filament in the fourth quadrant in the side view while the segments may be defined by distinct surface roughness.

Additionally, the portions of the LED filament presented in the upper quadrants in the side view may be asymmetric with the portions of the LED filament presented in the lower quadrants in the side view in brightness. In some embodiments, the portion of the LED filament presented in the first quadrant and the fourth quadrant in the side view is asymmetric in structure, in length, in emitting direction, in arrangement of LED chips, in power configuration of LED chips with different power, in refractive index, or in surface roughness, and the portion of the LED filament presented in the second quadrant and the third quadrant in the side view is asymmetric in structure, in length, in emitting direction, in arrangement of LED chips, in power configuration of LED chips with different power, in refractive index, or in surface roughness. In order to fulfill the illumination purpose and the requirement of omnidirectional lamps, light rays emitted from the upper quadrants (the portion away from the bulb base 16) in the side view should be greater than those emitted from the lower quadrants (the portion close to the bulb base 16). Therefore, the asymmetric characteristic of the LED filament of the LED light bulb between the upper quadrants and the lower quadrants in the side view may contribute to the omnidirectional requirement by concentrating the light rays in the upper quadrants.

A tolerance (a permissible error) of the symmetric structure of the LED filament in the first quadrant and the second quadrant in the side view may be 20%-50%. For example, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in the first quadrant in the side view is substantially equal to that of a portion of the LED filament in the second quadrant in the side view. A length of a portion of the LED filament in the third quadrant in the side view is substantially equal to that of a portion of the LED filament in the fourth quadrant in the side view. However, the length of the portion of the LED filament in the first quadrant or the second quadrant in the side view is different from the length of the portion of the LED filament in the third quadrant or the fourth quadrant in the side view. In some embodiment, the length of the portion of the LED filament in the third quadrant or the fourth quadrant in the side view may be less than that of the portion of the LED filament in the first quadrant or the second quadrant in the side view. The lengths of portions of the LED filament in the first and the second quadrants or in the third and the fourth quadrants in the side view may also have 20%-50% difference.

Figure 27D:
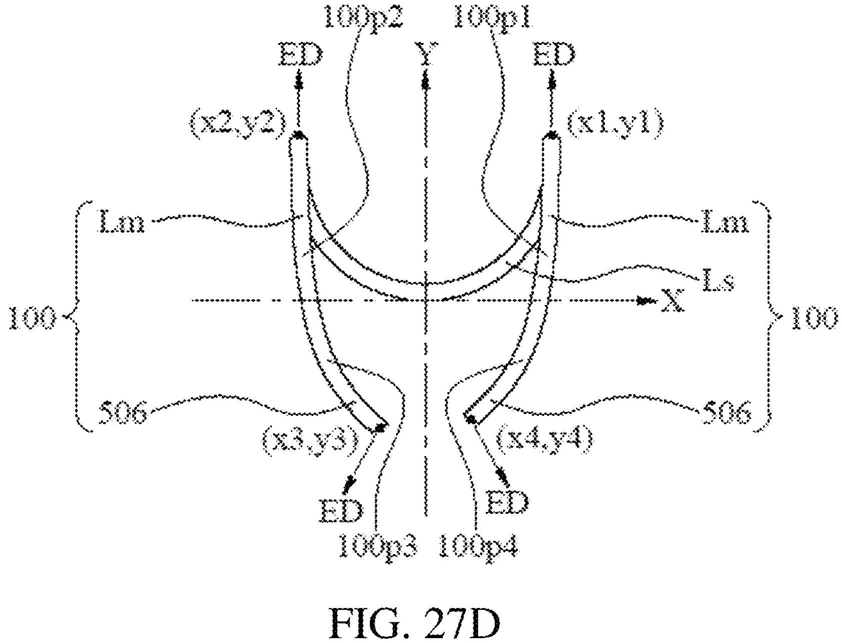
FIG. 27D is the LED filament shown in FIG. 27B presented in two dimensional coordinate system defining four quadrants.

Please refer to FIG. 27D. FIG. 27D is the LED filament 100 shown in FIG. 27B presented in two dimensional coordinate system defining four quadrants. The LED filament 100 in FIG. 27D is the same as that in FIG. 27B, which is a front view (or a side view) of the LED light bulb 20*d* shown in FIG. 3A. As shown in FIG. 3B and FIG. 3D, the Y-axis is aligned with the stand 19*a* of the stem (i.e., being along the elongated direction of the stand 19*a*), and the X-axis crosses the stand 19*a* (i.e., being perpendicular to the elongated direction of the stand 19*a*). As shown in FIG. 27D, the LED filament 100 in the side view can be divided into a first portion 100*p*1, a second portion 100*p*2, a third portion 100*p*3, and a fourth portion 100*p*4 by the X-axis and the Y-axis. The first portion 100*p*1 of the LED filament 100 is the portion presented in the first quadrant in the side view. The second portion 100*p*2 of the LED filament 100 is the portion presented in the second quadrant in the side view. The third portion 100*p*3 of the LED filament 100 is the portion presented in the third quadrant in the side view. The fourth portion 100*p*4 of the LED filament 100 is the portion presented in the fourth quadrant in the side view.

As shown in FIG. 27D, the LED filament 100 is in line symmetry. The LED filament 100 is symmetric with the Y-axis in the side view. That is to say, the geometric shape of the first portion 100*p*1 and the fourth portion 100*p*4 are symmetric with that of the second portion 100*p*2 and the third portion 100*p*3. Specifically, the first portion 100*p*1 is symmetric to the second portion 100*p*2 in the side view. Particularly, the first portion 100*p*1 and the second portion 100*p*2 are symmetric in structure in the side view with respect to the Y-axis. In addition, the third portion 100*p*3 is symmetric to the fourth portion 100*p*4 in the side view. Particularly, the third portion 100*p*3 and the fourth portion 100*p*4 are symmetric in structure in the side view with respect to the Y-axis.

In the embodiment, as shown in FIG. 27D, the first portion 100*p*1 and the second portion 100*p*2 presented in the upper quadrants (i.e., the first quadrant and the second quadrant) in the side view are asymmetric with the third portion 100*p*3 and the fourth portion 100*p*4 presented in the lower quadrants (i.e., the third quadrant and the fourth quadrant) in the side view. In particular, the first portion 100*p*1 and the fourth portion 100*p*4 in the side view are asymmetric, and the second portion 100*p*2 and the third portion 100*p*3 in the side view are asymmetric. According to an asymmetry characteristic of the structure of the filament 100 in the upper quadrants and the lower quadrants in FIG. 27D, light rays emitted from the upper quadrants to pass through the upper bulb shell 12 (the portion away from the bulb base 16) would be greater than those emitted from the lower quadrants to pass through the lower bulb shell 12 (the portion close to the bulb base 16) in order to fulfill the illumination purpose and the requirement of omnidirectional lamps.

Based upon symmetry characteristic of LED filament 100, the structures of the two symmetric portions of the LED filament 100 in the side view (the first portion 100*p*1 and the second portion 100*p*2 or the third portion 100*p*3 and the fourth portion 100*p*4) may be exactly symmetric or be symmetric with a tolerance in structure. The tolerance (or a permissible error) between the structures of the two symmetric portions of the LED filament 100 in the side view may be 20%-50% or less.

The tolerance can be defined as a difference in coordinates, i.e., x-coordinate or y-coordinate. For example, if there is a designated point on the first portion 100*p*1 of the LED filament 100 in the first quadrant and a symmetric point on the second portion 100*p*2 of the LED filament 100 in the second quadrant symmetric to the designated point with respect to the Y-axis, the absolute value of y-coordinate or the x-coordinate of the designated point may be equal to the absolute value of y-coordinate or the x-coordinate of the symmetric point or may have 20% difference compared to the absolute value of y-coordinate or the x-coordinate of the symmetric point.

For example, as shown in FIG. 27D, a designated point (x1, y1) on the first portion 100*p*1 of the LED filament 100 in the first quadrant is defined as a first position, and a symmetric point (x2, y2) on the second portion 100*p*2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100$p$1 and the second portion 100$p$2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1). For example, as shown in FIG. 27D, a designated point (x3, y3) on the third portion 100$p$3 of the LED filament 100 in the third quadrant is defined as a third position, and a symmetric point (x4, y4) on the fourth portion 100$p$4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100$p$3 and the fourth portion 100$p$4 are symmetric with a tolerance (e.g., a difference in coordinates being less than 20%) in structure. In other words, the absolute value of x4 of the symmetric point (x4, y4) is unequal to the absolute value of x3 of the designated point (x3, y3), and the absolute value of y4 of the symmetric point (x4, y4) is unequal to the absolute value of y3 of the designated point (x3, y3). As shown in FIG. 27D, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 27D, a length of the first portion 100$p$1 of the LED filament 100 in the first quadrant in the side view is substantially equal to a length of the second portion 100$p$2 of the LED filament 100 in the second quadrant in the side view. In the embodiment, the length is defined along an elongated direction of the LED filament 100 in a plane view (e.g., a side view, a front view, or a top view). For example, the first portion 100$p$1 elongates in the first quadrant in the side view shown in FIG. 27D to form a reversed "V" shape with two ends respectively contacting the X-axis and the Y-axis, and the length of the first portion 100$p$1 is defined along the reversed "V" shape between the X-axis and the Y-axis.

In addition, a length of the third portion 100$p$3 of the LED filament 100 in the third quadrant in the side view is substantially equal to a length of fourth portion 100$p$4 of the LED filament 100 in the fourth quadrant in the side view. Since the third portion 100$p$3 and the fourth portion 100$p$4 are symmetric with respect to the Y-axis with a tolerance in structure, there may be a slight difference between the length of the third portion 100$p$3 and the length of fourth portion 100$p$4. The difference may be 20%-50% or less.

As shown in FIG. 27D, an emitting direction of a designated point of the first portion 100$p$1 and an emitting direction of a symmetric point of the second portion 100$p$2 symmetric to the designated point are symmetric in direction in the side view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100$p$1 has an emitting direction ED which is upwardly in FIG. 27D, and the symmetric point (x2, y2) of the second portion 100$p$2 has an emitting direction ED which is upwardly in FIG. 27D. The emitting direction ED of the designated point (x1, y1) and the emitting direction ED of the symmetric point (x2, y2) are symmetric with respect to the Y-axis. In addition, the designated point (x3, y3) of the third portion 100$p$3 has an emitting direction ED towards a lower-left direction in FIG. 27D, and the symmetric point (x4, y4) of the fourth portion 100$p$4 has an emitting direction ED towards a lower-right direction in FIG. 27D. The emitting direction ED of the designated point (x3, y3) and the emitting direction ED of the symmetric point (x4, y4) are symmetric with respect to the Y-axis.

Figure 27E:
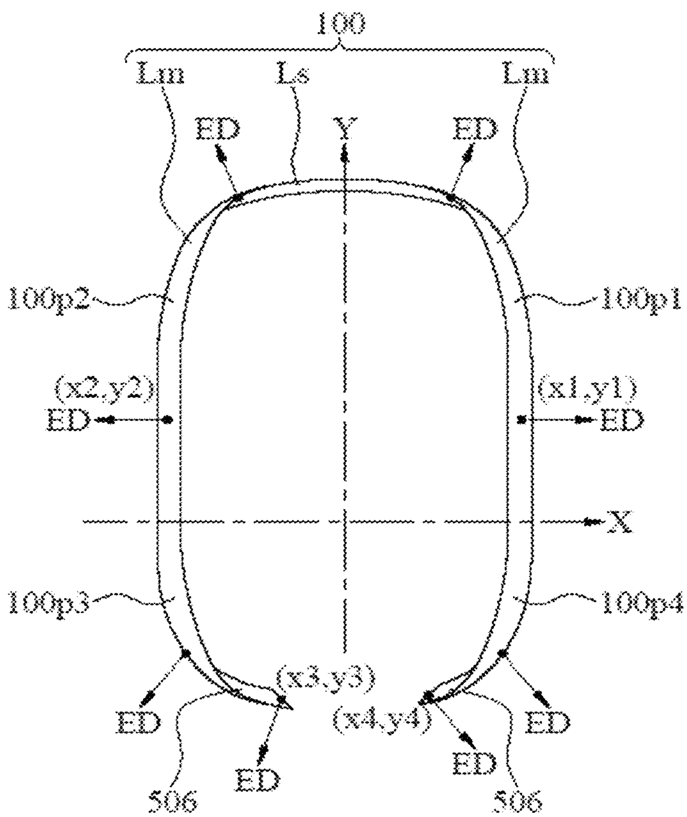
FIG. 27E is the LED filament shown in FIG. 27C presented in two dimensional coordinate system defining four quadrants.

Please refer to FIG. 27E. FIG. 27E is the LED filament 100 shown in FIG. 27C presented in two dimensional coordinate system defining four quadrants. The LED filament 100 in FIG. 27E is the same as that in FIG. 27C, which is a top view of the LED light bulb 20$d$ shown in FIG. 27A. As shown in FIG. 27C and FIG. 27E, the origin of the four quadrants is defined as a center of a stand 19$a$ of the LED light bulb 20$d$ in the top view (e.g., a center of the top of the stand 19$a$ shown in FIG. 27A). In the embodiment, the Y-axis is vertical, and the X-axis is horizontal in FIG. 27E. As shown in FIG. 27E, the LED filament 100 in the top view can be divided into a first portion 100$p$1, a second portion 100$p$2, a third portion 100$p$3, and a fourth portion 100$p$4 by the X-axis and the Y-axis. The first portion 100$p$1 of the LED filament 100 is the portion presented in the first quadrant in the top view. The second portion 100$p$2 of the LED filament 100 is the portion presented in the second quadrant in the top view. The third portion 100$p$3 of the LED filament 100 is the portion presented in the third quadrant in the top view. The fourth portion 100$p$4 of the LED filament 100 is the portion presented in the fourth quadrant in the top view.

In some embodiments, the LED filament 100 in the top view may be symmetric in point symmetry (being symmetric with the origin of the four quadrants) or in line symmetry (being symmetric with one of the two axis the four quadrants). In the embodiment, as shown in FIG. 27E, the LED filament 100 in the top view is in line symmetry. In particular, the LED filament 100 in the top view is symmetric with the Y-axis. That is to say, the geometric shape of the first portion 100$p$1 and the fourth portion 100$p$4 are symmetric with that of the second portion 100$p$2 and the third portion 100$p$3. Specifically, the first portion 100$p$1 is symmetric to the second portion 100$p$2 in the top view. Particularly, the first portion 100$p$1 and the second portion 100$p$2 are symmetric in structure in the top view with respect to the Y-axis. In addition, the third portion 100$p$3 is symmetric to the fourth portion 100$p$4 in the top view. Particularly, the third portion 100$p$3 and the fourth portion 100$p$4 are symmetric in structure in the top view with respect to the Y-axis.

Based upon symmetry characteristic of LED filament 100, the structures of the two symmetric portions of the LED filament 100 in the top view (the first portion 100$p$1 and the second portion 100$p$2 or the third portion 100$p$3 and the fourth portion 100$p$4) may be exactly symmetric or be symmetric with a tolerance in structure. The tolerance (or a permissible error) between the structures of the two symmetric portions of the LED filament 100 in the top view may be 20%-50% or less.

For example, as shown in FIG. 27E, a designated point (x1, y1) on the first portion 100$p$1 of the LED filament 100 in the first quadrant is defined as a first position, and a symmetric point (x2, y2) on the second portion 100$p$2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100$p$1 and the second portion 100$p$2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 27E, a designated point (x3, y3) on the third portion 100$p$3 of the LED filament 100 in the third quadrant is defined as a third position, and a symmetric point (x4, y4) on the fourth portion 100$p$4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100$p$3 and the fourth portion 100$p$4 are symmetric with a tolerance (e.g., a difference in coordinates being less than 20%) in structure. In other words, x4 of the symmetric point (x4, y4) is unequal to negative x3 of the designated point (x3, y3), and y4 of the symmetric point (x4, y4) is unequal to y3 of the designated point (x3, y3). As shown in FIG. 27E, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 27E, a length of the first portion 100$p$1 of the LED filament 100 in the first quadrant in the top view is substantially equal to a length of the second portion 100$p$2 of the LED filament 100 in the second quadrant in the top view. In the embodiment, the length is defined along an elongated direction of the LED filament 100 in a plane view (e.g., a top view, a front view, or a top view). For example, the second portion 100$p$2 elongates in the second quadrant in the top view shown in FIG. 27E to form a reversed "L" shape with two ends respectively contacting the X-axis and the Y-axis, and the length of the second portion 100$p$2 is defined along the reversed "L" shape.

In addition, a length of the third portion 100$p$3 of the LED filament 100 in the third quadrant in the top view is substantially equal to a length of fourth portion 100$p$4 of the LED filament 100 in the fourth quadrant in the top view. Since the third portion 100$p$3 and the fourth portion 100$p$4 are symmetric with respect to the Y-axis with a tolerance in structure, there may be a slight difference between the length of the third portion 100$p$3 and the length of fourth portion 100$p$4. The difference may be 20%-50% or less.

As shown in FIG. 27E, an emitting direction of a designated point of the first portion 100$p$1 and an emitting direction of a symmetric point of the second portion 100$p$2 symmetric to the designated point are symmetric in direction in the top view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100$p$1 has an emitting direction ED towards the right in FIG. 27E, and the symmetric point (x2, y2) of the second portion 100$p$2 has an emitting direction ED towards left in FIG. 27E. The emitting direction ED of the designated point (x1, y1) and the emitting direction ED of the symmetric point (x2, y2) are symmetric with respect to the Y-axis. In addition, the designated point (x3, y3) of the third portion 100$p$3 has an emitting direction ED towards a lower-left direction in FIG. 27E, and the symmetric point (x4, y4) of the fourth portion 100$p$4 has an emitting direction ED towards a lower-right direction in FIG. 27E. The emitting direction ED of the designated point (x3, y3) and the emitting direction ED of the symmetric point (x4, y4) are symmetric with respect to the Y-axis. In addition, an emitting direction ED of any designated point of the first portion 100$p$1 and an emitting direction ED of a corresponding symmetric point of the second portion 100$p$2 symmetric to the designated point are symmetric in direction in the top view with respect to the Y-axis. An emitting direction ED of any designated point of the third portion 100$p$3 and an emitting direction ED of a corresponding symmetric point of the fourth portion 100$p$4 symmetric to the designated point are symmetric in direction in the top view with respect to the Y-axis.

Definition of the omni-directional light depends on regions and varies over time. Depending on different institutions and countries, LED light bulbs which claim omni-directional light may need to meet different standards. For example, page 24 of the ENERGY STAR Program Requirements for Lamps (bulbs)—Eligibility Criteria Version 1.0 defines that an omnidirectional lamp in base-on position has to emit at least 5% of total flux (lm) in 135° to 180° zone, that 90% of measured intensity values may vary by no more than 25% from the average of all measured values in all planes, and that luminous intensity (cd) is measured within each vertical plane at a 5° vertical angle increment (maximum) from 0° to 135°. Japanese JEL 801 requires luminous flux of an LED lamp within a 120 degrees zone about a light axis shall not be less than 70% of total flux. Because the above embodiment possesses a symmetrical arrangement of LED filament, an LED light bulb with the LED filament is able to meet various standards of omni-directional lamps.

Figure 28A:
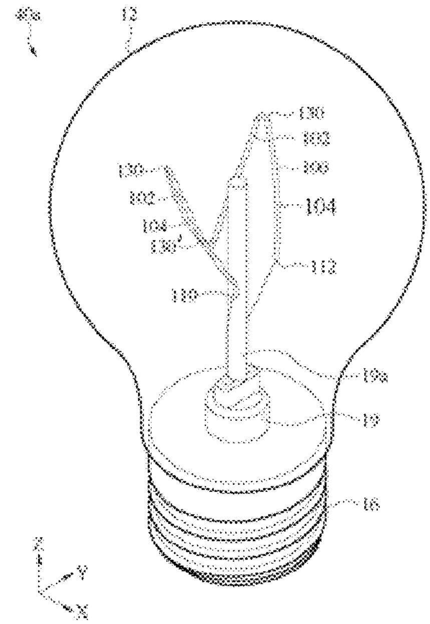
FIGS. 28A to 28D are respectively a perspective view, a side view, another side view and a top view of an LED light bulb in accordance with an embodiment of the present invention.
Figure 28B:
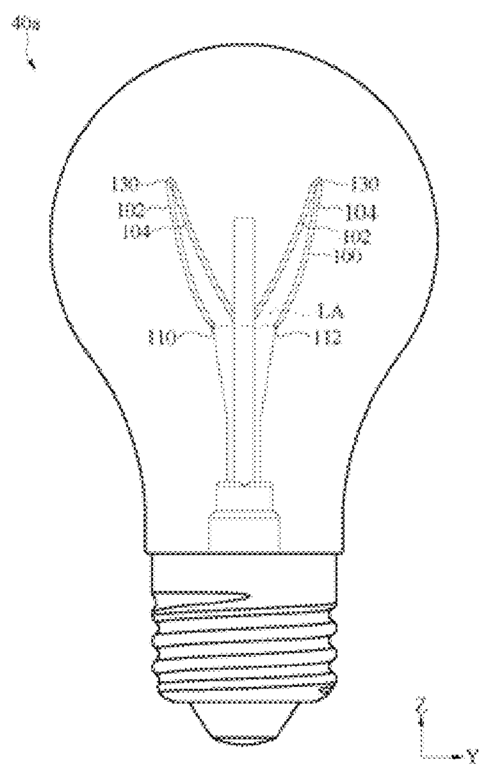
Figure 28C:
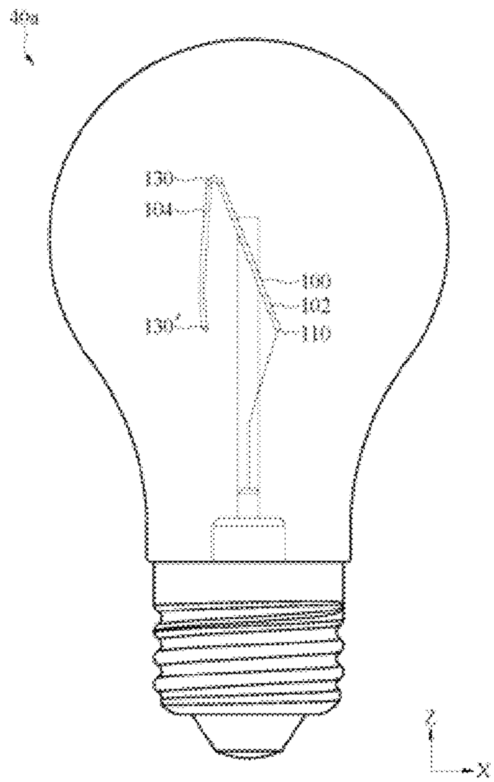
Figure 28D:
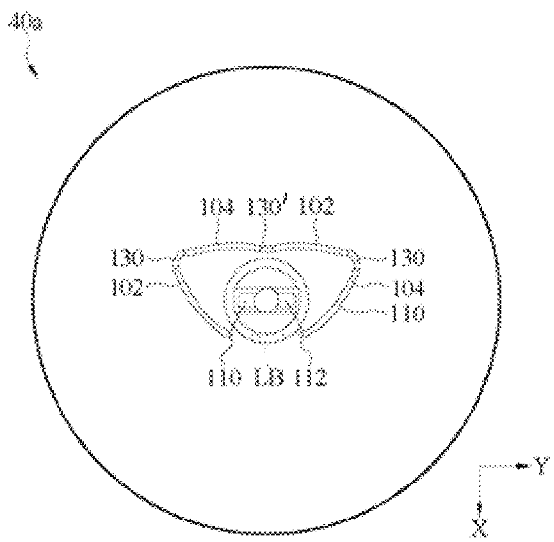

Referring to FIGS. 28A, 28B, 28C and FIG. 28D, FIG. 28A illustrates a schematic diagram of an LED light bulb 40$a$ according to an embodiment of the present invention, FIG. 28B to FIG. 28D are a side view, another side view and the top view of the LED light bulb, respectively. In the present embodiment, the LED light bulb 40$a$ includes a lamp housing 12, a bulb base 16 connected to the lamp housing 12, a stem 19, and a single LED filament 100. Moreover, the LED light bulb 40$a$ and the single LED filament 100 disposed in the LED light bulb 40$a$ can refer to related descriptions of the previous embodiments, wherein the same or similar components and the connection relationship between components is no longer detailed.

In the present embodiment, the stem 19 is connected to the bulb base 16 and located in the lamp housing 12, the stem 19 has a stand 19$a$ extending vertically to the center of the lamp housing 12, the stand 19$a$ is located on the central axis of the bulb base 16, or is located on the central axis of the LED light bulb 40$a$. The LED filament 100 is disposed around the stand 19$a$ and is located within the lamp housing 12, and the LED filament 100 can be coupled to the stand 19$a$ through a cantilever to maintain a predetermined curve and shape. Wherein a detailed description of the cantilever can be referenced to the previous embodiment and the drawings. The LED filament 100 includes two conductive electrodes 110, 112 at both ends, a plurality of LED sections 102, 104 and a plurality of conductive sections 130. As shown in FIG. 28A to FIG. 28D, in order to separate the conductive section 130 and the LED sections 102, 104 in the drawing, the plurality of the conductive sections 130 of the LED filament 100 is illustrated as points or small segments, which is only for the illustrations. It is easier to understand, and not for any limitation, and the subsequent embodiments are similar to the related drawings by the point or small segment distribution of the conductive section 130 to distinguish from the LED sections 102, 104. As described in various previous embodiments, each of the LED sections 102, 104 can include a plurality of LED chips connected to each other, and each of the conductive sections 130 can include a conductor. Each conductive section 130 is located between adjacent two LED sections 102, 104. The conductors in each conductive section 130 connect the LED chips in the adjacent two LED sections 102, 104, and the LED chips in the two LED sections 102 adjacent to the two conductive electrodes 110, 112 are respectively connected to the two conductive electrodes 110, 112. The stem 19 can be connected to the two conductive electrodes 110, 112 by means of conductive brackets, details of the conductive brackets can be referred to the previous embodiment and the drawings.

As shown in FIG. 28A to FIG. 28D, the LED filament 100 comprises two first conductive sections 130, one second conductive sections 130', and four LED sections 102, 104, and every two adjacent LED sections 102, 104 are connected through the bending first and second conductive section 130, 130'. Moreover, since the first and second conductive sections 130, 130' have better bendability than that of the LED sections 102, 104, the first and second conductive sections 130, 130' between the two adjacent LED sections 102, 104 can be bent severely, so that the angle between the two adjacent LED sections 102, 104 can be smaller, for example, the included angle can reach 45 degrees or less. In the present embodiment, each LED section 102, 104 is slightly curved or not bent compared to the first and second conductive sections 130, 130', so that a single LED filament 100 in the LED light bulb 40*a* can be bent severer because of the first and second conductive sections 130, 130', and the curling change in bending is more significant. Moreover, the LED filament 100 can be defined as a piece following each bending conductive sections 130, 130', and each LED section 102, 104 is formed into a respective piece.

As shown in FIG. 28B and FIG. 28C, each of the first and second conductive sections 130, 130' and the two adjacent LED sections 102, 104 is composed to form a U-shaped or V-shaped bent structure, that is, the U-shaped or V-shaped bent structure formed by each of the first and second conductive sections 130, 130' and the adjacent two LED sections 102, 104 is bent with two pieces, and the two LED sections 102, 104 are respectively formed the two pieces. In the present embodiment, the LED filament 100 is bent into four pieces by the first and second conductive sections 130, 130', the four LED sections 102, 104 are respectively formed the four pieces. Also, the number of LED sections 102, 104 is one more than the number of the conductive sections 130, 130'.

As shown in FIG. 28B, in the present embodiment, the conductive electrodes 110, 112 are located between the highest point and the lowest point of the LED filament 100 in the Z direction. The highest point is located at the highest first conductive section 130 in the Z direction, and the lowest point is located at the lowest second conductive section 130' in the Z direction. The lower second conductive section 130' and the higher first conductive section 130 are defined with the conductive electrodes 110, 112 as being close to or away from the bulb base 16. Referring to FIG. 28B, in the YZ plane, the positions of the conductive electrodes 110, 112 may constitute a line LA showing with dotted line, there are two first conductive sections 130 above the line LA, and one second conductive sections 130' below the line LA. In other words, in the Z direction, the number of the first conductive sections 130 positioned above the line LA to which the conductive electrodes 110, 112 are connected may be one more than the number of the second conductive section 130' positioned below the line LA. It is also contemplated that relative to the conductive electrodes 110, 112 as a whole, the number of the first conductive sections 130 away from the bulb base 16 is one more than the number of the second conductive section 130' near the bulb base 16. Further, if the LED filament 100 is projected on the YZ plane (refer to FIG. 28B), the line LA connected by the conductive electrodes 110, 112 has at least one intersection with the projection of the LED sections 102, 104. In the YZ plane, the lines LA connected by the conductive electrodes 110, 112 respectively intersect the projections of the two LED sections 104, so that the line LA and the projection of the adjacent two LED sections 104 have two intersections.

As shown in FIG. 28C, if the LED filament 100 is projected on the XZ plane, the projections of the opposing two LED sections 102, 104 overlap each other. In some embodiments, the projections of the opposing two LED sections 102, 104 on a particular plane may be parallel to each other.

As shown in FIG. 28D, if the LED filament 100 is projected on the XY plane, the projections of the conductive electrodes 110, 112 on the XY plane can be connected in a straight line LB showing with dotted line, and the projections of the first and second conductive sections 130,130' on the XY plane are not intersected or overlapped with the line LB, and the projections of the first and second conductive sections 130, 130' on the XY plane are respectively located on one side of the line LB. For example, as showing in FIG. 28D, the projections of the first conductive sections 130 on the XY plane are above the line LB.

As shown in FIGS. 28B to 28D, in the present embodiment, and the projection lengths of the LED filament 100 on the projection planes perpendicular to each other can have a designed proportion, so that the illumination is more uniform. For example, the projection of the LED filament 100 on the first projection surface, such as the XY plane, has a length L1, the projection of the LED filament 100 on the second projection surface, such as the YZ plane, has a length L2, and the projection of the LED filament 100 on the third projection planes, such as the XZ plane, has a length L3. The first projection plane, the second projection plane and the third projection plane are perpendicular to each other, and the normal line of the first projection plane is parallel to the axis of the LED light bulb 40*a* from the center of the lamp housing 12 to the center of the bulb base 16. Further, the projection of the LED filament 100 on the XY plane as shown in FIG. 28D, and the projection thereof will be similar to an inverted and deformed U shape, and the total length of the projection of the LED filament 100 on the XY plane is the length L1. The projection of the LED filament 100 on the YZ plane as shown in FIG. 28B, the projection thereof will be similar to the inverted and deformed W shape, and the total length of the projection of the LED filament 100 on the YZ plane is the length L2. The projection of the LED filament 100 on the XZ plane can be as shown in FIG. 28C, the projection of which will be similar to an inverted V shape, and the total length of the projection of the LED filament 100 on the XZ plane is the length L3. In the present embodiment, the length L1, the length L2, and the length L3 are approximately in a ratio of 1:1:0.9. In some embodiments, the length L1, the length L2, and the length L3 are approximately in a ratio of 1:(0.5 to 1):(0.6 to 0.9). For example, if the ratio of the length L1, the length L2, and the length L3 is closer to 1:1:1, the illumination uniformity of the single LED filament 100 in the LED light bulb 40*a* is better, and the omni-directional light appearance is better.

In some embodiments, the projected length of the LED filament 100 in the XZ plane or in the YZ plane is, for example but not limited thereto, a minimum of the height difference between the first conductive section 130 and the second conductive section 130' in the Z direction multiply by the number of LED sections 102, 104, or a minimum of the height difference of the LED filament 100 in the Z direction multiply by the number of LED sections 102, 104. In the present embodiment, the total length of the LED filament 100 is about 7 to 9 times the total length of the first conductive section 130 or the second conductive section 130'.

In the present embodiment, the LED filament 100 can be bent at the positions of the first and second conductive sections 130, 130' to form various curves, so that not only the overall aesthetic appearance of the LED light bulb 40*a* can be increased but also the light emitting of the LED light bulb 40*a* can be more uniform, and the better illumination is achieved.

Figure 29A:
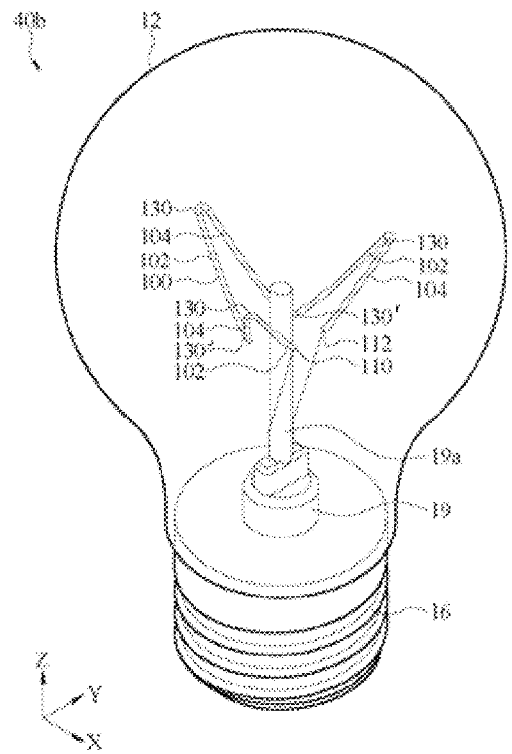
FIGS. 29A to 29D are respectively a perspective view, a side view, another side view and a top view of an LED light bulb in accordance with an embodiment of the present invention.
Figure 29B:
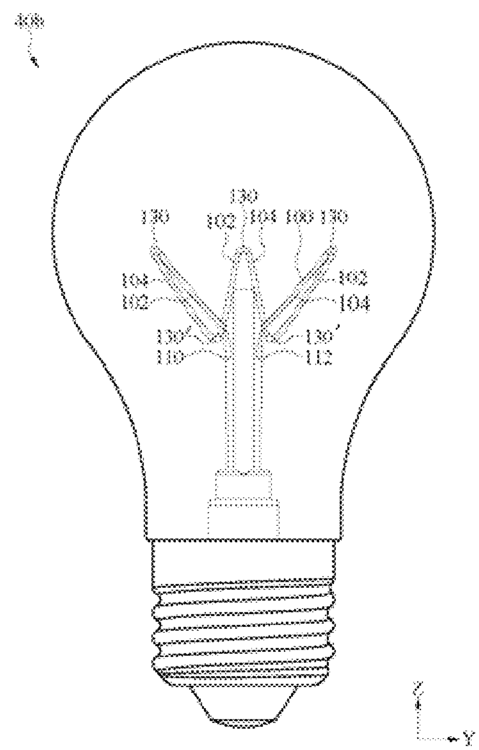
Figure 29C:
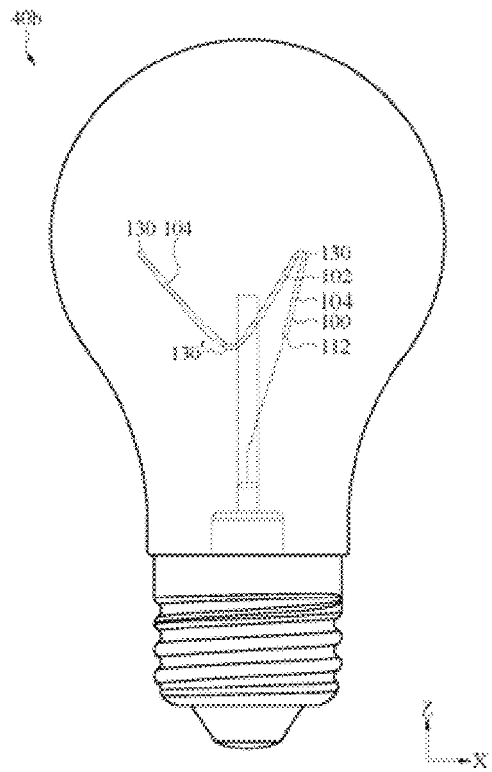
Figure 29D:
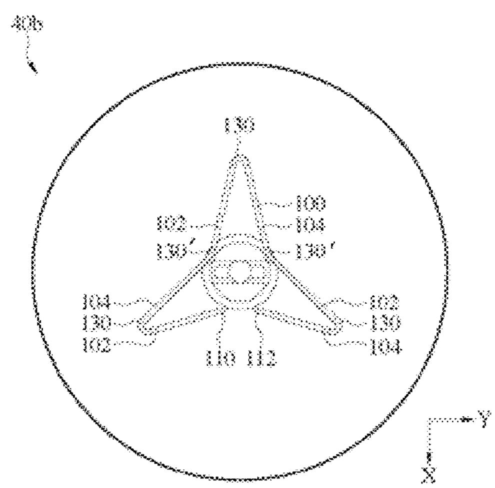

Referring to FIGS. 29A to 29D, FIG. 29A is a perspective diagram of an LED light bulb 40*b* according to an embodiment of the present invention, and FIGS. 29B to 29D are respectively side views, another side view, and top view of FIG. 29A. In the present embodiment, the LED light bulb 40*b* includes a lamp housing 12, a bulb base 16 connected to the lamp housing 12, a stem 19, a stand 19*a*, and a single LED filament 100. The LED filament 100 includes two conductive electrodes 110, 112 disposed at two ends, a plurality of LED sections 102, 104 and a plurality of the first and second conductive sections 130, 130'. Moreover, the LED light bulb 40*b* and the LED filament 100 disposed in the LED light bulb 40*b* may refer to related descriptions of the previous embodiments, wherein the same or similar components and the connection relationship between components is no longer detailed.

As shown in FIG. 29A to FIG. 29D, the LED filament 100 comprises three first conductive sections 130, two second conductive sections 130' of, and six LED sections 102, 104, and every two adjacent LED sections 102, 104 are connected through the bending first or second conductive sections 130, 130'. Therefore, a single LED filament 100 in the LED light bulb 40*b* can be bent severer because of the first and second conductive sections 130, 130', and the curling modification in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into six sections by the three first conductive sections 130 and the two second conductive sections 130', wherein the six LED sections 102, 104 are respectively the six pieces.

Referring to FIG. 29A and FIG. 29B, in the present embodiment, the height of the upper three first conductive sections 130 may be greater than the height of the other lower two second conductive sections 130' in the Z direction. The height of the four LED sections 102, 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the first conductive section 130 in the Z direction. As shown in FIG. 29C of the present embodiment, the projections of the opposite LED sections 102, 104 are overlapped each other when the LED filament 100 is projected on the XZ plane. In the embodiment as shown in FIG. 29D, when the LED filament 100 is projected on the XY plane, the projections of all the second conductive sections 130' are located in one side of a straight line connecting between the conductive electrodes 110, 112, and the projections of the first conductive section 130 is dispersed on both sides of the straight line connecting between the conductive electrodes 110, 112.

Figure 30A:
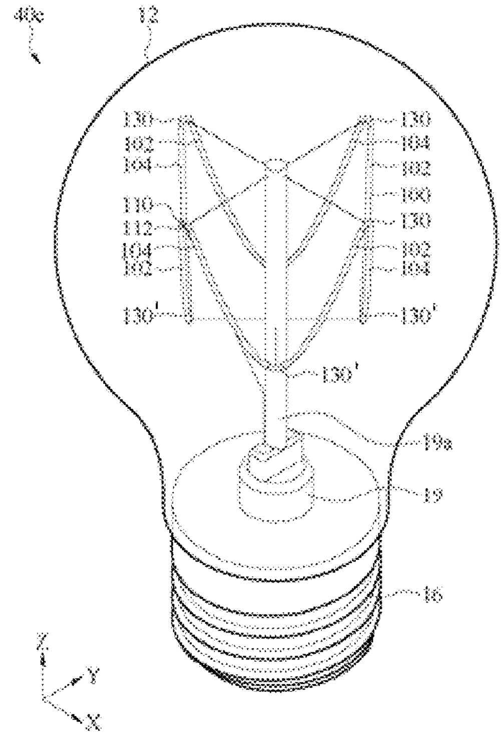
FIGS. 30A to 30D are respectively a perspective view, a side view, another side view and a top view of an LED light bulb in accordance with an embodiment of the present invention.
Figure 30B:
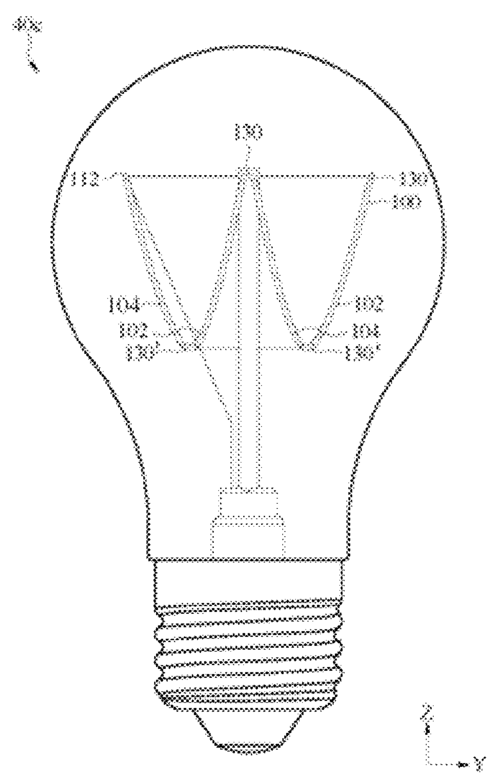
Figure 30C:
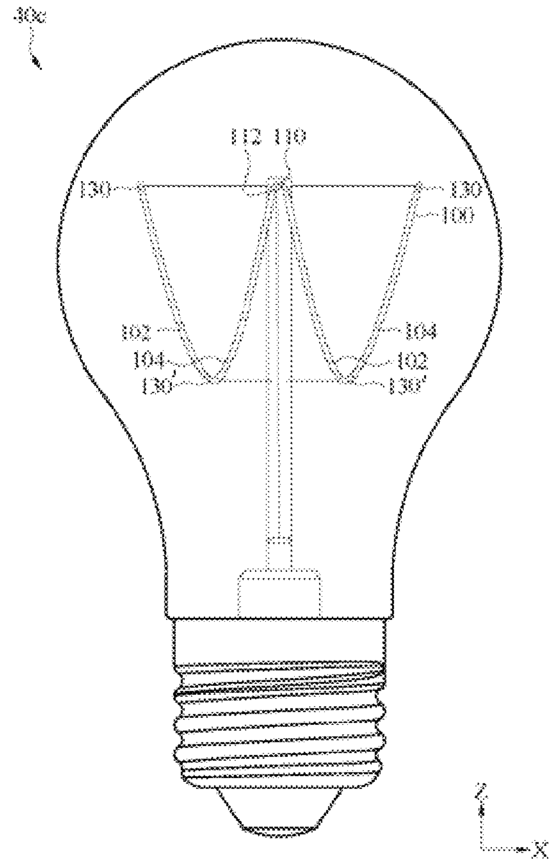
Figure 30D:
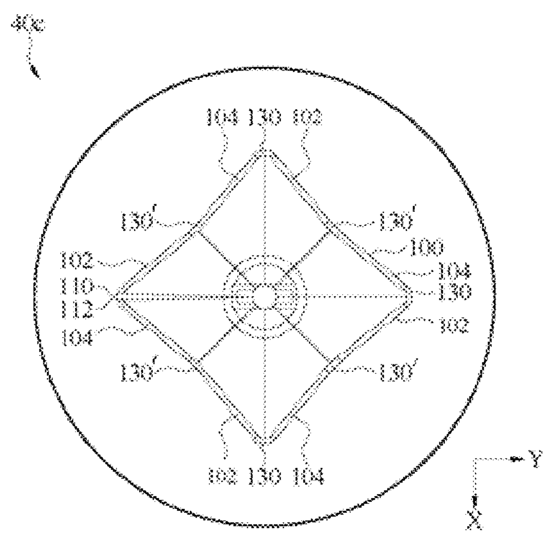

Referring to FIGS. 30A to 30D, FIG. 30A is a perspective diagram of an LED light bulb 40*c* according to an embodiment of the present invention, and FIGS. 30B to 30D are respectively side view, another side view, and top view of the FIG. 30A. In the present embodiment, the LED light bulb 40*c* includes a lamp housing 12, a bulb base 16 connected to the lamp housing 12, a stem 19, a stand 19*a*, and a single LED filament 100. The LED filament 100 includes two conductive electrodes 110, 112 disposed at two ends, a plurality of LED sections 102, 104 and a plurality of first and second conductive sections 130, 130'. Moreover, the LED light bulb 40*c* and the single LED filament 100 disposed in the LED light bulb 40*c* can refer to related descriptions of the previous embodiments, wherein the same or similar components and the connection relationship between components is no longer detailed.

As shown in FIG. 30A to FIG. 30D, the LED filament 100 comprises three first conductive sections 130 and four second conductive sections 130', and eight LED sections 102, 104, and every two adjacent LED sections 102, 104 are connected by the bending first or second conductive sections 130, 130'. Therefore, the single LED filament 100 in the LED light bulb 40*c* can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into eight sections by the three first conductive sections 130 and the four second conductive sections 130', wherein the eight LED sections 102, 104 are respectively the eight sections.

Referring to FIG. 30A and FIG. 30B, in the present embodiment, the height of the upper three first conductive sections 130 may be greater than the height of the other lower four second conductive sections 130' in the Z direction. The height of the six LED sections 102, 104 is between the upper first conductive section 130 and the lower second conductive section 130' in the Z direction. The other two LED sections 102, 104 extend upward from the corresponding second conductive section 130' in the Z direction, and the height of the conductive electrodes 110, 112 is approximately equal to the height of the upper first conductive section 130 in the Z direction. As shown in FIG. 30B and FIG. 30C of the present embodiment, the projections of the opposite LED sections 102, 104 are overlapped each other when the LED filament 100 is projected on the YZ plane (referring to FIG. 30B) or XZ plane (referring to FIG. 30C). In the embodiment as shown in FIG. 30D, when the LED filament 100 is projected on the XY plane, all the projections of the first and second conductive sections 130, 130' are located in one side of a straight line connecting between the conductive electrodes 110, 112.

Figure 31A:
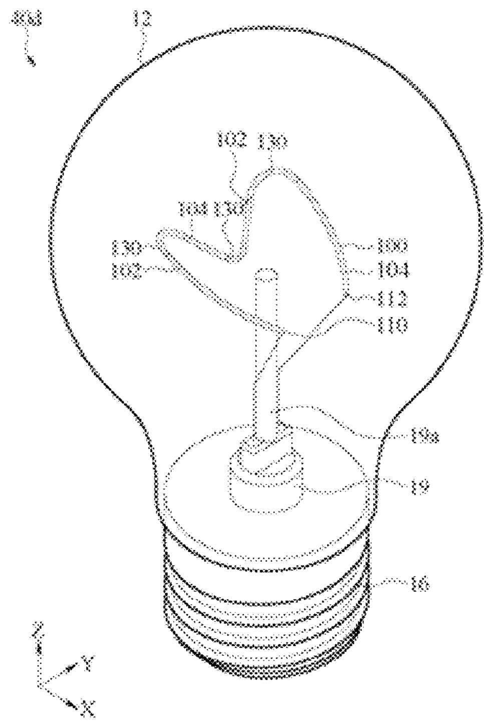
FIGS. 31A to 31D are respectively a perspective view, a side view, another side view and a top view of an LED light bulb in accordance with an embodiment of the present invention.
Figure 31B:
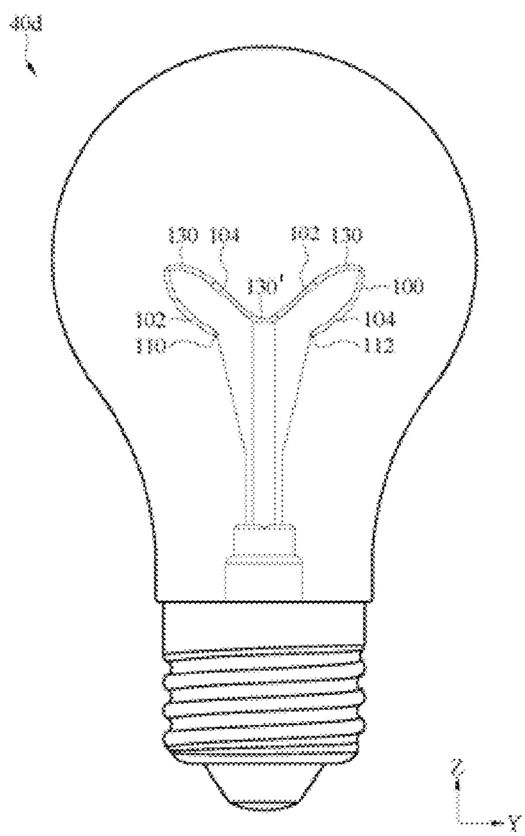
Figure 31C:
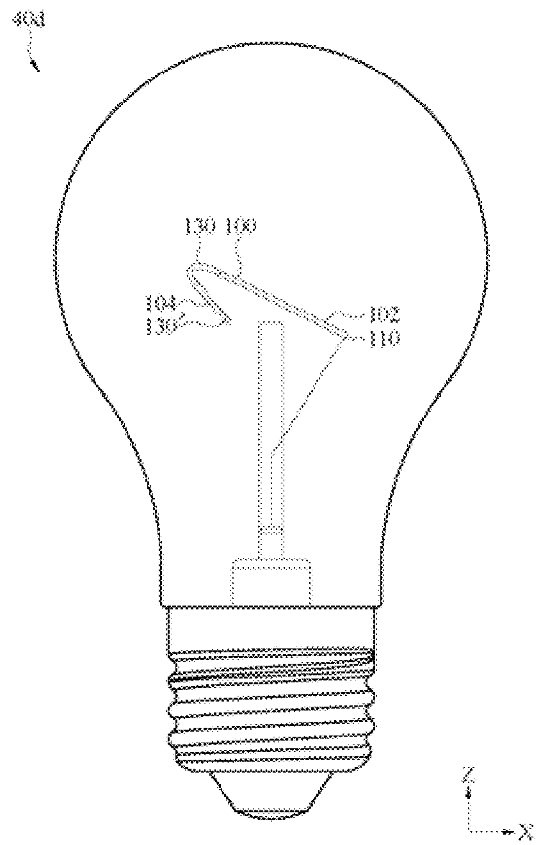
Figure 31D:
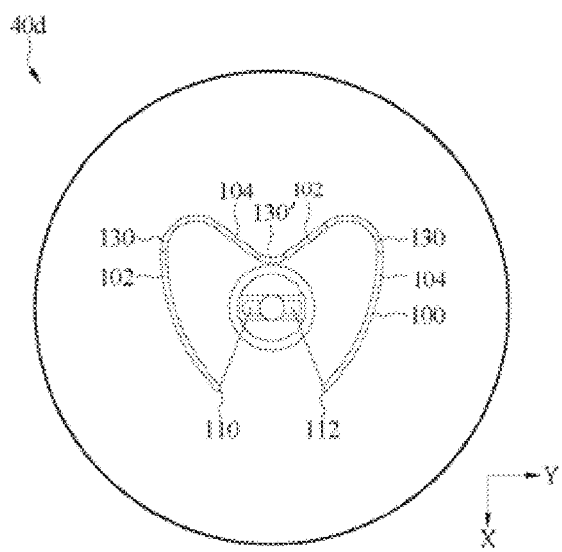

Referring to FIGS. 31A to 31D, FIG. 31A is a perspective diagram of an LED light bulb 40*d* according to an embodiment of the present invention, and FIGS. 31B to 31D are respectively side view, another side view, and top view of the FIG. 31A. In the present embodiment, the LED light bulb 40*d* includes a lamp housing 12, a bulb base 16 connected to the lamp housing 12, a stem 19, a stand 19*a*, and a single LED filament 100. The LED filament 100 includes two conductive electrodes 110, 112 at two ends, a plurality of LED sections 102, 104 and a plurality of first and second conductive sections 130, 130'. Moreover, the LED light bulb 40*d* and the single LED filament 100 disposed in the LED light bulb 40*d* can refer to related descriptions of the previous embodiments, wherein the same or similar components and the connection relationship between components is no longer detailed.

As shown in FIG. 31A to FIG. 31D, the LED filament 100 comprises two first conductive sections 130 and one second conductive section 130', and four LED sections 102, 104, and every two adjacent LED sections 102, 104 are connected by the bending first or second conductive sections 130, 130'. Therefore, the single LED filament 100 in the LED light bulb 40*d* can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into four sections by two first conductive sections 130 and one second conductive sections 130', wherein the four LED sections 102, 104 are respectively the four sections.

Referring to FIG. 31A, FIG. 31B and FIG. 31C, in the present embodiment, the height of the upper two first conductive sections 130 may be greater than the height of the second conductive sections 130' in the Z direction. The height of the two LED sections 102, 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the second conductive section 130' in the Z direction. As shown in FIG. 31C of the present embodiment, the projections of the opposite LED sections 102, 104 are overlapped each other when the LED filament 100 is projected on the XZ plane. In the embodiment as shown in FIG. 31D, when the LED filament 100 is projected on the XY plane, all the projections of the first and second conductive sections 130, 130' are located in one side of a straight line connecting between the conductive electrodes 110, 112.

Compared to the LED filament 100 of the LED light bulb 40*a* shown in FIGS. 28A to 28D, the height difference between the first and second conductive sections 130, 130' of the LED filament 100 of the LED light bulb 40*d* shown in FIGS. 31A to 31D is smaller in the Z direction, the bending curvature of the first and second conductive sections 130, 130' is relatively large, so that the fluctuation curve of the LED filament 100 as a whole is tending to smaller.

Figure 32A:
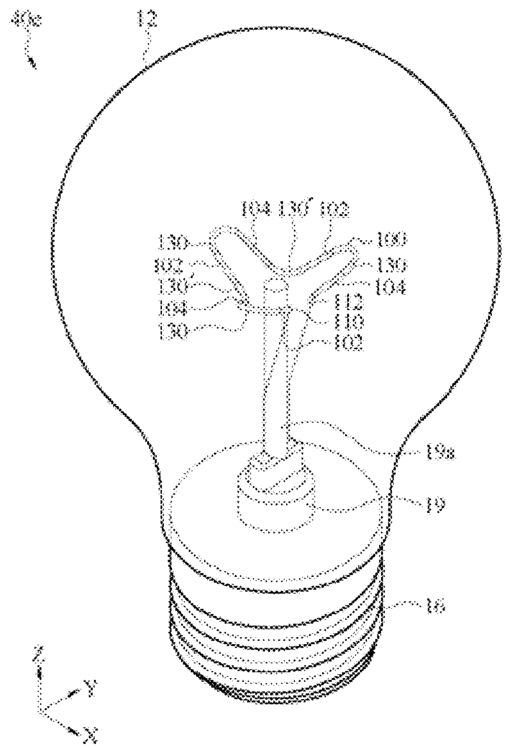
FIGS. 32A to 32D are respectively a perspective view, a side view, another side view and a top view of an LED light bulb in accordance with an embodiment of the present invention.
Figure 32B:
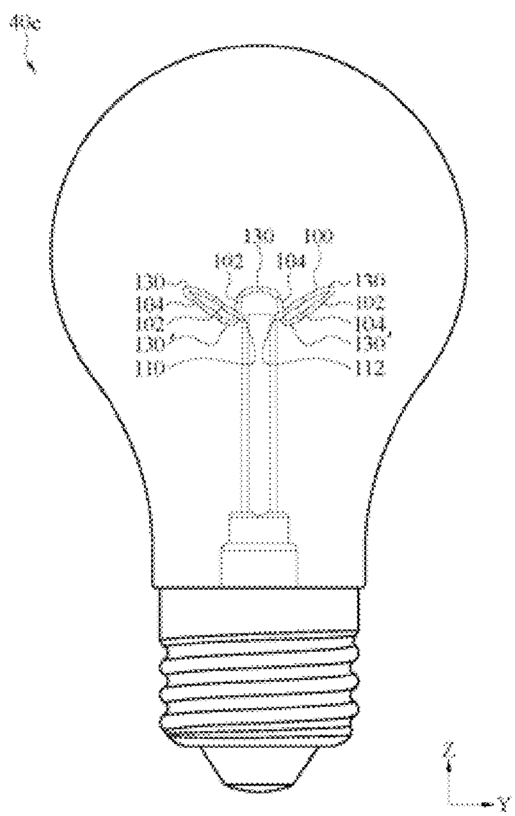
Figure 32C:
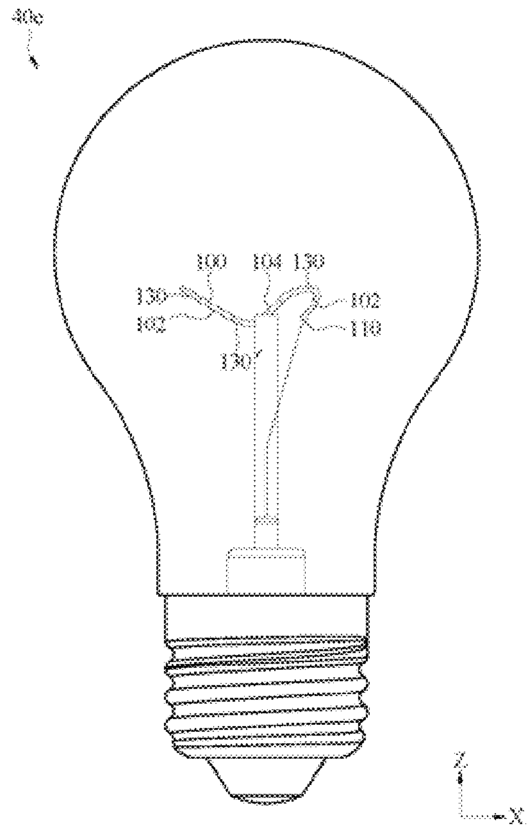
Figure 32D:
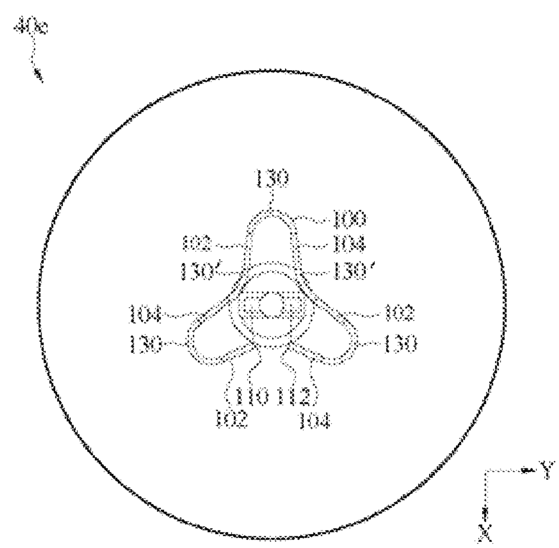

Referring to FIGS. 32A to 32D, FIG. 32A is a perspective diagram of an LED light bulb 40*e* according to an embodiment of the present invention, and FIGS. 32B to 32D are respectively side view, another side view, and top view of the FIG. 32A. In the present embodiment, the LED light bulb 40*e* includes a lamp housing 12, a bulb base 16 connected to the lamp housing 12, a stem 19, a stand 19*a*, and a single LED filament 100. The LED filament 100 includes two conductive electrodes 110, 112 disposed at two ends, a plurality of LED sections 102, 104 and a plurality of first and second conductive sections 130, 130'. Moreover, the LED light bulb 40*c* and the single LED filament 100 disposed in the LED light bulb 40*e* can refer to related descriptions of the previous embodiments, wherein the same or similar components and the connection relationship between components is no longer detailed.

As shown in FIG. 32A to FIG. 32D, the LED filament 100 comprises three first conductive sections 130 and two second conductive sections 130', and six LED sections 102, 104, and every two adjacent LED sections 102, 104 are connected by the bending first or second conductive sections 130, 130'. Therefore, the single LED filament 100 in the LED light bulb 40*e* can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into six sections by the three first conductive sections 130 and the two second conductive sections 130', wherein the six LED sections 102, 104 are respectively the six sections.

Referring to FIG. 32A, FIG. 32B and FIG. 32C, in the present embodiment, the height of the upper three first conductive sections 130 may be greater than the height of the lower two second conductive sections 130' in the Z direction. The height of the four LED sections 102, 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the first conductive section 130 in the Z direction. As shown in FIG. 32C of the present embodiment, the projections of the opposite LED sections 102, 104 are overlapped each other when the LED filament 100 is projected on the XZ plane. In the embodiment as shown in FIG. 32D, when the LED filament 100 is projected on the XY plane, the projections of the second conductive sections 130' are located in one side of a straight line connecting between the conductive electrodes 110, 112.

Compared to the LED filament 100 of the LED light bulb 40*b* shown in FIGS. 29A to 29D, the height difference between the first and second conductive sections 130, 130' of the LED filament 100 of the LED light bulb 40*e* of FIGS. 32A to 32D is smaller in the Z direction, the bending curvature of the first and second conductive sections 130, 130' is relatively large, so that the fluctuation curve of the LED filament 100 as a whole is tending to smaller.

Figure 33A:
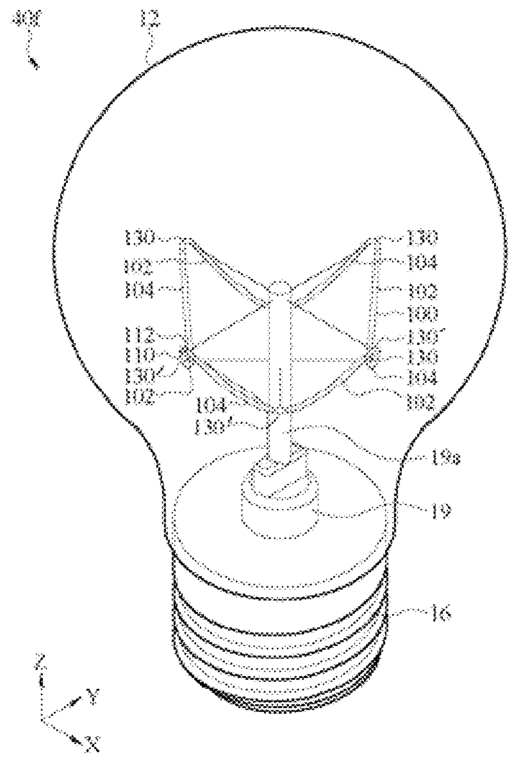
FIGS. 33A to 33D are respectively a perspective view, a side view, another side view and a top view of an LED light bulb in accordance with an embodiment of the present invention.
Figure 33B:
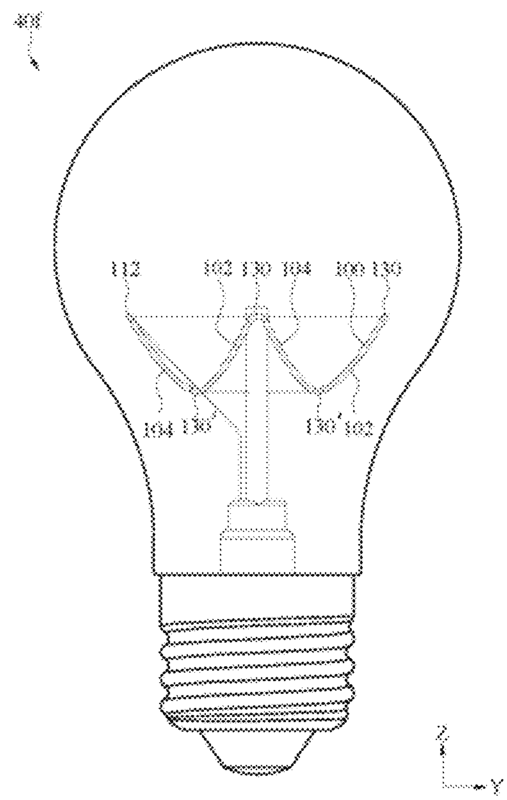
Figure 33C:
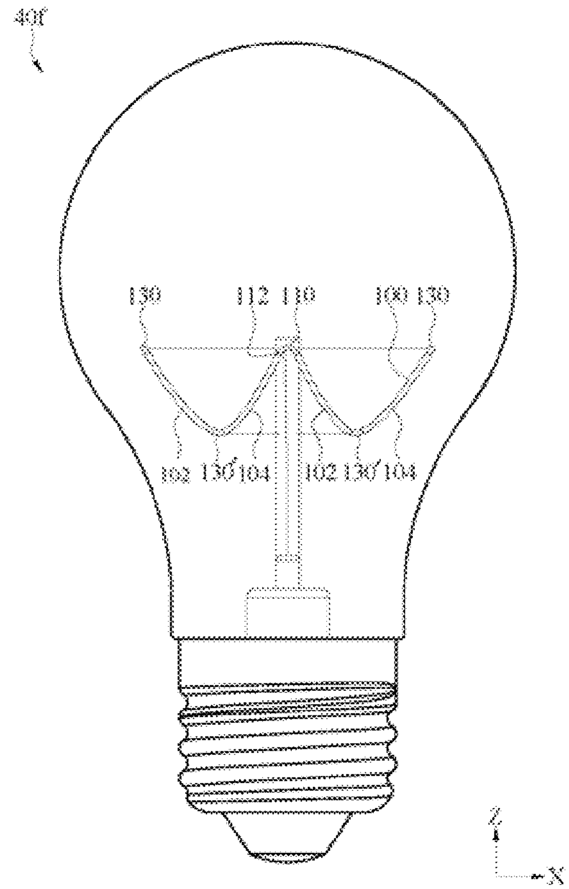
Figure 33D:
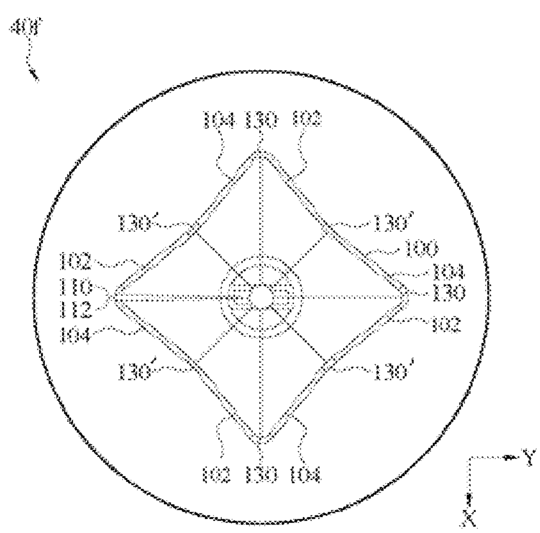

Referring to FIGS. 33A to 33D, FIG. 33A is a perspective diagram of an LED light bulb 40*f* according to an embodiment of the present invention, and FIGS. 33B to 33D are respectively side view, another side view, and top view of the FIG. 33A. In the present embodiment, the LED light bulb 40*f* includes a lamp housing 12, a bulb base 16 connected to the lamp housing 12, a stem 19, a stand 19*a*, and a single LED filament 100. The LED filament 100 includes two conductive electrodes 110, 112 disposed at two ends, a plurality of LED sections 102, 104 and a plurality of first and second conductive sections 130, 130'. Moreover, the LED light bulb 40*f* and the single LED filament 100 disposed in the LED light bulb 40*f* can refer to related descriptions of the previous embodiments, wherein the same or similar components and the connection relationship between components is no longer detailed.

As shown in FIG. 33A to FIG. 33D, the LED filament 100 comprises three first conductive sections 130 and four second conductive sections 130', and eight LED sections 102, 104, and every two adjacent LED sections 102, 104 are connected by the bending first or second conductive sections 130, 130'. Therefore, the single LED filament 100 in the LED light bulb 40*f* can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into respective sections. In the present embodiment, the LED filament 100 is bent into eight sections by three conductive sections 130 and four second conductive sections 130', wherein the eight LED sections 102, 104 are respectively the eight sections.

Referring to FIG. 33A, FIG. 33B and FIG. 33C, in the present embodiment, the height of the upper three first conductive sections 130 may be greater than the height of the lower four second conductive sections 130' in the Z direction. The height of the six LED sections 102, 104 is between the upper first conductive section 130 and the lower second conductive section 130' in the Z direction. The other two LED sections 102, 104 extend upward from the corresponding second conductive section 130' in the Z direction, and the height of the conductive electrodes 110, 112 is approximately equal to the height of the upper second conductive section 130' in the Z direction. As shown in FIG. 33B and FIG. 33C of the present embodiment, the projections of the opposite LED sections 102, 104 are overlapped each other when the LED filament 100 is projected on the YZ plane (referring to FIG. 33B) or the XZ plane (referring to FIG. 33C). In the embodiment as shown in FIG. 33D, when the LED filament 100 is projected on the XY plane, all the projections of the first and second conductive sections 130, 130' are located in one side of a straight line connecting between the conductive electrodes 110, 112.

Compared to the LED filament 100 of the LED light bulb 40*c* shown in FIGS. 30A to 30D, the height difference between the first and second conductor sections 130, 130' of the LED filament 100 of the LED light bulb 40*f* shown in FIGS. 33A to 33D is smaller in the Z direction, the bending curvature of the first and second conductive sections 130, 130' is relatively large, so that the fluctuation curve of the LED filament 100 as a whole is tending to smaller.

Figure 34A:
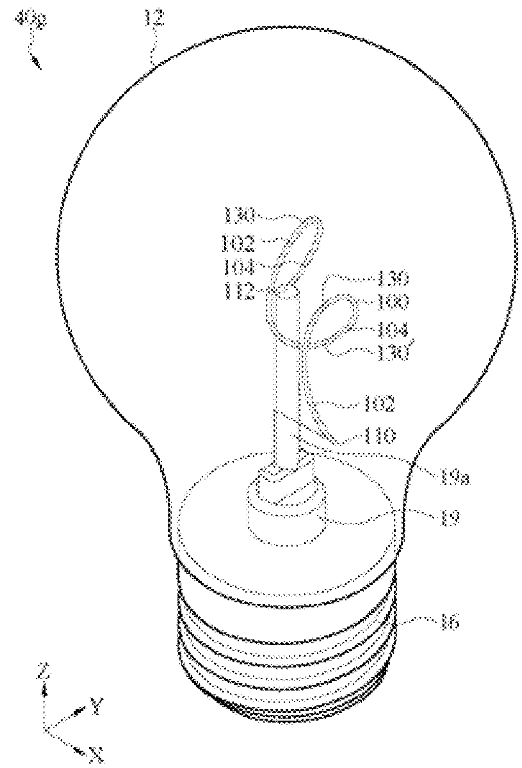
FIGS. 34A to 34D are respectively a perspective view, a side view, another side view and a top view of an LED light bulb in accordance with an embodiment of the present invention.
Figure 34B:
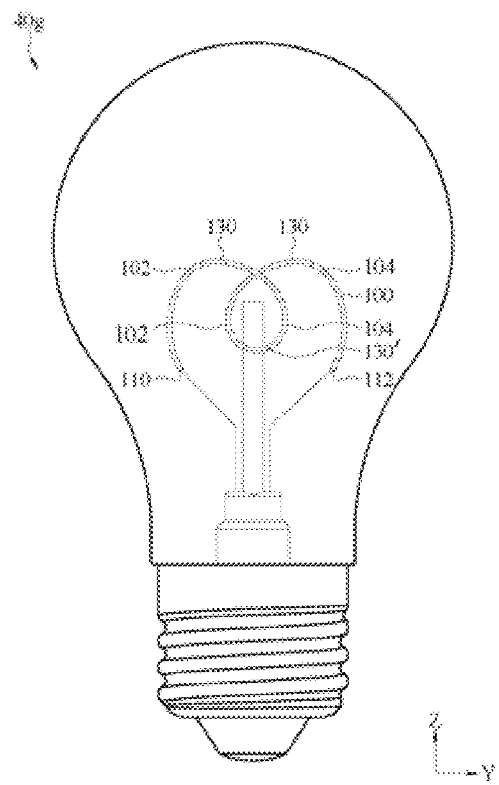
Figure 34C:
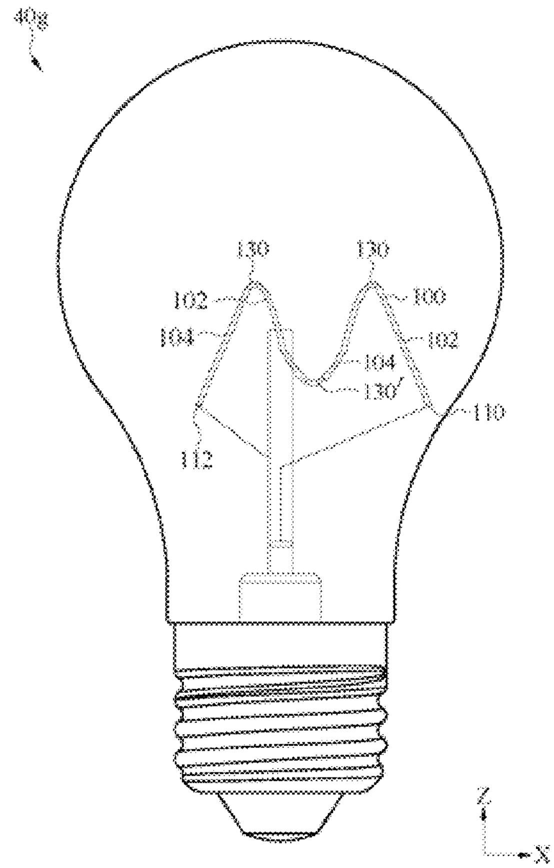
Figure 34D:
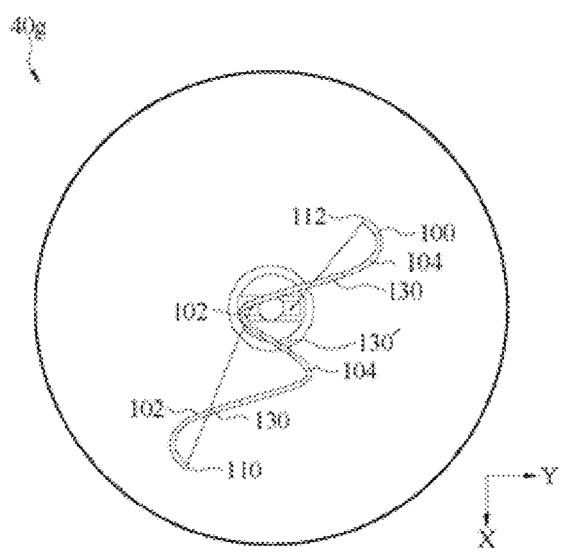

Referring to FIGS. 34A to 34D, FIG. 34A is a perspective diagram of an LED light bulb 40*g* according to an embodiment of the present invention, and FIGS. 34B to 34D are respectively side view, another side view, and top view of the FIG. 34A. In the present embodiment, the LED light bulb 40*g* includes a lamp housing 12, a bulb base 16 connected to the lamp housing 12, a stem 19, a stand 19*a*, and a single LED filament 100. The LED filament 100 includes two conductive electrodes 110, 112 disposed at two ends, a plurality of LED sections 102, 104 and a plurality of first and second conductive sections 130, 130'. Moreover, the LED light bulb 40*g* and a single LED filament 100 disposed in the LED light bulb 40*g* can refer to related descriptions of the previous embodiments, wherein the same or similar components and the connection relationship between components is no longer detailed.

As shown in FIG. 34A to FIG. 34D, the LED filament 100 comprises two conductive sections 130, one second conductive section 130', and four LED sections 102, 104, and every two adjacent LED sections 102, 104 are connected by the bending first and second conductive sections 130, 130'. Therefore, the single LED filament 100 in the LED light bulb 40*g* can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into four sections by the two conductive sections 130 and the one second conductive section 130', wherein the four LED sections 102, 104 are respectively the four sections.

Referring to FIG. 34A, FIG. 34B and FIG. 34C, in the present embodiment, the height of the upper two first conductive sections 130 may be greater than the height of the lower one second conductive sections 130' in the Z direction. The height of the two LED sections 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the second conductive section 130' in the Z direction.

In the present embodiment as shown in FIG. 34A, the LED filament 100 extends around an axial direction and is resulted of a curling posture similar to spiral-like. As shown in FIG. 34B, the diameter of the spiral-like intermediate coil of the LED filament 100 (ie, the portion around which the two LED sections 102, 104 are formed) is relatively small, and the diameter of the outer spiral-like coil of the LED filament 100 (ie, the portion of the other two LED sections 102, 104 that extends outwardly and connects respectively with the conductive electrodes 110, 112) is relatively large. Moreover, the contour of the LED filament in the YZ plane may form a heart-like shape, and the distance between the two first conductive sections 130 is less than the distance between the two conductive electrodes 110, 112 in the Y direction. In other embodiments, the distance between the two first conductive sections 130 may be greater than or equal to the distance between the two conductive electrodes 110, 112 in the Y direction. In the present embodiment as shown in FIG. 34C, the LED filament 100 is in a shape like deformed S letter in the XZ plane. If the length of the LED filament 100 continues extending in a spiral-like posture along its axial direction, the curling posture of the LED filament 100 may have a plurality of overlapping shapes like deformed S letter in the XZ plane. In the present embodiment as shown in FIG. 34D, the curling posture of the LED filament 100 also has a shape like deformed S letter in the XY plane. If the length of the LED filament 100 continues extending in a spiral-like posture along its axial direction, the curling posture of the LED filament 100 may have a plurality of overlapping shapes like deformed S letter in the XY plane. As shown in FIGS. 34C and 34D, in the present embodiment, the first and second conductive sections 130, 130' are located between the conductive electrodes 110, 112.

Figure 35A:
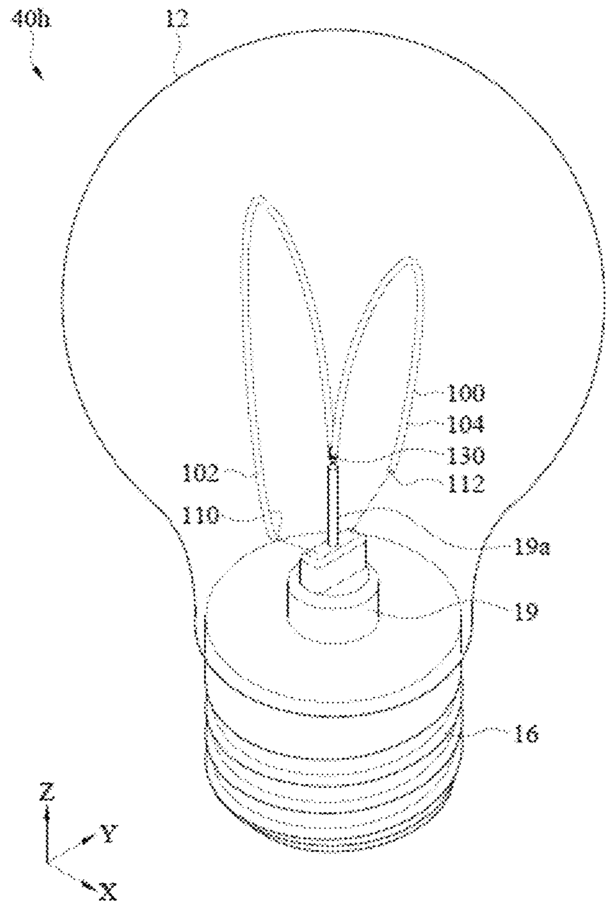
FIGS. 35A to 35D are respectively a perspective view, a side view, another side view and a top view of an LED light bulb in accordance with an embodiment of the present invention.
Figure 35B:
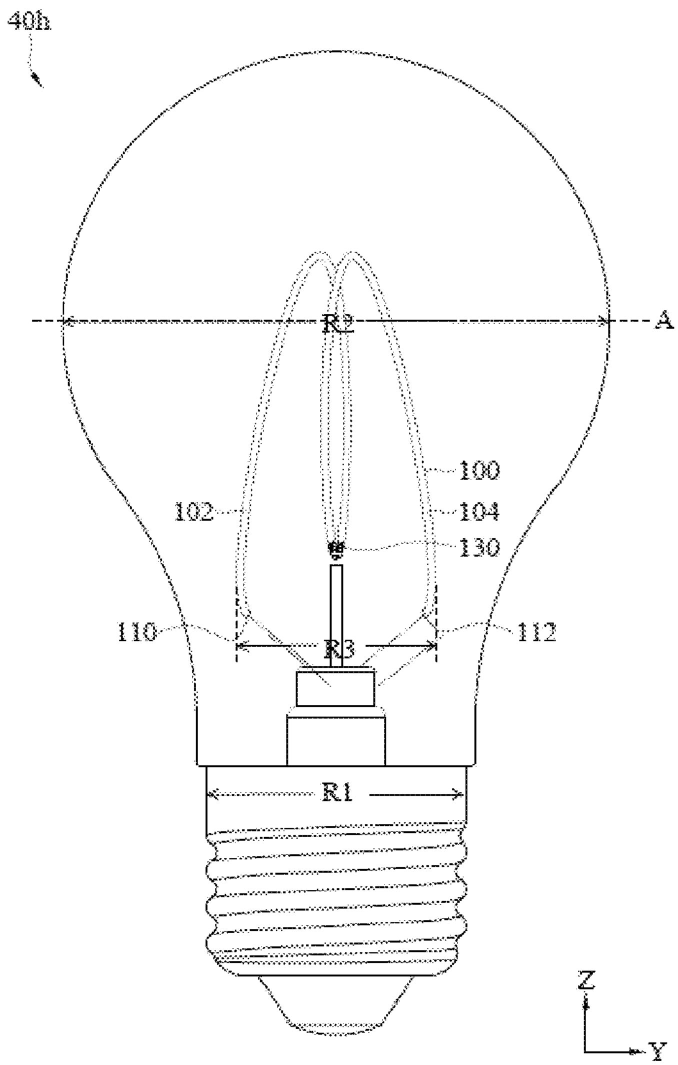
Figure 35C:
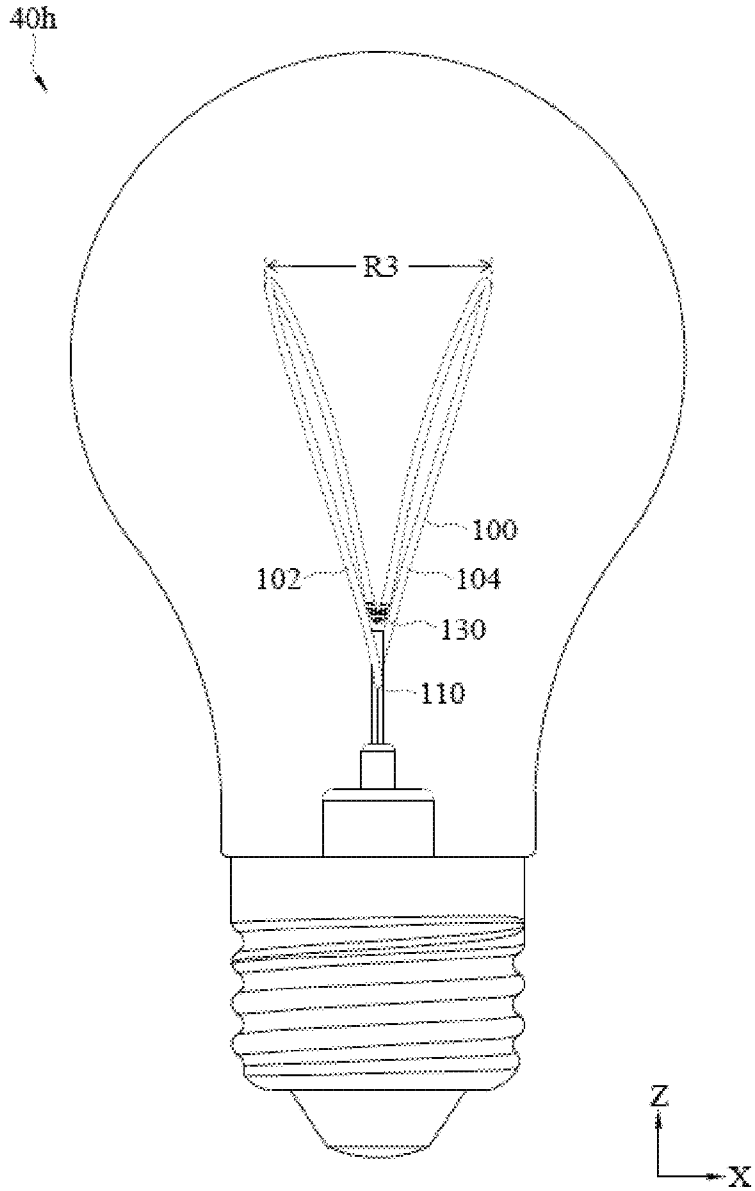
Figure 35D:
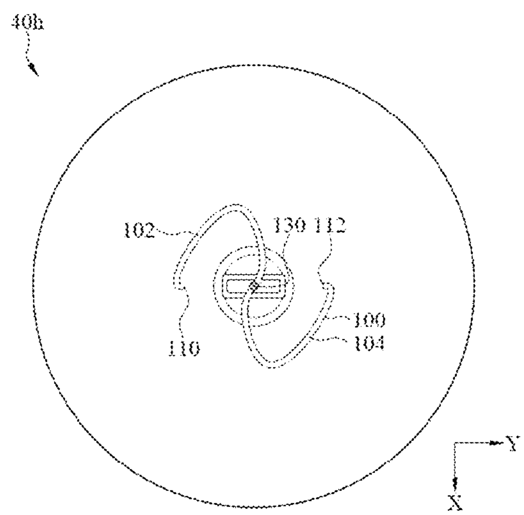

Referring to FIGS. 35A to 35D, FIG. 35A is a perspective diagram of an LED light bulb 40*h* according to an embodiment of the present invention, and FIGS. 35B to 35D are respectively side view, another side view, and top view of the FIG. 35A. In the present embodiment, the LED light bulb 40*h* includes a lamp housing 12, a bulb base 16 connected to the lamp housing 12, a stem 19, a stand 19*a*, and a single LED filament 100. The LED filament 100 includes two conductive electrodes 110, 112 at two ends, a plurality of LED sections 102, 104 and a single conductive section 130. Moreover, the LED light bulb 40*h* and the single LED filament 100 disposed in the LED light bulb 40*h* can refer to related descriptions of the previous embodiments, wherein the same or similar components and the connection relationship between components is no longer detailed.

Referring to FIGS. 35A to 35D, in the present invention, the LED filament section 100 includes one conductive section 130, two LED sections 102, 104, and between two adjacent LED sections 102, 104 is connected by the conductive section 130. Wherein the LED filament 100 having a circular arc at the highest point of the bending curvature, that is, each of the LED sections 102, 104 respectively having a circular arc at the highest point of the LED filament 100, and the conductive section also exhibits a circular arc at the low point of the LED filament. Moreover, the LED filament 100 can be defined as having a plurality of sections, each of the sections is connected between the first and second conductive sections 130, and each LED section 102, 104 is formed into a respective section.

Moreover, since the LED filament 100 is equipped with a flexible base layer, the flexible base layer preferably is made by an organosilicon-modified polyimide resin composition, and thus the LED sections 102, 104 themselves also have a certain degree of bendability. In the present embodiment, the two LED sections 102, 104 are respectively bent to form in the shape like an inverted deformed U letter, and the conductive section 130 is located between the two LED sections 102, 104, and the degree of the bending of the conductive section 130 is the same as or greater than the degree of the bending of the LED sections 102, 104. In other words, the two LED sections 102, 104 of the LED filament are respectively bent at the high point to form in the shape like an inverted deformed U letter and have a bending radius value at R1, and the conductive section 130 is bent at a low point of the LED filament 100 and has a bending radius value at R2, wherein the value R1 is the same as or greater than the value R2. Through the configuration of the conductive section 130, the LED filament 100 disposing in a limited space can be realized with a small radius bending of the LED filament 100. In one embodiment, the bending points of the LED sections 102, 104 are at the same height in the Z direction. Further, in the Z direction, the stand 19*a* of the present embodiment has a lower position than the stand 19*a* of the previous embodiment, and the height of the present stand 19*a* is corresponding to the height of the conductive section 130. For example, the lowest portion of the conductive section 130 can be connected to the top of the stand 19*a* so that the overall shape of the LED filament 100 is not easily deformed. In various embodiments, the conductive sections 130 may be connected to the stand 19*a* through the perforation of the top of the stand 19*a*, or the conductive sections 130 may be glued to the top of the stand 19*a* to connect with each other, but are not limited thereto. In an embodiment, the conductive section 130 and the stand 19*a* may be connected by a guide wire, for example, a guide wire connected to the conductive section 130 is drawn at the top of the stand 19*a*.

As shown in FIG. 35B, in the present embodiment, the height of the conductive section 130 is higher than the two conductive electrodes 110, 112 in the Z direction, and the two LED sections 102, 104 are respectively shaped upward from the two conductive electrodes 110, 112 to the highest point and then are bent down to connect with the conductive section 130. As shown in FIG. 35C, in the present embodiment, the contour of the LED filament 100 in the XZ plane is similar to the V letter, that is, the two LED sections 102, 104 are respectively shaped obliquely upward and outward and are bent respectively at the highest point and then obliquely inwardly to connect with the conductive section 130. As shown in FIG. 35D, in the present embodiment, the LED filament 100 has a contour in the shape like S letter in the XY plane. As shown in FIG. 35B and FIG. 35D, in the present embodiment, the conductive section 130 is located between the conductive electrodes 110, 112. As shown in FIG. 35D, in the XY plane, the main bending points of the LED sections 102, 104, and the conductive electrodes 110, 112 are substantially on the circumference centered on the conductive section 130.

In this embodiment, as shown in FIG. 35A to FIG. 35D, the LED light bulb includes a lamp housing 12, a lamp cap 16 connected to the lamp housing 12, at least two conductive brackets disposed in the lamp housing 12, a supporting arm (not shown), a stem 19, and a single LED filament 100. The stem 19 includes a stem bottom portion and a stem top portion that are opposite to each other. The stem bottom portion is connected to the lamp cap 16. The stem top portion extends to the inside of the lamp housing 12, for example, the stem top portion may be located approximately at the center of the lamp housing 12. The conductive brackets are connected to the stem 19. The LED filament 100 includes a filament body and two filament electrodes (electrodes of conductive electrodes) 110, 112. The two filament electrodes 110, 112 are located at two opposite ends of the filament body. The filament body is the other portion of the LED filament 100 excluding the filament electrodes 110, 112. The two filament electrodes 110, 112 are connected to the two conductive brackets, respectively. One end of the supporting arm is connected to the stem 19, and the other end is connected to the filament body.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pomp is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum se lamp housing and substitute it nitrogen or a pomp can pump out the air inside combination of nitrogen and helium in a proper ratio through the stem, to improve the thermal conductivity of the gas inside the lamp housing and remove water hidden in the air at the same time. In one embodiment, the air may alternatively be pumped out and substitute it with a combination of nitrogen and oxygen or nitrogen and air in a proper ratio. The content of oxygen or air is 1-10% of the volume of the lamp housing, preferably 1-5%. When a base layer contains saturated hydrocarbons, during the use of the LED light bulb, the saturated hydrocarbons will generate free radicals under the effect of light, heat, stress, etc. The generated free radicals or activated molecules will combine with oxygen to form peroxide free radicals. Thus, filling the lamp housing with oxygen can improve the heat and light resistance of the base layer containing the saturated hydrocarbons.

In the manufacturing process of the LED light bulb, in order to increase the refractive index of the lamp housing 12 to the light emitted by the LED filament, some foreign matter, for example, rosin, may be attached to an inner wall of the lamp housing 12. The average thickness of the foreign matter deposited per square centimeter of the inner wall area of the lamp housing 12 is 0.01-2 mm, and the thickness of the foreign matter is preferably 0.01-0.5 mm. In one embodiment, the content of the foreign matter per square centimeter of the inner wall area of the lamp housing 12 is 1-30% of the content of the foreign matter on the inner wall of the entire lamp housing 12, preferably 1-10%. For example, the content of the foreign matter may be adjusted by vacuum drying the lamp housing. In another embodiment, some impurities may be left in the gas filled in the lamp housing 12. The content of the impurities in the gas filled is 0.1-20% of the volume of the lamp housing 12, preferably 0.1-5%. For example, the content of the impurities may be adjusted, for example, by a method of vacuum drying to the lamp housing. Because the gas filled contains a small amount of impurities, the light emitted by the LED filament is emitted or refracted by the impurities to increase a luminous angle, which is beneficial to improving the luminous effect of the LED filament.

A Cartesian coordinate system having an X-axis, a Y-axis and a Z-axis is oriented for the LED light bulb, where the Z-axis is parallel to the stem 19, and the total length of the projection of the LED filament 100 on the KY plane, YZ plane and XZ plane is respectively the length L1, length L2, and length L3. In the present embodiment, the length L1, the length L2, and the length L3 are approximately in a ratio of 0.8:1:0.9. In some embodiments, the length L1, the length L2, and the length L3 are approximately in a ratio of (0.5 to 0.9):1:(0.6 to 1), the ratio of the length L1, the length L2, and the length L3 is closer to 1:1:1, the illumination uniformity of the LED filament 100 in the LED light bulb 40*a* is better, and the omni-directional light appearance is better. The LED filament 100 has at least one first bending point and at least two second bending points when the LED filament is bent. The at least one first bending point and the at least two second bending points are arranged alternately, and the height of any one of the at least one first bending point on the Z-axis is greater than that of any one of the at least two second bending points. In one embodiment, the distances between any of two adjacent first bending points on the Y-axis and the X-axis are equal, and the LED filament has a neat and beautiful appearance. In one embodiment, a distance between any of two adjacent first bending points on the Y-axis or the X-axis has a maximum value D1 and a minimum value D2, where the range of D2 is from 0.5D1 to 0.9D1, and the luminous flux distribution on each plane is relatively consistent. Assuming that a diameter of the lamp cap 16 is R1 (referring to FIG. 35B), a maximum diameter of the lamp housing 12 or a maximum horizontal spacing of the lamp housing 12 in the YZ-plane is R2 (referring to FIG. 35B), a maximum width in the Y-axis direction on the YZ-plane (referring to FIG. 35B) or a maximum width in the X-axis direction on the XZ-plane (referring to FIG. 35C) of the LED filament 100 is R3, then R3 is between R1 and R2, that is, R1≤R3<R2. When the LED filament is bent, the distance between adjacent first bending points and/or adjacent second bending points in the Z-axis direction is wide, which is beneficial to improving the heat dissipation effect of the LED filament. In the manufacturing process of the LED light bulb, the LED filament 100 may be placed into an inner space of the lamp housing 12 in a manner of folding first, and then the LED filament 100 may be stretched in the lamp housing 12 manually or mechanically, so that a maximum length of the LED filament 100 on the XZ-plane satisfies the above-mentioned relationship.

As shown in FIG. 35A to FIG. 35D, in this embodiment, the LED filament 100 has one conductive section 130 and two LED sections 102, 104, and every two adjacent LED sections 102, 104 are connected to each other by the conductive section 130. The bent portion of the LED filament 100 at the highest point has an are shape, that is, the LED sections 102, 104 respectively has an arc shape at the highest point of the LED filament 100, and the conductive section 130 shows an arc shape at a low point of the LED filament 100 as well. The LED filament 100 may be configured to have a structure where each bent conductive section 130 is followed by one segment, and each LED section 102, 104 is formed into are respective section.

Moreover, since the base layer as a flexible substrate (preferably made of a silicone-modified polyimide resin composition) is adopted by the LED filament 100, the silicone-modified polyimide resin composition includes organosilicon-modified polyimide, a thermal curing agent, heat dissipation particles, and phosphor. In this embodiment, two LED sections 102, 104 are respectively bent to form an inverted U shape, the conductive section 130 is located between the two LED sections 102, 104 and the bending degree of the conductive section 130 is the same as or greater than that of the LED sections 102/104. That is, the two LED sections 102, 104 are respectively bent at a high point of the LED filament to form an inverted U shape and have a bending radius r1, the conductive section 130 is bent at a low point of the LED filament 100 and has a bending radius r2, and r1 is greater than r2. Through the configuration of the conductive section 130, the LED filament 100 can be bent with a small radius of gyration in a limited space. In one embodiment, the bending points of the LED section 102 and the LED section 104 are at the same height in the Z direction, the LED filament 100 has a certain symmetry in some directions, so the light distribution of the LED light bulb may be more uniform. In one embodiment, the bending points of the LED section 102 and the LED section 104 are at different height in the Z direction, the height of the bending points of the LED section 102 is greater than that the bending points of the LED section 104, in the case of the same LED filament length, when the LED filament is placed in the lamp housing in this way, part of the LED filament will be more biased towards the lamp housing, so the heat dissipation of the LED filament is better. In addition, in the Z direction, a stand 19*a* of this embodiment has a smaller height than a stand 19*a* of the previous embodiment, and the height of the stand 19*a* of this embodiment corresponds to the height of the conductive section 130 or the stand 19*a* is presumably in contact with part of the conductor section 130. For example, the lowest portion of the conductive section 130 may be connected to the top portion of the stand 19*a*, so that the overall shape of the LED filament 100 is not easily deformed. In different embodiments, the conductive section 130 may pass through a through hole of the top portion of the stand 19*a* to be connected to the stand 19*a*, or the conductive section 130 may be attached to the top portion of the stand 19*a* to be connected to the stand 19*a*, but it is not limited thereto. In one embodiment, the conductive section 130 may be connected to the stand 19*a* by a conductive wire, for example, the conductive wire is extended from the top portion of the stand 19*a* and connected to the conductive section 130.

As shown in FIG. 35B, in this embodiment, in the Z direction, the height of the conductive section 130 is greater than that of the two electrodes 110, 112. The two LED sections 102 may be seen as the two electrodes 110 and 112 extending upward to the highest point respectively and then bending down and further extending to connect to the conductive section 130. As shown in FIG. 35C, in this embodiment, the outline of the LED filament 100 in the XZ-plane is similar to a V shape, that is, the two LED sections 102, 104 respectively extend upward and outward obliquely, and respectively extend downward and inward obliquely to the conductive section 130 after being bent at the highest points. As shown in FIG. 35D, in this embodiment, the outline of the LED filament 100 in the XY-plane has an S shape. As shown in FIG. 35B and FIG. 35D, in this embodiment, the conductive section 130 is located between the electrodes 110, 112. As shown in FIG. 35D, in this embodiment, in the XY-plane, the bending point of the LED section 102, the bending point of the LED section 104, and the electrodes 110, 112 are substantially located on a circumference of a circle taking the conductive section 130 for the stem 19 or the stand 19*a*) as a center. For example, in the XY-plane, the bending point of the LED section 102 and the bending point of the LED section 104 are located on the same circumference of a circle taking the stem 19 or the stand 19*a* as a center. In some embodiments, in the XY-plane, the bending point of the LED section 102, the bending point of the LED section 104, and the electrodes 110, 112 are located on the same circumference of a circle taking the stem 19 or the stand 19*a* as a center.

In this embodiment, as shown in FIG. 35A to FIG. 35D, the LED bulb includes a lamp housing 12, a bulb base 16 connected to the lamp housing 12, a stem 19, and a single LED filament 100 where the stem 19, and the single LED filament 100 are in the lamp housing 12. The stem 19 includes a stem bottom and a stem top (or stand 19*a* or pole 19*a*) opposite to the stem bottom. The stem bottom is connected to the bulb base 16, and the stem top extends into the interior of the lamp housing 12 (e.g., the stem top may be extended into approximately the center of the lamp housing 12). The LED filament 100 includes a filament body and two filament electrodes 110 and 112. The two filament electrodes 110 and 112 are located at opposite ends of the filament body. The filament body is the part of the LED filament 100 that excludes the filament electrodes 110 and 112.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pump is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum pump can be applied to replace the air inside the lamp housing with full nitrogen or to configure a moderate ratio of nitrogen and helium inside the lamp housing through the stem to improve the thermal conductivity of the gas in the lamp housing and to remove the water mist in the air at the same time. In one embodiment, the gas inside the lamp housing can also be replaced with a moderate ratio of nitrogen and oxygen or a moderate ratio of nitrogen and air. The oxygen or air content is 1% to 10%, preferably 1% to 5% of the volume of the lamp housing. When the base layer contains saturated hydrocarbons, during the use of the LED bulbs, the saturated hydrocarbons will generate free radicals under the effect of light, heat, stress, etc. The generated free radicals or activated molecules will combine with oxygen to form peroxide radicals. Thus, the lamp housing filled with oxygen may increase thermal resistance and light resistance of the base layer having saturated hydrocarbons.

During the manufacturing process of the LED bulb, in order to increase the refractive index of the lamp housing 12 to the light emitted by the LED filament, some impurities, such as rosin, may be attached to the inner wall of the lamp housing 12. The lamp housing 12 can be vacuum dried to reduce the impurity content in the inner wall of the lamp housing 12 or in the gas filled in the lamp housing 12. After the lamp housing 12 is vacuum dried, the average thickness of the impurity deposition per square centimeter of the inner wall area of the lamp housing 12 is 0.01 to 2 mm, and the thickness of the impurity is preferably 0.01 to 0.5 mm. In one embodiment, the content of the impurity per square centimeter of the inner wall area of the lamp housing 12 accounts for 1% to 30%, preferably 1% to 10% of the content of the impurity on the inner wall of the entire lamp housing 12. The content of the impurity can be adjusted, for example, by a method of vacuum drying to the lamp housing 12. In another embodiment, a part of impurities may be left in the gas of the lamp housing 12, and the content of impurities in the gas is 0.1% to 20%, preferably 0.1 to 5%, of the volume of the lamp housing 12. The impurity content may be adjusted by the method of vacuum drying to the lamp housing 12. Because a small amount of impurities is contained in the filling gas, the light emitted by the LED filament is scattered or refracted by the impurities, and thus the light emitting angle may be increased, which is beneficial to improving the light emitting effect of the LED filament. Furthermore, since the impurity content in the filling gas is low, the heat transfer effect is increased, and the heat dissipation effect of the LED light bulb is improved. Finally, by further reducing the impurity content in the base layer 240*b* (for example, the silicone-modified polyimide resin composition), the strength of the base layer 240*b* is increased, thereby effectively increasing the service life of the LED filament.

A Cartesian coordinate system having an X-axis, a Y-axis and a Z-axis is oriented for the LED light bulb, where the Z-axis is parallel to the stem 19, and the LED filament 100 has at least two first bending point and at least one second bending points when the LED filament is bent. The at least two first bending point and the at least one second bending points are arranged alternately, and the height of any one of the at least two first bending point on the Z-axis is greater than that of any one of the at least one second bending points. In one embodiment, the distances between any of two adjacent first bending points on the Y-axis or on the Z-axis are equal. Therefore, the appearance of the LED filament can be neat and beautiful. In an embodiment, the distance between the two adjacent first bending points on the Y-axis or on X-axis has a maximum value D1 and a minimum value D2, where the range of D2 is from 0.5D1 to 0.9D1, and the light flux distribution on each plane is relatively consistent. Let (1) the diameter of the bulb base 16 be R1 (shown in FIG. 35A), (2) the maximum diameter of the lamp housing 12 or the maximum horizontal distance between the lamp housings 12 in the Y-Z plane be R2 (shown in FIG. 35B), and (3) the maximum width of the LED filament 100 in the Y-axis direction on the Y-Z plane (shown in FIG. 35B) or the maximum width in the X-axis direction on the X-Z plane be R3 (shown in FIG. 35C) Specifically, FIGS. 35B and 35C are merely illustrative, and the magnitude of R1, R2, and R3 is such that R3 is between R1 and R2, that is, R1<R3<R2, and is not a visual magnitude as shown in FIG. 35B and FIG. 35C. When the LED filament is bent, the distance between adjacent first bending points and/or adjacent second bending points in the Z-axis direction is wide, which is beneficial to improving the heat dissipation effect of the LED filament. In the manufacturing process of the LED bulb, the LED filament 100 can be folded into the inner space of the lamp housing 12 first, and then the filament 100 can be manually or mechanically extended in the lamp housing 12 so that the maximum length of the filament 100 on the X-Z plane satisfies the above-mentioned relationship.

As shown in FIG. 35A to FIG. 35D, in this embodiment, the LED filament 100 has one conductor section 130 and two LED sections 102 and 104. The two adjacent LED sections 102 and 104 are connected through the conductor section 130. The bent portion of the LED filament 100 at the highest point has an arc shape. That is, the LED sections 102 and 104 show arc shapes respectively at the highest point of the LED filament 100. The conductor section 130 shows an arc shape at the lower point of the LED filament as well. The LED filament 100 may be configured to have a structure where each bent conductor section 130 is followed by one segment, and each LED sections 102,104 is formed into a respective section.

Moreover, since a flexible substrate (preferably made of a silicone-modified polyimide resin composition) is adopted by the LED filament 100, the LED sections 102 and 104 also have a certain degree of bending ability. In this embodiment, the two LED sections 102 are respectively bent to form an inverted U shape, and the conductor section 130 is located between the two LED sections 102, and the degree of bending of the conductor section 130 is the same as or greater than that of the LED section 102. That is, the two LED sections 102 are respectively bent at the higher point of the LED filament 100 to form an inverted U shape and have a bent radius r1. The conductor section 130 is bent at the lower point of the LED filament 100 and has a bent radius r2, where r1 is greater than r2. The arrangement of the conductor sections 130 enables the LED filament 100 to achieve a bending with a small turning radius in a limited space. In one embodiment, the bending points of the LED section 102 and that of the LED section 104 are at the same height in the Z direction. In addition, the height of the pole 19*a* corresponds to the height of the conductor section 130. For example, the lowest portion of the conductor section 130 may be connected to the top of the pole 19*a*, so that the overall shape of the LED filament 100 may not be easily deformed. In different embodiments, the conductor sections 130 may be connected to the pole 19*a* by passing through a hole on the top of the pole 19*a*, or the conductor sections 130 may be connected to the pole 19*a* by being glued on the top of the pole 19*a*, but is not limited thereto. In one embodiment, the conductor section 130 and the pole 19*a* may be connected by a conductive wire. For example, a conductive wire is extended from the top of the pole 19*a* and connected to the conductor section 130.

As shown in FIG. 35B, in this embodiment, in the Z direction, the height of the conductor section 130 is higher than that of the two electrodes 110 and 112. The two LED sections 102 may be seen as the two electrodes 110 and 112 extending upward to the highest point respectively and then bending down and further extending to connect to the conductor section 130. As shown in FIG. 35C, in this embodiment, the outline of the LED filament 100 in the X-Z plane is similar to a V shape, that is, the two LED sections 102 are extended obliquely upward and outward respectively, and are bent at the highest point then extended downwardly and inwardly to the conductor section 130. As shown in FIG. 35D, in this embodiment, the outline of the LED filament 100 in the X-Y plane has an S shape. As shown in FIG. 35B and FIG. 35D, in this embodiment, the conductor section 130 is located between the electrodes 110 and 112. As shown in FIG. 35D, in this embodiment, in the X-Y plane, the bending point of the LED section 102, the bending point of the LED section 104, and the electrodes 110, 112 are located substantially on a circumference of a circle taking the conductor section 130 as a center.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

Figure 36A:
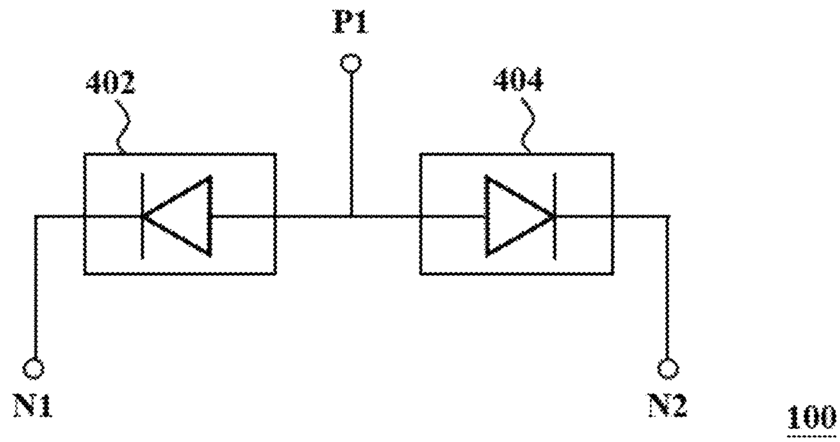
FIGS. 36A to 36C are schematic circuit diagrams of an LED filament in accordance with an embodiment of the present invention.

In some embodiments, LED filament 100 may have multiple LED sections. At least part or all of LED chips on a single LED section are electrically connected in series. Different LED sections are electrically connected in parallel. Anode and cathode of each LED section may serve as a positive electrode and negative electrodes of the LED filament, respectively. The negative electrodes separately connect with two or more of the conductive supports (e.q., conductive supports 51*a*, 51*b* in FIG. 26A) and finally connect to a power module (such as power module 518 in FIG. 26A). As shown in FIG. 36A, which is a schematic circuit diagram of the LED filament according to some embodiments of the present invention, LED filament 100 in this embodiment has two LED sections 402, 404. Each LED section 402, 404 includes one or more LED chips. LED chips in a single LED section are electrically connected in series. Two LED sections 402, 404 have respective current paths after they have been electrically connected (i.e. in parallel). In detail, in this embodiment, anodes of LED sections 402, 404 are electrically connected together to serve as a positive electrode P1 of LED filament 100. Cathodes of LED section 402 and 404 serve as a first negative electrode N1 and a second negative electrode N2, respectively. Positive electrode P1, first negative electrode N1 and second negative electrode N2 are separately electrically connected to the power module through conductive supports such as conductive supports 51*a*, 51*b* and power module 518 shown in FIG. 26A.

Figure 36B:
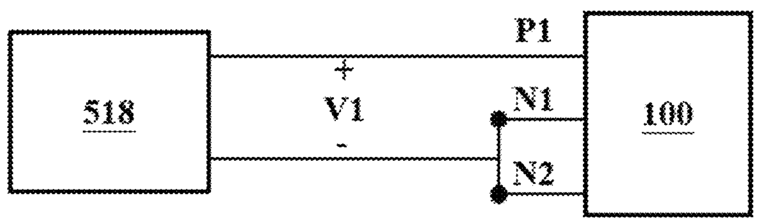
Figure 36C:
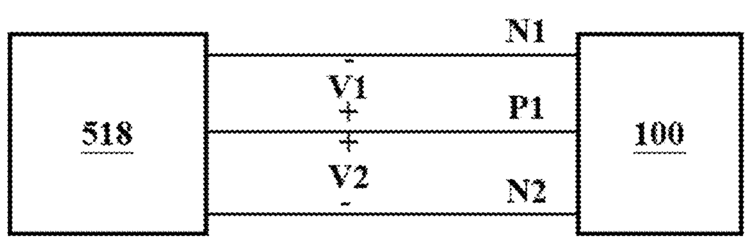

In more detail, the connection relationship between positive electrode P1, first negative electrode N1 and second negative electrode N2 may be shown as FIG. 36B or FIG. 36C, in which FIGS. 36B and 36C are two schematic views of electrical connections of the LED filament according to some embodiments of the present invention. Please refer to FIG. 36B first. In this embodiment, positive electrode P1 of LED filament 100 is electrically connected to a first output terminal (also called "positive output terminal) of power module 518. First and second negative electrodes N1, N2 of LED filament 100 are electrically connected together and then jointly electrically connected to a second output terminal (also called "negative output terminal") of power module 518. Further refer to FIG. 36A, under the electrical relationship shown in FIG. 36B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature.

Please further refer to FIG. 36C. In this embodiment, positive electrode P1 of LED filament 100 is electrically connected to the first output terminal of power module 518, first negative electrode N1 of LED filament 100 is electrically connected to the second output terminal (also called "first negative output terminal") of power module 518, and the second negative electrode N2 of LED filament 100 is electrically connected to the third output terminal (also called "second negative output terminal") of power module 518. Driving voltage V1 is formed between the first output terminal and the second output terminal of power module 518, and another driving voltage V2 is formed between the first output terminal and the third output terminal of power module 518. Referring to FIG. 36A together, under the electrical relationship shown in FIG. 36C, LED section 402 is electrically connected between the first output terminal and the second output terminal, and LED section 404 is electrically connected between the first output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V1 and V2, so as to make LED sections 402, 404 separately generate corresponding intensity and/or color temperature. In other words, dimming the different LED sections individually on a single LED filament can be implemented by design and control of the power module based on the arrangement of FIG. 36C.

In some embodiments, the second and third output terminals of power module 518 can be electrically connected together through a resistor, and either of the second and third output terminals of the power module 518 is electrically connected to a ground terminal. By this arrangement, negative output terminals with different levels can be obtained to generate two different driving voltages V1 and V2. In some embodiments, levels of the second and third output terminals can be controlled by a circuit. The present invention is not limited thereto.

Figure 37A:
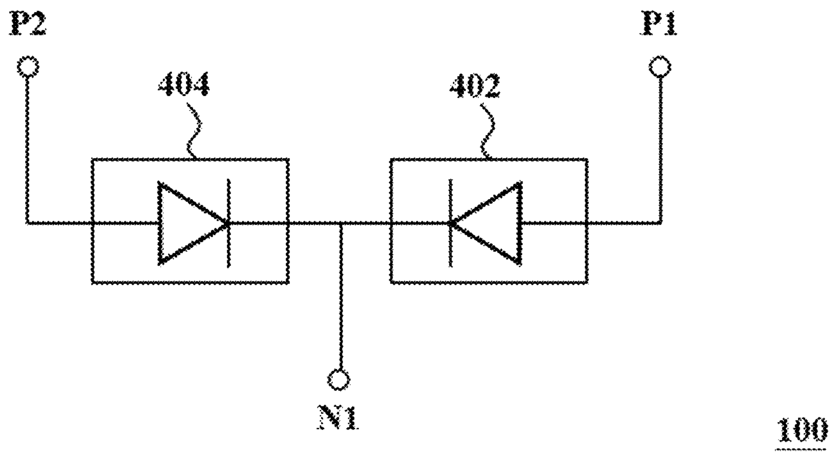
FIGS. 37A to 37C are schematic circuit diagrams of an LED filament in accordance with another embodiment of the present invention.

FIG. 37A is a schematic circuit diagram of the LED filament according to some embodiments of the present invention. In this embodiment, LED filament 100, which is similar to the one shown in FIG. 36A, has two LED sections 402, 404, and thus the details of the LED sections 402, 404 will not be repeated herein. A main difference between this embodiment and the embodiment shown in FIG. 36A is that cathodes of LED sections 402, 404 of this embodiment are electrically connected together to serve as negative electrode N1 of the LED filament, and anodes of LED sections 402, 404 serve as first positive electrode P1 and second positive electrode P2 of LED filament 100, respectively. Negative electrode N1, first positive electrode P1 and second positive electrode P2 of LED filament 100 are electrically connected to the power module through conductive supports, such as conductive supports 51*a*, 51*b* and power module 518 shown in FIG. 26A.

Figure 37B:
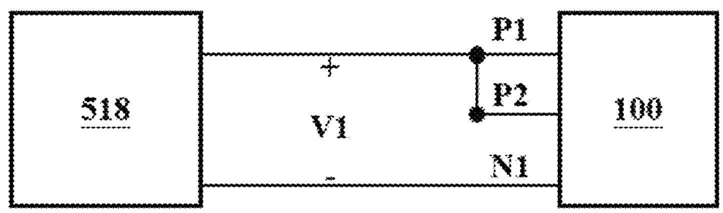
Figure 37C:
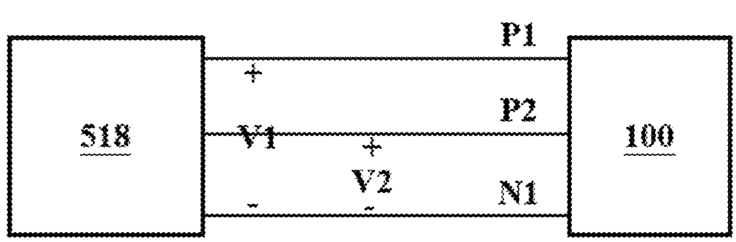

The electrical relationship between negative electrode N1, first positive electrode P1 and second positive electrode P2 of LED filament 100 and the power module may be shown in FIG. 37B or 37C. FIGS. 37B and 37C are two schematic views of electrical connections of the LED filament according to two different embodiments. Please refer to FIG. 37B first. In this embodiment, a first positive electrode P1 and a second positive electrode P2 of LED filament 100 are electrically connected together and jointly electrically connected to a first output terminal (also called "positive output terminal) of power module 518. Negative electrode N1 of LED filament 100 is electrically connected to a second output terminal (also called "negative output terminal") of power module 518. Further refer to FIG. 37A, under the electrical relationship shown in FIG. 37B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature. This arrangement is equivalent to that of the embodiment shown in FIG. 36B.

Please further refer to FIG. 37C. In this embodiment, positive electrode P1 of LED filament 100 is electrically connected to the first output terminal of power module 518, second positive electrode P2 of LED filament 100 is electrically connected to the second output terminal (also called "second positive output terminal") of power module 518, and negative electrode N1 of LED filament 100 is electrically connected to the third output terminal (also called "negative output terminal") of power module 518. Driving voltage V1 is formed between the first output terminal and the third output terminal of power module 518, and another driving voltage V2 is formed between the second output terminal and the third output terminal of power module 518. Please further refer to FIG. 37A. Under the electrical relationship shown in FIG. 37C, LED section 402 is electrically connected between the first output terminal and the third output terminal, and LED section 404 is electrically connected between the second output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V2, V2 so as to make LED sections 402, 404 separately generate corresponding intensity and/or color temperature. In other words, in the arrangement of FIG. 37C, a dimming function can be implemented to a single LED filament by design and control of the power module.

Figure 38A:
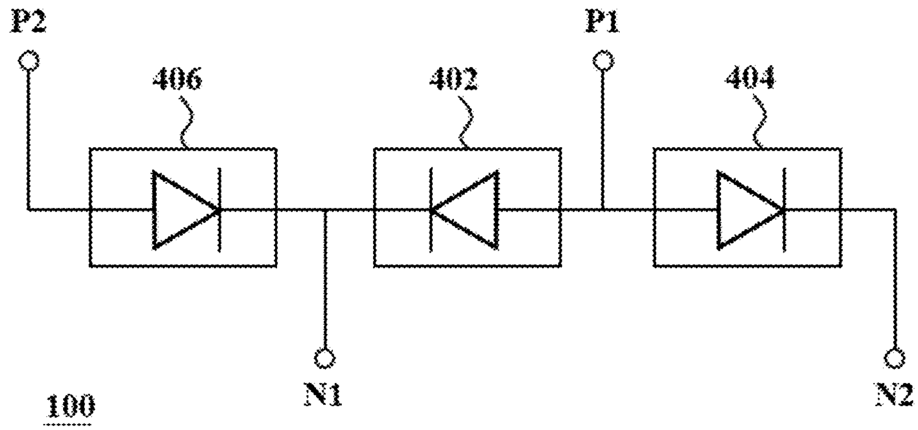
FIGS. 38A to 38D are schematic circuit diagrams of an LED filament in accordance with another embodiment of the present invention.

FIG. 38A is a schematic circuit diagram of the LED filament according to some embodiments of the present invention. In this embodiment, LED filament 100 has three LED sections 402, 404, 406 as shown in FIG. 38A. In detail, LED filament 100 of this embodiment is based on FIG. 36A and adds LED section 406 (also deemed as being based on FIG. 37A and adding LED section 404 in FIG. 38A, wherein LED section 406 in FIG. 38A corresponds to LED section 404 in FIG. 37A). The arrangement of LED sections 402, 404 can refer to the above embodiments, it will not be repeated here. In this embodiment, the arrangement of LED section 406, which is identical or similar to that of LED section 402 or 404, includes one or more LED chips. The LED chips are electrically connected in series. Three LED sections 402, 404, 406 have respective current paths after they have been electrically connected (i.e. in parallel). In detail, in this embodiment, cathodes of LED sections 406 and 402 are electrically connected together (i.e. cathodes of LED sections 402, 406 jointly serve as a first negative electrode N1). And anode of LED section 406 serves as a second positive electrode P2 of LED filament 100. In other words, In this embodiment, LED filament 100 further includes second positive electrode P2 formed by connecting to the anode of LED section 406 other than first positive electrode P1, first negative electrode N1 and second negative electrode N2.

Figure 38B:
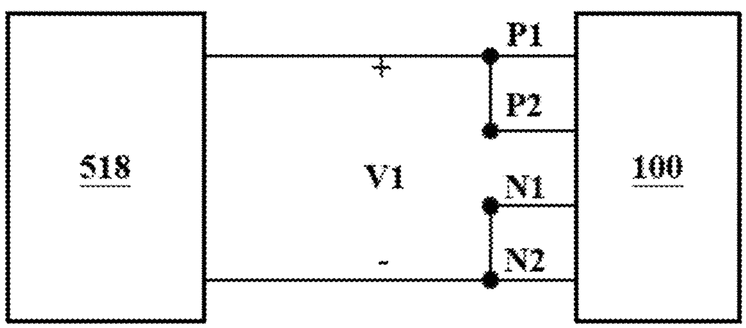
Figure 38C:
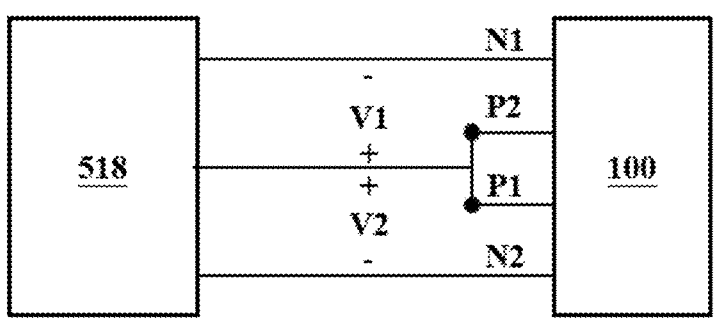
Figure 38D:
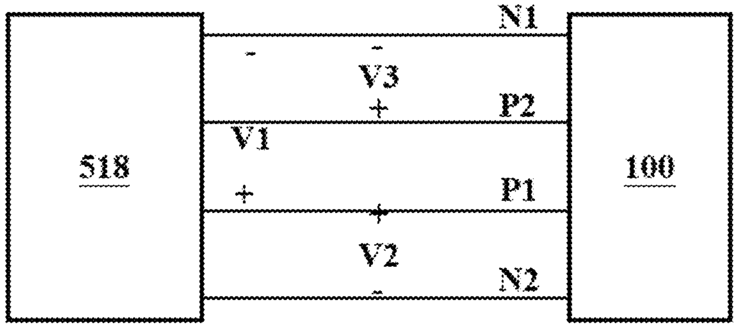

In this embodiment, under the arrangement of LED filament 100, the electrical relationship between LED filament 100 and the power module may be shown in FIGS. 38B to 38D to implement the current sharing drive control or sectional independent control. FIGS. 37B and 37C are two schematic views of electrical connections of two embodiments of the LED filament. Please refer to FIG. 37B first. In this embodiment, a first positive electrode P1 and a second positive electrode P2 of LED filament 100 are electrically connected together and jointly electrically connected to a first output terminal (also called "positive output terminal) of power module 518. First negative electrode N1 and second negative electrode N2 of LED filament 100 are electrically connected together and electrically connected to a second output terminal (also called "negative output terminal") of power module 518. Further refer to FIG. 38A, under the electrical relationship shown in FIG. 38B, LED sections 402, 404, 406 can be deemed as being electrically connected to the output terminals of power module 518 in parallel. Thus, all LED sections 402, 404, 406 are driven by driving voltage V1 between the first and second output terminals. Under a precondition of LED sections 402, 404, 406 having identical or similar chips number and arrangement, the driving current from power module 518 will evenly dividedly flow to each of LED sections 402, 404, 406. As a result, LED sections 402, 404, 406 can present approximately even intensity and/or color temperature. This arrangement is equivalent to that of the embodiment shown in FIGS. 36B and 37B.

Please further refer to FIG. 38C. In this embodiment, first positive electrode P1 and second positive electrode P2 of LED filament 100 are electrically connected together and jointly electrically connected to the first output terminal (also called "first positive output terminal") of power module 518, first negative electrode N1 of LED filament 100 is electrically connected to the second output terminal (also called "first negative output terminal") of power module 518, and second negative electrode N2 of LED filament 100 is electrically connected to the third output terminal (also called "second negative output terminal") of power module 518. Under such an arrangement, both first positive electrode P1 and second positive electrode P2 can be deemed as the same terminal. Thus, the whole circuit is equivalent to FIG. 36C. Related control manner, functions and effects can refer to the description of FIG. 36C. The arrangement of this embodiment can make a single filament have a two-stage dimming effect.

Please further refer to FIG. 38D. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to fourth output terminal (also called "second negative output terminal") of power module 518. Further refer to FIG. 38A, under such an arrangement shown in FIG. 38D, LED section 402 is electrically connected between the first and third terminals, LED section 404 is electrically connected between the first and fourth output terminals, and LED section 406 is electrically connected between the second and third terminals. Thus, LED sections 402, 404, 406 can be deemed as being driven by driving voltages V1, V2, V3, respectively. In such an arrangement, the driving currents provided by power module 518 to LED sections 402, 404, 406 can be independently controlled by adjusting output voltages V2, V2, V3 so as to make LED sections 402, 404, 406 separately generate corresponding intensity and/or color temperature. The arrangement of this embodiment can make a single filament have a three-stage dimming effect.

Figure 39A:
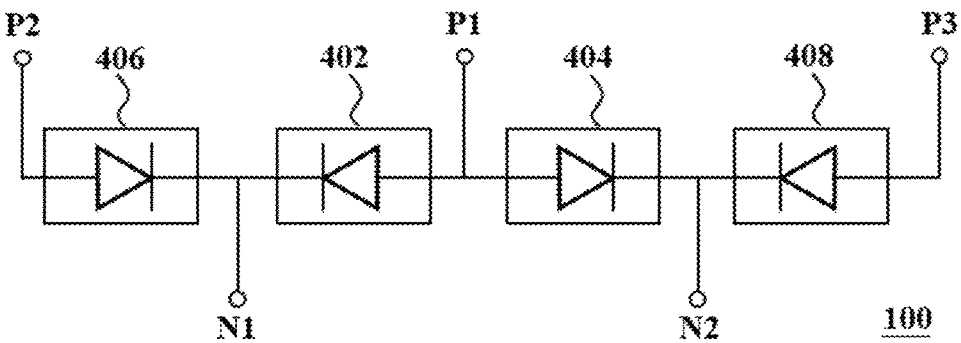
FIGS. 39A to 39E are schematic circuit diagrams of an LED filament in accordance with another embodiment of the present invention.
Figure 39B:
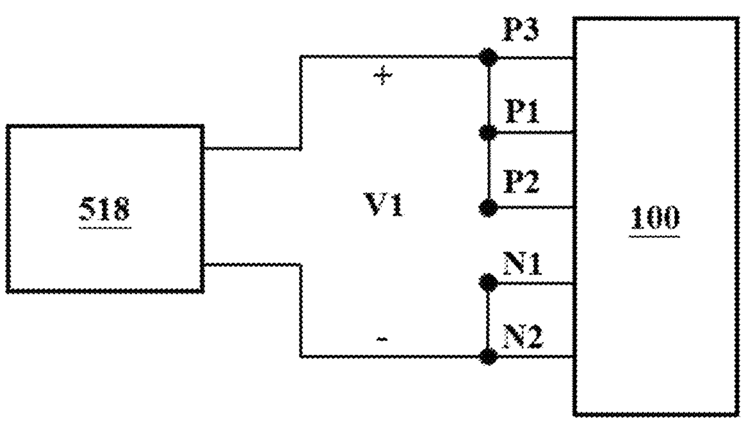

FIG. 39A is a schematic circuit diagram of an embodiment of the LED filament of the present invention. In this embodiment, LED filament 100 has four LED sections 402, 404, 406, 408 as shown in FIG. 39A. In detail, LED filament 100 of this embodiment is based on FIG. 38A and further includes LED section 408. The arrangement of LED sections 402, 404, 406 can refer to the above embodiments, it will not be repeated here. In this embodiment, the arrangement of LED section 408, which is identical or similar to that of LED section 402, 404 or 406, includes one or more LED chips. The LED chips are electrically connected in series. Three LED sections 402, 404, 406, 408 have respective current paths after they have been electrically connected (i.e. in parallel). In detail, cathodes of LED sections 408 and 404 are electrically connected together (i.e. cathodes of LED sections 402, 406 jointly serve as a second negative electrode N2). And anode of LED section 408 serves as a third positive electrode P3 of LED filament 100. In other words, In this embodiment, LED filament 100 further includes third positive electrode P3 formed by connecting to the anode of LED section 408 other than first positive electrode P1, second positive electrode P2, first negative electrode N1 and second negative electrode N2.

In this embodiment, under the arrangement of LED filament 100, the electrical relationship between LED filament 100 and the power module may be shown in FIGS. 39B to 39E to implement the current sharing drive control or sectional independent control. FIGS. 39B to 39E are four schematic views of electrical connections of four embodiments of the LED filament. Please refer to FIG. 39B first. In this embodiment, a first positive electrode P1, a second positive electrode P2 and a third positive electrode P3 of LED filament 100 are electrically connected together and jointly electrically connected to a first output terminal (also called "positive output terminal) of power module 518. First negative electrode N1 and second negative electrode N2 of LED filament 100 are electrically connected together and electrically connected to a second output terminal (also called "negative output terminal") of power module 518. Further refer to FIG. 39A, under the electrical relationship shown in FIG. 39B, LED sections 402, 404, 406, 408 can be deemed as being electrically connected to the output terminals of power module 518 in parallel. Thus, all LED sections 402, 404, 406, 408 are driven by driving voltage V1 between the first and second output terminals. Under a precondition of LED sections 402, 404, 406, 408 having identical or similar chips number and arrangement, the driving current from power module 518 will evenly dividedly flow to each of LED sections 402, 404, 406, 408. As a result, LED sections 402, 404, 406 can present approximately even intensity and/or color temperature. This arrangement is equivalent to that of the embodiment shown in FIGS. 36B, 37B and 38B.

Figure 39C:
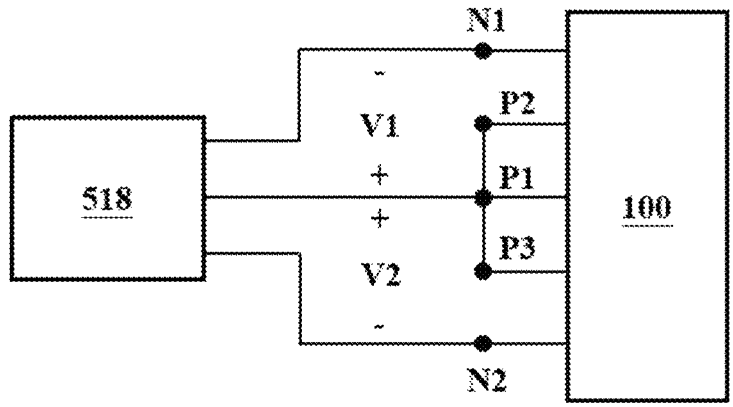

Please further refer to FIG. 39C. In this embodiment, first positive electrode P1, second positive electrode P2 and third positive electrode P3 of LED filament 100 are electrically connected together and jointly electrically connected to the first output terminal (also called "first positive output terminal") of power module 518, first negative electrode N1 of LED filament 100 is electrically connected to second output terminal (also called "first negative output terminal") of power module 518, and second negative electrode N2 of LED filament 100 is electrically connected to the third output terminal (also called "second negative output terminal") of power module 518. Under such an arrangement, first positive electrode P1, second positive electrode P2 and third positive electrode P3 can be deemed as the same terminal. Thus, the whole circuit is equivalent to FIG. 36C. Related control manner, functions and effects can refer to the description of FIG. 36C. The arrangement of this embodiment can make a single filament have a two-stage dimming effect.

Figure 39D:
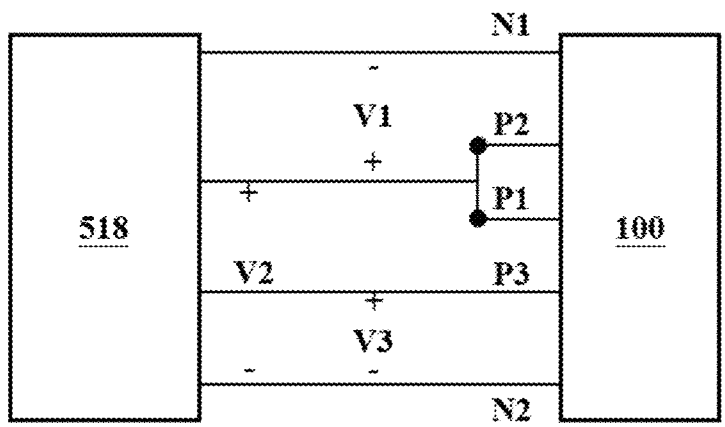

Please further refer to FIG. 39D. In this embodiment, first positive electrode P1 and second positive electrode P2 of LED filament 100 are electrically connected to the first output terminal (also called "first positive output terminal") of power module 518, third positive electrode P3 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to the fourth output terminal (also called "second negative output terminal") of power module 518. Under such an arrangement, first positive electrode P1 and second positive electrode P2 can be deemed as the same terminal. Thus, the whole circuit is equivalent to FIG. 38D. Related control manner, functions and effects can refer to the description of FIG. 38D. The arrangement of this embodiment can make a single filament have a three-stage dimming effect.

Figure 39E:
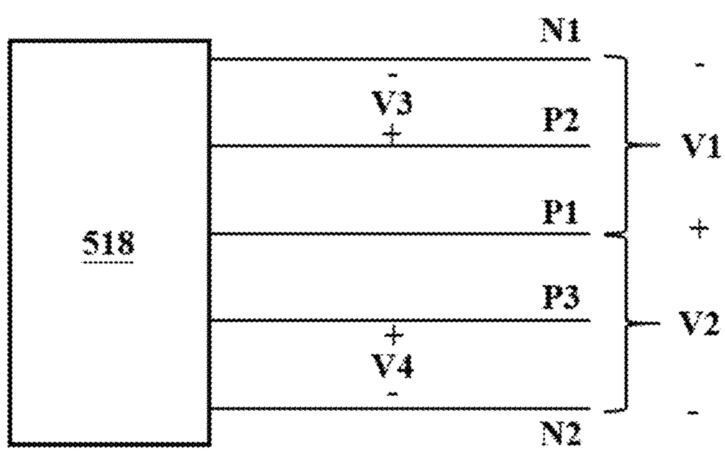

Please further refer to FIG. 39E. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, third positive electrode P3 of LED filament 100 is electrically connected to the third output terminal (also called "third positive output terminal") of power module 518, first negative electrode N1 of LED filament 100 is electrically connected to the fourth output terminal (also called "first negative output terminal"), and second negative electrode N2 is electrically connected to the fifth output terminal (also called "second negative output terminal") of power module 518. Under such an arrangement, a driving voltage V1 is formed between the first output terminal and the fourth output terminal of power module 518, another driving voltage V2 is formed between the first output terminal and the fifth output terminal of power module 518, still another driving voltage V3 is formed between the second output terminal and the fourth output terminal of power module 518, and yet another driving voltage V4 is formed between the third output terminal and the fifth output terminal of power module 518. Further refer to FIG. 39A, under the electrical relationship shown in FIG. 39E, LED section 402 is electrically connected between the first and fourth terminals, LED section 404 is electrically connected between the first and fifth output terminals, LED section 406 is electrically connected between the second and fourth terminals, and LED section 408 is electrically connected between the third and fifth output terminals. Thus, LED sections 402, 404, 406, 408 can be deemed as being driven by driving voltages V1, V2, V3, V4, respectively. In such an arrangement, the driving currents provided by power module 518 to LED sections 402, 404, 406, 408 can be independently controlled by adjusting output voltages V2, V2, V3, V4 so as to make LED sections 402, 404, 406, 408 separately generate corresponding intensity and/or color temperature. The arrangement of this embodiment can make a single filament have a four-stage dimming effect.

In sum, according to the abovementioned embodiments, the description has clearly disclosed a strip of filament with multiple dimming control by two, three or four LED sections. According to the description, a person having ordinary skill in the art can easily implement a strip of filament with multiple dimming control by five or more LED sections.

Figure 40:
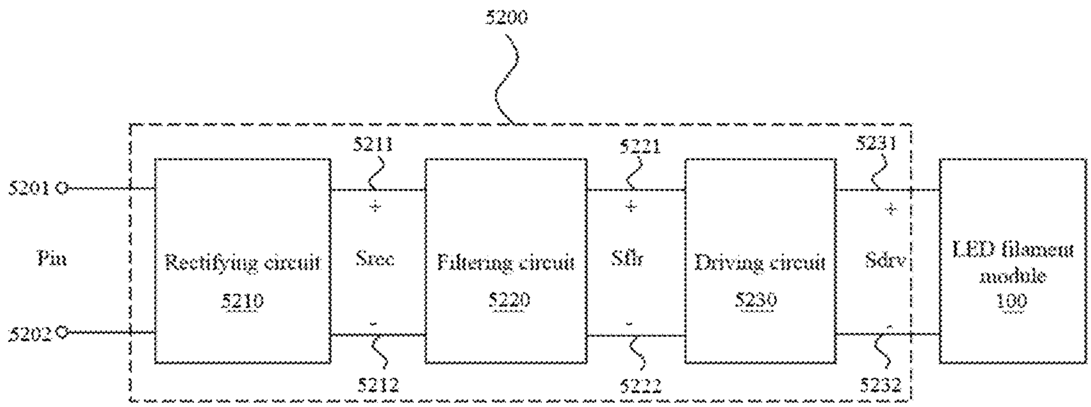
FIG. 40 is a block diagram of a power supply module of an LED light bulb in accordance with an embodiment of the present invention.

Next part of the present disclosure will describe the circuit design of the driving circuit of the filament bulb. From circuit perspective, power module 518 in FIG. 26A may be represented by a circuit block 5200 (below described and referred to as "power module 5200") as shown in FIG. 40. FIG. 40 is a circuit block diagram of a power module of an LED filament bulb according to some embodiments of present invention. Referring to FIG. 40, power module 5200 includes a rectifying circuit 5210, a filtering circuit 5220, and a driving circuit 5230. Rectifying circuit 5210 is coupled to a first pin 5201 and a second pin 5202, also known as external connection terminals, to receive and then rectify an external driving signal Pin, in order to output a rectified signal Srec through a first rectifying output terminal 5211 and a second rectifying output terminal 5212. In different embodiments, external driving signal Pin may be an AC driving signal, an AC power supply signal (such as a power grid signal), or even a DC signal, which choices each typically do not affect operations of the LED filament bulb. When the LED filament bulb is designed to emit light or light up based on a DC signal, rectifying circuit 5210 in power module 5200 may be omitted. In a configuration without rectifying circuit 5210, first rectifying output terminal 5211 and second rectifying output terminal 5212 would be directly coupled to input terminals (as 5211 and 5212) of filtering circuit 5220. Filtering circuit 5220 is coupled to rectifying circuit 5210 in order to filter rectified signal Srec, that is, input terminals of filtering circuit 5220 are coupled to first rectifying output terminal 5211 and second rectifying output terminal 5212 to receive and then filter rectified signal Srec, in order to output a filtered signal Sflr through a first filtering output terminal 5221 and a second filtering output terminal 5222. First rectifying output terminal 5211 may be regarded as a first filtering input terminal and second rectifying output terminal 5212 may be regarded as a second filtering input terminal, of filtering circuit 5220. In this embodiment, filtering circuit 5220 may filter out ripples in rectified signal Srec, to make the waveform of produced filtered signal Sflr smoother than that of rectified signal Srec. Besides, circuit configuration of filtering circuit 5220 may be set to realize filtering with respect to a certain or specific (band of) frequency, to filter out frequency response or output energy at a certain or specific frequency in response to external driving signal Pin.

Driving circuit 5230 is coupled to filtering circuit 5220, to receive and then perform power conversion to filtered signal Sflr, in order to generate a driving power Sdrv, that is, input terminals of driving circuit 5230 are coupled to first filtering output terminal 5221 and second filtering output terminal

5222 to receive filtered signal Sflr and then generate driving power Sdrv used for driving LED filament module 100 for emitting light. First filtering output terminal 5221 may be regarded as a first driving input terminal and second filtering output terminal 5222 may be regarded as a second driving input terminal, of driving circuit 5230. Driving power Sdrv generated by driving circuit 5230 is then provided to LED filament module 100 through a first driving output terminal and a second driving output terminal, to enable an LED filament (as 100) of LED filament module 100 to light up in response to driving power Sdrv. Some embodiments of rectifying circuit 5210, filtering circuit 5220, and driving circuit 5230 of power module 5200 in possible configurations are presented and described below, but the invention is not limited thereto.

Figure 41A:
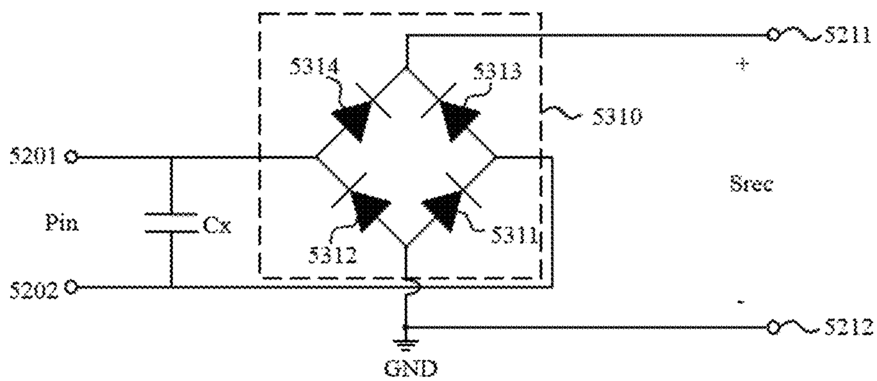
FIG. 41A is a schematic diagram of a rectifying circuit in accordance with an embodiment of the present invention.

FIG. 41A is a circuit diagram of a rectifying circuit according to some embodiments of present invention. Referring to FIG. 41A, rectifying circuit 5310 is a bridge rectifier including diodes 5311-5314 used for performing (full-wave) rectification to a received signal. Diode 5311 has an anode coupled to a second rectifying output terminal 5212, and a cathode coupled to a second pin 5202. Diode 5312 has an anode coupled to second rectifying output terminal 5212, and a cathode coupled to a first pin 5201. Diode 5313 has an anode coupled to second pin 5202, and a cathode coupled to a first rectifying output terminal 5211. And diode 5314 has an anode coupled to first pin 5201, and a cathode coupled to first rectifying output terminal 5211. In this embodiment, diodes 5311-5314 may be referred to as first diode 5311, second diode 5312, third diode 5313, and fourth diode 5314.

Operations of rectifying circuit 5310 when first and second pins 5201 and 5202 receive an AC signal as external driving signal Pin are described as follows. During the AC signal's positive half cycle, assuming the voltage level at first pin 5201 being higher than that at second pin 5202, diodes 5311 and 5314 operate in a forward-biased state to conduct current, while diodes 5312 and 5313 are cut off as being reverse-biased, which states of the four diodes form a circuit loop between the first and second pins 5201 and 5202. Under the configuration of the diodes during the AC signal's positive half cycle, an input current from or caused by the AC signal flows through first pin 5201, diode 5314, and first rectifying output terminal 5211 in sequence into a later-stage load, and after which flows through second rectifying output terminal 5212, diode 5311, and second pin 5202 in sequence, out of the LED filament bulb. Accordingly, during the AC signal's negative half cycle, the voltage level at first pin 5202 is higher than that at second pin 5201, so diodes 5312 and 5313 operate in a forward-biased state to conduct current, while diodes 5311 and 5314 are cut off as being reverse-biased, which states of the four diodes form a circuit loop between first and second pins 5201 and 5202. Under the configuration of the diodes during the AC signal's negative half cycle, an input current from or caused by the AC signal flows through second pin 5202, diode 5313, and first rectifying output terminal 5211 in sequence into a later-stage load, and after which flows through second rectifying output terminal 5212, diode 5312, and first pin 5201 in sequence, out of the LED filament bulb. Therefore, no matter during the AC signal's positive or negative half cycle, the positive polarity of rectified signal Srec output by rectifying circuit 5310 remains at first rectifying output terminal 5211 and the negative polarity of rectified signal Srec remains at second rectifying output terminal 5212. According to the above description of operations, the rectified signal output by rectifying circuit 5210 is a full-wave rectified signal.

Operations of rectifying circuit 5310 when first and second pins 5201 and 5202 are coupled to a DC power supply to receive a DC signal therefrom as external driving signal Pin are described as follows. When first pin 5201 is coupled to the positive electrode, and second pin 5202 is coupled to the negative electrode, of the DC power supply, diodes 5311 and 5314 operate in a forward-biased state to conduct current, while diodes 5312 and 5313 are cut off as being reverse-biased, which states of the four diodes form a circuit loop between first and second pins 5201 and 5202. In this case the circuit configuration and operations of rectifying circuit 5310 are the same as those of rectifying circuit 5310 under and during the above-described AC signal's positive half cycle. On the other hand, when first pin 5201 is coupled to the negative electrode, and second pin 5202 is coupled to the positive electrode, of the DC power supply, diodes 5312 and 5313 operate in a forward-biased state to conduct current, while diodes 5311 and 5314 are cut off as being reverse-biased, which states of the four diodes form a circuit loop between first and second pins 5201 and 5202. In this case the circuit configuration and operations of rectifying circuit 5310 are the same as those of rectifying circuit 5310 under and during the above-described AC signal's negative half cycle.

From the above description, it is known that no matter whether rectifying circuit 5310 in this embodiment receives an AC signal or a DC signal, rectifying circuit 5310 can properly output rectified signal Srec.

Besides, in some embodiments, a capacitor Cx may be disposed between input terminals of rectifying circuit 5310, wherein capacitance of capacitor Cx may be for example 47 nF and capacitor Cx may be used to reduce EMI (: electromagnetic interference) effects of power module 5200.

Figure 41B:
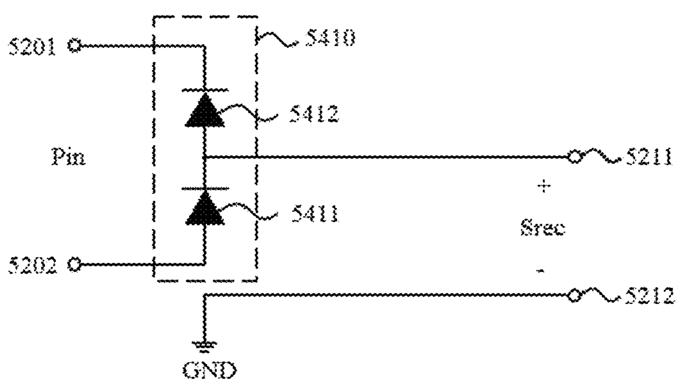
FIG. 41B is a schematic diagram of a rectifying circuit in accordance with another embodiment of the present invention.

FIG. 41B is a circuit diagram of a rectifying circuit according to some embodiment of present invention. Referring to FIG. 41B, rectifying circuit 5410 includes diodes 5411 and 5412 used for performing (half-wave) rectification to a received signal. Diode 5411 has an anode coupled to second pin 5202, and a cathode coupled to first rectifying output terminal 5211. Diode 5412 has an anode coupled to first rectifying output terminal 5211, and a cathode coupled to first pin 5201. Depending on practical applications involving rectifying circuit 5210, second rectifying output terminal 5212 may be omitted or grounded. In this embodiment, diodes 5411 and 5412 may be referred to as a first diode 5411 and a second diode 5412.

Next, in a similar vein, what follows are descriptions of operations of rectifying circuit 5410 under the two operational situations of when the received signal is an AC signal and when the received signal is a DC signal, respectively.

Operations of rectifying circuit 5410 when first and second pins 5201 and 5202 receive an AC signal as external driving signal Pin are described as follows. During the AC signal's positive half cycle, assuming the input voltage level at first pin 5201 from the AC signal being higher than that at second pin 5202, diodes 5411 and 5412 are in a reverse-biased state, so rectifying circuit 5410 ceases to output rectified signal Srec, or rectified signal Srec output by rectifying circuit 5410 is at a zero level. On the other hand, during the AC signal's negative half cycle, the input voltage level at first pin 5201 from the AC signal is lower than that at second pin 5202, so diodes 5411 and 5412 operate in a forward-biased state to conduct current, causing the AC signal to flow through diode 5411 and first rectifying output terminal 5211 into a later-stage load, after which the current of the AC signal flowing out through second rectifying output terminal 5212, another circuit of the LED filament bulb, or a ground terminal. According to the above description of operations, the rectified signal output by rectifying circuit 5410 is a half-wave rectified signal.

Operations of rectifying circuit 5410 when first and second pins 5201 and 5202 are coupled to a DC power supply to receive a DC signal as external driving signal Pin are described as follows. When first pin 5201 is coupled to the positive electrode, and second pin 5202 is coupled to the negative electrode, of the DC power supply, diodes 5411 and 5412 are cut off as being reverse-biased, so rectifying circuit 5410 ceases to output rectified signal Srec. On the other hand, when first pin 5201 is coupled to the negative electrode, and second pin 5202 is coupled to the positive electrode, of the DC power supply, diodes 5411 and 5412 operate in a forward-biased state to conduct current forming a circuit loop, so in this case the circuit configuration and operations of rectifying circuit 5410 are the same as those of rectifying circuit 5410 under and during the above-described AC signal's negative half cycle. From this description, in this embodiment, when first pin 5201 is coupled to the negative electrode, and second pin 5202 is coupled to the positive electrode, of the DC power supply, the rectifying circuit 5410 can still operate normally.

Figure 42A:
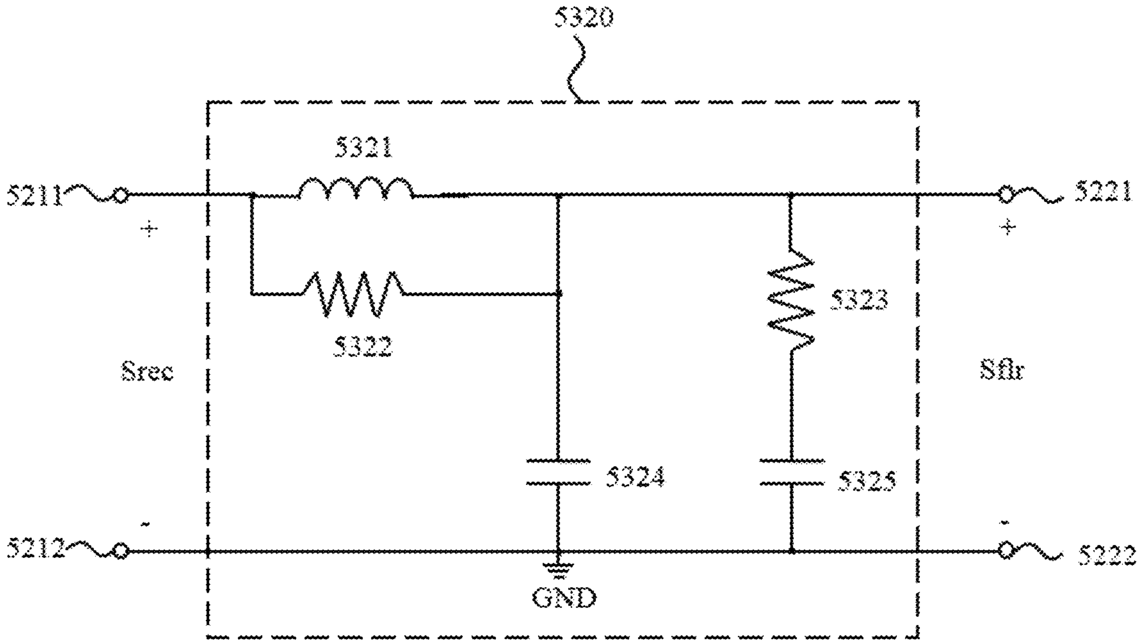
FIG. 42A is a schematic diagram of a filtering circuit in accordance with an embodiment of the present invention.

FIG. 42A is a circuit diagram of a filtering circuit according to some embodiments of present invention. Referring to FIG. 42A, the filtering circuit 5320 includes an inductor 5321, resistors 5322 and 5323, and capacitors 5324 and 5325. Inductor 5321 has a first end coupled to first rectifying output terminal 5211, and has a second end coupled to a first filtering output terminal 5221. So inductor 5321 is electrically connected between first rectifying output terminal 5211 and first filtering output terminal 5221 in series. Resistor 5322 has a first end coupled to first rectifying output terminal 5211 and the first end of inductor 5321, and has a second end coupled to first filtering output terminal 5221 and the second end of inductor 5321. So resistor 5322 and inductor 5321 are electrically connected in parallel. Resistor 5323 has a first end coupled to first filtering output terminal 5221 and the second end of inductor 5321. Capacitor 5324 has a first end coupled to first filtering output terminal 5221 and the second end of inductor 5321, and has a second end coupled to second rectifying output terminal 5212 and second filtering output terminal 5222, wherein second rectifying output terminal 5212 and second filtering output terminal 5222 may be regarded as the same terminal and/or a ground terminal GND. Capacitor 5325 has a first end coupled to a second end of resistor 5323, and has a second end coupled to second rectifying output terminal 5212 and second filtering output terminal 5222. Under the structure and configuration of filtering circuit 5320 in this embodiment, filtering circuit 5320 can perform low-pass filtering to rectified signal Srec, to filter out high-frequency components of rectified signal Srec so as to produce a filtered signal Sflr then output through first and second filtering output terminals 5221 and 5222.

Figure 42B:
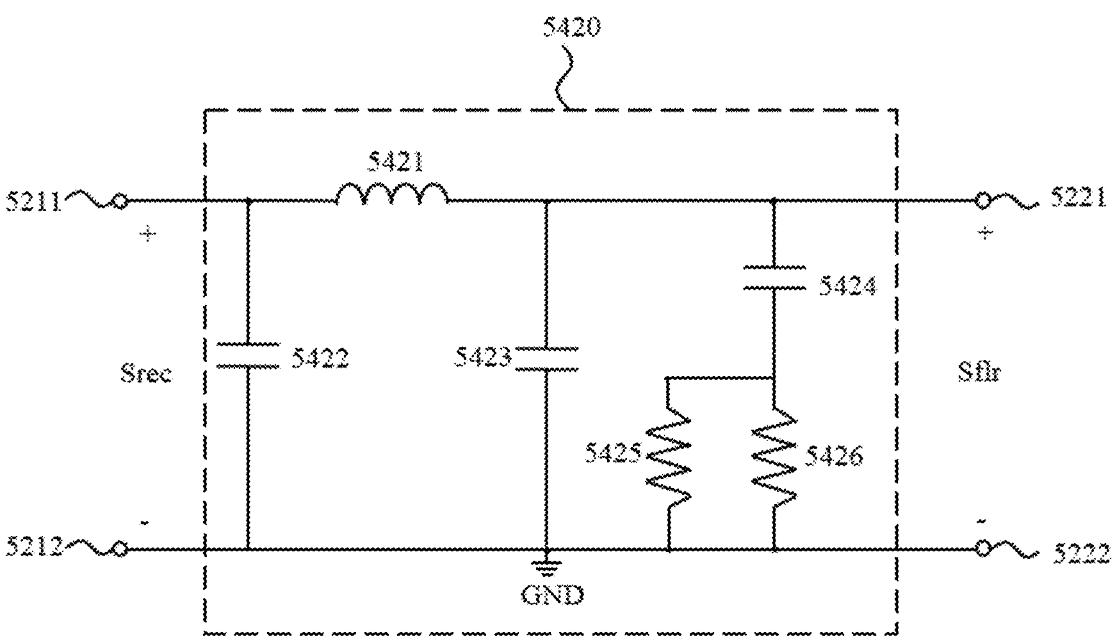
FIG. 42B is a schematic diagram of a filtering circuit in accordance with another embodiment of the present invention.

FIG. 42B is a circuit diagram of a filtering circuit according to some embodiments of the present invention. Referring to FIG. 42B, filtering circuit 5420 comprises a x-shape filtering circuit and includes an inductor 5421, capacitors 5422, 5423, and 5424, and resistors 5425 and 5426. Inductor 5421 has a first end coupled to first rectifying output terminal 5211, and has a second end coupled to a first filtering output terminal 5221. So inductor 5421 is electrically connected between first rectifying output terminal 5211 and first filtering output terminal 5221 in series. Capacitor 5422 has a first end coupled to first rectifying output terminal 5211 and first end of inductor 5421, and has a second end coupled to second rectifying output terminal 5212 and a second filtering output terminal 5222, so the first end of capacitor 5422 is coupled to first filtering output terminal 5221 through inductor 5421. Capacitor 5423 has a first end coupled to first filtering output terminal 5221 and the second end of inductor 5421, and has a second end coupled to second rectifying output terminal 5212 and second filtering output terminal 5222, so the first end of capacitor 5423 is coupled to first rectifying output terminal 5211 through inductor 5421. Capacitor 5424 has a first end coupled to first filtering output terminal 5221 and the second end of inductor 5421, and has a second end coupled to first ends respectively of resistors 5425 and 5426, whose respective second ends are coupled to second rectifying output terminal 5212 and second filtering output terminal 5222.

By way of structural equivalence, the positional structure of inductor 5421 and capacitor 5423 of filtering circuit 5420 is similar to that of inductor 5321 and capacitor 5324 of filtering circuit 5320. Compared to filtering circuit 5320 in FIG. 42A, filtering circuit 5420 further includes capacitor 5422, which is similar to inductor 5421 and capacitor 5423 in having a low-pass filtering function. So compared to filtering circuit 5320 in FIG. 42A, filtering circuit 5420 has better ability to filter out high-frequency components, which ability causes the waveform of its output filtered signal Sflr to be smoother.

Inductors 5321 and 5421 in the above embodiments each have an inductance preferably in the range of about 10 nH~10 mH. And capacitors 5324, 5325, 5422, 5423, and 5424 each have a capacitance preferably in the range of about 100 pF~1 uF.

Figure 43:
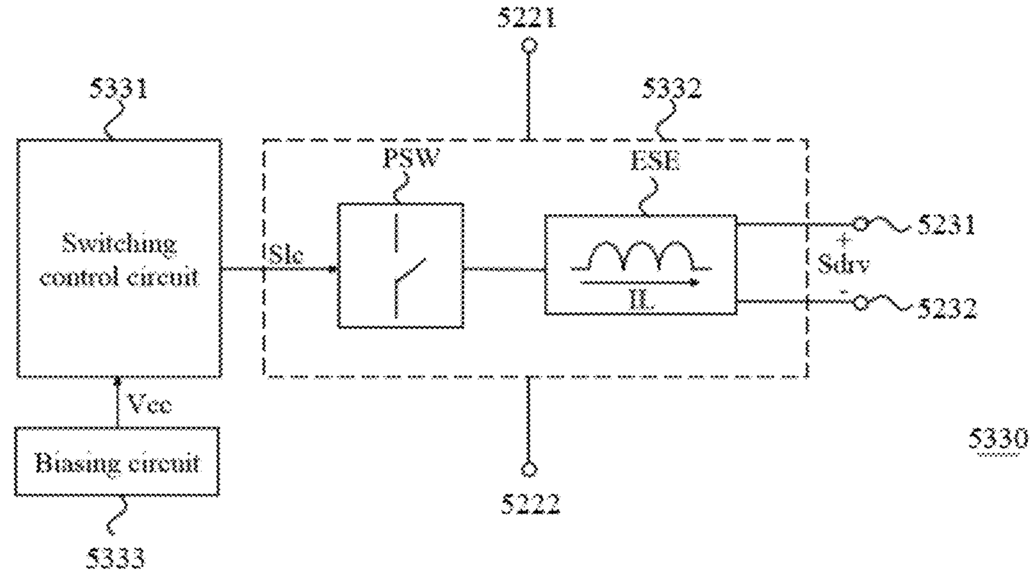
FIG. 43 is a block diagram of a driving circuit in accordance with an embodiment of the present invention.

FIG. 43 is a circuit diagram of a driving circuit according to some embodiments of the present invention. Referring to FIG. 43, the driving circuit 5330 includes a switching control circuit 5331 and a conversion circuit 5332, for performing power conversion based on, or in a mode of being, a current source, in order to drive the LED filament module to emit light. Conversion circuit 5332 includes a switching circuit PSW (which may be referred to as a power switch) and an energy storage circuit ESE. And conversion circuit 5332 is coupled to first and second filtering output terminals 5221 and 5222 to receive and then convert filtered signal Sflr, under the control by switching control circuit 5331, into a driving power Sdrv to be output at a first and a second driving output terminals 5231 and 5232 for driving the LED filament module. Under the control by switching control circuit 5331, driving power Sdrv output by conversion circuit 5332 comprises a steady current, causing the LED filament module to steadily emit light. Besides, driving circuit 5330 may further include a biasing circuit 5333, which may be configured to generate working voltage Vcc based on voltage on an input power line of the power module, wherein working voltage Vcc is provided to and used by switching control circuit 5331, so that switching control circuit 5331 can be activated and then operate in response to working voltage Vcc.

Figure 44A:
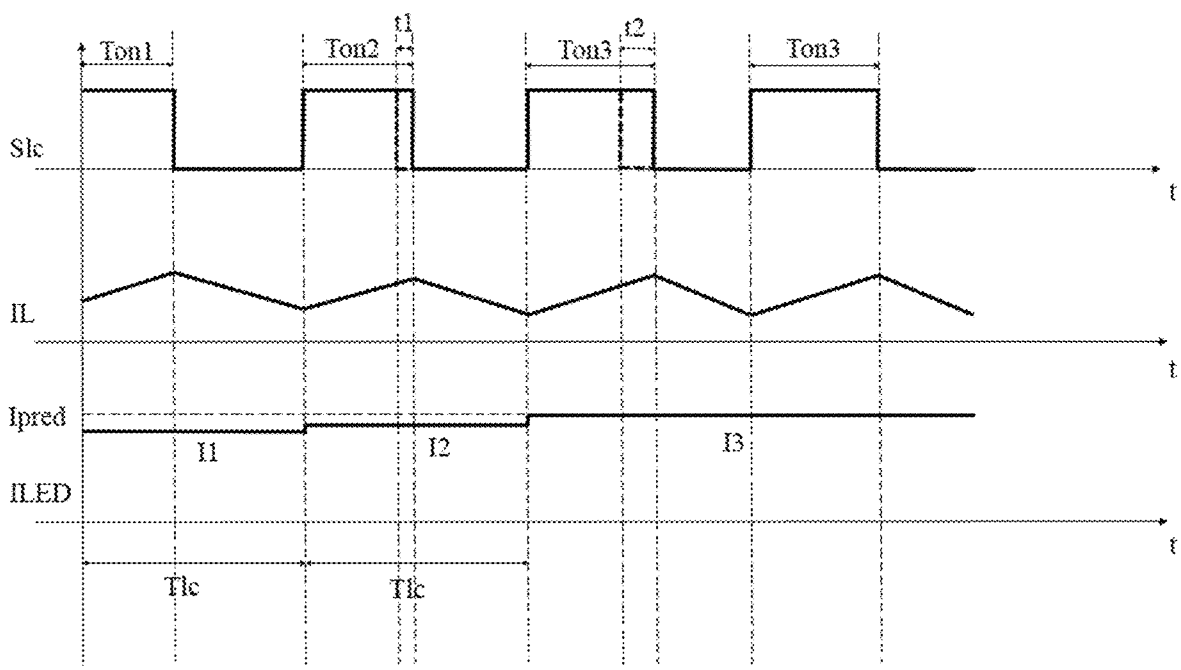
FIGS. 44A to 44D are schematic diagrams showing signal waveforms of a driving circuit in accordance with various embodiments of the present invention.
Figure 44B:
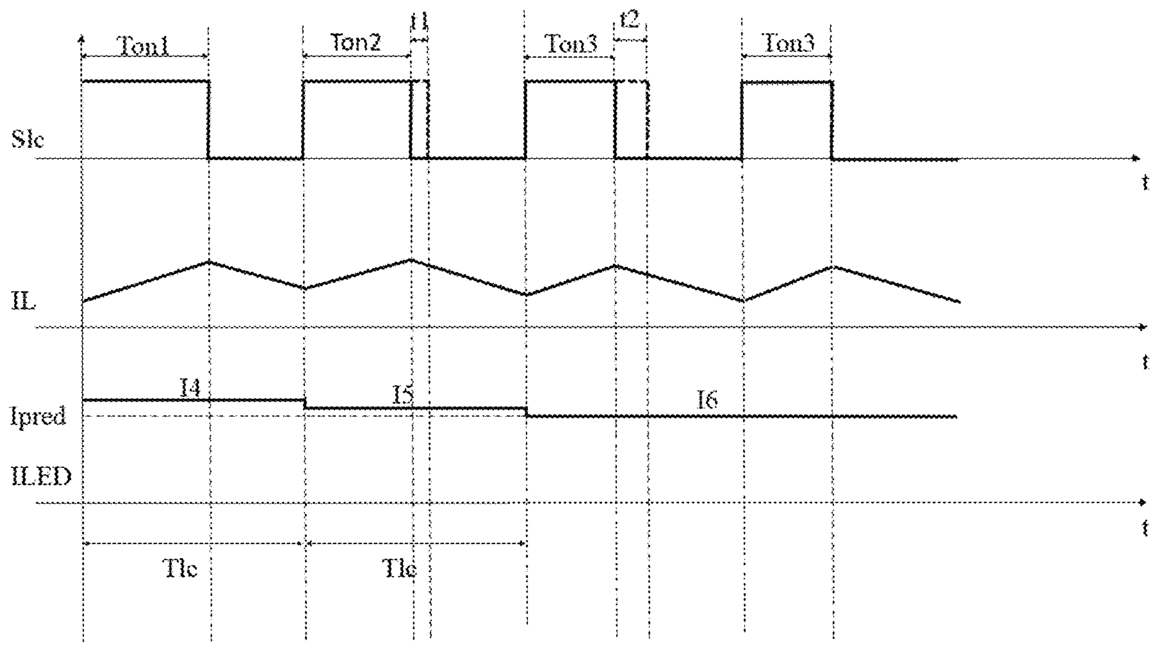
Figure 44C:
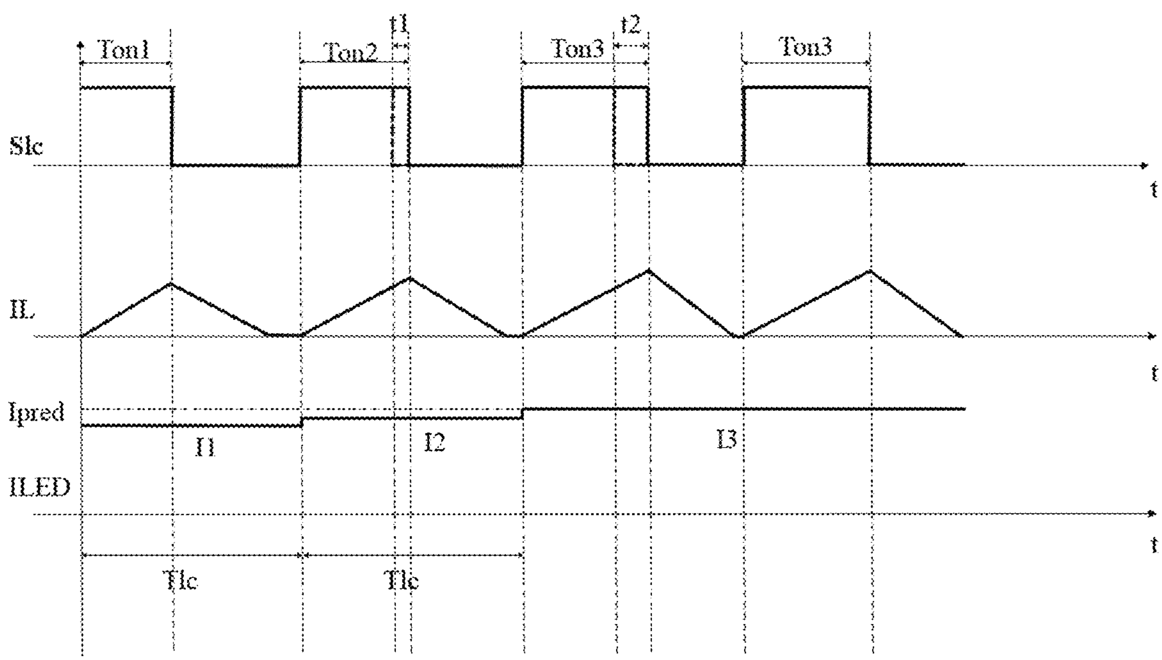
Figure 44D:
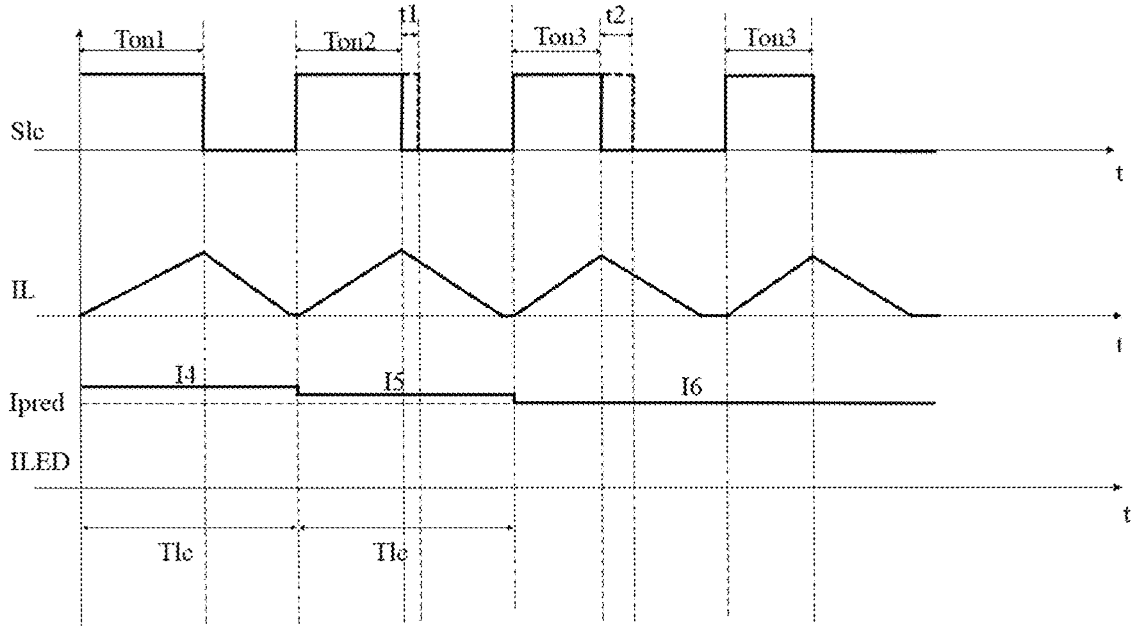

Next, operations of driving circuit 5330 are further described with reference to the illustrating signal waveforms shown in FIGS. 44A-44D. FIGS. 44A-44D are signal waveform diagrams related to and in different embodiments of operating the driving circuit (5230/5330). FIGS. 44A and 44B illustrate signal waveforms and control situation in an embodiment of operating driving circuit 5330 in a continuous-conduction mode (CCM). FIGS. 44C and 44D illustrate signal waveforms and control situation in an embodiment of operating driving circuit 5330 in a discontinuous-conduction mode (DCM). In the signal-waveform diagrams, the horizontal axis represents time, which is denoted by "t", and the vertical axis represents the variable of voltage or current depending on which type of signal is being described or referred to.

Switching control circuit 5331 in this embodiment is configured to perform real-time regulation or adjusting of the duty cycle of a lighting control signal Slc according to current operational states of the LED filament bulb, in order to turn on or turn off switching circuit PSW according to or in response to lighting control signal Slc. Switching control circuit 5331 can determine or judge a current operational state of the LED filament bulb by detecting one or more of an input voltage (such as a voltage level on first pin 5201 or second pin 5202, on first rectifying output terminal 5211, or on first filtering output terminal 5221), an output voltage (such as a voltage level on first driving output terminal 5231), an input current (such as a current on the input power line or flowing through rectifying output terminal 5211/5212 and filtering output terminal 5221/5222), and an output current (such as a current flowing through driving output terminal 5231/5232 or through switching circuit PSW). Energy storage circuit ESE is configured to alternate or switch its operation between being charged with energy and discharging energy, according to the state of switching circuit PSW being turned on or turned off, in order to maintain or make a driving current ILED received by the LED filament module be stable above a predefined current value Ipred. Lighting control signal Slc has a fixed signal period Tlc and a signal amplitude, wherein the pulse on time (such as Ton1, Ton2, or Ton3, and also referred to as a pulse width) during each of signal period Tlc may be adjusted according to control needs. And the duty cycle of lighting control signal Slc is the ratio of the pulse on time to signal period Tlc. For example, if pulse on time Ton1 is 40% of signal period Tlc, this means the duty cycle of lighting control signal Slc during first signal period Tlc is 0.4.

FIG. 44A illustrates variations in signal waveforms during multiple consecutive signal periods Tlc related to operating driving circuit 5330 when driving current ILED is below predefined current value Ipred. Referring to both FIG. 43 and FIG. 44A, specifically, during first signal period Tlc, switching circuit PSW conducts current during pulse on time Ton1 when lighting control signal Slc is at a high level. So during pulse on time Ton1, in addition to generating driving current ILED for LED filament module 100 according to input power supply received from first filtering output terminal 5221 and second filtering output terminal 5222, conversion circuit 5332 electrically charges energy storage circuit ESE through conducting switching circuit PSW so as to gradually increase a current signal IL flowing through energy storage circuit ESE. In other words, during pulse on time Ton1, energy storage circuit ESE is electrically charged to store energy in response to the input power supply received from first filtering output terminal 5221 and second filtering output terminal 5222.

Subsequently, upon the end of pulse on time Ton1, switching circuit PSW is turned off or not conducting in response to lighting control signal Slc being at a low level. During the time that switching circuit PSW is turned off, the input power supply received from first filtering output terminal 5221 and second filtering output terminal 5222 is not provided to the LED filament module, but instead energy storage circuit ESE discharges electrical energy to generate driving current ILED for the LED filament module, wherein current signal IL flowing through energy storage circuit ESE gradually decreases due to the energy discharging. Therefore, even when lighting control signal Slc is at a low level, that is, when switching circuit PSW is turned off or disabled, driving circuit 5330 continues to provide electrical power to the LED filament module due to the energy discharging from and by energy storage circuit ESE. In other words for this case, no matter whether switching circuit PSW is turned on or turned off, driving circuit 5330 will continually provide a stable driving current ILED to the LED filament module, wherein the current value of driving current ILED during first signal period Tlc is about I1 as shown in FIG. 44A.

During first signal period Tlc, switching control circuit 5331 judges that current value I1 of driving current ILED is below a predefined current value Ipred, according to a current detection signal indicative of a working state of the LED filament. Thus upon entering into second signal period Tlc, switching control circuit 5331 adjusts the pulse on time of lighting control signal Slc into Ton2, which is equal to pulse on time Ton1 plus a unit duration t1.

During second signal period Tlc, operations of switching circuit PSW and energy storage circuit ESE are similar to their operations during the previous or first signal period Tlc. The difference(s) in operations between two signal periods Tlc is mainly that since pulse on time Ton2 is longer than pulse on time Ton1, the charging time and discharging time of energy storage circuit ESE during second signal period Tlc are longer and shorter respectively than their counterparts during first signal period Tlc, causing an average value I2 of driving current ILED provided by driving circuit 5330 during second signal period Tlc higher than current value I1 and closer to predefined current value Ipred.

Similarly, since at this stage current value I2 of driving current ILED is still below predefined current value Ipred, during third signal period Tlc switching control circuit 5331 again adjusts the pulse on time of lighting control signal Slc into Ton3, which is equal to pulse on time Ton2 plus unit duration t1 or equal to pulse on time Ton1 plus duration t2 of 2 unit durations t1. During third signal period Tlc, operations of switching circuit PSW and energy storage circuit ESE are similar to their operations during each of first two signal periods Tlc. Because pulse on time Ton3 is further longer than pulse on time Ton2, the current value of driving current ILED provided by driving circuit 5330 during third signal period Tlc is raised to I3 approximately reaching predefined current value Ipred. Afterwards, since current value I3 of driving current ILED during third signal period Tlc has reached predefined current value Ipred, switching control circuit 5331 maintains a constant duty cycle of lighting control signal Slc, to maintain the current value of driving current ILED continually at predefined current value Ipred.

FIG. 44B illustrates variations in signal waveforms during multiple consecutive signal periods Tlc related to operating driving circuit 5330 when driving current ILED is above predefined current value Ipred. Referring to both FIG. 43 and FIG. 44B, specifically, during first signal periods Tlc shown in FIG. 44B, switching circuit PSW conducts current during pulse on time Ton1 when lighting control signal Slc is at a high level. So during pulse on time Ton1, in addition to generating driving current ILED for LED filament module 18 according to input power supply received from first filtering output terminal 5221 and second filtering output terminal 5222, conversion circuit 5332 electrically charges energy storage circuit ESE through conducting switching circuit PSW so as to gradually increase a current signal IL flowing through energy storage circuit ESE. In other words, during pulse on time Ton1, energy storage circuit ESE is electrically charged to store energy in response to the input power supply received from first filtering output terminal 5221 and second filtering output terminal 5222.

Subsequently, upon the end of pulse on time Ton1, switching circuit PSW is turned off or not conducting in response to lighting control signal Slc being at a low level. During the time that switching circuit PSW is turned off, the input power supply received from first filtering output terminal 5221 and second filtering output terminal 5222 is not provided to LED filament module 100, but instead energy storage circuit ESE discharges electrical energy to generate driving current ILED for LED filament module 100, wherein current signal IL flowing through energy storage circuit ESE gradually decreases due to the energy discharging. Therefore, even when lighting control signal Slc is at a low level, that is, when switching circuit PSW is turned off or disabled, driving circuit 5330 continues to provide electrical power to LED filament module 100 due to the energy discharging from and by energy storage circuit ESE. In other words for this case, no matter whether switching circuit PSW is turned on or turned off, driving circuit 5330 will continually provide a stable driving current ILED to LED filament module 100, wherein the current value of driving current ILED during first signal period Tlc is about 14 as shown in FIG. 44B.

During first signal period Tlc, switching control circuit 5331 judges that current value I4 of driving current ILED is above a predefined current value Ipred, according to a current detection signal Sdet. Thus upon entering into second signal period Tlc, switching control circuit 5331 adjusts the pulse on time of lighting control signal Slc into Ton2, which is equal to pulse on time Ton1 minus a unit duration t1.

During second signal period Tlc, operations of switching circuit PSW and energy storage circuit ESE are similar to their operations during previous or first signal period Tlc. The difference(s) in operations between two signal periods Tlc is mainly that since pulse on time Ton2 is shorter than pulse on time Ton1, the charging time and discharging time of energy storage circuit ESE during second signal period Tlc are shorter and longer respectively than their counterparts during first signal period Tlc, causing an average value I5 of driving current ILED provided by driving circuit 5330 during second signal period Tlc lower than current value I4 and closer to predefined current value Ipred.

Similarly, since at this stage current value I5 of driving current ILED is still above predefined current value Ipred, during third signal period Tlc switching control circuit 5331 again adjusts the pulse on time of lighting control signal Slc into Ton3, which is equal to pulse on time Ton2 minus unit duration t1 or equal to pulse on time Ton1 minus duration t2 of 2 unit durations t1. During third signal period Tlc, operations of switching circuit PSW and energy storage circuit ESE are similar to their operations during each of first two signal periods Tlc. Because pulse on time Ton3 is further shorter than pulse on time Ton2, the value of driving current ILED provided by driving circuit 5330 during third signal period Tlc is lowered to I6 approximately reaching predefined current value Ipred. Afterwards, since current value I6 of driving current ILED during third signal period Tlc has reached predefined current value Ipred, switching control circuit 5331 maintains a constant duty cycle of lighting control signal Slc, to maintain the current value of driving current ILED continually at predefined current value Ipred.

From the above descriptions of the embodiments of both FIGS. 44A and 44B, it's seen that driving circuit 5330 adjusts the pulse width or pulse on time of lighting control signal Slc for each of consecutive signal periods Tlc, in a stepping manner depending on the level of driving current ILED in relation to predefined current value Ipred, to gradually bring the value of driving current ILED above or below predefined current value Ipred to approach or be closer to predefined current value Ipred, so as to realize outputting of a stable or constant current.

In addition, the above embodiments of FIGS. 44A and 44B are examples of operating driving circuit 5330 in a continuous-conduction mode, wherein when switching circuit PSW is turned off energy storage circuit ESE does not discharge current to the extent that current signal IL flowing through energy storage circuit ESE decreases to zero. By using driving circuit 5330 operating in the continuous-conduction mode to provide power for the LED filament module, the electrical power provided to the LED filament module is relatively stable and is not likely to cause signal ripples.

Next are descriptions of embodiments of a control situation of operating driving circuit 5330 in a discontinuous-conduction mode. Referring to both FIG. 43 and FIG. 44C, the signal waveforms and operations of the driving circuit 5330 shown by FIG. 44C are similar to those shown by FIG. 44A. The difference(s) between the two embodiments of FIG. 44C and FIG. 44A is mainly that because driving circuit 5330 in this embodiment of FIG. 44C operates in a discontinuous-conduction mode, when switching circuit PSW is turned off or disabled by lighting control signal Slc being at a low level energy storage circuit ESE discharges current to the extent that current signal IL flowing through energy storage circuit ESE decreases to zero, followed by energy storage circuit ESE being charged again upon starting of next signal period Tlc. Apart from this difference, description of other operations of this embodiment of FIG. 44C can be referred to the above description of the embodiment of FIG. 44A and so is not repeated again.

Then referring to both FIG. 43 and FIG. 44D, the signal waveforms and operations of driving circuit 5330 shown by FIG. 44D are similar to those shown by FIG. 44B. The difference(s) between the two embodiments of FIG. 44D and FIG. 44B is mainly that because driving circuit 5330 in this embodiment of FIG. 44D operates in a discontinuous-conduction mode, when switching circuit PSW is turned off or disabled by lighting control signal Slc being at a low level energy storage circuit ESE discharges current to the extent that current signal IL flowing through energy storage circuit ESE decreases to zero, followed by energy storage circuit ESE being charged again upon starting of next signal period Tlc. Apart from this difference, description of other operations of this embodiment of FIG. 44D can be referred to the above description of the embodiment of FIG. 44B and so is not repeated again.

By using driving circuit 5330 operating in the discontinuous-conduction mode to provide power for the LED filament module, energy or power loss incurred in performing power conversion by driving circuit 5330 can be reduced, thereby resulting in a higher conversion efficiency. The following are descriptions to introduce and further explain several concrete circuit examples of driving circuit 5330.

Figure 45A:
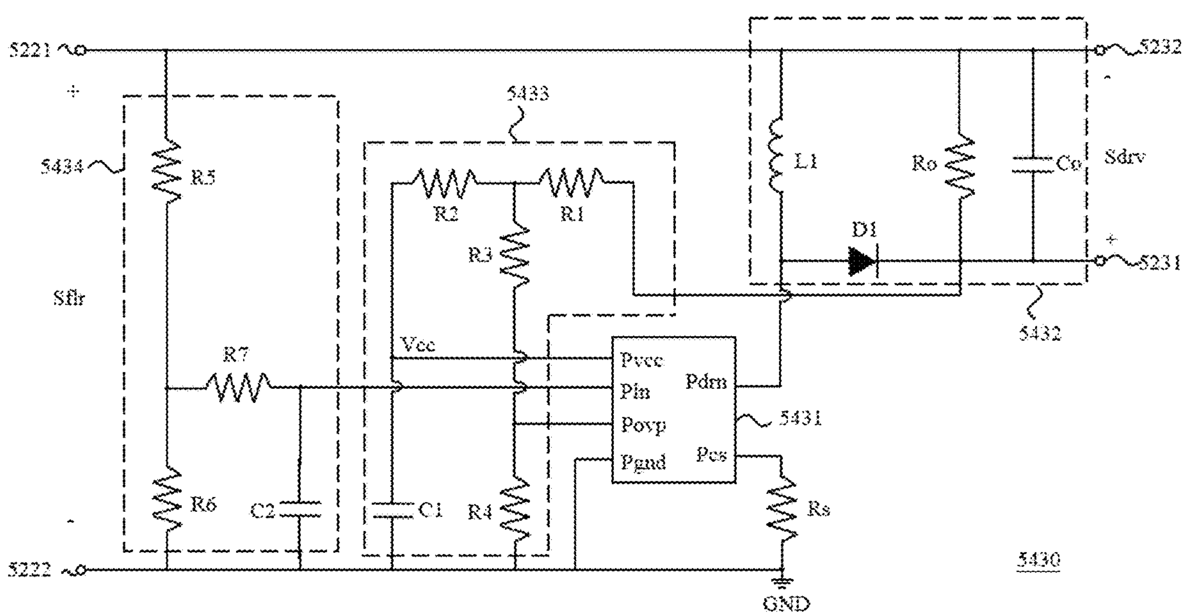
FIG. 45A is a perspective diagram of a driving circuit in accordance with an embodiment of the present invention.

FIG. 45A is a circuit diagram of a driving circuit according to some embodiments of the present invention. Referring to FIG. 45A, in this embodiment, driving circuit 5430 comprises a buck DC-to-DC converter circuit, including a controller 5431, an output circuit 5432, a biasing circuit 5433 and a sampling circuit 5434. Driving circuit 5430 is coupled to first filtering output terminal 5221 and second filtering output terminal 5222 to convert received filtered signal Sflr to driving power Sdrv for driving the LED filament module coupled between first and second driving output terminals 5231 and 5232.

Controller 5431 includes for example an integrated-circuit chip, which has a drain-terminal or drain pin Pdrn, a source-terminal or source pin Pcs, an power pin Pvcc, a voltage sampling pin Pln, an overvoltage protection pin Povp, and a ground pin Pgnd. Drain pin Pdrn is coupled to output circuit 5432. Source pin Pcs is coupled to second filtering output terminal 5222 and ground terminal GND through a resistor Rs. Power pin Pvcc and overvoltage protection pin Povp are coupled to biasing circuit 5433. Voltage sampling pin Pln is coupled to sampling circuit 5434. And ground pin Pgnd is coupled to second filtering output terminal 5222 and ground terminal GND.

In this embodiment of FIG. 45A, the above-mentioned switching circuit or power switch (PSW) of conversion circuit 5332 is for example integrated in controller 5431, and has first and second terminals electrically connected to drain pin Pdrn and source pin Pcs respectively. Therefore, controller 5431 can determine current conduction or cutoff at or through drain pin Pdrn, source pin Pcs, and/or corresponding current path(s), by controlling switching of its internal switching circuit between, or into one of, conduction and cutoff states. In some other embodiments, the above-mentioned switching circuit is a discrete device disposed external to controller 5431. In applications using a discrete device as switching circuit, definitions or connection-structure of pins of controller 5431 would be adjusted accordingly, such as setting drain pin Pdrn as a pin to be electrically connected to a control terminal of the discrete switching circuit instead and for providing a lighting control signal.

Output circuit 5432 includes a diode D1, an inductor L1, a capacitor Co, and a resistor Ro, wherein inductor L1 and capacitor Co act as (part of) the energy storage circuit (ESE) of conversion circuit 5332. Diode D1 acts as a freewheeling diode; has its anode coupled to drain pin Pdrn of controller 5431 so as to be coupled through drain pin Pdrn to the first or drain terminal of the switching circuit (PSW) within controller 5431; and has its cathode coupled to first driving output terminal 5231 Inductor L1 has a first end coupled to the anode of the diode D1 and the drain pin Pdrn of the controller 5431, and has a second end coupled to first filtering output terminal 5221 and second driving output terminal 5232. Resistor Ro and capacitor Co are electrically connected in parallel and coupled between first and second driving output terminals 5231 and 5232. In this embodiment, first filtering output terminal 5221 and second driving output terminal 5232 can be regarded as the same terminal.

In this embodiment of FIG. 45A, the controller 5431 is configured to control current conduction or cutoff on a path between drain pin Pdrn and source pin Pcs. When there is current conduction on the path between drain pin Pdrn and source pin Pcs, a current flows from first filtering output terminal 5221 into driving circuit 5430, and flows through inductor L1 and drain pin Pdrn into controller 5431, and then flows through source pin Pc and second filtering output terminal 5222 to ground terminal GND. In this case of current conduction, the current flowing through inductor L1 increases with time and causes inductor L1 to be in a state of storing electrical energy; while the voltage across capacitor Co decreases with time and causes capacitor Co to be in a state of releasing electrical energy in order to maintain the LED filament module as emitting light. On the other hand, when the path between drain pin Pdrn and source pin Pcs is in a cutoff state or not conducting current, inductor L1 is in a state of releasing or discharging electrical energy and the current flowing through inductor L1 decreases with time. In this cutoff case the current flowing through inductor L1 flows through diode D1, first driving output terminal 5231, the LED filament module, second driving output terminals 5232, and then back to inductor L1, forming a current flyback; and capacitor Co is in a state of storing electrical energy with its voltage increasing with time.

It should be noted that capacitor Co may be omitted. When capacitor Co is omitted, and there is current conduction on the path between drain pin Pdrn and source pin Pcs, a current flowing through inductor L1 doesn't flow through first filtering output terminal 5221 and second driving output terminal 5232, so the LED filament module does not emit light. But when the path between drain pin Pdrn and source pin Pcs is in a cutoff state, a current flowing through inductor L1 flows through freewheeling diode D1 to the LED filament module to cause the LED filament to emit light. By adjusting or controlling the duration of light emission by the LED filament and the magnitude of current flowing through the LED filament module, an average luminance of the emitted light stable above a defined value can be achieved, so as to achieve a favorable function of emitting stable light. Apart from the above, since driving circuit 5430 of this embodiment takes a non-isolation power-conversion structure, feedback control, if any, of switching circuit or power switch (PSW) performed by controller 5431 may be based on detecting a magnitude of current flowing through the switching circuit or power switch.

In another aspect, driving circuit 5430 keeps the current flowing through the LED module without variety, so for some LED modules (for example, white, red, blue and green LED modules), it can be improved that color temperature changes with current. In other words, the LED module can keep color temperature constant under different current intensity. Inductor L1 which serves as an energy storage circuit releases stored energy when the switching circuit turns off. This makes not only the LED filament keep lighting but also the current in the LED filament does not suddenly drop to the lowest value. When the switching circuit turns on again, it is unnecessary that both current and voltage goes from the lowest value to the highest value. Thereby, discontinuous lighting of LED filament can be avoided to cause the luminance of the LED filament being varied, to decrease the lowest conducting cycle and to raise the driving frequency.

Biasing circuit 5433 includes capacitor C1 and resistors R1-R4. A first end of capacitor C1 is electrically connected to power pin Pvcc. A second end of capacitor C1 is electrically connected to second filtering output terminal 5222 and ground terminal GND. A first end of resistor R1 is electrically connected second driving output terminal 5232. A first end of resistor R2 is electrically connected to a second end of resistor R1. A second end of resistor R2 is electrically connected to the first end of capacitor C1 and power pin Pvcc. A first end of resistor R3 is electrically connected a second end of resistor R1 and the first end of resistor R2. A second end of resistor R3 is electrically connected to overvoltage protection pin Povp of controller 5431. A first end of resistor R4 is electrically connected to the second end of resistor R3. A second end of resistor R4 is electrically connected to both second filtering output terminal 5222 and ground terminal GND.

Resistors R1 and R2 acquire a voltage of second driving output terminal 5232 to generate working voltage Vcc. Working voltage Vcc is stabilized by capacitor C1 and transmitted to power pin Pvcc for being used by controller 5431. Resistors R3 and R4 acquire or sample a voltage of second driving output terminal 232 by voltage division so that controller 5431 can determine if the overvoltage protection function should be executed or not according to the voltage of overvoltage protection pin Povp.

Sampling circuit 5434 includes capacitor C2 and resistors R5-R7. A first end of capacitor C2 is electrically connected to voltage sampling pin Pln. A second end of capacitor C2 is electrically connected to both second filtering output terminal 5222 and ground terminal GND. A first end of resistor R5 is electrically connected to both first filtering output terminal 5221 and second driving output terminal 5232. A first end of resistor R6 is electrically connected to a second end of resistor R5. A second end of resistor R6 is electrically connected to both second filtering output terminal 5222 and ground terminal GND. A first end of resistor R7 is electrically connected to both the second end of resistor R7 and the first end of resistor R6. A second end of resistor R7 is electrically connected to both voltage sampling pin Pln and the first end of capacitor C2.

Resistors R5 and R6 acquire or sample a voltage of the power line (i.e. the voltage of first filtering output terminal 5221) by voltage division. The sampled voltage is transmitted to voltage sampling pin Pln of controller 5431 through resistor R7. Capacitor C2 is used for stabilizing a voltage of voltage sampling pin Pin.

Figure 45B:
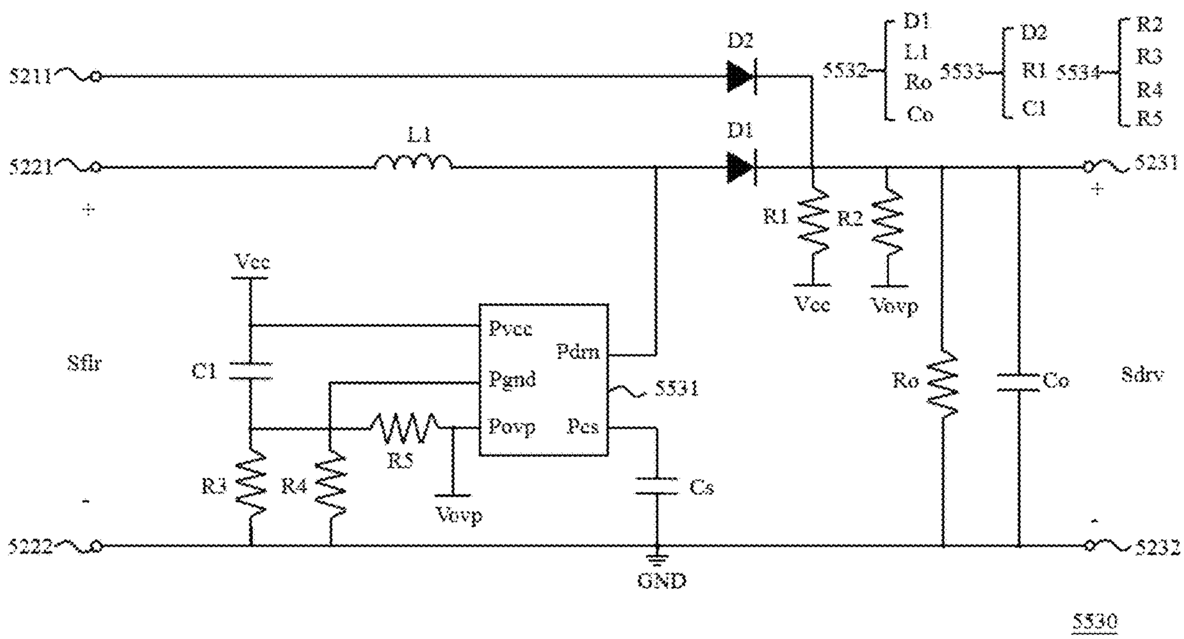
FIG. 45B is a perspective diagram of a driving circuit in accordance with another embodiment of the present invention.

Please refer to FIG. 45B, which is a schematic circuit diagram of the driving circuit according to some embodiments of the present invention. In this embodiment, a boost DC-to-DC converter serves as the driving circuit 5530 as an example, which includes controller 5531, output circuit 5532, biasing circuit 5533 and sampling circuit 5534. The driving circuit is electrically connected to both first filtering output terminal 5221 and second filtering terminal 5222 for converting the received filtered signal Sflr into a driving power Sdrv to drive the LED filament module electrically connected between first and second driving output terminals 5231 and 5232. In addition, driving circuit 5530 is further electrically connected to first rectifying output terminal 5211 for acquiring voltage of the power line (or bus line) to generate working voltage Vcc.

Controller 5531 may be an integrated circuit or a chip including drain pin Pdrn, source pin Pcs, power pin Pvcc, overvoltage protection pin Povp and ground pin Pgnd. Drain pin Pdrn is electrically connected to output circuit 5532. Source pin Pcs is electrically connected to second filtering output terminal 5222, second driving output terminal 5532 and ground terminal GND through capacitor Cs. Power pin Pvcc is electrically connected to biasing circuit 5533. Overvoltage protection pin Povp is electrically connected to sampling circuit 5534. Ground pin Pgnd is electrically connected to both biasing circuit 5533 and sampling circuit 5534.

In this embodiment, the switching circuit/power switch (PSW) may be integrated in controller 5531, and the first end and the second end of the switching circuit are electrically connected to drain pin Pdrn and source pin Pcs, respectively. In other words, controller 5531 can determine switch-on or switch-off of a current path related to drain pin Pdrn and source pin Pcs by controlling the switching state of the switching circuit within controller 5531. In other embodiments, the switching circuit may also be a discrete element which is not integrated into controller 5531. Under such a situation using a discrete element as a switching circuit, definition of pinout of controller 5531 will be correspondingly adjusted. For example, drain pin Pdrn can be adjusted to connect to a control end of the switching circuit and to serve as a pin providing a lighting control signal.

Output circuit 5532 includes diode D1, inductor L1, capacitor Co and resistor Ro. Both inductor L1 and capacitor C1 serve as an energy storage circuit (ESE) of the converting circuit. Diode D1 serves as a freewheeling diode, whose anode is electrically connected to drain pin Pdrn of controller 5531 by connecting drain pin Pdrn to the first end/drain of the switching circuit in controller 5531. The cathode of diode D1 is electrically connected to first driving output terminal 5231. The first end of inductor L1 is electrically connected to first filtering output terminal 5221. The second end of inductor L1 is electrically connected to both drain pin Pdrn of controller 431 and the anode of diode D1. Resistor Ro and capacitor Co are electrically connected in parallel and electrically connected between first driving output terminal 5231 and second driving output terminal 5232. In this embodiment, first filtering output terminal 5221 is electrically connected to first driving output terminal 5231 via both diode D1 and inductor L1.

Controller 5531 controls switch-on and switch-off between drain pin Pdrn and source pin Pcs. When circuit between drain pin Pdrn and source pin Pcs is switched on, current will flow in first filtering output terminal 5521 to controller 5531 via inductor L1 and drain pin Pdrn, and finally flow to ground terminal GND via source pin Pcs, capacitor Cs and second filtering output terminal 5222. At this time, current flowing through inductor L1 increases with time and inductor L1 is in a status of energy storing. Meanwhile, capacitor Co is in a status of energy releasing to drive the LED filament module to emit light. When drain pin Pdrn and source pin Pcs are switched off, inductor L1 is in a status of energy releasing, and the current in inductor L1 decreases with time. The current in inductor L1 flows to capacitor Co and the LED filament via diode D1. At this time, capacitor Co is in a status of energy storing.

It is noted that capacitor Co may be omitted. When capacitor Co is omitted and drain pin Pdrn and source pin Pcs are switched on, the current in inductor L1 does not flow through first driving output terminal 5231 and second driving output terminal 5232 to make the LED filament module not light. When drain pin Pdrn and source pin Pcs are switched off, the current in inductor L1 flows to the LED filament module via freewheeling diode D1 to light up the LED filament. By controlling lighting time of the LED filament and magnitude of the current flowing therethrough, the average intensity of the LED filament can be stabilized at a predetermined value to obtain an effect of identically stable lighting.

Biasing circuit 5533 includes diode D2, capacitor C1 and resistor R1. The anode and the cathode of diode D1 are electrically connected to first rectifying output terminal 5211 and first driving output terminal 5231, respectively. The first end and the second end of capacitor C1 are electrically connected to power pin Pvcc and ground pin Pgnd, respectively. The first end of resistor R1 is electrically connected to cathodes of diodes D1 and D2 and first driving output terminal 5231. The second end of resistor R1 is electrically connected to the first end of capacitor C1 and power pin Pvcc. Resistor R1 acquires a voltage of first driving output terminal 5231 to generate a working voltage Vcc. Working voltage Vcc is stabilized by capacitor C1 and transmitted to power pin Pvcc of controller 5431 for being used by controller 5431.

Sampling circuit 5534 includes resistor R2-R5. The first end and the second end of resistor R2 are electrically connected to first driving output terminal 5231 and overvoltage protection pin Povp, respectively. Resistors R3 and R4 are electrically connected in parallel. The first ends of resistors R3 and R4 are electrically connected to ground pin Pgnd. The second ends of resistors R3 and R4 are electrically connected to second filtering output terminal 5222, second driving output terminal 5232 and ground terminal GND. The first end and the second end of resistor R5 are electrically connected to ground pin Pgnd and both the second end of resistor R2 and overvoltage protection terminal Povp.

Resistors R2 to R5 acquire or sample a voltage of the output voltage (i.e. the voltage of first driving output terminal 5231) by voltage division. The sampled voltage is transmitted to overvoltage protection pin Povp of controller 5531. As a result, controller 5531 can determine if the overvoltage protection function should be executed or not according to a voltage of overvoltage protection pin Povp.

Additionally, driving circuits 5430, 5530 is shown by a single-stage DC-to-DC power conversion circuit as an example, but not limited to this. For example, driving circuit 5330 can be a two-stage power conversion circuit which includes an active power factor correction circuit and a DC-to-DC converter.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can apply some features of the FIG. A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The LED filament of the present invention and the LED light bulb of the application thereof have been implemented as described above, and it should be reminded that for the same LED filament or the LED light bulb using the LED filament, the features pertaining to aforementioned embodiments such as "light conversion layer", "light conversion layer wrapping conductive electrode and/or LED chip", "wire", "silicon gel and/or polyimide and/or resin", "phosphor particles constitute a ratio", "filament layer structure", "phosphor glue/film conversion wavelength/particle size/thickness/transmittance/hardness/shape", "transparent layer", "phosphor particles constitute a heat conduction path", "circuit film", "oxidation nanoparticles (inorganic heat dissipating particles), "die bond paste", "LED filament body wavy", "stem", "gas in lamp housing", "filament assembly", "the length of conductive brackets", "the length of the conductive brackets of the LED filament", "the surface of the supporting arm and/or stem can be coated with a graphene film", "the pressure inside the lamp housing", "the Young's modulus of the LED filament", "Shore scleroscope hardness of the LED filament base layer", "auxiliary strip", "lamp housing surface coating adhesive film, diffusion film, color film", "lamp housing/stem/pole with light conversion substance", "lamp housing having thermal dissipation area", "filament hole or notch", "thermal dissipation path in the LED filament", "curve formula of filament shape", "ventilation hole of lamp housing", "wavy fitting interface between the top layer and the base layer of the LED filament", the fitting surface is serrated", "through hole of the base layer", "light conversion layer includes the first fluorescent adhesive layer, the second fluorescent adhesive layer and the transparent layer", "auxiliary strip in wavy shape", "auxiliary strip in spiral shape", "multiple auxiliary strips are arranged in both horizontal and vertical", "at least one end of the longitudinal auxiliary strip is bent into an L shape", "the LED filament having bends", "no pole in lamp housing", "lamp housing with spray coating", "lamp housing raw materials with doped color", "butt seal between lamp housing and stem", "the wall thickness of the lamp housing is different from that of the stem", "the wall thickness of the lamp housing is thicker than that of the stem", "holes or gaps are appropriately set near the bending portion", "the width of the LED chip is smaller than the width of the base layer or the top layer", "the shape and/or the thickness of the top layer, and even the center of the top layer whether overlaps with the light emitting surface of the LED chip were the factors in the light emitting efficiency" may be included, whatever one, two, more, or all technical features under non-conflicting situations. The LED filament related components and the connection thereof may be selected from one or a combination of the technical features included in the corresponding embodiments.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

Figure 46A:
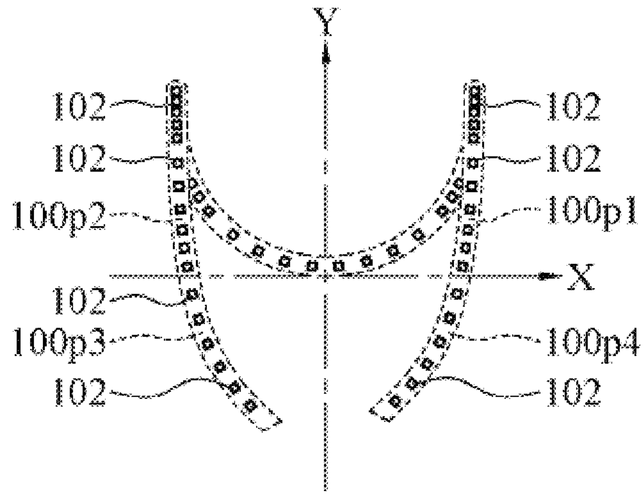
FIG. 46A is the LED filament shown in FIG. 27D presented in two dimensional coordinate system defining four quadrants showing arrangements of LED chips according to an embodiment of the present invention.

Please refer to FIG. 46A. FIG. 46A is the LED filament 100 shown in FIG. 27D presented in two dimensional coordinate system defining four quadrants showing arrangements of LED chips 102 according to an embodiment of the present invention. As shown in FIG. 46A, an arrangement of the LED chips 102 in the first portion 100*p*1 in the first quadrant in the side view is symmetric with an arrangement of LED chips 102 in the second portion 100*p*2 in the second quadrant in the side view, and an arrangement of the LED chips 102 in the third portion 100*p*3 in the third quadrant in the side view is symmetric with an arrangement of LED chips 102 in the fourth portion 100*p*4 in the fourth quadrant in the side view.

In the embodiment, the arrangement of the LED chips 102 may be referred to a density variation (or a concentration variation) of the LED chips 102 on the axial direction of the LED filament 100. As shown in FIG. 46A, the density of the LED chips 102 in the first portion 100*p*1 and the second portion 100*p*2 gradually increase from a side close to the X-axis to a side away from the X-axis, and the density of the LED chips 102 in the third portion 100*p*3 and the fourth portion 100*p*4 gradually decrease from a side close to the X-axis to a side away from the X-axis. Based upon the symmetric characteristic of the arrangement of LED chips 102, the illumination of the LED light bulb (as shown in FIG. 26A) along a direction from the LED filament 100 towards the top of the LED light bulb would be brighter than other directions while the effect of the illumination is still even due to the symmetry characteristics.

In some embodiments, the density of the LED chips 102 of the LED filament 100 may increase from the middle of the LED filament 100 towards the conductive electrodes 506. The conductive electrode 506 is a relative large metal component larger than the LED chip 102 and is with higher thermal conductivity. Moreover, a part of the conductive electrode 506 is exposed from the enclosure of the LED filament 100 and is connected to another metal support outside the LED filament 100, e.g., the conductive supports 51*a*, 51*b*. While the density of the LED chips 102 in the portion of the LED filament 100 closer to the conductive electrode 506 is higher than that of the LED chips 102 in another portion of the LED filament 100, the portion of the LED filament 100 closer to the conductive electrode 506 may generate more heat accordingly. In such case, the conductive electrodes 506 are benefit to dissipate heat generated by the LED chips 102 with higher density.

In some embodiments, whether the density of the LED chips 102 of the LED filament 100 on the axial direction of the LED filament 100 is identically arranged (with the same density all over the LED filament 100) or is in not identically arranged (as shown in FIG. 46A), the LED chips 102 may have different power, and a power configuration of the LED chips 102 may be symmetric in the side view.

For example, as shown in FIG. 27D, the LED chip 102 located at (x1, y1) may have a first power, and the LED chip 102 located at (x2, y2) may have a second power. The first power may be equal to the second power (e.g., 0.5 W). The LED chip 102 located at (x3, y3) may have a third power, and the LED chip 102 located at (x4, y4) may have a fourth power. The third power may be equal to the fourth power (e.g., 0.25 W). The power configuration of the LED chips 102 of the first portion 100*p*1 is symmetric with the power configuration of the LED chips 102 of the second portion 100*p*2, which means that the power of the LED chips 102 in the first portion 100*p*1 or in the second portion 100*p*2 may be not identical, but the power of the LED chip 102 at a designated point in the first portion 100*p*1 would be equal to that of the LED chip 102 at a corresponding symmetric point in the second portion 100*p*2. Analogously, the power configuration of the LED chips 102 of the third portion 100*p*3 is symmetric with the power configuration of the LED chips 102 of the fourth portion 100*p*4.

In some embodiments, the LED chips 102 with higher power may be configured to be close to the conductive electrodes 506 for better heat dissipation since the high power LED chips 102 would generate considerable heat.

Figure 46B:
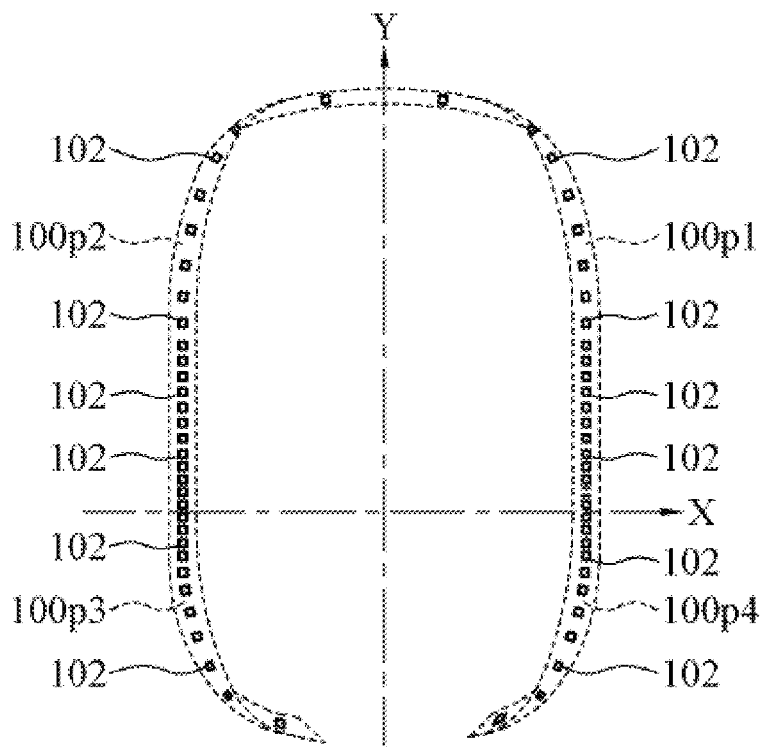
FIG. 46B is the LED filament shown in FIG. 27E presented in two dimensional coordinate system defining four quadrants showing arrangements of LED chips according to an embodiment of the present invention.

Please refer to FIG. 46B. FIG. 46B is the LED filament shown in FIG. 27E presented in two dimensional coordinate system defining four quadrants showing arrangements of LED chips according to an embodiment of the present invention. As shown in FIG. 46B, an arrangement of LED chips 102 in the first portion 100*p*1 of the LED filament 100 in the first quadrant (e.g., a density variation of the LED chips in the portion of the LED filament 100 in the first quadrant) in the top view is symmetric with an arrangement of LED chips 102 in the second portion 100*p*2 of the LED filament 100 in the second quadrant, and an arrangement of LED chips 102 in the third portion 100*p*3 of the LED filament 100 in the third quadrant in the top view is symmetric with an arrangement of LED chips 102 in the fourth portion 100*p*4 of the LED filament 100 in the fourth quadrant.

In some embodiments, as the above discussion, whether the density of the LED chips 102 of the LED filament 100 on the axial direction of the LED filament 100 is identically arranged (with the same density all over the LED filament 100) or is in not identically arranged (as shown in FIG. 46B), the LED chips 102 may have different power, and a power configuration of the LED chips 102 may be symmetric in the top view.

Figure 46C:
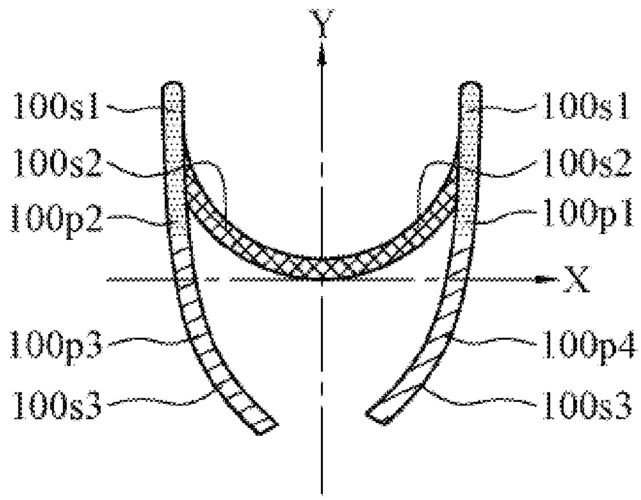
FIG. 46C is the LED filament shown in FIG. 27D presented in two dimensional coordinate system defining four quadrants showing segments of LED chips according to an embodiment of the present invention.

Please refer to FIG. 46C. FIG. 46C is the LED filament shown in FIG. 27D presented in two dimensional coordinate system defining four quadrants showing segments of LED chips according to an embodiment of the present invention. The LED filament 100 may be divided into segments by distinct refractive indexes. In other words, the segments of the LED filament 100 are defined by their distinct refractive indexes. In the embodiment, the LED filament 100 is divided into two first segments 100*s*1, a second segment 100*s*2, and two third segments 100*s*3. The second segment 100*s*2 is in the middle of the LED filament 100, the two third segments 100*s*3 are respectively at two ends of the LED filament 100, and the two first segments 100*s*1 are respectively between the second segment 100*s*2 and the two third segments 100*s*3. In particular, the enclosures (e.g., phosphor glue layers) of the first segment 100*s*1, the second segment 100*s*2, and the third segment 100*s*3 may be different from one another in composition and may have distinct refractive indexes, respectively.

For example, the enclosures of the first segments 100*s*1 have a first refractive index, the enclosure of the second segment 100*s*2 has a second refractive index, and the enclosures of the third segments 100*s*3 have a third refractive index. The first refractive index, the second refractive index, and the third refractive index are different from one another; therefore, the amount and the emitting direction of light rays from the first segment 100*s*1, the second segment 100*s*2, and the third segment 100*s*3 are accordingly different from one another. Consequently, the brightness of presented by the first segment 100*s*1, the second segment 100*s*2, and the third segment 100*s*3 of the LED filament 100 are different from one another while the LED filament operates.

As shown in FIG. 46C, in the embodiment, the refractive indexes of the segments of the first portion 100*p*1 (including one of the first segments 100*s*1, half of the second segment 100*s*2, and a part of one of the third segments 100*s*3) of the LED filament 100 in the first quadrant in the side view are symmetric with the refractive indexes of the segments of second portion 100*p*2 (including the other one of the first segments 100*s*1, the other half of the second segment 100*s*2, and a part of the other one of the third segments 100*s*3) of the LED filament 100 in the second quadrant in the side view, and the refractive indexes of the segments of the third portion 100*p*3 (including a part of one of the third segments 100*s*3) of the LED filament 100 in the third quadrant in the side view are symmetric with the refractive indexes of the segments of the fourth portion 100*p*4 (including a part of the other one of the third segments 100*s*3) of the LED filament 100 in the fourth quadrant in the side view.

As shown in FIG. 46C, in another embodiment, the LED filament 100 may be divided into segments by distinct surface roughness. In other words, the segments of the LED filament 100 are defined by their distinct surface roughness of the outer surface of the enclosure (e.g., phosphor glue layers) of the LED filament 100. In particular, the enclosures of the first segment 100*s*1, the second segment 100*s*2, and the third segment 100*s*3 respectively have distinct surface roughness.

For example, the outer surfaces of the enclosures of the first segments 100*s*1 have a first surface roughness, the outer surface of the enclosure of the second segment 100*s*2 has a second surface roughness, and the outer surfaces of the enclosures of the third segments 100*s*3 have a third surface roughness. The first surface roughness, the second surface roughness, and the third surface roughness are different from one another; therefore, the distribution and the emitting direction of light rays from the first segment 100*s*1, the second segment 100*s*2, and the third segment 100*s*3 are accordingly different from one another. Consequently, the brightness of presented by the first segment 100*s*1, the second segment 100*s*2, and the third segment 100*s*3 of the LED filament 100 are different from one another while the LED filament operates.

As shown in FIG. 46C, in another embodiment, the surface roughness of the segments of the first portion 100*p*1 (including one of the first segments 100*s*1, half of the second segment 100*s*2, and a part of one of the third segments 100*s*3) of the LED filament 100 in the first quadrant in the side view are symmetric with the surface roughness of the segments of second portion 100*p*2 (including the other one of the first segments 100*s*1, the other half of the second segment 100*s*2, and a part of the other one of the third segments 100*s*3) of the LED filament 100 in the second quadrant in the side view, and the surface roughness of the segments of the third portion 100*p*3 (including a part of one of the third segments 100*s*3) of the LED filament 100 in the third quadrant in the side view are symmetric with the surface roughness of the segments of the fourth portion 100*p*4 (including a part of the other one of the third segments 100*s*3) of the LED filament 100 in the fourth quadrant in the side view.

Figure 46D:
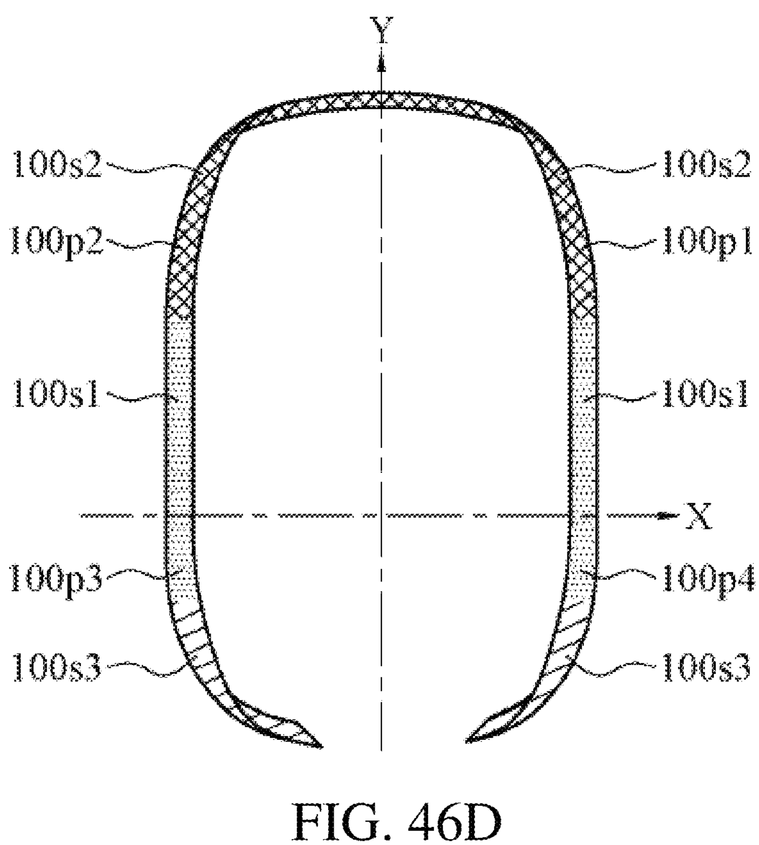
FIG. 46D is the LED filament shown in FIG. 27E presented in two dimensional coordinate system defining four quadrants showing segments of LED chips according to an embodiment of the present invention.

Please refer to FIG. 46D. FIG. 46D is the LED filament shown in FIG. 27E presented in two dimensional coordinate system defining four quadrants showing segments of LED chips according to an embodiment of the present invention. As shown in FIG. 46D, in the embodiment, the refractive indexes of the segments of the first portion 100*p*1 (including a part of one of the first segments 100*s*1 and half of the second segment 100*s*2) of the LED filament 100 in the first quadrant in the top view are symmetric with the refractive indexes of the segments of second portion 100*p*2 (including a part of the other one of the first segments 100*s*1 and the other half of second segment 100*s*2) of the LED filament 100 in the second quadrant in the top view, and the refractive indexes of the segments of the third portion 100*p*3 (including a part of one of the first segments 100*s*1 and one of the third segments 100*s*3) of the LED filament 100 in the third quadrant in the top view are symmetric with the refractive indexes of the segments of the fourth portion 100*p*4 (including a part of the other one of the first segments 100*s*1 and the other one of the third segments 100*s*3) of the LED filament 100 in the fourth quadrant in the top view.

As shown in FIG. 46D, in another embodiment, the surface roughness of the segments of the first portion 100*p*1 (including a part of one of the first segments 100*s*1 and half of the second segment 100*s*2) of the LED filament 100 in the first quadrant in the top view are symmetric with the surface roughness of the segments of second portion 100*p*2 (including a part of the other one of the first segments 100*s*1 and the other half of second segment 100*s*2) of the LED filament 100 in the second quadrant in the top view, and the surface roughness of the segments of the third portion 100*p*3 (including a part of one of the first segments 100*s*1 and one of the third segments 100*s*3) of the LED filament 100 in the third quadrant in the top view are symmetric with the surface roughness of the segments of the fourth portion 100*p*4 (including a part of the other one of the first segments 100*s*1 and the other one of the third segments 100*s*3) of the LED filament 100 in the fourth quadrant in the top view.

As above discussion of the embodiments, the symmetry characteristic regarding the symmetric structure, the symmetric emitting direction, the symmetric arrangement of the LED chips 102, the symmetric power configuration of the LED chips 102, the symmetric refractive indexes, and/or the symmetric surface roughness of the LED filament 100 in the side view (including the front view or the rear view) and/or the top view is benefit to create an evenly distributed light rays, such that the LED light bulb with the LED filament 100 is capable of generating an omnidirectional light.

Figure 47:
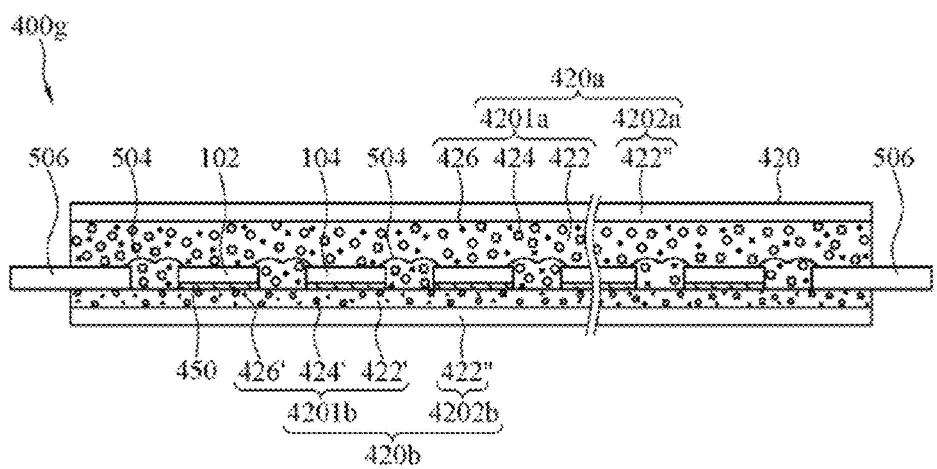
FIG. 47 is a cross-sectional view of an LED filament according to an embodiment of the present disclosure.

Please refer to FIG. 47. FIG. 47 illustrates a cross-sectional view of an LED filament 400*g* according to an embodiment of the present disclosure. As above description, the refractive indexes or the surface roughness of segments of the LED filaments may be different from one another and can be defined by the enclosures of the segments. That is to say, the compositions of the enclosures or the surface roughness of the outer surface of the enclosures of the segments may be different from one another. In other embodiments, the enclosures of the segments may be identical, and there is an external transparent layer enclosing the entire enclosure of the LED filament to define segments with distinct refractive indexes or surface roughness on the axial direction of the LED filament. The external transparent layer has different refractive indexes or different surface roughness on different portion thereof. The external transparent layer can be referred to the following illustration of FIG. 47.

As shown in FIG. 47, in the embodiment, the LED filament 400*g* is analogous to and can be referred to the LED filament 100 comprising the top layer 420*a* and the base layer 420*b*. A difference between the LED filament 400*g* and 100 is that the top layer 420*a* of the LED filament 400*g* is further divided into two layers, a phosphor glue layer 4201*a* and a transparent layer 4202*a*. The phosphor glue layer 4201*a* may be the same as the top layer 420*a* and comprises an adhesive 422, phosphors 424, and inorganic oxide nanoparticles 426. The transparent layer 4202*a* comprises an adhesive 422" only. The transparent layer 4202*a* may be of highest transmittance than other layers and can protect the phosphor glue layer 4201*a*. In some embodiments (not shown), the transparent layer 4202*a* encloses the phosphor glue layer 4201*a*, i.e., all sides of the phosphor glue layer 4201*a* except the one adjacent to the phosphor film layer 4201*b* are covered by the transparent layer 4202*a*.

In addition, the base layer 420*b* of the LED filament 400*g* is further divided into two layers, a phosphor glue layer 4201*b* and a transparent layer 4202*b*. The phosphor glue layer 4201*b* may be the same as the base layer 420*b* and comprises an adhesive 422', phosphors 424', and inorganic oxide nanoparticles 426'. The transparent layer 4202*b* comprises an adhesive 422" only. The transparent layer 4202*b* may be of highest transmittance than other layers and can protect the phosphor glue layer 4201*b*. In some embodiments (not shown), the transparent layer 4202*b* encloses the phosphor glue layer 4201*b*, i.e., all sides of the phosphor glue layer 4201*b* except the one adjacent to the phosphor film layer 4201*a* are covered by the transparent layer 4202*b*.

The transparent layers 4202*a*, 4202*b* not only protect the phosphor glue layer 4201*a* and the phosphor film layer 4201*b* but also strengthen the whole structure of the LED filament. Preferably, the transparent layers 4202*a*, 4202*b* may be thermal shrink film with high transmittance.

In some embodiments, the transparent layers 4202*a*, 4202*b* may be analogous to the aforementioned external transparent layer enclosing the entire enclosure (e.g., the phosphor film layers 4201*a*, 4201*b*) of the LED filament 400*g* and defines segments by distinct refractive indexes on the axial direction of the LED filament 400*g*. That is to say, the transparent layers 4202*a*, 4202*b* may have different compositions with different refractive indexes on different portions on the axial direction of the LED filament 400*g*.

In another embodiment, the aforementioned external transparent layer (e.g., the transparent layers 4202*a*, 4202*b* of FIG. 47) may be divided into segments on the axial direction of the LED filament by their thickness. The thickness of the external transparent layers of the segments of the LED filaments on the axial direction of the LED filament may be different from one another. The thickness of the external transparent layers of the segments of the LED filaments may be symmetric in the top view or in the side view. The symmetric thickness can be referred to the above discussion regarding the symmetric refractive indexes and the symmetric surface roughness.

Figure 48A:
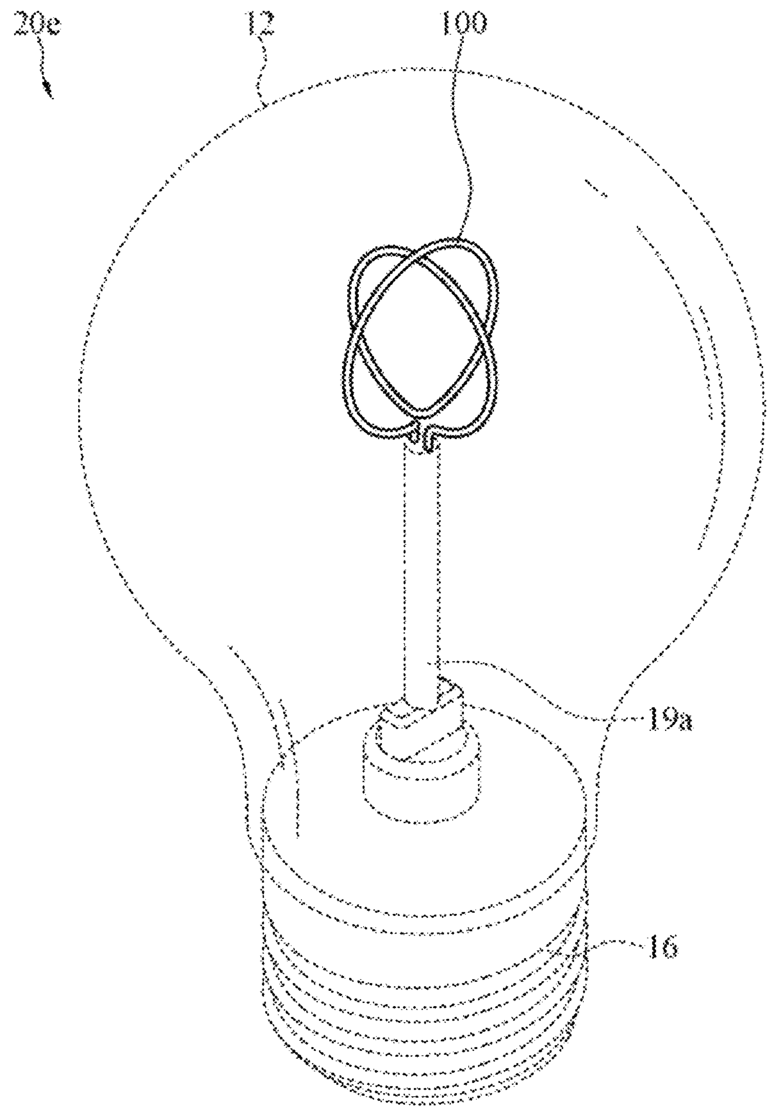
FIG. 48A is a perspective view of an LED light bulb according to an embodiment of the present invention.
Figure 48B:
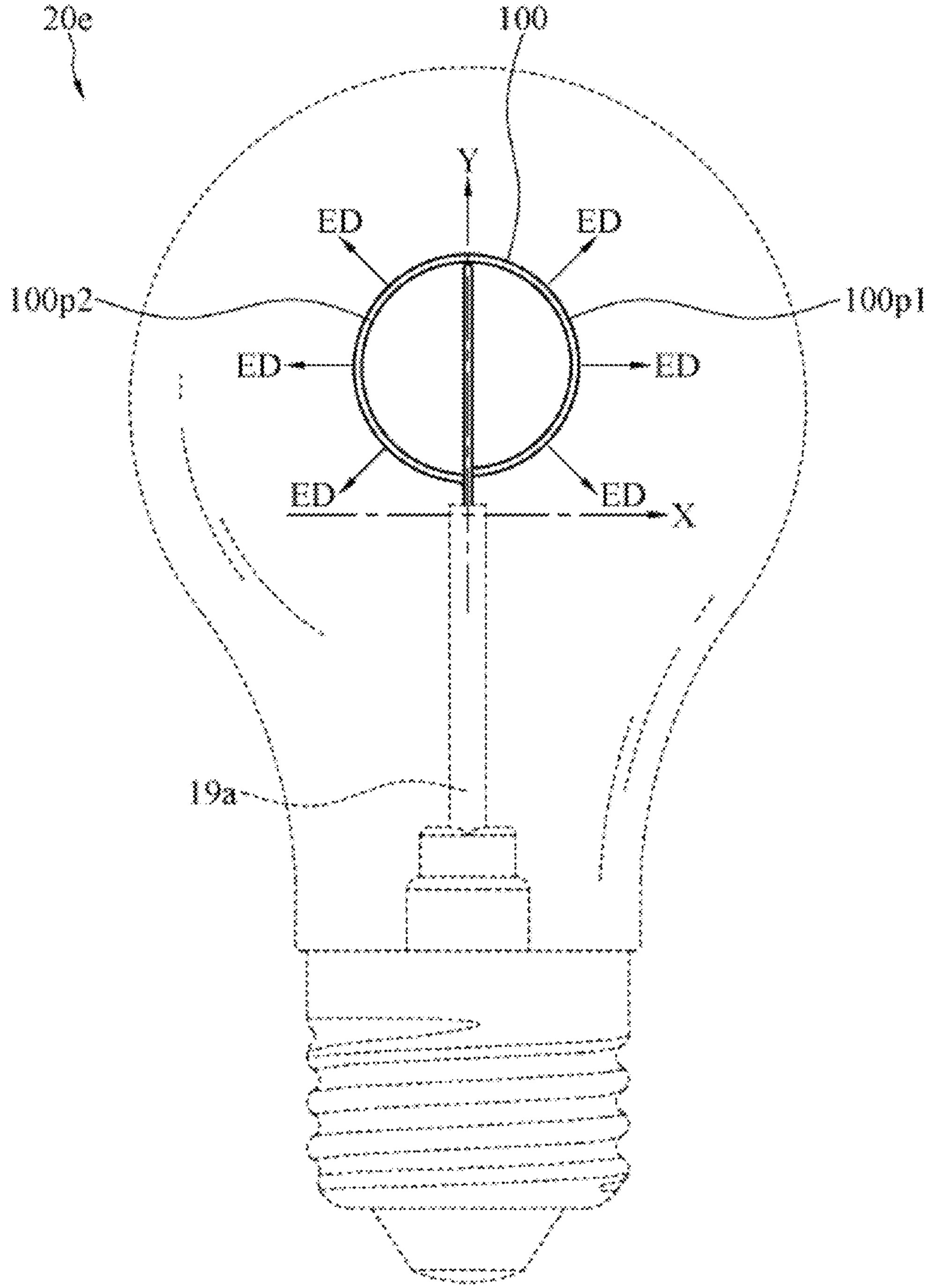
FIG. 48B is a side view of the LED light bulb of FIG. 48A.

Please refer to FIG. 48A and FIG. 48B. FIG. 48A is a perspective view of an LED light bulb 20*e* according to an embodiment of the present invention. FIG. 48B is a side view of the LED light bulb 20*e* of FIG. 48A. The LED light bulb 20*e* shown in FIG. 48A and FIG. 48B is analogous to the LED light bulb 20*d* shown in FIG. 27A. The main difference between the LED light bulb 20*e* and the LED light bulb 20*d* is the LED filament 100. As shown in FIG. 48A, the LED filament 100 of the LED light bulb 20*e* is connected to the top of the stand 19*a* and elongates to form two circles perpendicular to each other. In the embodiment, the LED filament 100 is above the stand 19*a*, and the stand 19*a* (i.e., the stem) is between the bulb base 16 and the LED filament 100.

As shown in FIG. 48B, the LED filament 100 is presented in two dimensional coordinate system defining four quadrants. In the embodiment, the Y-axis is aligned with the stand 19*a*, and the X-axis crosses the stand 19*a*. As shown in FIG. 48B, the LED filament 100 in the side view can be divided into a first portion 100*p*1 and a second portion 100*p*2 by the Y-axis while the LED filament is entirely in the upper quadrants in FIG. 48B. The first portion 100*p*1 of the LED filament 100 is the portion presented in the first quadrant in the side view. The second portion 100*p*2 of the LED filament 100 is the portion presented in the second quadrant in the side view. The LED filament 100 is in line symmetry. The LED filament 100 is symmetric with the Y-axis in the side view. The first portion 100*p*1 and the second portion 100*p*2 are symmetric in structure in the side view with respect to the Y-axis. The first portion 100*p*1 in the side view forms a semicircle shape, and the second portion 100*p*2 in the side view forms a semicircle shape. The first portion 100*p*1 and the second portion 100*p*2 in the side view jointly form a circle shape. In addition, emitting directions ED of the first portion 100*p*1 and emitting directions ED of the second portion 100*p*2 are symmetric in direction in the side view with respect to the Y-axis.

Figure 48C:
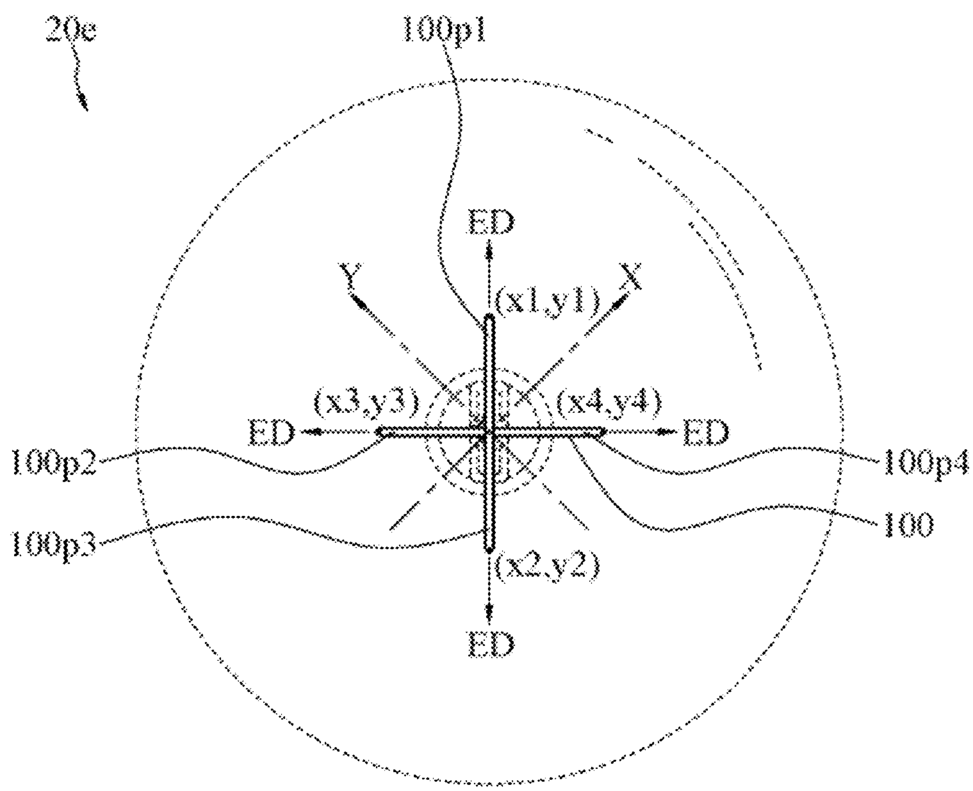
FIG. 48C is a top view of the LED light bulb of FIG. 48A.

Please refer to FIG. 48C. FIG. 48C is a top view of the LED light bulb 20*e* of FIG. 48A. The LED filament 100 shown in FIG. 48C is presented in two dimensional coordinate system defining four quadrants. The origin of the four quadrants is defined as a center of the stand 19*a* of the LED light bulb 20*e* in the top view (e.g., a center of the top of the stand 19*a* shown in FIG. 48A). In the embodiment, the Y-axis is inclined in FIG. 48C, and the X-axis is also inclined in FIG. 48C. As shown in FIG. 48C, the LED filament 100 in the top view can be divided into a first portion 100*p*1, a second portion 100*p*2, a third portion 100*p*3, and a fourth portion 100*p*4 by the X-axis and the Y-axis. The first portion 100*p*1 of the LED filament 100 is the portion presented in the first quadrant in the top view. The second portion 100*p*2 of the LED filament 100 is the portion presented in the second quadrant in the top view. The third portion 100*p*3 of the LED filament 100 is the portion presented in the third quadrant in the top view. The fourth portion 100*p*4 of the LED filament 100 is the portion presented in the fourth quadrant in the top view. In the embodiment, the LED filament 100 in the top view is in point symmetry. In particular, the LED filament 100 in the top view is symmetric with the origin of the four quadrants. In other words, the structure of the LED filament 100 in the top view would be the same as the structure of the LED filament 100 in the top view being rotated about the origin to 180 degrees.

For example, as shown in FIG. 48C, a designated point (x1, y1) on the first portion 100*p*1 of the LED filament 100 in the first quadrant is defined as a first position, and a symmetric point (x2, y2) on the third portion 100*p*3 of the LED filament 100 in the third quadrant is defined as a second position. The second position of the symmetric point (x2, y2) is symmetric to the first position of the designated point (x1, y1) with respect to the origin. In other words, the designated point (x1, y1) on the first portion 100*p*1 of the LED filament 100 in the top view would overlap the symmetric point (x2, y2) on the third portion 100*p*3 of the LED filament 100 in the third quadrant while the LED filament 100 is rotated about the origin to 180 degrees.

For example, as shown in FIG. 48C, a designated point (x3, y3) on the second portion 100*p*2 of the LED filament 100 in the second quadrant is defined as a third position, and a symmetric point (x4, y4) on the fourth portion 100*p*4 of the LED filament 100 in the fourth quadrant is defined as a fourth position. The fourth position of the symmetric point (x4, y4) is symmetric to the third position of the designated point (x3, y3) with respect to the origin. In other words, the designated point (x3, y3) on the second portion 100*p*1 of the LED filament 100 in the top view would overlap the symmetric point (x4, y4) on the fourth portion 100*p*4 of the LED filament 100 in the fourth quadrant while the LED filament 100 is rotated about the origin to 180 degrees.

In the embodiment, the LED filament 100 in the top view is also symmetric in line symmetry. In particular, the LED filament 100 in the top view is symmetric with the X-axis or the Y-axis. In other words, the first portion 100*p*1 and the second portion 100*p*2 are symmetric with the Y-axis, and the third portion 100*p*3 and the fourth portion 100*p*4 are symmetric with the Y-axis. In addition, the first portion 100*p*1 and the fourth portion 100*p*4 are symmetric with the X-axis, and the second portion 100*p*2 and the third portion 100*p*3 are symmetric with the X-axis. The first portion 100*p*1, the second portion 100*p*2, the third portion 100*p*3, and the fourth portion 100*p*4 jointly form an "X" shape in the top view.

In addition, an emitting direction ED of the designated point (x1, y1) of the first portion 100*p*1 and an emitting direction ED of the symmetric point (x2, y2) of the third portion 100*p*3 are symmetric in direction in the top view with respect to the origin, and an emitting direction ED of the designated point (x3, y3) of the second portion 100*p*2 and an emitting direction ED of the symmetric point (x4, y4) of the fourth portion 100*p*4 are symmetric in direction in the top view with respect to the origin. Further, the emitting direction ED of the first portion 100*p*1 and the emitting direction ED of the second portion 100*p*2 are symmetric in direction in the top view with respect to the Y-axis, and the emitting direction ED of the third portion 100*p*3 and the emitting direction ED of the fourth portion 100*p*4 are symmetric in direction in the top view with respect to the Y-axis. Additionally, the emitting direction ED of the first portion 100*p*1 and the emitting direction ED of the fourth portion 100*p*4 are symmetric in direction in the top view with respect to the X-axis, and the emitting direction ED of the third portion 100*p*3 and the emitting direction ED of the second portion 100*p*2 are symmetric in direction in the top view with respect to the X-axis.

Figure 49A:
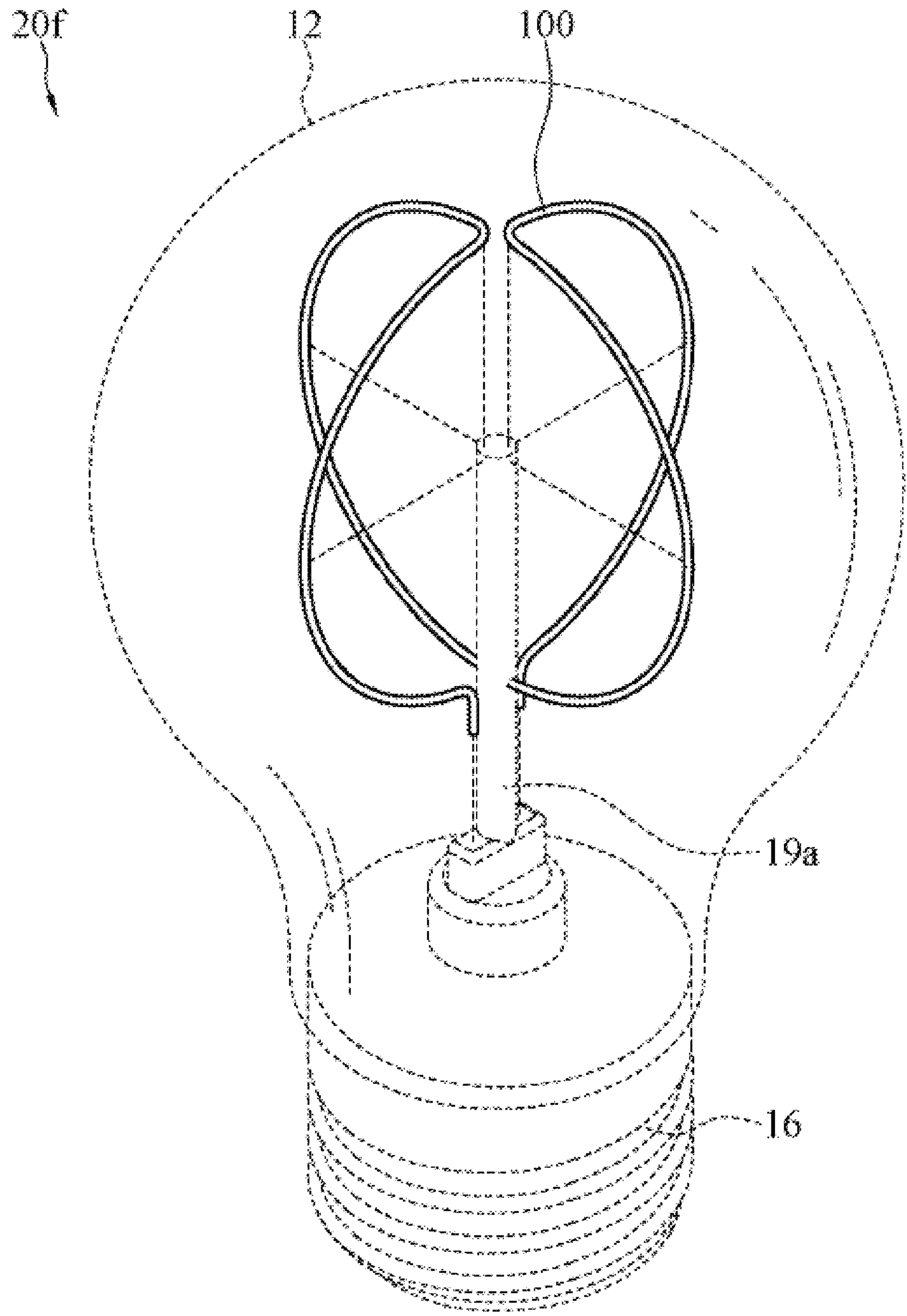
FIG. 49A is a perspective view of an LED light bulb according to an embodiment of the present invention.
Figure 49B:
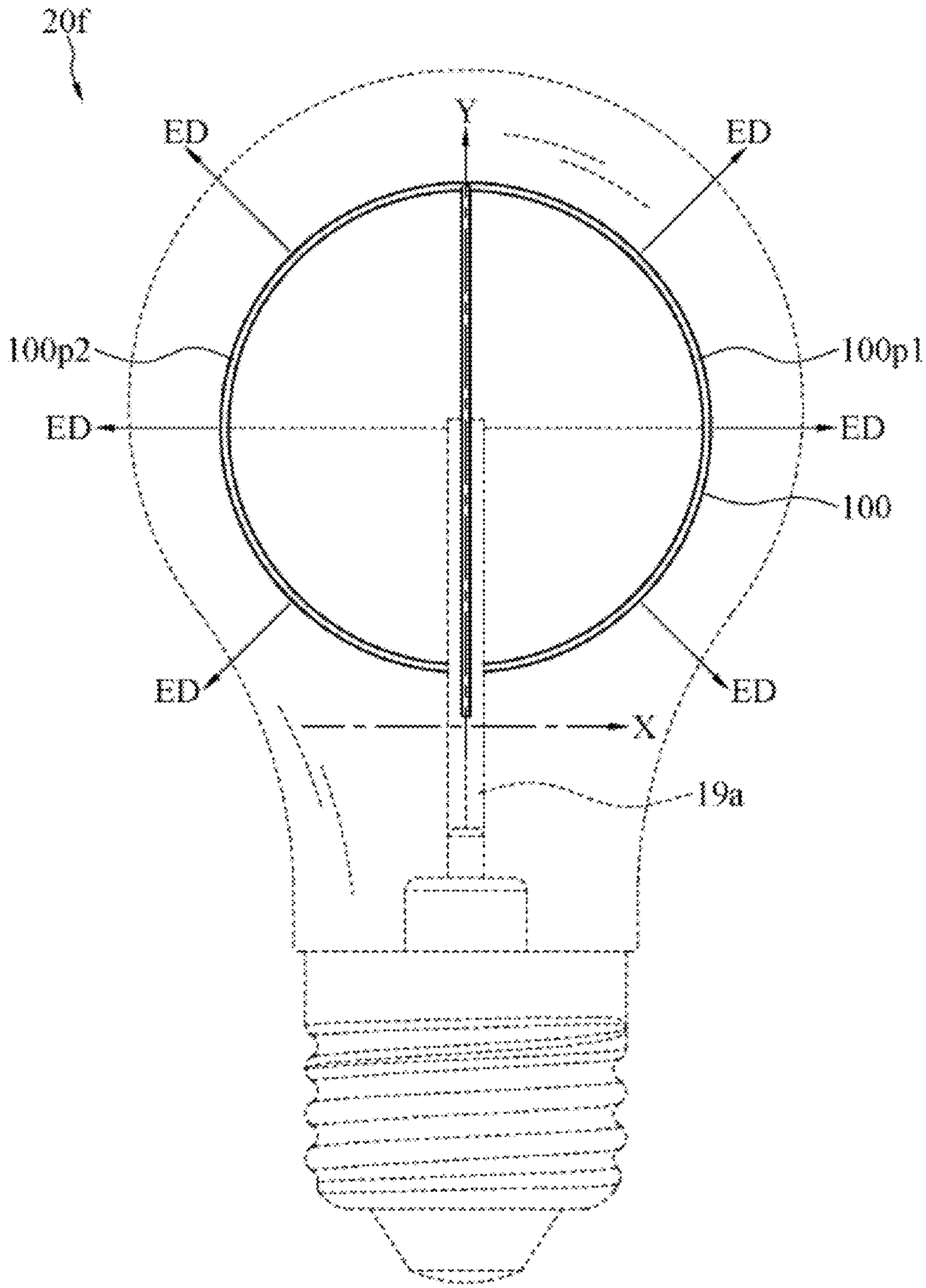
FIG. 49B is a side view of the LED light bulb of FIG. 49A.

Please refer to FIG. 49A and FIG. 49B. FIG. 49A is a perspective view of an LED light bulb 20*f* according to an embodiment of the present invention. FIG. 49B is a side view of the LED light bulb 20*f* of FIG. 49A. The LED light bulb 20*f* shown in FIG. 49A and FIG. 49B is analogous to the LED light bulb 20*d* shown in FIG. 27A. The main difference between the LED light bulb 20*f* and the LED light bulb 20*d* is the LED filament 100. As shown in FIG. 49A, the LED filament 100 of the LED light bulb 20*f* is connected to the stand 19*a* and elongates to form two circles perpendicular to each other (or four semi-circles perpendicular to one another). The LED filament 100 penetrates through the stand 19*a*.

As shown in FIG. 49B, the LED filament 100 is presented in two dimensional coordinate system defining four quadrants. In the embodiment, the Y-axis is aligned with the stand 19*a*, and the X-axis crosses the stand 19*a*. As shown in FIG. 49B, the LED filament 100 in the side view can be divided into a first portion 100*p*1 and a second portion 100*p*2 by the Y-axis. The first portion 100*p*1 of the LED filament 100 is the portion presented in the first quadrant in the side view. The second portion 100*p*2 of the LED filament 100 is the portion presented in the second quadrant in the side view. The LED filament 100 is in line symmetry. The LED filament 100 is symmetric with the Y-axis in the side view. The first portion 100*p*1 and the second portion 100*p*2 are symmetric in structure in the side view with respect to the Y-axis. In addition, emitting directions ED of the first portion 100*p*1 and emitting directions ED of the second portion 100*p*2 are symmetric in direction in the side view with respect to the Y-axis.

Figure 49C:
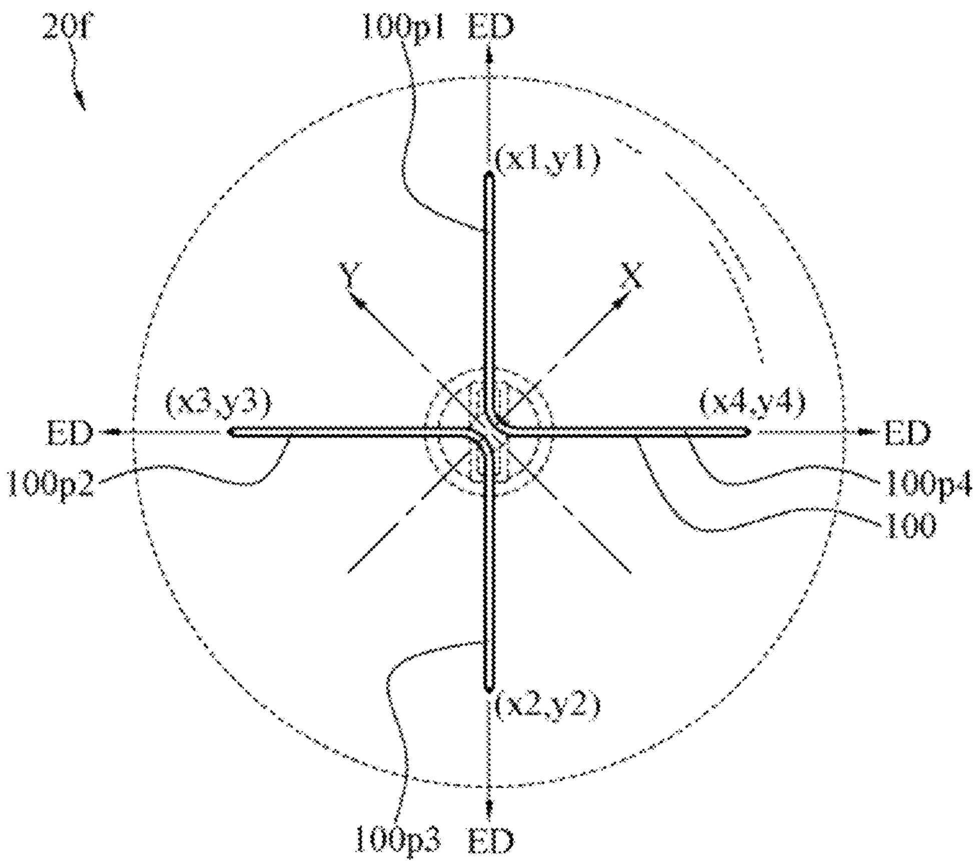
FIG. 49C is a top view of the LED light bulb of FIG. 49A.

Please refer to FIG. 49C. FIG. 49C is a top view of the LED light bulb of FIG. 49A. The LED filament 100 shown in FIG. 49C is presented in two dimensional coordinate system defining four quadrants. The origin of the four quadrants is defined as a center of the stand 19*a* of the LED light bulb 20*f* in the top view (e.g., a center of the top of the stand 19*a* shown in FIG. 49A). In the embodiment, the Y-axis is inclined in FIG. 49C, and the X-axis is also inclined in FIG. 49C. As shown in FIG. 49C, the LED filament 100 in the top view can be divided into a first portion 100*p*1, a second portion 100*p*2, a third portion 100*p*3, and a fourth portion 100*p*4 by the X-axis and the Y-axis. The first portion 100*p*1 of the LED filament 100 is the portion presented in the first quadrant in the top view. The second portion 100*p*2 of the LED filament 100 is the portion presented in the second quadrant in the top view. The third portion 100*p*3 of the LED filament 100 is the portion presented in the third quadrant in the top view. The fourth portion 100*p*4 of the LED filament 100 is the portion presented in the fourth quadrant in the top view. In the embodiment, the LED filament 100 in the top view is in point symmetry. In particular, the LED filament 100 in the top view is symmetric with the origin of the four quadrants. In other words, the structure of the LED filament 100 in the top view would be the same as the structure of the LED filament 100 in the top view being rotated about the origin to 180 degrees.

For example, as shown in FIG. 49C, a designated point (x1, y1) on the first portion 100*p*1 of the LED filament 100 in the first quadrant is defined as a first position, and a symmetric point (x2, y2) on the third portion 100*p*3 of the LED filament 100 in the third quadrant is defined as a second position. The second position of the symmetric point (x2, y2) is symmetric to the first position of the designated point (x1, y1) with respect to the origin. In other words, the designated point (x1, y1) on the first portion 100*p*1 of the LED filament 100 in the top view would overlap the symmetric point (x2, y2) on the third portion 100*p*3 of the LED filament 100 in the third quadrant while the LED filament 100 is rotated about the origin to 180 degrees.

For example, as shown in FIG. 49C, a designated point (x3, y3) on the second portion 100*p*2 of the LED filament 100 in the second quadrant is defined as a third position, and a symmetric point (x4, y4) on the fourth portion 100*p*4 of the LED filament 100 in the fourth quadrant is defined as a fourth position. The fourth position of the symmetric point (x4, y4) is symmetric to the third position of the designated point (x3, y3) with respect to the origin. In other words, the designated point (x3, y3) on the second portion 100*p*2 of the LED filament 100 in the top view would overlap the symmetric point (x4, y4) on the fourth portion 100*p*4 of the LED filament 100 in the fourth quadrant while the LED filament 100 is rotated about the origin to 180 degrees.

In the embodiment, the LED filament 100 in the top view is also symmetric in line symmetry. In particular, the LED filament 100 in the top view is symmetric with the X-axis or the Y-axis. In other words, the first portion 100*p*1 and the second portion 100*p*2 are symmetric with the Y-axis, and the third portion 100*p*3 and the fourth portion 100*p*4 are symmetric with the Y-axis. In addition, the first portion 100*p*1 and the fourth portion 100*p*4 are symmetric with the X-axis, and the second portion 100*p*2 and the third portion 100*p*3 are symmetric with the X-axis. The first portion 100*p*1 and the fourth portion 100*p*4 jointly form an "L" shape in the top view, and the second portion 100*p*2 and the third portion 100*p*3 jointly form a reversed "L" shape in the top view.

In addition, an emitting direction ED of the designated point (x1, y1) of the first portion 100*p*1 and an emitting direction ED of the symmetric point (x2, y2) of the third portion 100*p*3 are symmetric in direction in the top view with respect to the origin, and an emitting direction ED of the designated point (x3, y3) of the second portion 100*p*2 and an emitting direction ED of the symmetric point (x4, y4) of the fourth portion 100*p*4 are symmetric in direction in the top view with respect to the origin. Further, the emitting direction ED of the first portion 100*p*1 and the emitting direction ED of the second portion 100*p*2 are symmetric in direction in the top view with respect to the Y-axis, and the emitting direction ED of the third portion 100*p*3 and the emitting direction ED of the fourth portion 100*p*4 are symmetric in direction in the top view with respect to the Y-axis. Additionally, the emitting direction ED of the first portion 100*p*1 and the emitting direction ED of the fourth portion 100*p*4 are symmetric in direction in the top view with respect to the X-axis, and the emitting direction ED of the third portion 100*p*3 and the emitting direction ED of the second portion 100*p*2 are symmetric in direction in the top view with respect to the X-axis.

The definition of the omnidirectional light depends upon the area the LED light bulb is used and varies over time. According to different authority or countries, LED light bulbs alleged that can provide omnidirectional light may be required to comply with different standards. The definition of the omnidirectional light may be, but not limited to, the following example. Page 24 of Eligibility Criteria version 1.0 of US Energy Star Program Requirements for Lamps (Light Bulbs) defines omnidirectional lamp in base-up position requires that light emitted from the zone of 135 degree to 180 degree should be at least 5% of total flux (lm), and 90% of the measured intensity values may vary by no more than 25% from the average of all measured values in all planes (luminous intensity (cd) is measured within each vertical plane at a 5 degree vertical angle increment (maximum) from 0 degree to 135 degree). JEL 801 of Japan regulates the flux from the zone within 120 degrees along the light axis should be not less than 70% of total flux of the bulb. Based upon the configuration of the LED filaments of the above embodiments which have the symmetry characteristic, the LED light bulbs with the LED filaments can comply with different standards of the omnidirectional lamps.

As shown in FIG. 50 to FIG. 56, FIG. 57A to FIG. 57C, and FIG. 58A to FIG. 58E, an LED filament includes a light conversion layer 220/420, LED chip units 202/204 (or LED sections 402/404), and electrodes (or conductive electrodes) 210, 212/410, 412. The light conversion layer 220/420 wraps the LED chip units 202/204 (or LED sections 402/404) and parts of the electrodes (or conductive electrodes) 210, 212/410, 412, and parts of the electrodes (or conductive electrodes) 210, 212/410, 412 are exposed outside the light conversion layer 220/420, the adjacent LED chip units 202, 204 (or LED sections 402, 404) are electrically connected to each other, and the LED chip units 202/204 (or LED sections 402/404) and the electrodes (or conductive electrodes) 210, 212/410, 412 are electrically connected. The LED filament includes at least two LED chips 442, the two adjacent LED chips 442 are electrically connected to each other, the LED chip units 202/204 (or LED sections 402/404) include at least one LED chip 442 with an upper surface and a lower surface opposite to each other, the light conversion layer 420 includes a top layer 420*a* and a carrying layer, and the top layer 420*a* and the carrying layer may separately be a layered structure having at least one layer. The layered structure may be selected from: a phosphor glue with high plasticity (relative to a phosphor film), a phosphor film with low plasticity, a transparent layer, or any combination of the three. The phosphor glue/phosphor film includes the following components: organosilicon-modified polyimide and/or glue. The phosphor glue/phosphor film may also include phosphor and inorganic oxide nanoparticles (or heat dissipation particles). The transparent layer may be composed of light-transmitting resin (such as silica glue and polyimide) or a combination thereof. The glue may be, but is not limited to, silica glue. In one embodiment, materials of the top layer 420*a* and the carrying layer are the same. In one embodiment, the carrying layer includes a base layer, and in the height direction of the LED filament, the height of the top layer is greater than the height of the base layer. The base layer includes an upper surface and a lower surface opposite to each other, and the top layer includes an upper surface and a lower surface opposite to each other, where the upper surface of the base layer is in contact with a part of the lower surface of the top layer; the upper surface of the LED chip is close to the upper surface of the top layer relative to the lower surface of the LED chip, and the distance from the lower surface of the LED chip to the lower surface of the base layer is less than the distance from the lower surface of the LED chip to the upper surface of the top layer, because the thermal conductivity of the top layer is greater than the thermal conductivity of the base layer, and the heat transfer from the LED chip to the outer surface of the base layer is shorter, so the heat is not easy to collect, and the heat dissipation effect of the LED filament is good. In one embodiment, if the LED filament is supplied with electrical power no more than 8 W, when the LED filament is lit, at least 4 lm luminous flux of light is emitted every millimeter of a LED filament length on average or a filament body length on average or a top layer length on average. In one embodiment, there are at least two LED chips every millimeter of a LED filament length on average or a filament body length on average or a top layer length on average. In an environment at 25° C., the temperature of the LED filament is not greater than the junction temperature when the LED filament is lit for 15,000 h.

Figure 50:
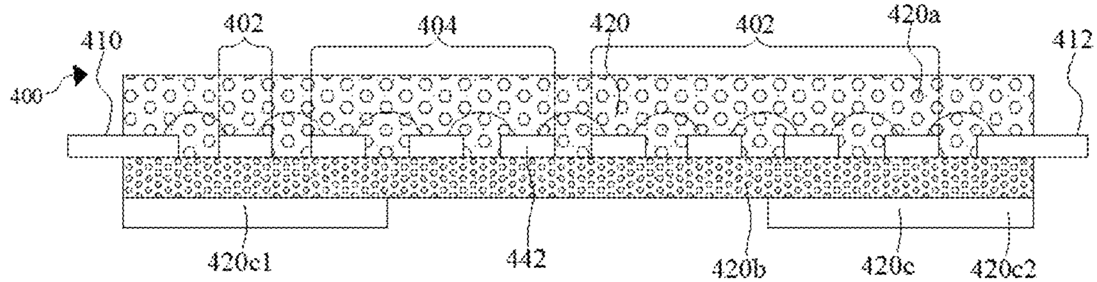
FIG. 50 is a schematic structural diagram of another embodiment of an LED filament according to this application.

FIG. 50 is a schematic structural diagram of an embodiment of an LED filament according to this application. An LED filament 400 includes: a light conversion layer 420, LED sections 402/404, and electrodes 410/412. The LED sections 402/404 have at least one LED chip 442. In the LED filament, the two adjacent LED chips are electrically connected to each other, and the LED chips and the electrodes 410/412 are electrically connected. For example, the electrical connection may be achieved by using a circuit film or a first conductive wire in FIG. 51 described below. The light conversion layer 420 includes a top layer 420*a* and a carrying layer, the carrying layer includes a base layer 420*b* and a transparent layer 420*c*, and the base layer 420*b* is located between the top layer 420*a* and the transparent layer 420*c* (at least located on a certain section of the LED filament 400). In one embodiment, the base layer 420*b* includes an upper surface and a lower surface opposite to each other, the upper surface of the base layer 420*b* is in contact with a part of the top layer 420*a*, and the lower surface of the base layer 420*b* is in contact with the transparent layer 420*c*. In some embodiments, a part of the lower surface of the base layer 420*b* is in contact with the transparent layer 420*c*, and the transparent layer 420*c* supports a part of the base layer 420*b*, thereby enhancing the strength of the base layer 420*b* and facilitating die bonding, and the part of the base layer 420*b* that is not covered by the transparent layer 420*c* can allow heat generated by some LED chips 442 to be directly dissipated through the base layer 420*b*. In this embodiment, the total length of the base layer 420*b* is the same as the total length of the top layer 420*a*. In one embodiment, the total length of the transparent layer 420*c* is 5-100% of the total length of the base layer 420*b*. In one embodiment, the length of the transparent layer 420*c* is less than that of the base layer 420*b*, the total length of the transparent layer 420*c* is 10-80% of the total length of the base layer 420*b*. In one embodiment, the total length of the transparent layer 420*c* is 10-50% of the total length of the base layer 420*b*. When the LED filament is thinner (for example, the width of the LED filament is ≤120 μm), the heat dissipation area of the LED chips 442 is relatively reduced. By providing the transparent layer 420*c* located below the base layer 420*b*, on the one hand, the deformation of the base layer 420*b* caused by heating can be reduced; and on the other hand, the transparent layer 420*c* can assist in supporting the LED chips 442, helping die bonding. In one embodiment, the transparent layer 420*c* includes a first transparent layer 420*cl* and a second transparent layer 420*c*2. The first transparent layer 420*cl* and the second transparent layer 420*c*2 both extend in the length direction of the LED filament 400. The first transparent layer 420*cl* extends from one end of the base layer 420*b*, the second transparent layer 420*c*2 extends from the other end of the base layer 420*b*, and the extending direction of the first transparent layer 420*cl* is opposite to the extending direction of the second transparent layer 420*c*2. In one embodiment, the light conversion layer 420 has a first end and a second end opposite to the first end. In one embodiment, the LED chips 442 are located between the first end and the second end of the light conversion layer 420. If the LED chip 442 closest to the first end is denoted as LED chip n1, then LED chips from the first end to the second end are sequentially LED chip n2, LED chip n3, . . . , and LED chip nm, where m is an integer and m≤800. In one embodiment, the value of m is 50≤m≤300. In the length direction of the LED filament 400, the length of the first transparent layer 420*cl*/the second transparent layer 420*c*2 is at least greater than the distance from the first end of the light conversion layer 420*a* to the LED chip n2. There is a gap between the first transparent layer 420*cl* and the second transparent layer 420*c*2. In the length direction of the LED filament 400, the distance between the first transparent layer 420*cl* and the second transparent layer 420*c*2 is greater than the length of the first transparent layer 420*cl* and/or the second transparent layer 420*c*2. When the LED filament 400 is bent, the electrode 410/412 is prone to be separated from the light conversion layer 420, or the part where the light conversion layer 420 is in contact with the electrode 410/412 is prone to cracks. The first transparent layer 420*cl* and the second transparent layer 420*c*2 can perform structural reinforcement on the part where the light conversion layer 420 is in contact with the electrodes 410,412, which prevents the part where the light conversion layer 420 is in contact with the electrodes 410,412 from cracks.

Figure 51:
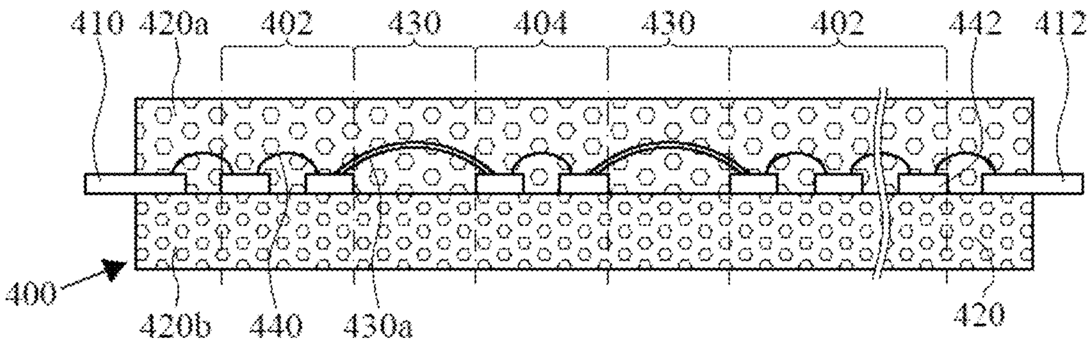
FIG. 51 is a schematic structural diagram of another embodiment of an LED filament according to this application.
Figure 52:
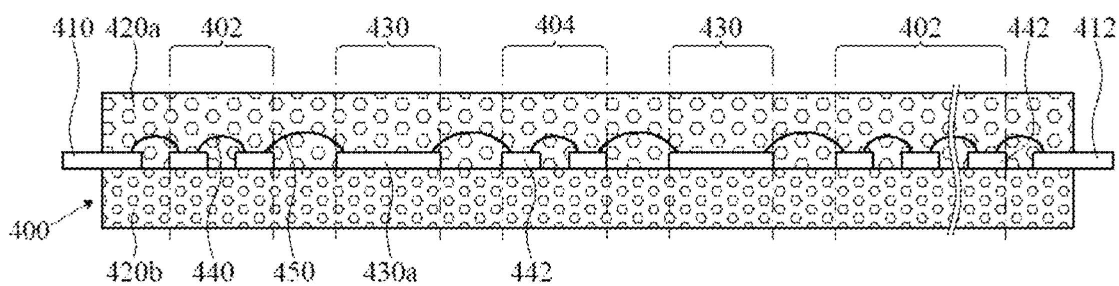
FIG. 52 is a schematic structural diagram of another embodiment of an LED filament according to this application.

FIG. 51 is a schematic structural diagram of another embodiment of an LED filament according to this application. As shown in FIG. 52, an LED filament 400 includes: a light conversion layer 420, LED sections 402, 404, electrodes 410, 412, and conductive sections 430 configured to electrically connect two adjacent LED sections 402, 404. The LED sections 402, 404 include at least two LED chips 442, and two adjacent LED chips 442 are electrically connected to each other by a first conductive wire 440. In this embodiment, the conductive section 430 includes a conductor 430*a* connecting the LED sections 402, 404. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430*a*. Therefore, it is ensured that, when bending occurs between the two LED sections 402, 404, the conductive section 430 is not easily broken due to the stress generated. The light conversion layer 420 is coated on at least two sides of the LED chips 442/the electrodes 410, 412. Parts of the electrodes 410, 412 are exposed outside the light conversion layer 420. The light conversion layer 420 has a top layer 420*a* and a carrying layer as an upper layer and a lower layer of the LED filament 400 respectively. In this embodiment, the carrying layer includes a base layer 420*b*, and the base layer 420*b* includes an upper surface and a lower surface opposite to the upper surface. The upper surface of the base layer 420*b* is close to the top layer 420*a* relative to the lower surface of the base layer 420*b*. The LED sections 402/404 and parts of the electrodes 410/412 are disposed on the upper surface of the base layer 420*b*, or at least one side of the LED sections 402/404 is in contact (direct contact or indirect contact) with the upper surface of the base layer 420*b*.

As shown in FIG. 52, in this embodiment, the conductive section 430 is also located between the two adjacent LED sections 402, 404, and a plurality of the LED chips 442 in the LED sections 402, 404 are electrically connected to each other by the first conductive wires 440. However, the conductor 430*a* in the conductive section 430 in FIG. 52 is not in the form of a conductive wire but in a sheet or film form. In some embodiments, the conductor 430*a* may be copper foil, gold foil, or other materials that can perform electrical conduction. In this embodiment, the conductor 430*a* is attached to the surface of the base layer 420*b* and adjacent to the top layer 420*a*, that is, located between the base layer 420*b* and the top layer 420*a*. Moreover, the conductive section 430 and the LED sections 402, 404 are electrically connected by second conductive wires 450, that is, the two LED chips 442 respectively located in two adjacent LED sections 402, 404 and having the shortest distance from the conductive section 430 are electrically connected to the conductor 430*a* in the conductive section 430 by the second conductive wires 450. The length of the conductive section 430 is greater than the distance between two adjacent LED chips 442 in one LED section 402/404, and the length of the first conductive wire 440 is less than the length of the conductor 430*a*. This design ensures that the conductive section 430 has good bendability because the conductive section 430 has a relatively long length. Assuming that a maximum thickness of the LED chip 442 in the radial direction of the filament is H, the thickness of the electrodes 410, 412 and the conductor 430*a* in the radial direction of the LED filament is 0.5H to 1.4H, preferably 0.5H to 0.7H. Due to the height difference between the LED chip 442 and the electrode 410/412, the LED chip 442 and the conductor 430*a*, it can ensure the wire bonding process can be carried out while ensures the quality of the wire bonding process (that is, having good strength), thereby improving the stability of the product.

Figure 53:
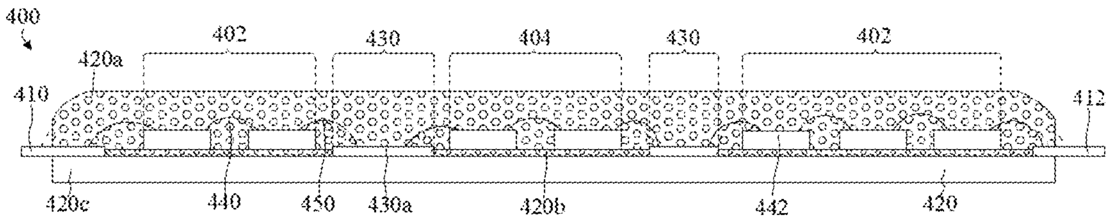
FIG. 53 to FIG. 55B are schematic structural diagrams of a plurality of embodiments of an LED filament according to this application.

As shown in FIG. 53, an LED filament 400 includes: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430*a* in the conductive section 430 by the second conductive wires 450. The LED chips 442 are electrically connected to each other by the first conductive wire 440. The conductive section 430 includes the conductor 430*a* connecting the LED sections 402, 404. For example, the conductor 430*a* is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430*a*. Therefore, it is ensured that, when bending occurs between the two LED sections 402,404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer 420*a* and a carrying layer, the carrying layer includes a base layer 420*b* and a transparent layer 420*c*, and the base layer 420*b* is located between the top layer 420*a* and the transparent layer 420*c*. The base layer 420*b* and the top layer 420*a* cover at least two sides of the LED chips 442. The thermal conductivity of the transparent layer 420*c* is greater than the thermal conductivity of the base layer 420*b*. The thickness of the base layer 420*b* in the radial direction of the LED filament 400 is less than or equal to the thickness of the conductor 430*a* in the radial direction of the LED filament 400. When the LED filament is thinner (for example, the width of the LED filament is ≤120 μm), the heat dissipation area of the LED chips is relatively reduced. By providing the transparent layer 420*c* located below the base layer 420*b*, on the one hand, the deformation of the base layer 420*b* caused by heating can be reduced, and on the other hand, the transparent layer 420*c* can assist in supporting the LED chips 442, helping die bonding. For example, the transparent layer 420*c* may be a hard substrate such as an alumina ceramic plate or a sapphire substrate, or a soft substrate with high thermal conductivity (for example, the thermal conductivity ≥2.0 (W/(m·K))). A translucent alumina ceramic plate or a transparent sapphire substrate facilitates the penetration of the light emitted by the LED chips 442 toward the transparent layer 420*c*, thereby realizing omnidirectional light of the LED filament 400. In this embodiment, the top layer 420*a*, the base layer 420*b*, and the transparent layer 420*c* wrap the conductor 430*a*. On one hand, the impact of the external environment on the conductor 430*a* is reduced, and on the other hand, the carrying capacity of the conductor 430*a* in electrical connection is improved, and the stability of the electrical connection when the conductor 430*a* is bent is improved. In some embodiments, the thickness of the base layer 420*b* in the height direction of the LED filament 400 is less than or equal to the thickness of the conductor 430*a* in the height direction of the LED filament 400. The heat conduction path of the heat generated by the LED chips 442 to the transparent layer 420*c* is short, improving the heat dissipation effect of the LED filament 400. In other embodiments, the thickness of the transparent layer 420*c* in the height direction of the LED filament 400 is greater than the thickness of the base layer 420*b* in the height direction of the LED filament 400. The heat conduction path of the heat generated by the LED chips 442 to the transparent layer 420*c* is short, such that the heat dissipation effect of the LED filament 400 is improved. In some embodiments, the absolute value of the height difference between the LED chip 442 and the conductor 430*a* in the height direction of the LED filament 400 is greater than the height of the LED chip 442 in the height direction of the LED filament 400. When the LED filament 400 is bent, the second conductive wire 450 is less deformed after being stretched under force, and the second conductive wire 450 is not prone to be broken. In some embodiments, the base layer 420*b* is in contact with at least one side of the LED chips 442 and one side of the conductive section 430. In this embodiment, the LED chips 442 and the conductors 430*a* are located on different sides of the base layer 420*b*.

Figure 54:
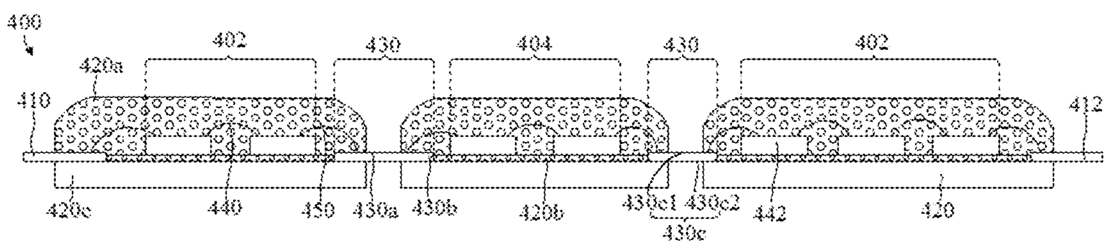
Figure 55A:
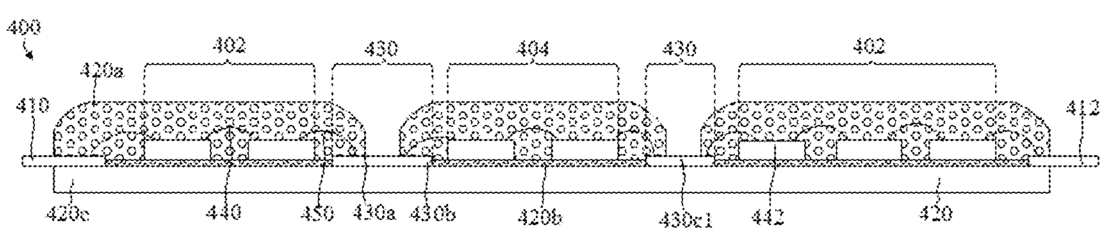
Figure 55B:
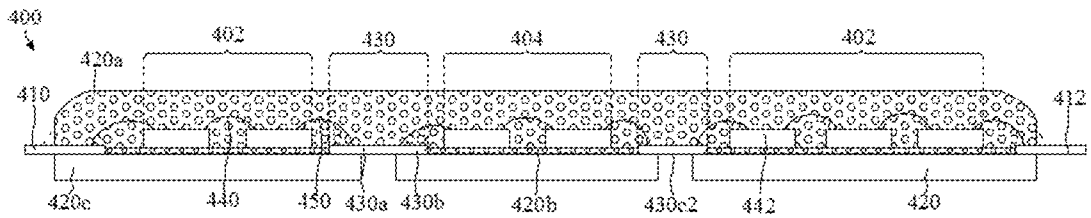

Referring to FIG. 54 to FIG. 55B, in some embodiments, the conductor 430*a* includes a covering portion 430*b* and an exposed portion 430*c*, and the length of the exposed portion 430*c* in the axial direction of the LED filament 400 is less than the distance between adjacent LED chips 442 in any LED section 402/404. When the LED filament 400 is bent, the exposed portion 430*c* is slightly deformed under force with a small bending region and a small deformation degree, which is beneficial to keeping a bending shape of the LED filament 400. As shown in FIG. 54, the exposed portion 430*c* includes a first exposed portion 430*cl* and a second exposed portion 430*c*2, the portion of the top layer 420*a* where the conductor 430*a* is exposed is the first exposed portion 430*cl*, and the portion of the transparent layer 420*c* where the conductor 430*a* is exposed is the second exposed portion 430*c*2. The length of the first exposed portion 430*cl* in the axial direction (length direction) of the LED filament 400 is greater than or equal to the length of the second exposed portion 430*c*2 in the axial direction of the LED filament 400 to ensure the stability of the electrical connection and the uniform force when the conductor 430*a* is bent. As shown in FIG. 55A, the exposed portion only includes the first exposed portion 430*cl*. The length of the first exposed portion 430*cl* in the axial direction of the LED filament is less than or equal to the distance between adjacent LED chips in any LED section 402/404. When the LED filament 400 is bent, the stress generated during the bending is concentrated on the conductive section 430, which reduces the risk of breakage of the conductive wires 440 connecting adjacent LED chips 442. As shown in FIG. 55B, the exposed portion only includes the second exposed portion 430*c*2, which can relieve stress concentration of the conductors 430*a*. The length of the second exposed portion 430*c*2 in the axial direction of the LED filament 400 is less than or equal to the distance between adjacent LED chips 442 in any LED section 402/404. Since a part of the conductors 430*a* are located between adjacent transparent layers 420*c*, the stability of the support of the transparent layers 420*c* to the conductors 430*a* can be ensured.

Figure 56:
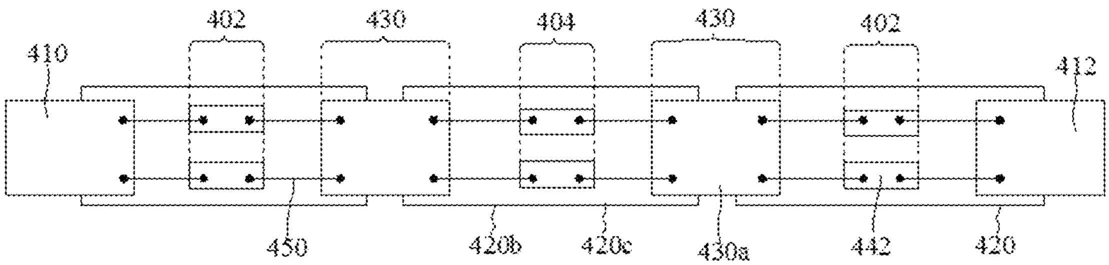
FIG. 56 is a top view of an embodiment of an LED filament with a top layer removed according to this application.

Referring to FIG. 56, an LED filament 400 has: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430*a* in the conductive section 430 by the second conductive wires 450. The conductive section 430 includes the conductor 430*a* connecting the LED sections 402, 404. For example, the conductor 430*a* is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, the two adjacent LED chips 442 are electrically connected to each other by the first conductive wire 440, and the length of the first conductive wire 440 is less than the length of the conductor 430*a*. When bending occurs between the two LED sections 402, 404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer (not shown) and a carrying layer. The carrying layer includes a base layer 420*b* and a transparent layer 420*c*. The LED chips 442 in the LED section 402/404 are arranged along the radial direction of the LED filament (or the width direction of the LED filament). Each LED chip 442 in the LED section 402/404 is connected to the conductor 430*a* and/or the electrode 410/412. In this embodiment, the widths of the base layer 420*b* and the transparent layer 420*c* in the radial direction of the LED filament are equal, the contact area between the base layer 420*b* and the transparent layer 420*c* is large, and there is no delamination between the base layer 420*b* and the transparent layer 420*c*. In other embodiments, the width of the base layer 420*b* in the radial direction of the LED filament is less than the width of the transparent layer 420*c* in the radial direction of the LED filament, the top layer (not shown) is in contact with the base layer 420*b* and the transparent layer 420*c*, and the thickness of the base layer 420*b* is less than the thickness of the top layer. The heat emitted by the LED chips 442 is conducted to the top layer and the transparent layer 420*c* at the same time through the base layer 420*b*, thereby improving the heat dissipation efficiency of the LED filament. Besides, the top layer and the transparent layer 420*c* completely wrap the base layer 420*b*, which can protect the base layer 420*b* from the external environment, and further can reduce the probability of the breakage of the second conductive wires 450 due to the protection from a plurality of sides of the top layer when the LED filament is bent, improving the yield of the product.

Figure 57A:
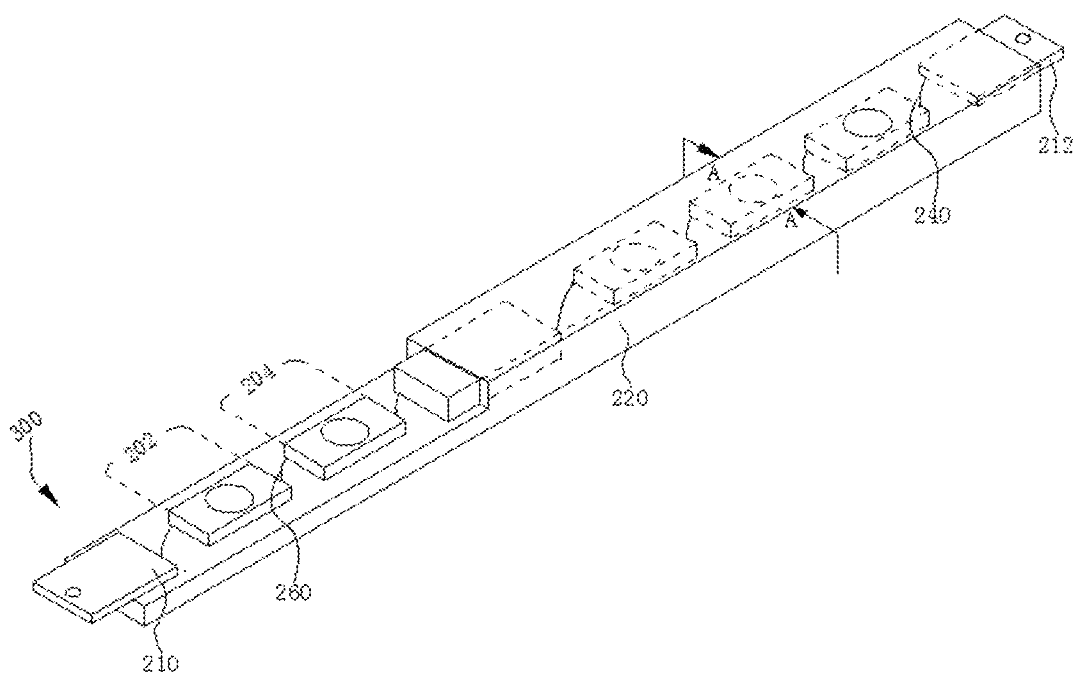
FIG. 57A is a schematic structural diagram of an embodiment of an LED filament according to this application.
Figure 57B:
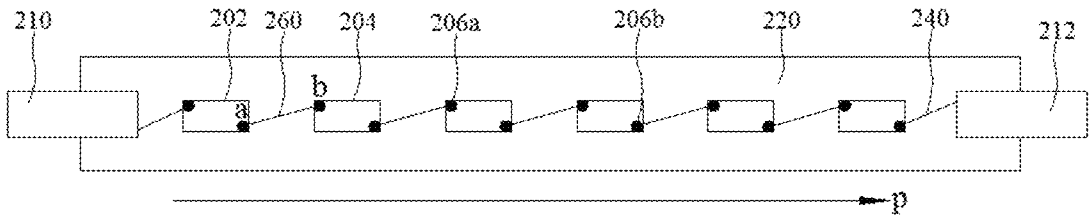
FIG. 57B is a top view of FIG. 57A.
Figure 57C:
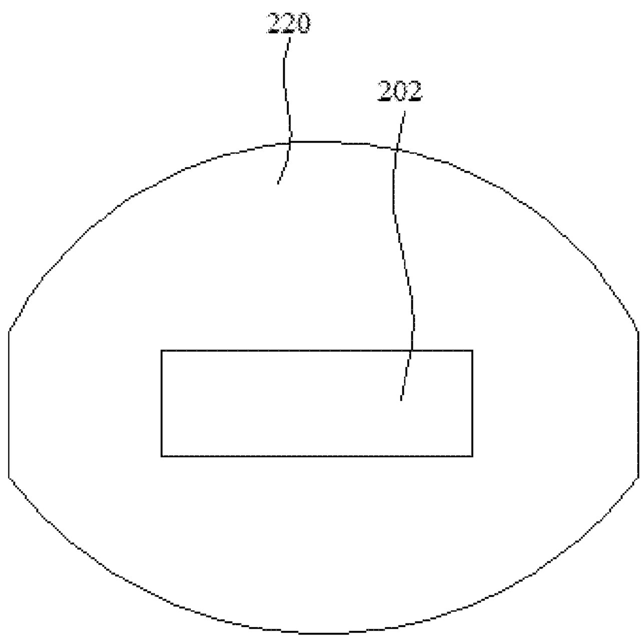

Still referring to FIG. 57A to FIG. 57C, FIG. 57A is a schematic three-dimensional partial cross-sectional view of an embodiment of an LED filament according to this application, FIG. 57B is a bottom view of FIG. 57A, and FIG. 57C is a schematic partial cross-sectional view of a position A-A in FIG. 57A. An LED filament 300 includes a plurality of LED chip units 202, 204, at least two conductive electrodes 210, 212, and a light conversion layer 220. The LED chip units 202, 204 are electrically connected to each other. The conductive electrodes 210, 212 are configured corresponding to the LED chip units 202, 204 and are electrically connected to the LED chip units 202, 204 by first conductive portions 240. The light conversion layer 220 wraps the LED chip units 202, 204 and the conductive electrodes 210, 212, and exposes at least parts of the two conductive electrodes 210, 212. The light conversion layer 220 includes silica glue, phosphor, and heat dissipation particles. In some embodiments, the LED chip unit 202/204 includes at least one LED chip. The concentration of phosphor corresponding to each surface of the LED chip is the same, so that the light conversion rate of each surface is the same, and the light uniformity of the LED filament is good.

The LED chip unit 202/204 includes at least one LED chip, and the LED chip unit 202/204 has a first electrical connecting portion 206*a* and a second electrical connecting portion 206*b*. In the length direction of the LED filament, the distance between first connecting portions 206*a* of two adjacent LED chip units is greater than the distance between the two adjacent LED chip units. In some embodiments, in the length direction of the LED filament, the distance between the first connecting portion 206*a* and the second connecting portion 206*b* of two adjacent LED chip units 202, 204 is greater than the distance between the two adjacent LED chip units 202, 204, and at least a part of the first electrical connecting portion 206*a* and the second electrical connecting portion 206*b* is in contact with the light conversion layer 220. The first electrical connecting portion 206*a* and the second electrical connecting portion 206*b* are located on the same side of the LED chip unit 202/204.

In one embodiment, the second electrical connecting portion 206*b* of the LED chip unit 202 is electrically connected to the first electrical connecting portion 206*a* of the LED chip unit 204. For example, the second electrical connecting portion 206*b* of the LED chip unit 202 may be electrically connected to the first electrical connecting portion 206*a* of the LED chip unit 204 by the second conductive portion 260. The second conductive portion 260 has an end point a and an end point b, a line connecting the end point a and the end point b forms a straight line ab, and the straight line ab intersects the length direction p of the LED filament. In some embodiments, the light conversion layer 220 includes a top layer and a carrying layer (not shown). The top layer wraps the LED chip units 202, 204 and the conductive electrodes 210, 212, and exposes at least parts of the two conductive electrodes 210, 212. The carrying layer includes a base layer. The base layer includes an upper surface and a lower surface opposite to the upper surface. The upper surface of the base layer is close to the top layer relative to the lower surface of the base layer. At least one of the first conductive portion 240 and the second conductive portion 260 is in contact (direct contact or indirect contact) with the upper surface of the base layer. When the LED filament is bent, the curvature radius of the base layer after being bent under force is relatively small, and the first conductive portion and the second conductive portion are not prone to be broken. In one embodiment, the first electrical connecting portion 206*a* and the second electrical connecting portion 206*b* are in contact (direct contact or indirect contact) with the upper surface of the base layer. The LED chip unit may be a flip chip or a mini LED chip. The mini LED refers to an LED with a package size of 0.1-0.2 mm, also referred to as the mini light emitting diode. When the LED chip unit is electrically connected, for example, the second electrical connecting portion 206*b* of the LED chip unit 202 may be a positive connection point, and the first electrical connecting portion 206*a* of the LED chip unit 204 may be a negative connection point, the second electrical connecting portion 206*b* of the LED chip unit 202 is electrically connected to the first electrical connecting portion 206*a* of the LED chip unit 204 by the second conductive portion 260. In another example, the second electrical connecting portion 206*b* of the LED chip unit 202 may be a negative connection point, and the first electrical connecting portion 206*a* of the LED chip unit 204 may be a positive connection point, the second electrical connecting portion 206*b* of the LED chip unit 202 is electrically connected to the first electrical connecting portion 206*a* of the LED chip unit 204 by the second conductive portion 260. The first conductive portion 240 and the second conductive portion 260 may be in the form of wires or films, such as copper wires, gold wires, circuit films, or copper foil.

Figure 58A:
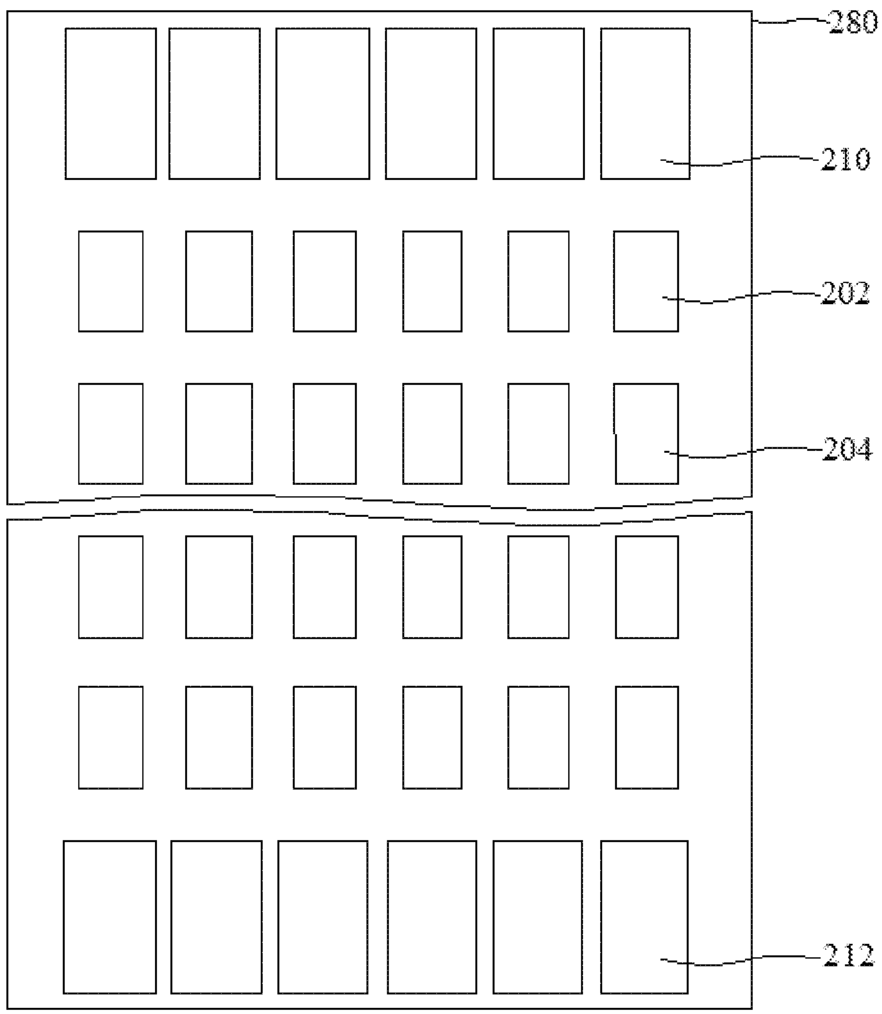
FIG. 58A to FIG. 58E are schematic diagrams of a first embodiment of a method for manufacturing an LED filament according to this application.

FIG. 58A to FIG. 58E are schematic diagrams of one embodiment of a method for manufacturing an LED filament according to this application. The method for manufacturing an LED filament includes the following steps:

S20. Lay LED chip units 202, 204 and conductive electrodes 210, 212 on a carrier 280 (as shown in FIG. 58A).

Figure 58B:
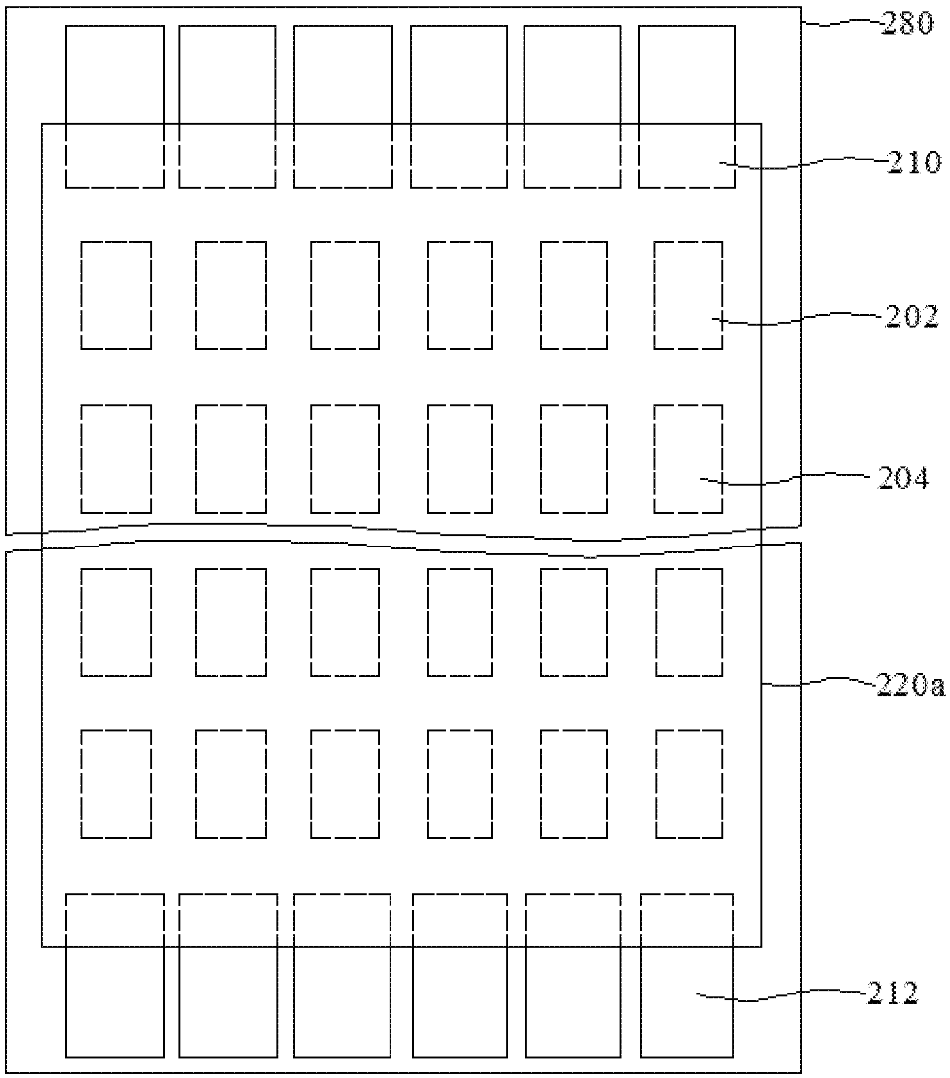

S22A. Coat the portion where the LED chip units 202, 204 and the conductive electrodes 210, 212 are not in contact with the carrier 280 with a top layer 220*a*, and then cure (or solidify) the LED chip units 202, 204 and the conductive electrodes 210, 212 that are coated with the top layer 220*a*, so that the top layer 220*a* is cured and covers the LED chip units 202, 204 and the conductive electrodes 210, 212 on the carrier, and at least parts of the two conductive electrodes 210, 212 are exposed (as shown in FIG. 58B). The curing procedure is, for example, but not limited to, heating or ultraviolet (UV) irradiation.

S22B. There are several ways to flip the LED chip units 202, 204 and the conductive electrodes 210, 212 that are coated with the top layer 220*a*, one is that the LED chip units 202, 204 and the conductive electrodes 210, 212 are only disposed on the carrier 280 with no adhesion therebetween and therefore can be flipped directly, and the flipped semi-finished product may be laid on the carrier 280.

The other is that, if there is a glue-like substance, such as a photoresist used in a semiconductor process or easy-to-remove die-bonding glue, for adhesion between the carrier 280 and the LED chip units 202, 204 and the conductive electrodes 210, 212, after being properly baked, the glue-like substance has the effect of temporarily fixing the LED chip units 202, 204 and the conductive electrodes 210, 212 on the carrier 280. Therefore, before or after the LED chip units 202, 204 and the conductive electrodes 210, 212 that are coated with the top layer 220*a* are flipped, the photoresist coated on the carrier 280 may be cleaned with acetone, or the die-bonding glue on the carrier may be removed with a corresponding solvent, so that the LED chip units 202, 204 and the conductive electrodes 210, 212 that are coated with the top layer 220*a* can be separated from the carrier 280. In addition, washing may be further performed to remove residual photoresist or die-bonding glue.

Figure 58C:
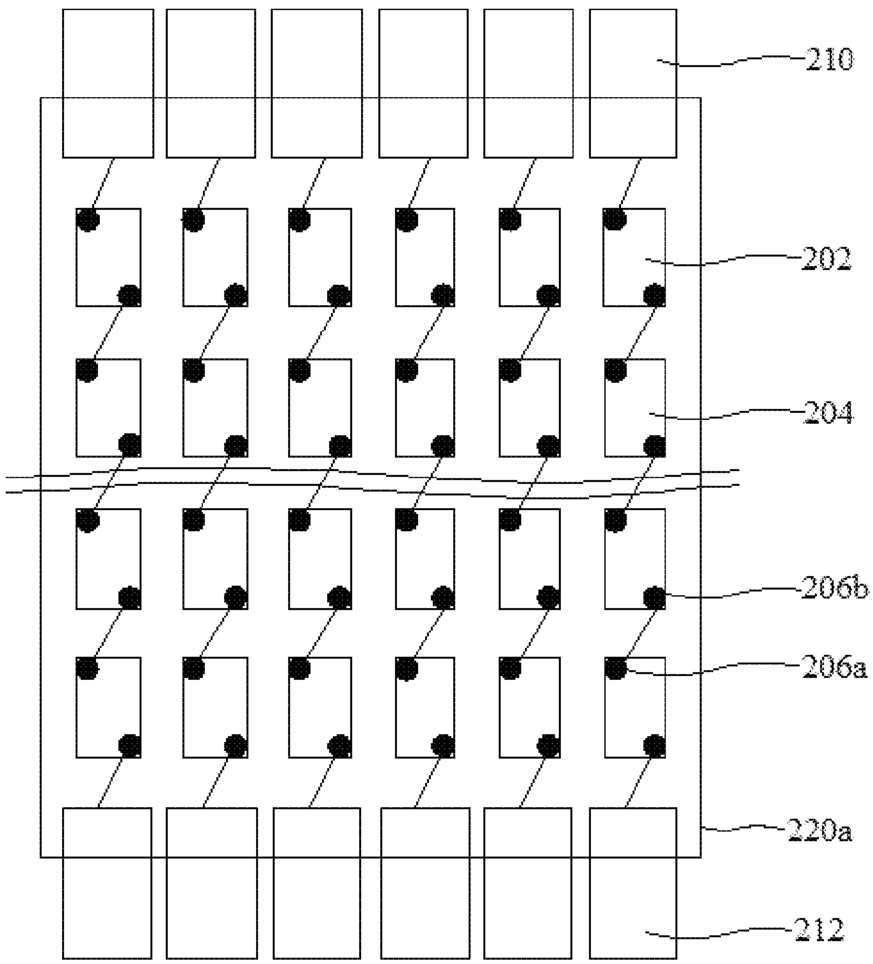

S24. Electrically connect adjacent LED chip units 202, 204, and the LED chip units 202/204 with the conductive electrodes 210, 212 (as shown in FIG. 58C).

Figure 58D:
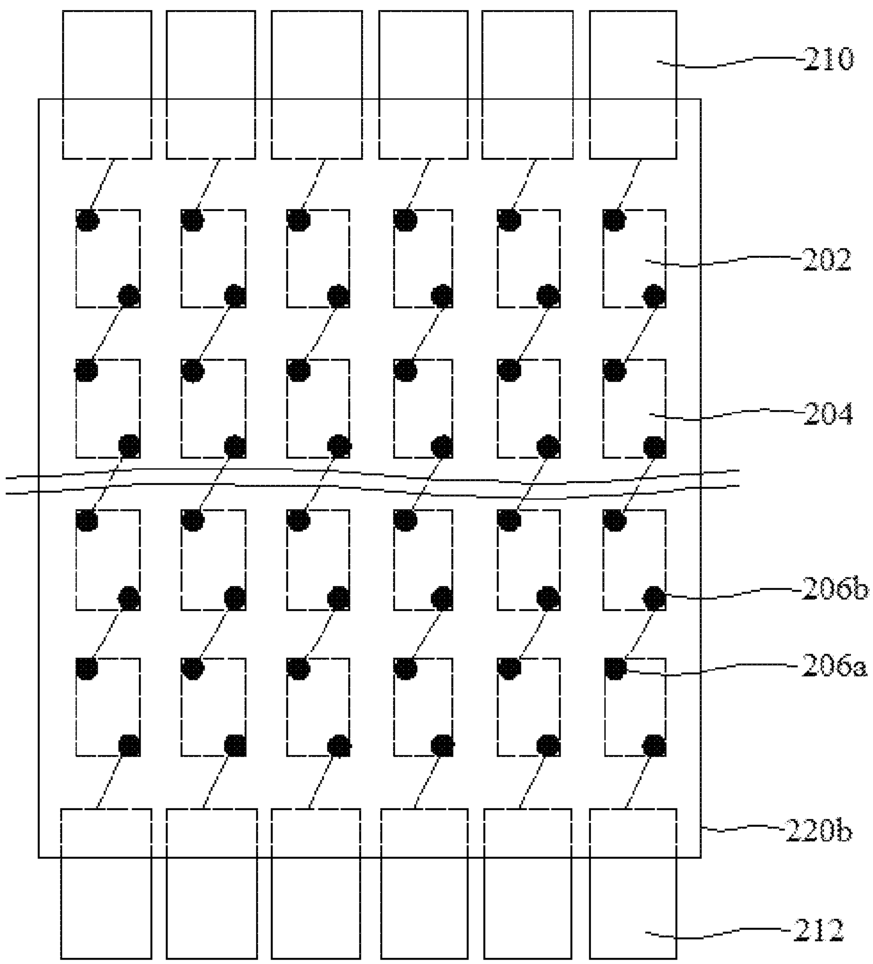

S26. After step S24, coat the portion where the LED chip units 202, 204 and the conductive electrodes 210, 212 are not coated with the top layer 220*a* with a base layer 220*b*, and perform curing after the coating is completed (as shown in FIG. 58D).

Figure 58E:
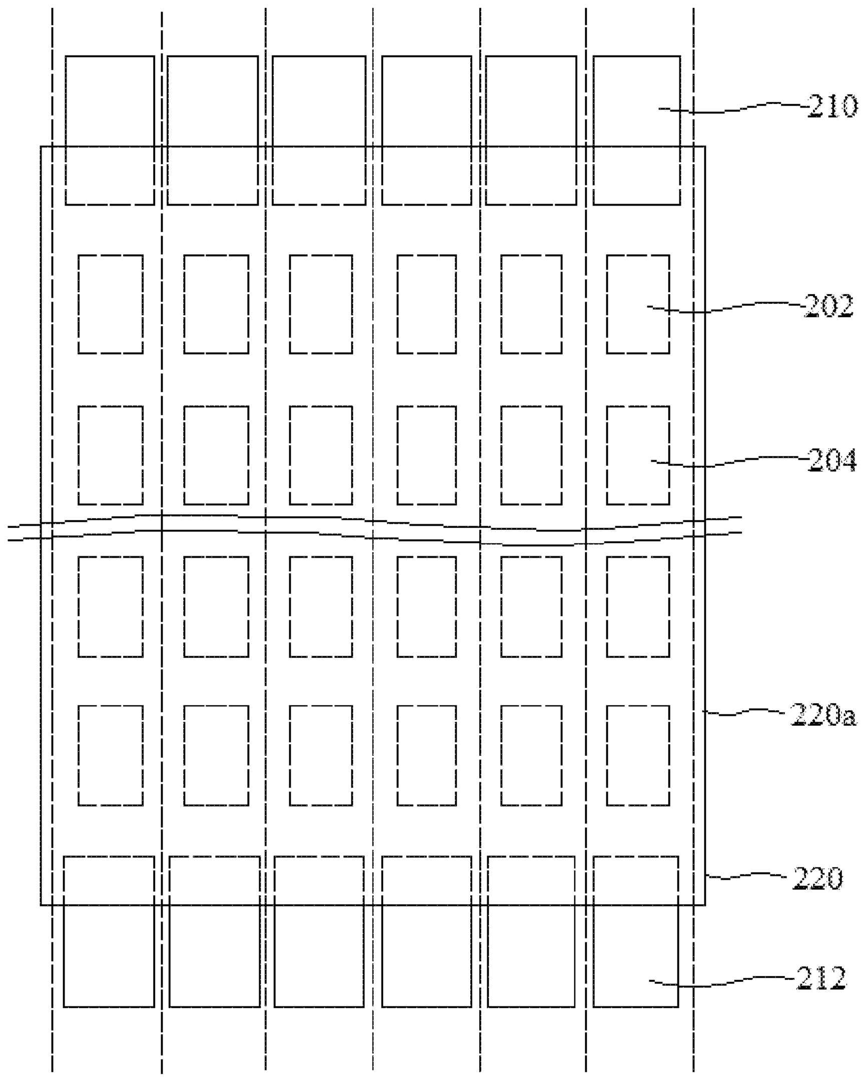

After step S26, another step S28 of cutting the LED chip units 202, 204 and the conductive electrodes 210, 212 that are wrapped with a light conversion layer 220 as cutting positions shown by dashed lines in FIG. 58E may be included. In this way, a strip-shaped element after cutting is the LED filament 300. The cutting method of step S28 is not limited to FIG. 58E, and every two adjacent columns of LED chip units 202, 204 may be cut into a single LED filament.

In the method for manufacturing an LED filament in this embodiment, the top layer 220*a* and the base layer 220*b* may be made of phosphor and silica glue in the same proportion. If the top layer 220*a* and the base layer 220*b* further contain oxidized nanoparticles, the proportions of phosphor, silica glue, and oxidized nanoparticles in the top layer 220*a* and the base layer 220*b* are the same. In other words, the materials of the top layer 220*a* and the base layer 220*b* are the same, and the top layer 220*a* and the base layer 220*b* are distinguished only for the convenience of description. Certainly, in other embodiments, the proportions of phosphor, silica glue, and oxidized nanoparticles in the top layer 220*a* and the base layer 220*b* may be different.

Figure 59:
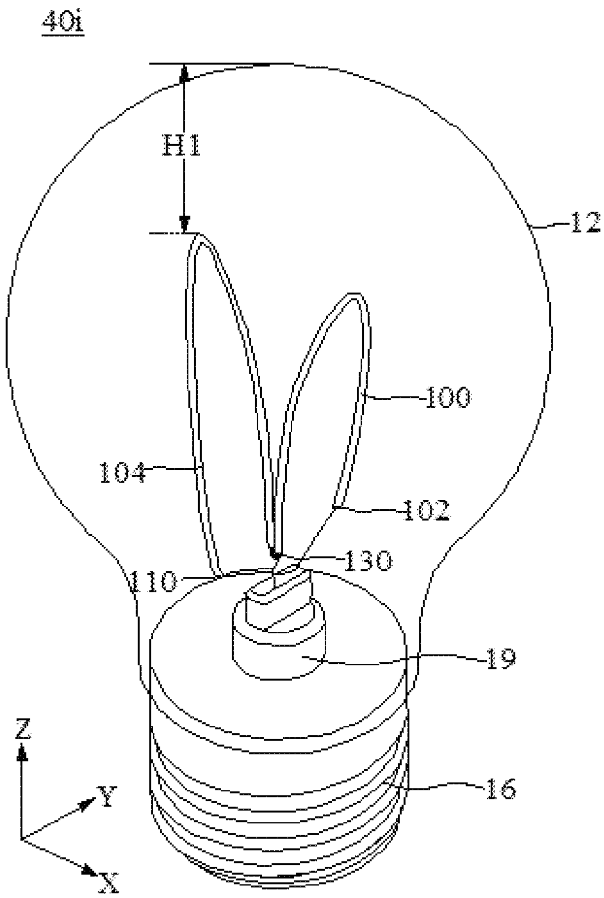
FIG. 59 is a schematic diagram of an LED light bulb according to an embodiment of this application.

Referring to FIG. 59, FIG. 59 is a schematic diagram of an LED light bulb 40*i* according to an embodiment of this application. The LED light bulb 40*i* in this embodiment has the same basic structure as the LED light bulb 40*h* in FIGS. 35A-35D, including a lamp housing 12, a lamp cap 16 connected to the lamp housing 12, at least two conductive brackets disposed in the lamp housing 12, a supporting arm (not shown), a stem 19, and a single LED filament 100. The difference is that the LED light bulb 40*i* in this embodiment does not have a stand 19*a*. The stem 19 includes an inflation pipe, and the gas in the lamp housing 12 is filled through the inflation pipe. As shown in FIG. 59, in the Z-axis direction, the shortest distance from the LED filament 100 (or the bending point of the LED section 102/104) to the lamp housing 12 is H1, the shortest distance from the conductive section 130 to the stem 19 of the LED filament 100 is H2, and H1 is less than or equal to H2, the bending point of the LED section 102/104 is closer to the lamp housing, so the heat dissipation path of the LED filament is short, thereby improving the heat dissipation effect of the LED light bulb. In one embodiment, H1 is greater than H2, the LED filament is approximately located in the middle area of the lamp housing, and the luminous effect of the light bulb is better.

Figure 60A:
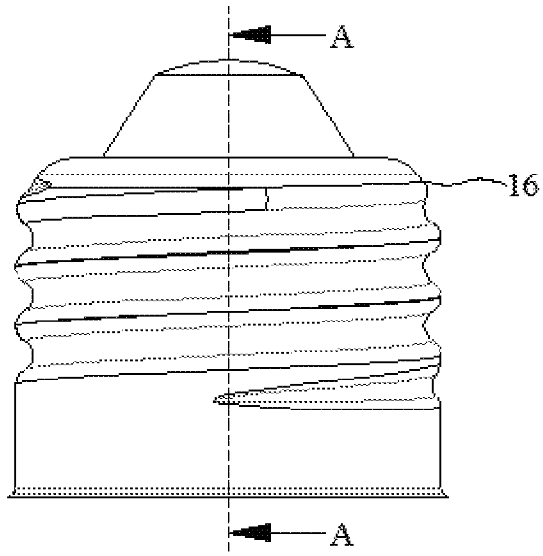
FIG. 60A is a schematic diagram of a lamp cap according to an embodiment of this application.
Figure 60B:
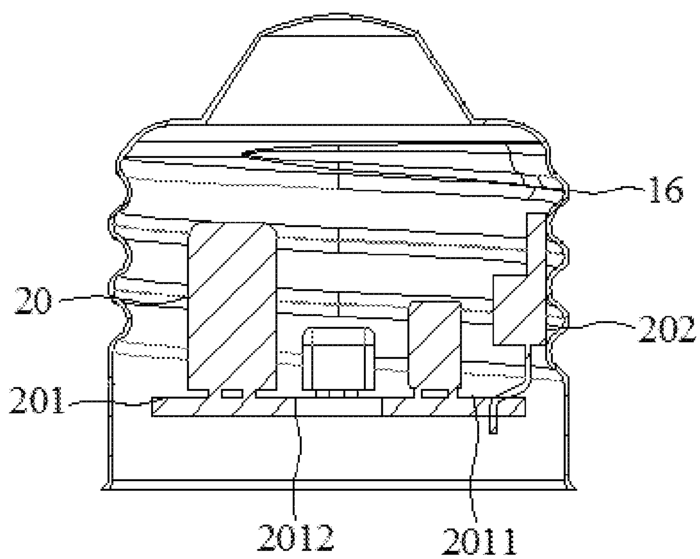
FIG. 60B is a schematic diagram of a cross section A-A in FIG. 60A.

Referring to FIGS. 60A-60B, FIG. 60A is a schematic structural diagram of a lamp cap according to an embodiment of this application, and FIG. 60B is a schematic diagram of a cross section A-A in FIG. 60A. In this embodiment, a power component 20 is disposed in a lamp cap 16, the power component 20 includes a substrate 201, a heating element (an element that generates more heat during operation, such as an IC or a resistor) and a non-heat-resistant element (such as an electrolytic capacitor) are disposed on the substrate 201, the lamp cap 16 has an inner surface and an outer surface opposite to the inner surface, the outer surface of the lamp cap 16 is away from the power component 20, the heating element is closer to the inner surface of the lamp cap 16 than the non-heat-resistant element, an insulation sheet 202 is disposed on the heating element, and the insulation sheet 202 is in contact with the inner surface of the lamp cap 16, for example, the insulation sheet 202 may be in contact with the inner surface of the lamp cap 16 by welding or using fasteners. In one embodiment, the heating element is integrally encapsulated into a component, a heat dissipation sheet is disposed on the component, and the heat dissipation sheet is in contact with the inner surface of the lamp cap 16. For example, after an IC and a rectifier bridge are encapsulated into a component, the heat dissipation sheet is in contact with the inner surface of the lamp cap 16 by welding or using fasteners, and the heat dissipation sheet may be welded to the inner surface of the lamp cap 16 as a negative wire.

In another embodiment, the substrate 201 is in direct contact with the inner surface of the lamp cap 16. Compared with the indirect contact between the substrate and the lamp cap through glue, the direct contact can improve the heat dissipation effect of the light bulb based on the reduction of heat transfer media.

In another embodiment, the heating element is covered with a heat conduction glue. For example, the substrate 201 has a first surface 2011 and a second surface 2012, the second surface 2012 is away from the LED filament, the heating element and the non-heat-resistant element are respectively located on the first surface 2011 and the second surface 2012, and the first surface 2011 is covered with the heat conduction glue, the heat generated by the heating element may be transferred to the lamp cap 16 through the heat conduction glue, thereby improving the heat dissipation effect of the LED light bulb.

Figure 61A:
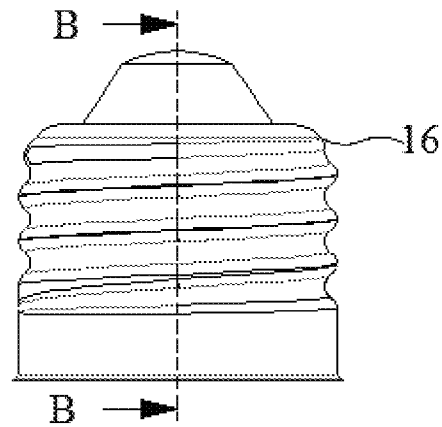
FIG. 61A is a schematic diagram of a lamp cap according to an embodiment of this application.
Figure 61B:
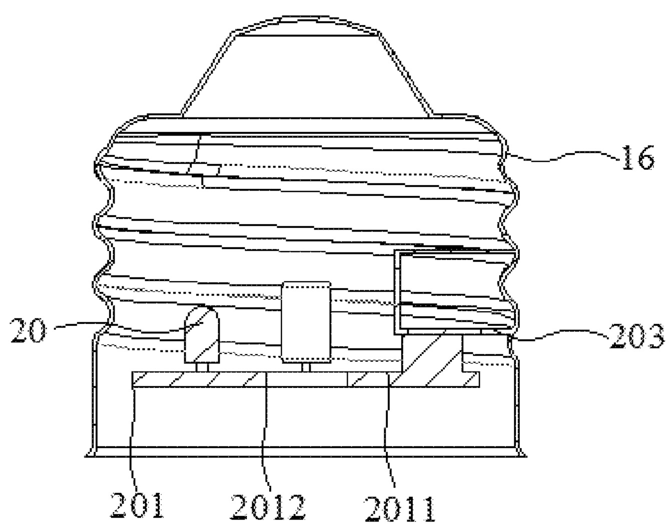
FIG. 61B is a schematic diagram of an embodiment of a cross section B-B in FIG. 61A.
Figure 61C:
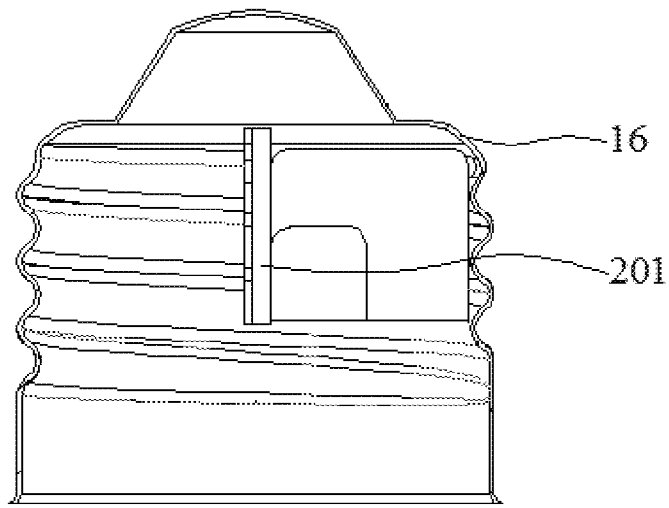
FIG. 61C is a schematic diagram of an embodiment of a cross section B-B in FIG. 61A.

Referring to FIGS. 61A-61C, FIG. 61A is a schematic diagram of a lamp cap according to an embodiment of this application, FIG. 61B is a schematic diagram of an embodiment of a cross section B-B in FIG. 61A, and FIG. 61C is a schematic diagram of an embodiment of a cross section B-B in FIG. 61A. In another embodiment, as shown in FIG. 61A, a heat conduction portion 203 is disposed on the inner surface of the lamp cap 16, the heat conduction portion 203 may be a net bag accommodating the heating element or a metal member in contact with the heating element, the thermal conductivity of the heat conduction portion 203 is greater than or equal to the thermal conductivity of the lamp cap 16, and the heat generated by the heating element may be quickly transferred to the lamp cap 16 through the heat conduction portion 203, thereby improving the heat dissipation effect of the LED light bulb.

In another embodiment, each surface of the power component 20 is covered with the heat conduction glue, and a part of the heat conduction glue is in contact with the inner surface of the lamp cap 16. For example, a flexible substrate may be used to be integrally mounted in the lamp cap 16 by pouring the heat conduction glue into the lamp cap 16. The power component is entirely covered with the heat conduction glue to increase the heat dissipation area, thereby greatly improving the heat dissipation effect of the LED light bulb.

In another embodiment, as shown in FIG. 61C, the substrate 201 is parallel to the axial direction of the lamp cap 16 or the axial direction of the stem 19 in FIGS. 35A-35D, FIG. 59, and FIGS. 62A-62D, since all the heating elements can be placed on the side of the substrate 201 close to the lamp cap 16, the heat generated by the heating elements can be quickly transferred to the lamp cap 16, thereby improving the heat dissipation efficiency of the power component; in addition, heating elements and non-heat-resistant elements can be separately arranged on the different surfaces of the substrate 201, it can reduce the influence of the heat generated by the heating element on the heat-resistant element, and improve the overall reliability and life of the power component. In one embodiment a heating element (an element that generates more heat during operation, such as an IC or a resistor) and a non-heat-resistant element (such as an electrolytic capacitor) are disposed on the substrate 201. The heating element is closer to the inner surface of the lamp cap 16 than other electronic elements (such as non-heat-resistant elements or other non-heat sensitive elements, for example, a capacitor). Therefore, compared with other electronic elements, the heating element has a shorter heat transfer distance from the lamp cap 16, which is more conducive to the heat generated by the heating element during operation being conducted to the lamp cap 16 for heat dissipation, thereby improving the heat dissipation efficiency of the power component 20.

As shown in FIG. 59 to FIGS. 61A-61C, the projections of the inflation pipe and the substrate 201 on the XY-plane overlap. In some embodiments, the projections of the inflation pipe and the substrate 201 on the XZ-plane and/or YZ-plane are separated (or do not overlap), or in the height direction of the lamp cap 16 (or Z-axis direction), there is a certain distance between the inflation pipe and the substrate 201, so the inflation pipe and the substrate 201 are not in contact with each other, and thereby increasing the accommodation space of the power component and improving the utilization rate of the substrate 201. In addition, when the substrate 201 is in contact with the inner surface of the lamp cap 16, a cavity is formed between the first surface 2011 of the substrate 201 and the stem 19, and the heat generated by the heating element located on the first surface of the substrate 201 may be transferred through the cavity, which reduces the thermal impact on the non-heat-resistant element located on the second surface, thereby increasing the service life of the power component.

Figure 62A:
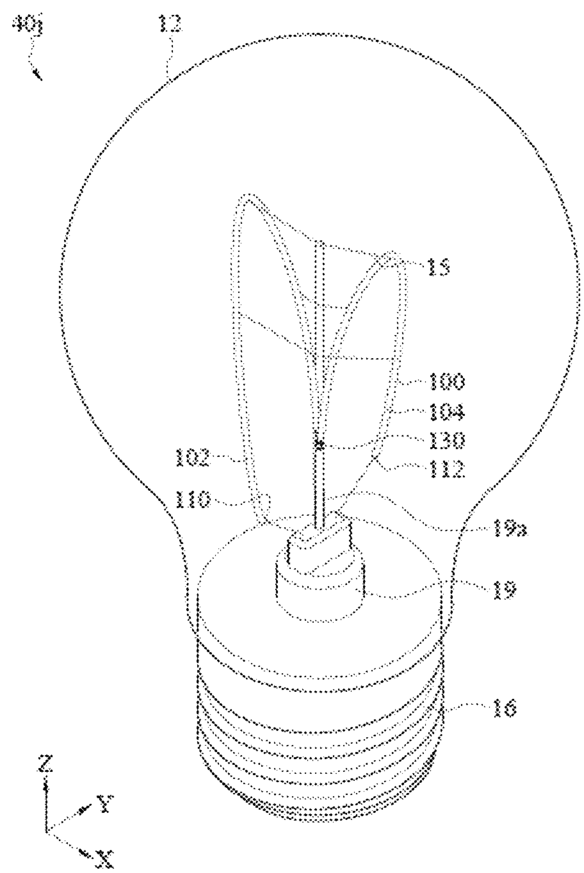
FIG. 62A to FIG. 62D are respectively a schematic diagram, a side view, another side view, and a top view of an LED light bulb according to an embodiment of this application.
Figure 62B:
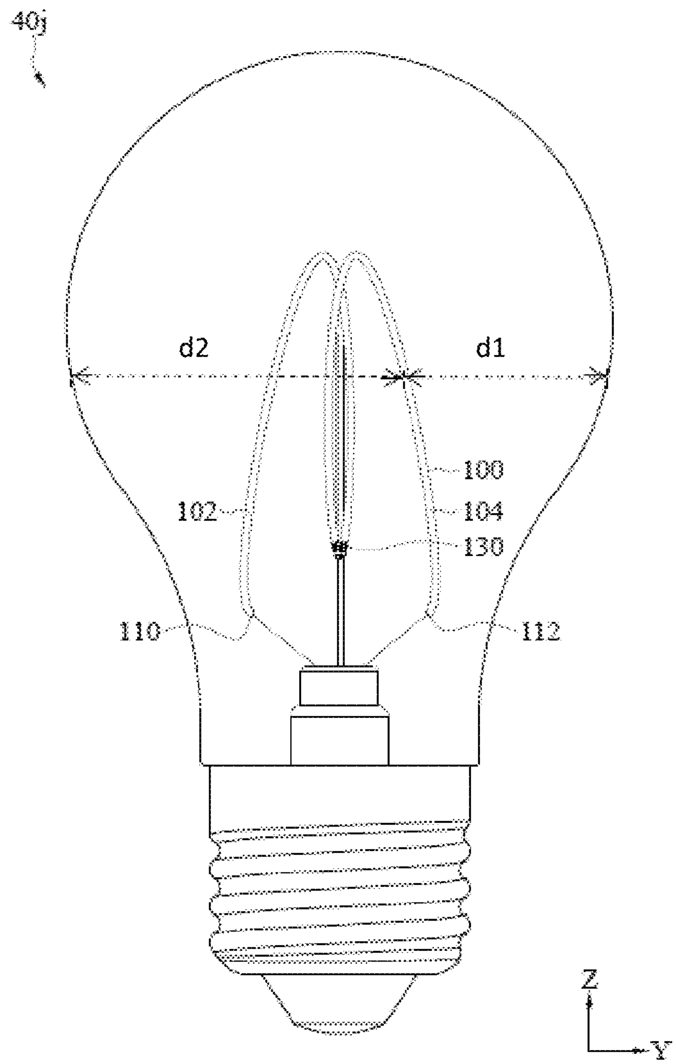
Figure 62C:
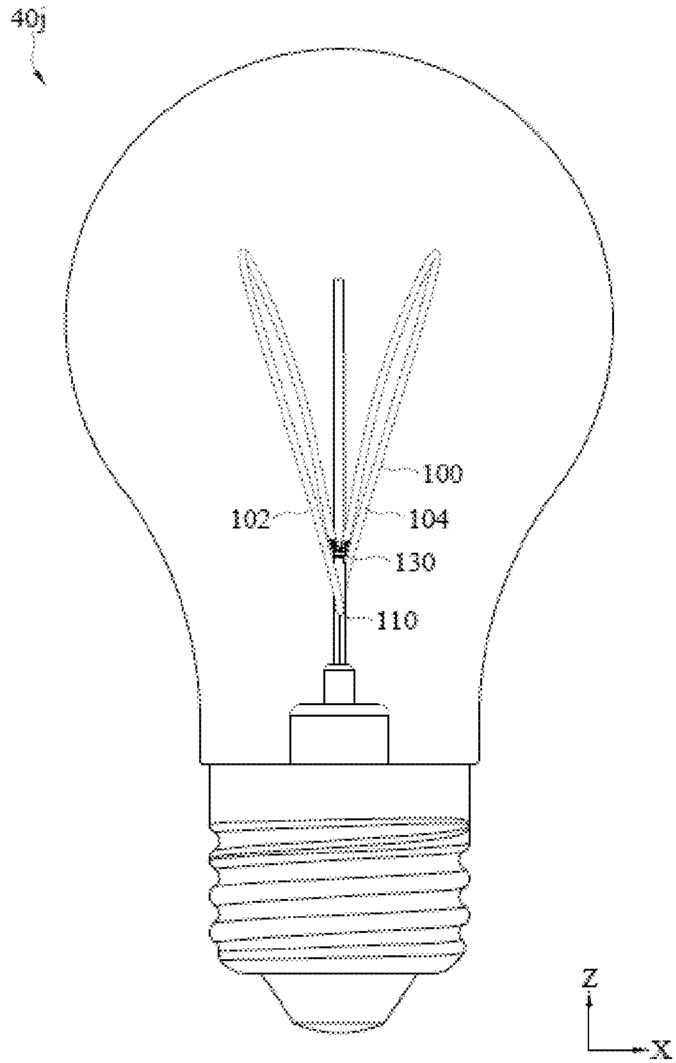
Figure 62D:
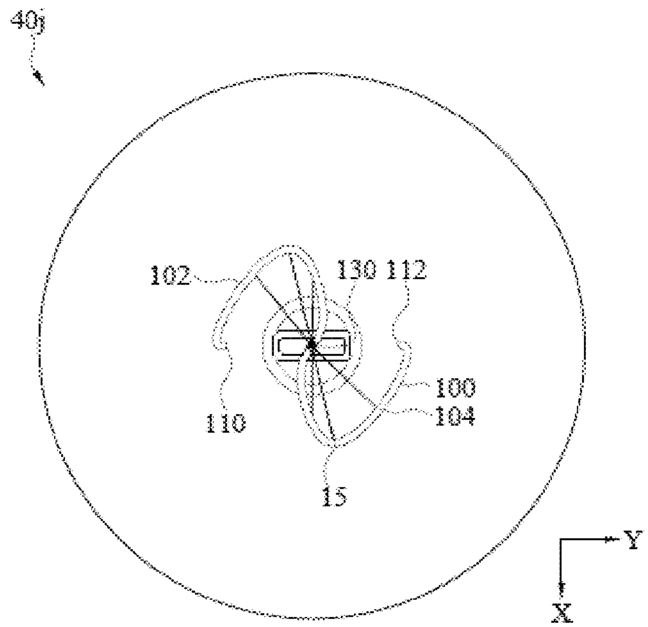

Referring to FIG. 62A to FIG. 62D, FIG. 62A to FIG. 62D are schematic diagrams of an LED light bulb 40*j* according to an embodiment of this application. The LED light bulb 40*j* in this embodiment has the same basic structure as the LED light bulb 40*h* in FIGS. 35A-35D, including a lamp housing 12, a lamp cap 16 connected to the lamp housing 12, at least two conductive brackets disposed in the lamp housing 12, at least one supporting arm 15, a stem 19, and an LED filament 100, and the supporting arms 15 are not shown in FIG. 62B and FIG. 62C. The stem 19 includes the stand 19*a*. Each supporting arm 15 includes a first end and a second end that are opposite to each other. The first end of each supporting arm 15 is connected to the stand 19*a*, and the second end of each supporting arm 15 is connected to the LED filament 100. The LED light bulb shown in FIG. 62C is different from the light bulb shown in FIGS. 35A-35D in that the height of the stand 19*a* is greater than the distance between a bottom portion of the stand 19*a* and the conductive section 130 in the Z-axis direction, and the stand 19*a* comprises the bottom portion of the stand 19*a* and the top portion of the stand 19*a* opposite to each other, where the bottom portion of the stand 19*a* is closer to the inflation pipe. As shown in FIG. 62D, in the XY-plane, the central angle corresponding to the arc where at least two bending points of the LED filament 100 are located ranges from 170° to 220°, so that there is a proper distance between bending points of the LED section 102, 104 to ensure the heat dissipation effect of the LED filament 100. At least one supporting arm 15 is located at the bending point of the LED filament 100, for example, at the bending point of the LED section 102/104. Each supporting arm 15 has an intersection with the LED filament 100. On the XY-plane, at least two intersections are located on a circumference of a circle taking the stem 19 (or the stand 19*a*) as a center, the LED filament has certain symmetry, and the luminous flux in all directions is roughly the same, so that the Light bulb can emit light evenly. In one embodiment, at least one intersection and the bending point of the conductive section 130 form a straight line La, and the intersection on the straight line La and the electrode 110/112 of the LED filament form a straight line Lb. The range of the angle α between the straight line La and the straight line Lb is $0°<\alpha<90°$, preferably $0°<\alpha<60°$, so that the LED sections have a proper spacing after bending, and have good light emission and heat dissipation effects. The LED section has a curvature radius at the bending point. For example, the LED section 102 has a curvature radius r3 at the bending point, the LED section 104 has a curvature radius r4 at the bending point, r3 is equal to r4, and the light is uniform on each plane. Certainly, it is also possible to set r3 to be greater than r4 or r3 to be less than r4 to meet lighting requirements and/or heat dissipation requirements in some specific directions. The conductive section 130 has a curvature radius r5 at the bending point, r5 is less than a maximum value of r3 and r4, that is, $r5<\max(r3, r4)$, so that the LED filament 100 is not easy to break, and there is a certain distance between the LED sections 102, 104 that are closer to the stem to prevent the heat generated by the two LED sections 102, 104 from affecting each other.

In one embodiment, the LED section 102/104 includes a first section and a second section. The first section is extending upward (the direction of the top portion of the lamp housing 12) from the electrode 110/112 to the bending point, and the second section is extending downward (the direction of the lamp cap 16) from the bending point to the conductive section 130 connecting two LED sections 102, 104. The first section and the second section to the lamp housing 12 respectively have a first distance and a second distance that are opposite to each other, and the first distance is less than the second distance. In the first distance direction, the base layer of the LED filament 100 is close to the lamp housing 12, and the top layer of the LED filament 100 is away from the lamp housing 12. For example, in FIG. 62B, the first section of the LED section 104 to the lamp housing 12 has a first distance d1 and a second distance d2, and the first distance d1 is less than the second distance d2. In the first distance d1 direction, the base layer of the LED filament 100 is close to the lamp housing 12, and the top layer of the LED filament 100 is away from the lamp housing 12. When the LED filament 100 is bent, the conductive wire in the LED filament 100 has a small bending stress and is not easy to break, improving the production quality of the LED light bulb 40*j*.

Referring to FIG. 35A to FIG. 35D and FIG. 62A to FIG. 62D, a plane A divides the lamp housing 12 into an upper portion and a lower portion, and the lamp housing 12 has the largest width at the plane A. For example, a plane figure formed by R2 (maximum horizontal spacing) in FIG. 35B is located on the plane A, and when there is an intersection between the stem 19 and the plane A, the lamp housing 12 has a lamp housing top portion and a lamp housing bottom portion that are opposite to each other, the lamp housing bottom portion is close to the lamp cap 12, and the length of the LED filament located between the lamp housing top portion and the plane A (or in the height direction of the LED light bulb, the distance from the highest point of the LED filament to the plane A) is less than the length of the LED filament located between the plane A and the lamp housing bottom portion (or in the height direction of the LED light bulb, the distance from the lowest point of the LED filament to the plane A). Because when there is an intersection between the stem 19 and the plane A, the inner diameter of the lamp housing 12 above the top portion of the stem 19 is small and the volume for accommodating gas is small, if a large part of the LED filament is located on the top portion of the stem 19, the overall heat dissipation effect of the LED filament is affected, thereby reducing the product quality. When there is a distance between the stem 19 and the plane A, and the distance from a stem top portion to the plane A is less than the height of the stand 19*a*, the stem 19 includes a stem bottom portion and a stem top portion opposite to each other, the stem bottom portion is connected to the lamp cap 16, the stem top portion extends to the direction of the lamp housing top portion, and the length of the LED filament located between the stem top portion and the lamp housing top portion (or the distance between the highest point of the LED filament and the stem top portion) is less than the length of the LED filament located between the stem top portion and the lamp housing bottom portion (or the distance between the stem top portion and the lowest point of the LED filament). Most of the LED filament can be indirectly supported by the stem 19, so as to ensure the stability of the LED filament shape during the transportation of the LED light bulb. In some embodiments, when there is a distance between the stem 19 and the plane A, and the distance from the stem top portion to the plane A is greater than the height of the stand 19*a*, the stem 19 includes a stem bottom portion and a stem top portion opposite to each other, the stem bottom portion is connected to the lamp cap 12, the stem top portion extends to the direction of the lamp housing top portion, and the length of the LED filament located between the stem top portion and the lamp housing top portion is greater than the length of the LED filament located between the stem top portion and the lamp housing bottom portion. Since the volume of gas contained between the stem top portion and the lamp housing bottom portion is large, and most of the LED filament is located between the stem top portion and the lamp housing bottom portion, which facilitates the heat dissipation of the LED filament.

Figure 63:
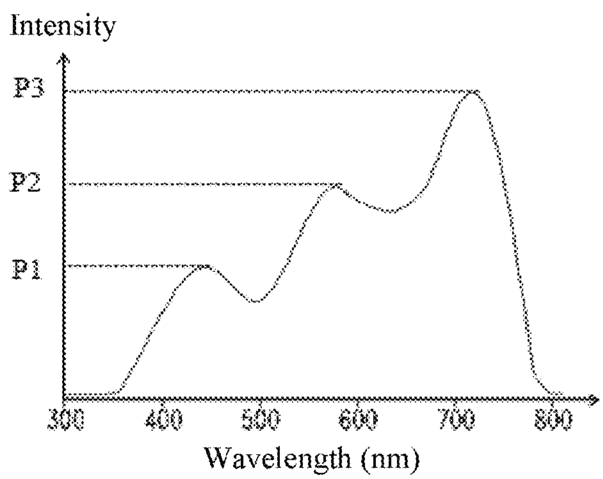
FIG. 63 is a schematic diagram of a light emission spectrum of an LED light bulb according to an embodiment of this application.
Figure 64:
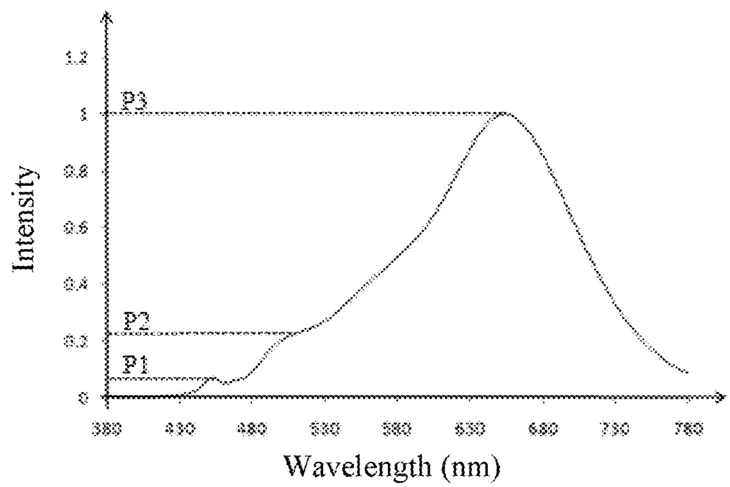
FIG. 64 is a schematic diagram of a light emission spectrum of an LED light bulb according to an embodiment of this application.

Referring to FIG. 63, FIG. 63 is a schematic diagram of a light emission spectrum of an LED light bulb according to an embodiment of this application. In this embodiment, the LED light bulb may be any LED light bulb disclosed in the previous embodiments, and any single LED filament disclosed in the previous embodiments is disposed in the LED light bulb. The light emitted by the LED light bulb is measured by a spectrometer to obtain a schematic diagram of a spectrum shown in FIG. 63. It can be seen from the schematic diagram of the spectrum that the spectrum of the LED light bulb is mainly distributed between the wavelengths from 400 nm to 800 nm, and three peaks P1, P2, P3 appear at three places in this range. The peak P1 is approximately between the wavelengths from 430 nm to 480 nm. The peak P2 is approximately between the wavelengths from 580 nm to 620 nm. The peak P3 is approximately between the wavelengths from 680 nm to 750 nm. With regard to intensity, the intensity of the peak P1 is less than the intensity of the peak P2, and the intensity of the peak P2 is less than the intensity of the peak P3. As shown in FIG. 63, such a spectral distribution is close to the spectral distribution of a conventional incandescent filament lamp and also close to the spectral distribution of natural light. In one embodiment, a schematic diagram of a light emission spectrum of a single LED filament is shown in FIG. 64. It can be seen from the schematic diagram of the spectrum that the spectrum of the LED light bulb is mainly distributed between the wavelengths from 400 nm to 800 nm, and there are three peaks P1, P2, and P3 appear in this range. The peak P1 is approximately between the wavelengths from 430 nm to 480 nm. The peak P2 is approximately between the wavelengths from 480 nm to 530 nm. The peak P3 is approximately between the wavelengths from 630 nm to 680 nm. With regard to intensity, the intensity of the peak P1 is less than the intensity of the peak P2, and the intensity of the peak P2 is less than the intensity of the peak P3. Such a spectral distribution is close to the spectral distribution of a conventional incandescent filament lamp and also close to the spectral distribution of natural light.

Figure 65:
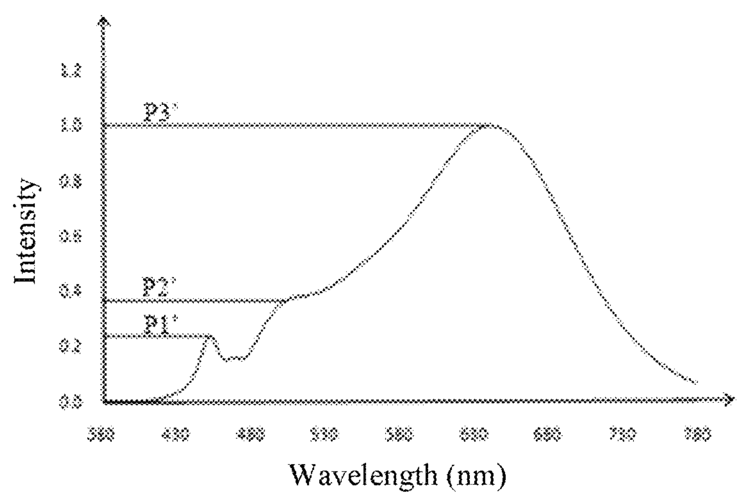
FIG. 65 is a schematic diagram of a light emission spectrum of an LED light bulb according to an embodiment of this application.

Referring to FIG. 65, FIG. 65 is a light emission spectrum of an LED light bulb according to one embodiment of this application. It can be seen from the figure that there are three peaks P1', P2', and P3' similar to those shown in FIG. 64 between the wavelengths from 400 nm to 800 nm where the spectrum of the LED light bulb is distributed. The peak P1' is approximately between the wavelengths from 430 nm to 480 nm. The peak P2' is approximately between the wavelengths from 480 nm to 530 nm. The peak P3' is approximately between the wavelengths from 630 nm to 680 nm. With regard to intensity, the intensity of the peak P1' is less than the intensity of the peak P2', and the intensity of the peak P2' is less than the intensity of the peak P3'. The difference is that the intensity of P1' is greater than that of P1, and the FWHM of P3' is greater than that of P3. The LED light bulb has an average color rendering index Ra (R1-R8) greater than 95, saturated red color (R9) greater than or equal to 90, and a luminous efficiency (Eff) of the LED filament greater than or equal to 100.

What is claimed is:

1. An LED light bulb, comprising:

a lamp housing with a central axis;

a bulb base connected to the lamp housing;

a stem disposed in the lamp housing along the central axis of the lamp housing;

two conductive supports disposed in the lamp housing, the two conductive supports having opposite polarities;

a driving circuit disposed in the bulb base and electrically connected to the two conductive supports; and a flexible LED filament disposed in the lamp housing and electrically connected to the two conductive supports, the flexible LED filament comprising:

a first LED section comprising a first plurality of LED chips connected in series and a first light conversion layer wrapping the first plurality of LED chips, the first LED section being bent into a first three-dimensional curve shape in the lamp housing;

a second LED section comprising a second plurality of LED chips connected in series and a second light conversion layer wrapping the second plurality of LED chips, the second LED section being bent into a second three-dimensional curve shape in the lamp housing;

a conductive section disposed between the first LED section and the second LED section, the conductive section comprising a conductor electrically connected to the first plurality of LED chips and the second plurality of LED chips, the conductor further electrically connected to one of the two conductive supports;

a first conductive electrode disposed at one end of the first LED section and electrically connected to the first plurality of LED chips and another one of the two conductive supports, a portion of the first conductive electrode and a portion of the conductor being wrapped by the first light conversion layer; and a second conductive electrode disposed at one end of the second LED section and electrically connected to the second plurality of LED chips and the another one of the two conductive supports, the other end of the second LED section connecting the other end of the first LED section by the conductive section, a portion of the second conductive electrode and a portion of the conductor being wrapped by the second light conversion layer;

wherein the flexible LED filament is bent into a third three-dimensional curve shape in the lamp housing, the third three-dimensional curve shape comprising the first three-dimensional curve shape, the conductive section, and the second three-dimensional curve shape, wherein the conductive section includes a center point of the flexible LED filament and a polarity of the conductor is opposite to polarities of the first conductive electrode and the second conductive electrode.

2. The LED light bulb according to claim 1, wherein a shortest distance between one of the first plurality of LED chips of the first LED section and one of the second plurality of LED chips of the second LED section is greater than a distance between adjacent two of the first plurality of LED chips of the first LED section and greater than a distance between adjacent two of the second plurality of LED chips of the second LED section.

3. The LED light bulb according to claim 2, wherein a length of the conductor is greater than a distance between the adjacent two of the first plurality of LED chips of the first LED section and greater than a distance between the adjacent two of the second plurality of LED chips of the second LED section.

4. The LED light bulb according to claim 3, wherein the first plurality of LED chips of the first LED section is connected in series by wires, the second plurality of LED chips of the second LED section is connected in series by wires, the conductor is a conductive foil, and the conductor is electrically connected to one of the first plurality of LED chips of the first LED section by a wire.

5. The LED light bulb according to claim 4, wherein a length of one of the wires connecting two of the first plurality of LED chips of the first LED section is less than a length of the conductor, and a length of one of the wires connecting two of the second plurality of LED chips of the second LED section is less than the length of the conductor.

6. The LED light bulb according to claim 5, wherein the first light conversion layer comprises a first top layer and a first base layer, the second light conversion layer comprises a second top layer and a second base layer, the first plurality of LED chips of the first LED section is disposed between the first top layer and the first base layer, and the second plurality of LED chips of the second LED section is disposed between the second top layer and the second base layer.

7. The LED light bulb according to claim 6, wherein a portion of the conductor is disposed between the first top layer and the first base layer, and a portion of the conductor is disposed between the second top layer and the second base layer.

8. The LED light bulb according to claim 7, wherein the first conductive electrode is disposed between the first top layer and the first base layer, and the second conductive electrode is disposed between the second top layer and the second base layer.

9. The LED light bulb according to claim 8, wherein a portion of the conductor is exposed from the first light conversion layer and the second light conversion layer.

10. The LED light bulb according to claim 9, wherein a portion of the first conductive electrode is exposed from the first light conversion layer, and a portion of the second conductive electrode is exposed from the second light conversion layer.

11. The LED light bulb according to claim 10, wherein the portion of the conductor exposed from the first light conversion layer and the second light conversion layer is electrically connected to the one of the two conductive supports, the portion of the first conductive electrode exposed from the first light conversion layer and the portion of the second conductive electrode exposed from the second light conversion layer are electrically connected to the other one of the two conductive supports.

12. The LED light bulb according to claim 11, wherein the first three-dimensional curve shape and the second three-dimensional curve shape are axially symmetrical about the central axis of the lamp housing.

13. An LED light bulb, comprising:

a lamp housing with a central axis;

a bulb base connected to the lamp housing;

a stem disposed in the lamp housing along the central axis of the lamp housing;

two conductive supports disposed in the lamp housing, the two conductive support having opposite polarities;

a driving circuit disposed in the bulb base and electrically connected to the two conductive supports, the driving circuit comprising a first output terminal, a second output terminal and a third output terminal; and a flexible LED filament disposed in the lamp housing and electrically connected to the two conductive supports, the flexible LED filament comprising:

a first LED section comprising a first plurality of LED chips connected in series to have a first node and a second node, wherein polarities of the first node and the second node of the first LED section are opposite, and wherein the first LED section is bent into a first three-dimensional curve shape in the lamp housing;

a second LED section comprising a second plurality of LED chips connected in series to have a third node and a fourth node, wherein polarities of the third node and the fourth node of the second LED section are opposite, the polarities of the first node and the fourth node are the same, the polarities of the second node and the third node are the same, and the second node of the first LED section is electrically connected to the third node of the second LED section, and wherein the second LED section is bent into a second three-dimensional curve shape in the lamp housing;

a conductive section comprising a conductor electrically connected to the second node of the first LED section and the third node of the second LED section;

a first conductive electrode electrically connected to the first node of the first LED section;

a second conductive electrode electrically connected to the fourth node of the second LED section; and a light conversion layer wrapping the first plurality of LED chips of the first LED section, the second plurality of LED chips of the second LED section, a portion of the first conductive electrode, a portion of the second conductive electrode, and a portion of the conductor;

wherein the first output terminal of the driving circuit is electrically connected to the conductor, the second output terminal of the driving circuit is electrically connected to the first node of the first LED section, and the third output terminal of the driving circuit is electrically connected to the fourth node of the second LED section, wherein the light conversion layer comprises a top layer and a base layer, and the first conductive electrode, the second conductive electrode, and the conductor are disposed between the base layer and the top layer, wherein the flexible LED filament is bent into a third three-dimensional curve shape in the lamp housing, the third three-dimensional curve shape comprises the first three-dimensional curve shape, the conductive section, and the second three-dimensional curve shape.

14. The LED light bulb according to claim 13, wherein the first output terminal is a positive electrode, the second output terminal is a negative electrode, the third output terminal is a negative electrode, the polarity of the second node is anode, and the polarities of the first node and fourth node are cathode.

15. The LED light bulb according to claim 13, wherein the first output terminal is a negative electrode, the second output terminal is a positive electrode, the third output terminal is a positive electrode, the polarities of the first node and the fourth node are anode, and the polarity of the second node is cathode.

16. The LED light bulb according to claim 13, wherein a shortest distance between one of the first plurality of LED chips of the first LED section and one of the second plurality of LED chips of the second LED section is greater than a distance between adjacent two of the first plurality of LED chips of the first LED section and greater than a distance between adjacent two of the second plurality of LED chips of the second LED section.

17. The LED light bulb according to claim 16, wherein a length of the conductive section is greater than a distance between the adjacent two of the first plurality of LED chips of the first LED section and greater than a distance between the adjacent two of the second plurality of LED chips of the second LED section.

18. The LED light bulb according to claim 17, wherein the first plurality of LED chips of the first LED section is connected in series by wires, the second plurality of LED chips of the second LED section is connected in series by wires, the conductor is a conductive foil, and the conductor is electrically connected to the second node of the first LED section and the third node of the second LED section by wires.

19. The LED light bulb according to claim 18, wherein a length of one of the wires connecting two of the first plurality of LED chips of the first LED section is less than a length of the conductor and a length of one of the wires connecting two of the second plurality of LED chips of the second LED section is less than the length of the conductor.

20. The LED light bulb according to claim 19, wherein the first plurality of LED chips of the first LED section and the second plurality of LED chips of the second LED section are disposed between the top layer and the base layer.

21. The LED light bulb according to claim 13, wherein a portion of the conductor is disposed between the top layer and the base layer, and a portion of the conductor is exposed from the light conversion layer.

22. The LED light bulb according to claim 21, the portion of the conductor exposed from the light conversion layer is electrically connected to one of the two conductive supports.

23. The LED light bulb according to claim 20, wherein the first three-dimensional curve shape and the second three-dimensional curve shape are axially symmetrical about the central axis of the lamp housing.

* * * * *